US012720757B1

(12) United States Patent
Guha et al.

(10) Patent No.: US 12,720,757 B1
(45) **Date of Patent: *Aug. 25, 2026**

(54) METHOD OF FABRICATING A MEMORY DEVICE BY WAFER BONDING

(71) Applicant: Kepler Computing Inc., San Francisco, CA (US)

(72) Inventors: Biswajeet Guha, Hillsboro, OR (US); Mauricio Manfrini, Heverlee (BE); Noriyuki Sato, Palo Alto, CA (US); James David Clarkson, El Sobrante, CA (US); Abel Fernandez, Berkeley, CA (US); Somilkumar J. Rathi, San Jose, CA (US); Niloy Mukherjee, San Ramon, CA (US); Tanay Gosavi, Portland, OR (US); Amrita Mathuriya, Portland, OR (US); Rajeev Kumar Dokania, Beaverton, OR (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 11 days.

This patent is subject to a terminal disclaimer.

(21) Appl. No.: 18/648,133

(22) Filed: Apr. 26, 2024

Related U.S. Application Data

(63) Continuation of application No. 18/620,808, filed on Mar. 28, 2024, now Pat. No. 12,563,737.

(51) Int. Cl.
*H10B 51/20* (2023.01)
*H10B 51/40* (2023.01)
(Continued)

(52) U.S. Cl.
CPC ............. *H10B 51/20* (2023.02); *H10B 51/40* (2023.02); *H10B 53/20* (2023.02); *H10B 53/40* (2023.02)

(58) Field of Classification Search
CPC ........ H10B 51/20; H10B 51/40; H10B 53/20; H10B 53/40
(Continued)

(56) References Cited

U.S. PATENT DOCUMENTS

| | | | |
|---|---|---|---|
| 9,099,526 | B2 | 8/2015 | Or-Bach et al. |
| 9,460,661 | B2 | 10/2016 | Shim et al. |

(Continued)

OTHER PUBLICATIONS

U.S. Appl. No. 18/620,808, all pages. (Year: 2024).*
(Continued)

*Primary Examiner* — Fernando Hidalgo
(74) *Attorney, Agent, or Firm* — MUGHAL GAUDRY & FRANKLIN PC

(57) ABSTRACT

A method of fabricating a device includes forming a multi-layer stack comprising a plurality of electrode layers and a first dielectric layer comprising a non-linear polar material. The method further comprises forming a second dielectric layer on the multi-layer stack, annealing the multi-layer stack, and forming a transistor above a second substrate. A third dielectric layer is formed above the transistor. The second dielectric layer can be bonded with the third dielectric layer and the multi-layer stack can be etched to form a capacitor and a plate electrode connected with the capacitor. An electrode structure can be formed, where at least a portion of the electrode structure extends through the plate electrode and couples with a terminal of the transistor.

20 Claims, 63 Drawing Sheets

(51) Int. Cl.
*H10B 53/20* (2023.01)
*H10B 53/40* (2023.01)

(58) Field of Classification Search
USPC .......................................................... 365/145
See application file for complete search history.

(56) References Cited

U.S. PATENT DOCUMENTS

| | | | | |
|---|---|---|---|---|
| 9,460,991 | B1 | 10/2016 | Or-Bach et al. | |
| 9,831,156 | B2 | 11/2017 | Lin | |
| 12,563,737 | B1 * | 2/2026 | Guha | H10B 51/20 |
| 2023/0171966 | A1 | 6/2023 | Chang et al. | |

OTHER PUBLICATIONS

Kasper Reck et al., Fusion bonding of silicon nitride surfaces, Journal of Micromechanics and Microengineering, Nov. 22, 2011, 6 pages, vol. 21, DOI 10.1088/0960-1317/21/12/125015.
Kinam Kim et al., Future Memory Technology and Ferroelectric Memory as an Ultimate Memory Solution, Aug. 23, 2011, 42 pages, IntechOpen, DOI: 10.5772/18550.
Samuel K. Moore, Hybrid Bonding Plays Starring Role in 3D Chips: Tech makes millions of connections in a square millimeter of silicon, IEEE Spectrum, Jun. 4, 2024, 13 pages.

* cited by examiner

120
A'
A
112B
112C
120D
120E
112A
114
116
A-A'
120C
112B
112B
120
112
A-A'
120C
112D
127
120C
112
120C
112B
127
112D
Z
X
Y
112A
123
114B
112C
114
125
114A
121
112

Z X

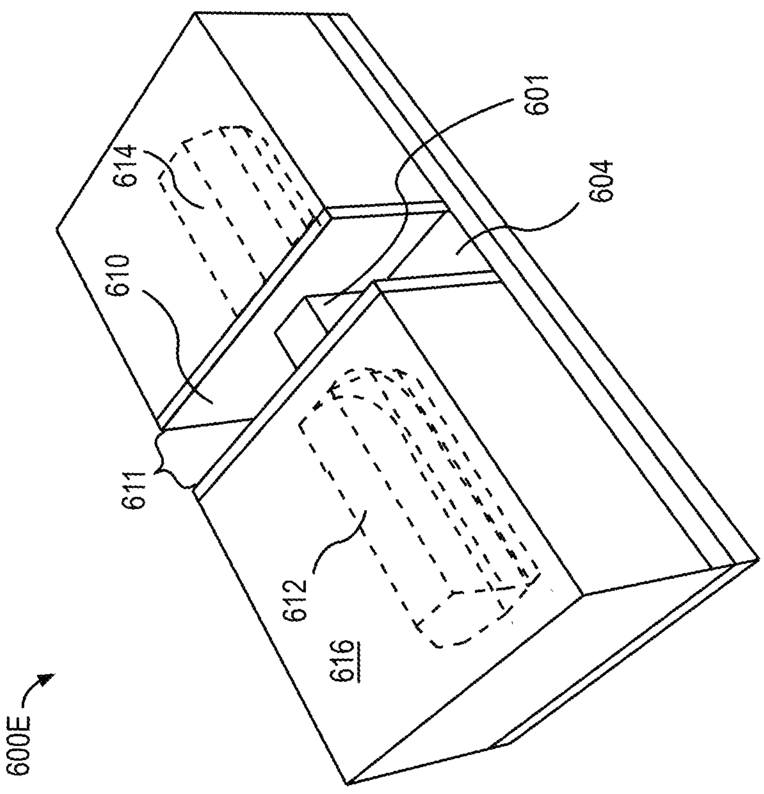
FIG. 6E
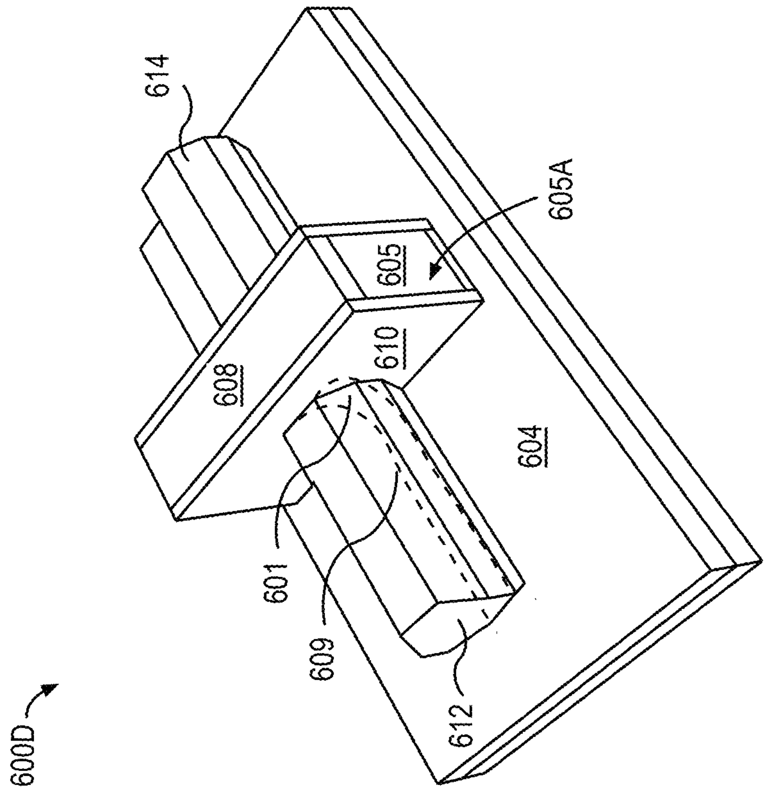
FIG. 6D
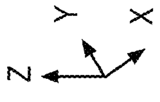

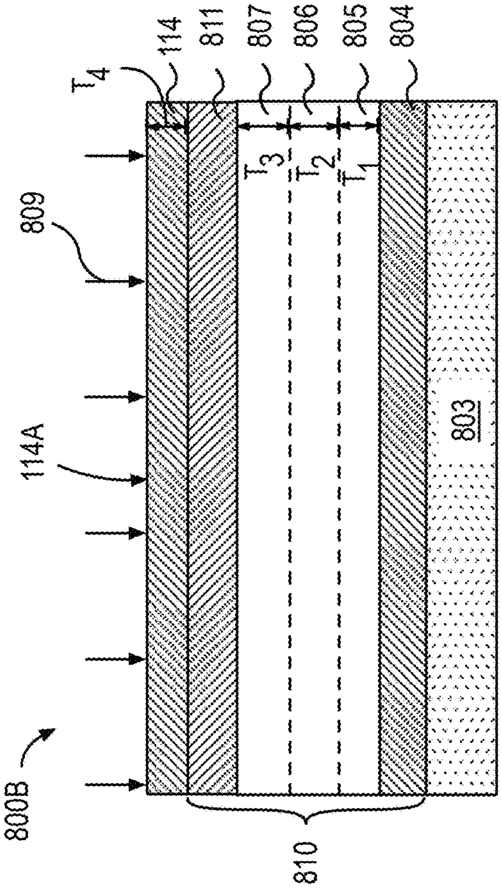
FIG. 8B
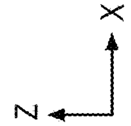
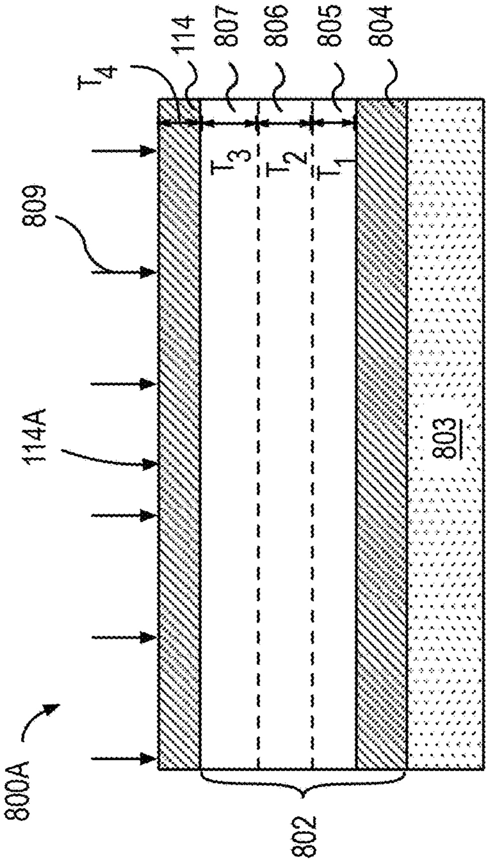
FIG. 8A
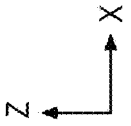
T4
114
811
807
806
805
804
809
114A
T3
T2
T1
803
800B
810
X
Z
T4
114
807
806
805
804
809
114A
T3
T2
T1
803
800A
802
X
Z

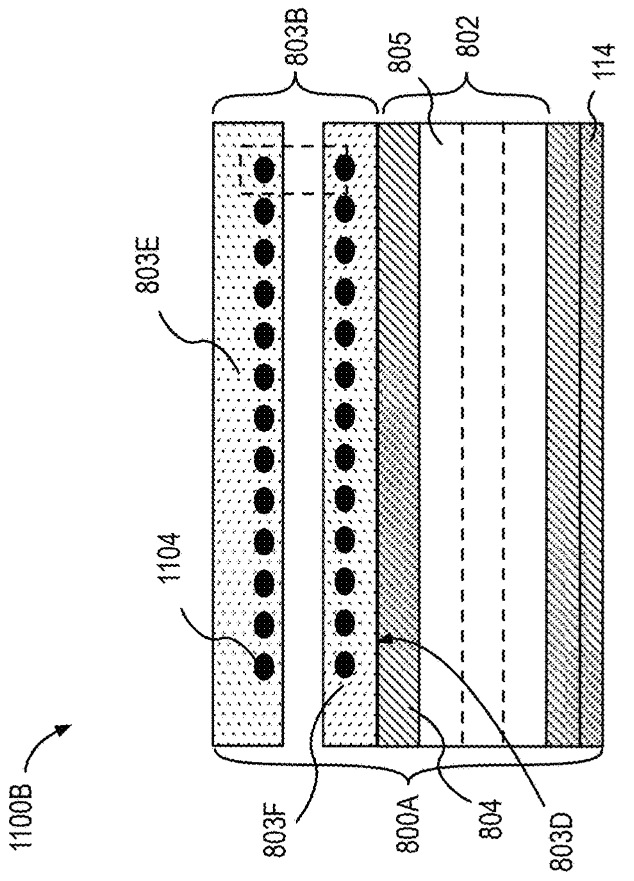
FIG. 11B
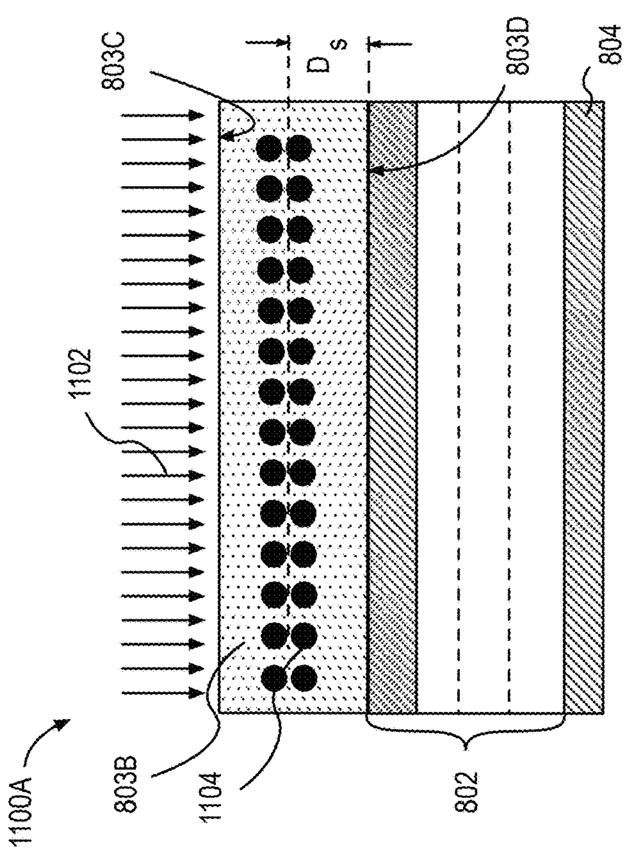
FIG. 11A
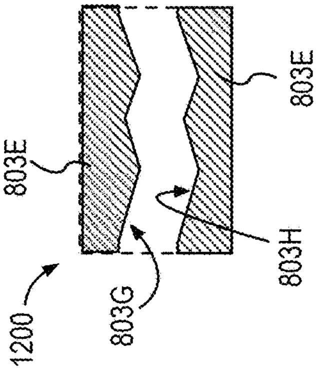
FIG. 12
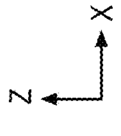

1300A
803
803A
803B
1302
804
805
114
$T_{SUB}$
1300B
1102
803D
$D_{S2}$
1104
803B
1300C
803E
803B
803D
803F
$T_2$
1300D
803G
803F
804
1302
Z
X

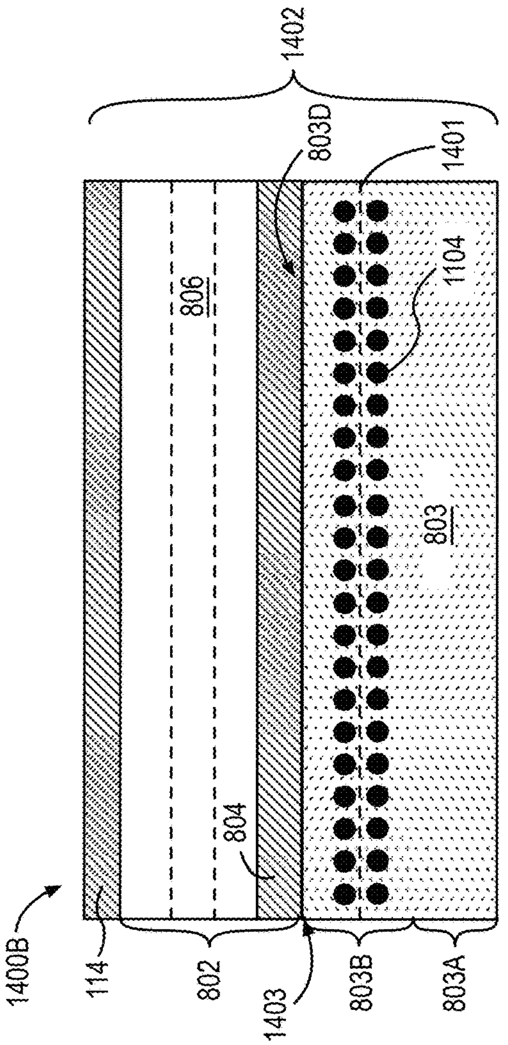
FIG. 14B
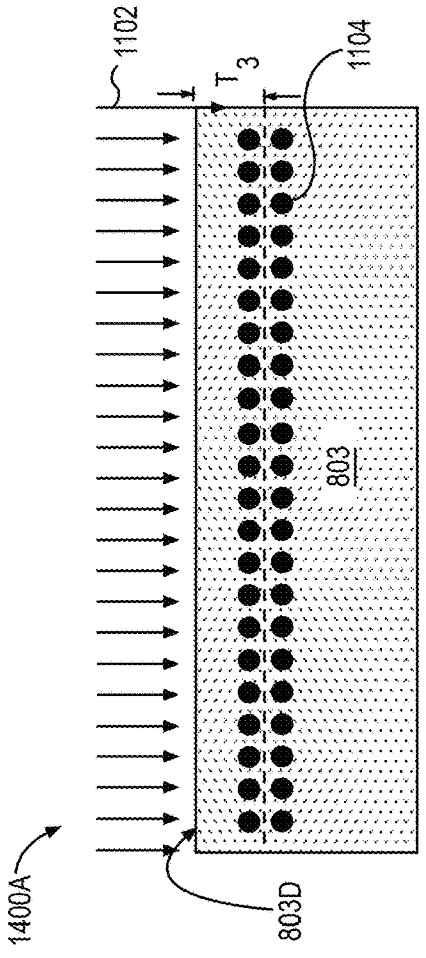
FIG. 14A
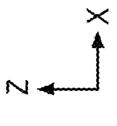

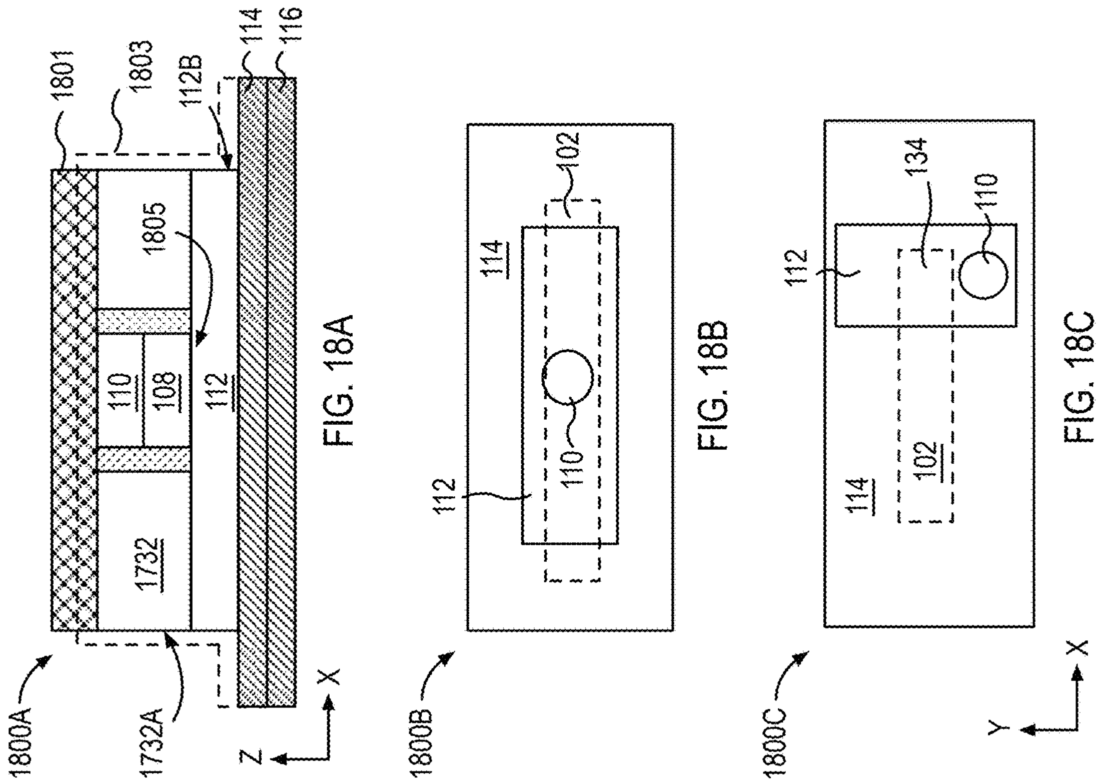
FIG. 18A
FIG. 18B
FIG. 18C
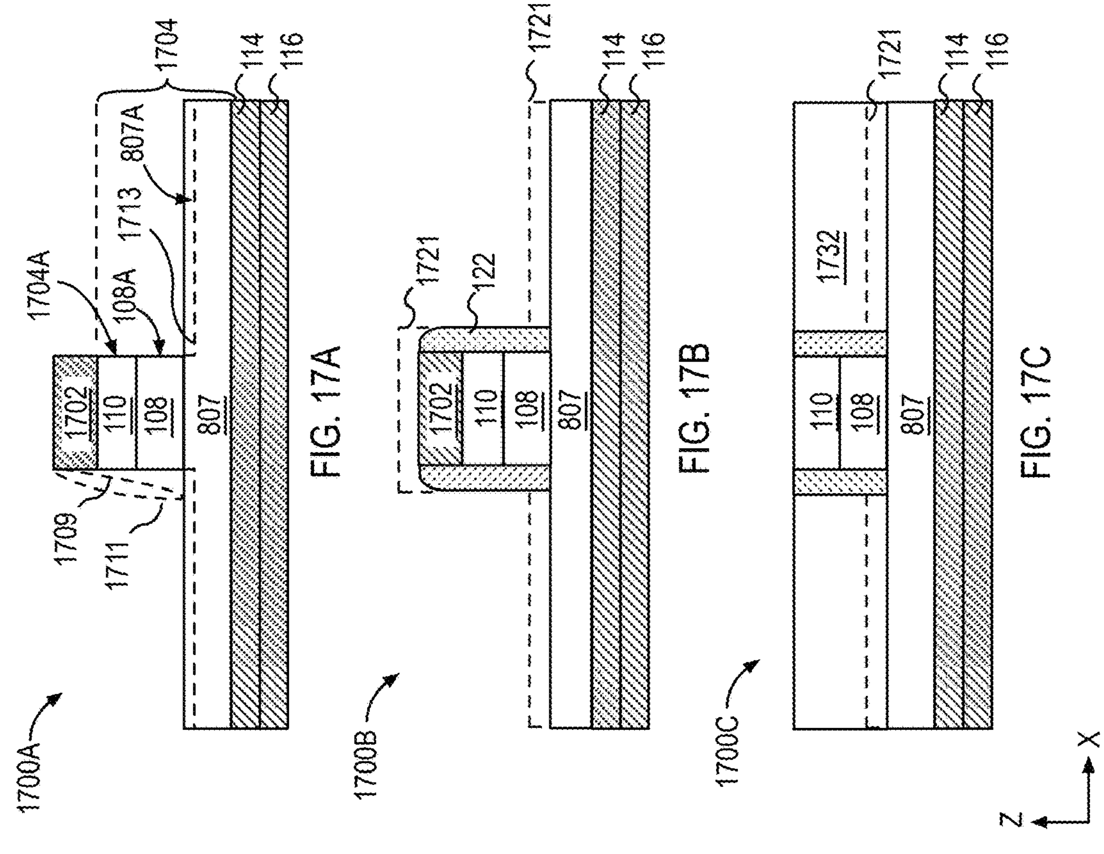
FIG. 17A
FIG. 17B
FIG. 17C
1800A
1801
1803
112B
114
116
1805
110
108
112
1732
1732A
Z
X
1800B
114
102
112
110
1800C
112
134
110
114
102
Y
X
1700A
1704A
108A
1713
807A
1704
114
116
1702
110
108
807
1709
1711
1700B
1721
122
1702
110
108
807
114
116
1700C
1721
114
116
1732
110
108
807
Z
X

Z X 1900B
1903
1901
1901A
1901B
1901C
1905
114
116
1902
1732
110
108
112
702
616
126
142
132
134
602
102
1900A
1721
X
Z 2000A
2003
2001
2001A
2001B
114
116
$W_O$
$W_T$
2005
112C
112B
1902
1732
110
108
112
$T_3$
702
616
126
142
132
134
602
102
1900C
1902A
120
120D
124
125
120F
Z
X 2000C
125
124
114
116
2002
112B
110
108
112
126
134
602
1732
702
616
132
142
1902
102

2000B
2001A
2001B
2001C
2001
122
1902

Z
X 2700A
800A
2701
W MD
2701A
S MD
2701B
S M
2701C
2701D
804
805
806
807
114
116
702
616
132
142
126
134
102

2700B
2702
807A
2702A
2702E
2702B
2702C
2702D
1702
110
108
807
2705
2707

Z
X

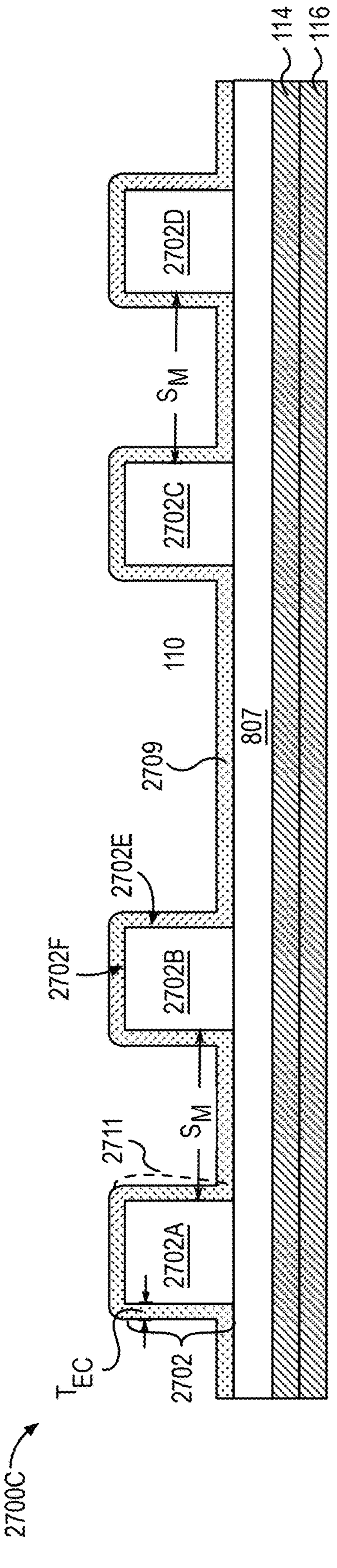
FIG. 27C
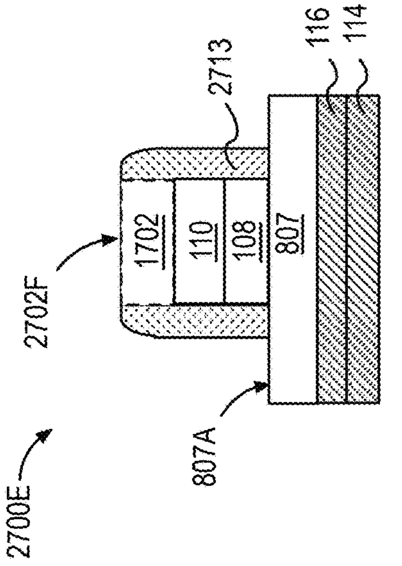
FIG. 27E
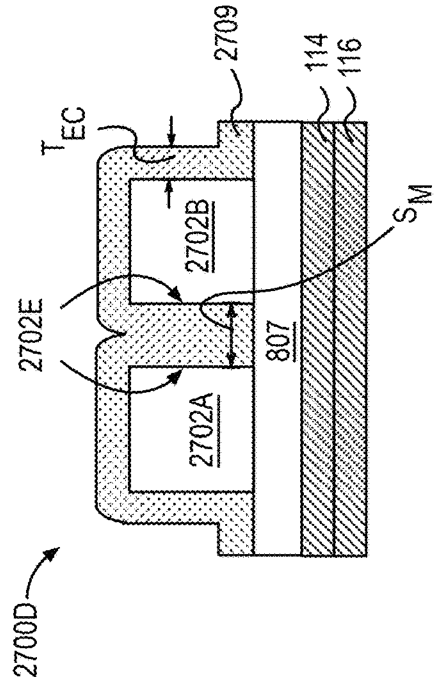
FIG. 27D
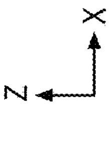

2803
2811
114
116
2802D
2802C
2804
112
2709
2802B
110
108
2802A
2801
2802
2800A 2807
2806
2805D
2805C
2805B
110A
2809
2805A
2702A
2800B

X
Z 2800C
2805A
2802
110A 2805B
2819
2815
2817
2813
2805C
2805D
2806
114
116
2804
112
2802A
2802B
2802C
2802D
2800D
2820
2824
2821
2822
2702F
2709

Z
X 2900A
2906
116
2902
146
142
126
140
408
406
702
616
402B
132
134
602
2905
404
402A 2900B
800A
804
805
806
807
314
$T_4$
$T_3$
$T_2$
$T_1$
2907D
2907C
2907B
2907A
2907
$S_{MD}$
2900A

Z
X 3200A
3202
804
807
806
805
3201
803

3200B
3201
803
3201A
3104B
3104A
3204C
3204B
3204A
112
110
1702
108

3200C
3201
3201A
3104B
3104A
3204B
3204C
3204D
1702
3206
3204A

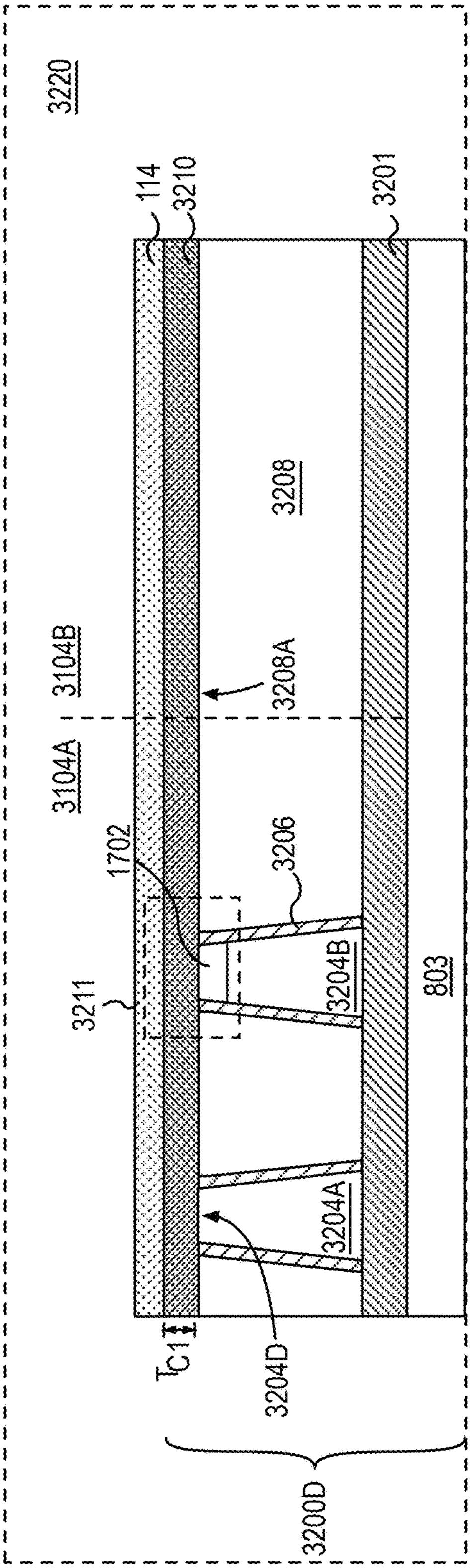
FIG. 32D
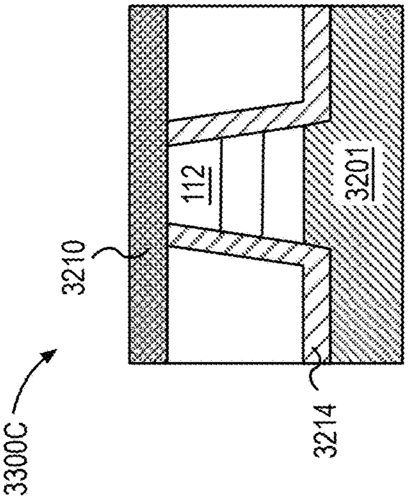
FIG. 33C
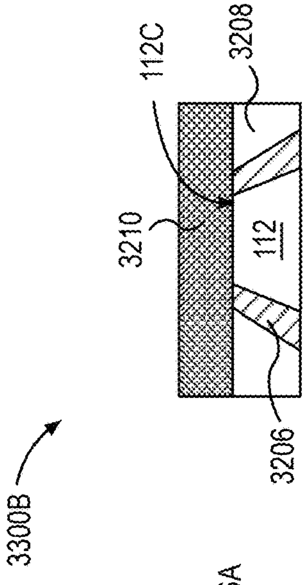
FIG. 33B
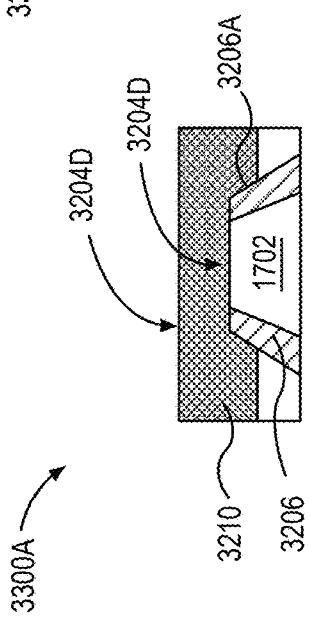
FIG. 33A
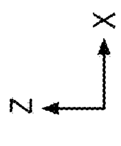

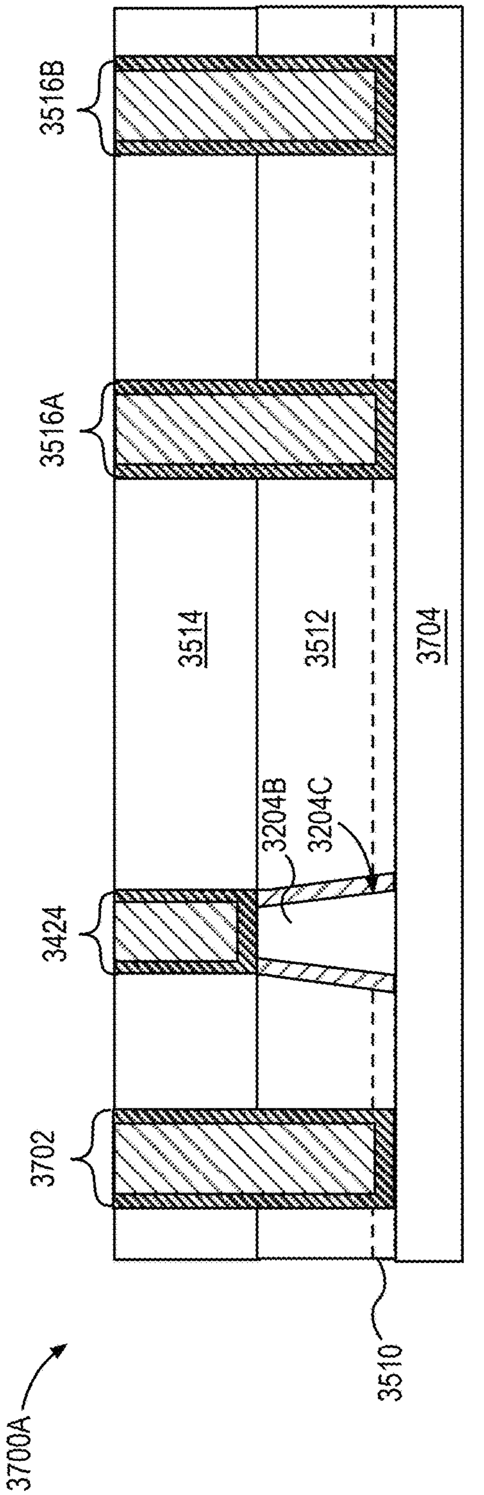
FIG. 37A
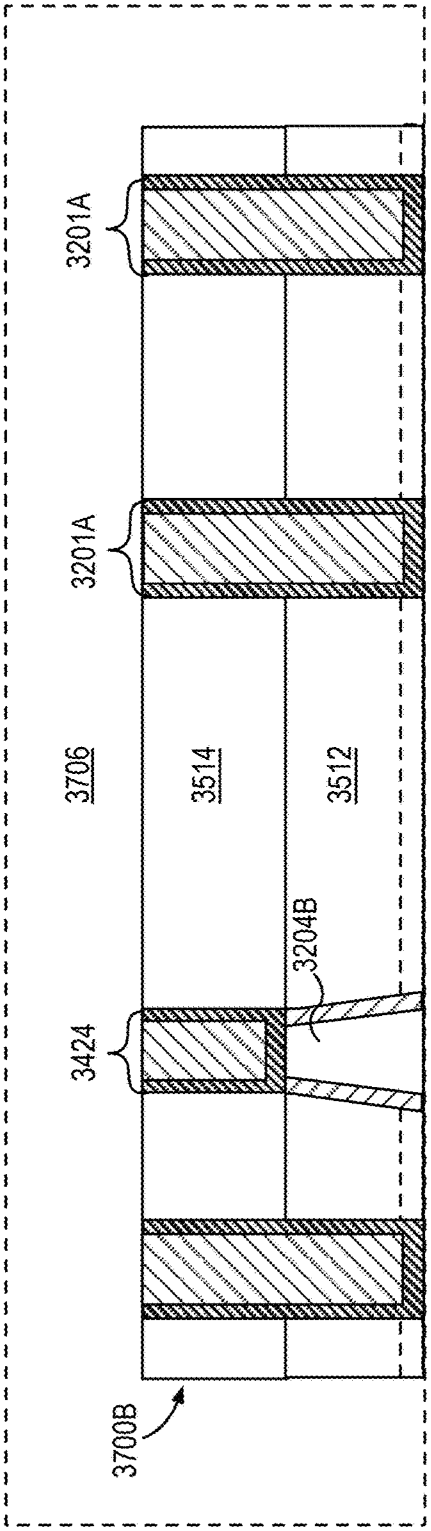
FIG. 37B
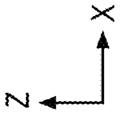

METHOD OF FABRICATING A MEMORY DEVICE BY WAFER BONDING

CLAIM FOR PRIORITY

This application claims priority to U.S. Non-Provisional patent application Ser. No. 18/620,808, filed on Mar. 28, 2024, titled "MEMORY DEVICE FABRICATION THROUGH WAFER BONDING," which is incorporated by reference in its entirety for all purposes.

BACKGROUND

Integration of capacitors including ferroelectric or paraelectric materials and logic devices on a same substrate can be challenging. As such, alternate methods to form structures that can couple capacitors with logic transistors are desirable to increase charge storage and facilitate operation of memory and logic devices based on capacitors.

BRIEF DESCRIPTION OF DRAWINGS

Material described herein is illustrated by way of example and not by way of limitation in accompanying figures. For simplicity and clarity of illustration, elements illustrated in figures are not necessarily drawn to scale. For example, dimensions of some elements may be exaggerated relative to other elements for clarity. Also, various physical features may be represented in their simplified "ideal" forms and geometries for clarity of discussion, but it is nevertheless to be understood that practical implementations may approximate illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among figures to indicate corresponding or analogous elements.

FIG. 6D is an isometric illustration of the structure in FIG. 6C following process to form an epitaxial source structure and an epitaxial drain structure, in at least one example.

FIG. 6E is an isometric illustration of the structure in FIG. 6D following process to remove mask, dummy gate, and dummy gate dielectric to form a gate opening, in at least one example.

FIG. 8A illustrates a cross-section of wafer that includes a multi-layer stack formed on a first substrate, followed by formation of dielectric layer on multi-layer stack, in at least one example.

FIG. 8B illustrates a cross-section of wafer that includes a multi-layer stack formed on a first substrate, followed by formation of dielectric layer on multi-layer stack, in at least one example.

FIG. 11A illustrates a cross-section of the structure in FIG. 10B following process to perform ion implantation into portion of the first substrate, in at least one example.

FIG. 11B illustrates a cross-section of the structure in FIG. 11A following process to following process to split portion of the first substrate, in at least one example.

FIG. 12 illustrates an enhanced cross-section of a portion of the structure in FIG. 11B showing lattice dislocations spread over a small thickness in a z-direction, in at least one example.

FIG. 14A illustrates a cross-section of a structure undergoing a process of ion implantation, in at least one example.

FIG. 14B illustrates a cross-section of the structure in FIG. 14A following process to deposit a multi-layer stack on a substrate, in at least one example.

FIG. 17A illustrates a cross-section of the structure in FIG. 16 following process to etch the multi-layer stack and form a partial capacitor structure, in at least one example.

FIG. 17B illustrates a cross-section of the structure in FIG. 17A following process to form spacer adjacent to sidewall of the partial capacitor structure, in at least one example.

FIG. 17C illustrates a cross-section of the structure in FIG. 17A following process to form a dielectric adjacent to spacer, in at least one example.

FIG. 18A illustrates a cross-section of the structure in FIG. 17C following process to etch dielectric and a conductive layer to form bottom electrode, in at least one example.

FIG. 18B is a plan view illustration of structure in FIG. 18A, in at least one example.

FIG. 18C is a plan view illustration of structure in FIG. 18A, in at least one example.

FIG. 27C illustrates a cross-section of structure process to form encapsulation layer on partial capacitor structures, in at least one example.

FIG. 27D illustrates a cross-section of a portion of structure in FIG. 27C where encapsulation layer formed on partial capacitor structures merge, in at least one example.

FIG. 27E illustrates a cross-section of a portion of structure in FIG. 27C where the encapsulation layer is etched to form a spacer, in at least one example.

FIG. 32D illustrates a cross-section of structure in FIG. 32C following process to deposit dielectric on sidewalls of spacer, in at least one example.

FIG. 33A illustrates a cross-section of portion of the structure in FIG. 32D, in at least one example.

FIG. 33B illustrates a cross-section of portion of the structure in FIG. 32D, in at least one example.

FIG. 33C illustrates a cross-section of portion of the structure in FIG. 32D, where encapsulation layer is formed below a lowermost level of the capacitor, in at least one example.

FIG. 37A illustrates a cross-section of structure where a capacitor formed above a first substrate, in at least one example.

FIG. 37B illustrates a cross-section of structure following removal of the first substrate to expose a lowermost surface of the capacitor, in at least one example.

FIG. 44B illustrates a 1TnC bit-cell comprising non-linear polar material for its capacitors, where plate-lines are parallel to word-line, in accordance with at least one example.

FIG. 45A illustrates a multi-element FE gain bit-cell with plate-lines parallel to bit-line, in accordance with at least one example.

FIG. 45B illustrates a multi-element FE gain bit-cell with plate-lines parallel to word-line, in accordance with at least one example.

FIG. 46 illustrates a multi-element FE gain bit-cell with plate-line switches, in accordance with at least one example.

DETAILED DESCRIPTION

Figure 1A:
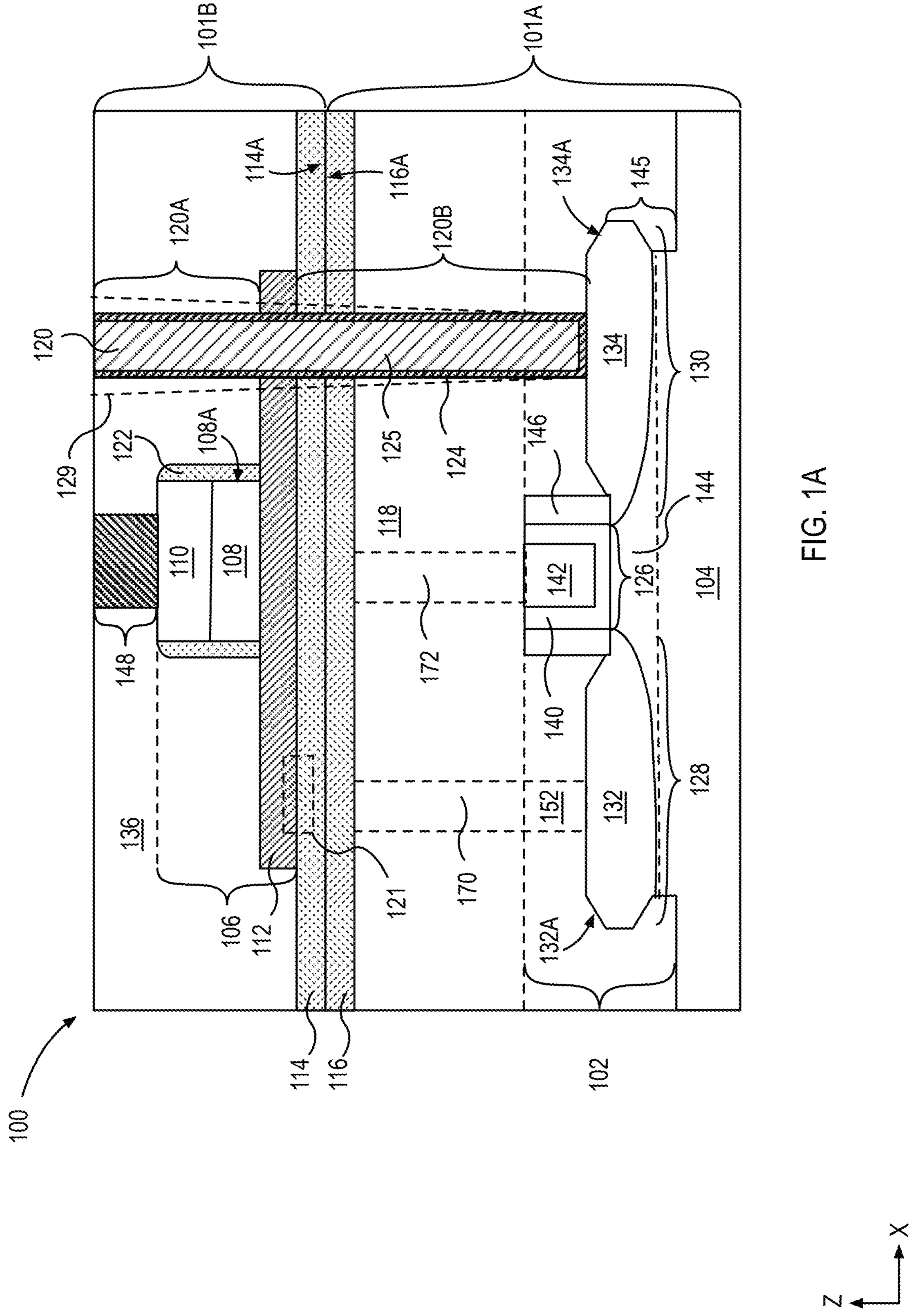
FIG. 1A illustrates a cross-section of a device structure including a memory device of a first substrate coupled with a transistor of a second substrate, in at least one example.

At least one example describes capacitors integrated with transistors. While at least one example is described with reference to FeRAM, paraelectric RAM, or antiferroelectric-RAM capacitive structures formed herein can be used for any application where a capacitor is desired. In at least one example, capacitive structure can be used for fabricating ferroelectric based or paraelectric based majority gate, minority gate, and/or threshold gate. Here, numerous specific details are set forth, such as structural schemes and detailed fabrication methods to provide a thorough understanding of examples of present disclosure. It will be apparent to one skilled in art that examples of present disclosure may be practiced without these specific details. In other instances, well-known features, such as process equipment and device operations, are described in lesser detail to not unnecessarily obscure examples of present disclosure. Furthermore, it is to be understood that examples shown in Figures are illustrative representations and are not necessarily drawn to scale.

In some instances, well-known methods and devices are shown in block diagram form, rather than in detail, to avoid obscuring at least one example. Reference throughout this specification to "an example," "one example," "in at least one example," or "some examples" means that a particular feature, structure, function, or characteristic described in connection with example is included in at least one example. Thus, appearances of phrase "in an example," "in at least one example," or "in one example" or "some examples" in various places throughout this specification are not necessarily referring to same example of disclosure. Furthermore, particular features, structures, functions, or characteristics may be combined in any suitable manner in one or more examples. For example, a first example may be combined with a second example anywhere particular features, structures, functions, or characteristics associated with two examples are not mutually exclusive.

As used in herein, singular forms "a," "an," and "the" are intended to include plural forms as well, unless context clearly indicates otherwise. It will also be understood that term "and/or" as used herein refers to and encompasses all possible combinations of one or more of associated listed items.

Here, "coupled" and "connected," along with their derivatives, may be used herein to describe functional or structural relationships between components. These terms are not intended as synonyms for each other. Rather, in particular examples, "connected" may be used to indicate that two or more elements are in direct physical, optical, or electrical contact with each other. "Coupled" may be used to indicated that two or more elements are in either direct or indirect (with other intervening elements between them) physical, electrical, or in magnetic contact with each other, and/or that two or more elements co-operate or interact with each other (e.g., as in a cause an effect relationship).

Here, "over," "under," "between," and "on" as used herein refer to a relative position of one component or material with respect to other components or materials where such physical relationships are noteworthy. For example, in context of materials, one material or material disposed over or under another may be directly in contact or may have one or more intervening materials. Moreover, one material disposed between two materials may be directly in contact with two layers or may have one or more intervening layers. In contrast, a first material "on" a second material is in direct contact with that second material/material. Similar distinctions are to be made in context of component assemblies. As used throughout this description, and in claims, a list of items joined by term "at least one of" or "one or more of" can mean any combination of listed terms.

Here, "adjacent" generally refers to a position of a thing being next to (e.g., immediately next to or close to with one or more things between them) or adjoining another thing (e.g., abutting it).

Here, "signal" may refer to current signal, voltage signal, magnetic signal, or data/clock signal.

Here, "device" may generally refer to an apparatus according to context of usage of that term. For example, a device may refer to a stack of layers or structures, a single structure or layer, a connection of various structures having active and/or passive elements, etc. Generally, a device is a three-dimensional structure with a plane along x-y direction and a height along z direction of an x-y-z Cartesian coordinate system. In at least one example, plane of device may also be plane of an apparatus which comprises device.

Unless otherwise specified in explicit context of their use, terms "substantially equal," "about equal," and "approximately equal" mean that there is no more than incidental variation between two things so described. Such variation is typically no more than +/−10% of a predetermined target value.

Here, "left," "right," "front," "back," "top," "bottom," "over," "under," and similar terms are used for descriptive purposes and not necessarily for describing permanent relative positions. For example, terms "over," "under," "front side," "back side," "top," "bottom," "over," "under," and "on" as used herein refer to a relative position of one component, structure, or material with respect to other referenced components, structures, or materials within a device, where such physical relationships are noteworthy. These terms are employed herein for descriptive purposes only and predominantly within context of a device z-axis and therefore may be relative to an orientation of a device. Hence, a first material "over" a second material in context of a figure provided herein may also be "under" second material if device is oriented upside-down relative to context of figure provided. Similar distinctions are to be made in context of component assemblies.

Here, "between" may be employed in context of z-axis, x-axis, or y-axis of a device. A material that is between two other materials may be in contact with one or both of those materials. In another example, a material that is between two or other material may be separated from both of other two materials by one or more intervening materials. A material "between" two other materials may therefore be in contact with either of other two materials. In another example, a material "between" two other materials may be coupled to other two materials through an intervening material. A device that is between two other devices may be directly connected to one or both of those devices. In another example, a device that is between two other devices may be separated from both of other two devices by one or more intervening devices.

Memory (random-access memory or RAM) devices based on capacitive technology (capacitors) that include a wide variety of dielectric materials have been implemented for high density storage. The term "capacitor(s) may be used interchangeably herein with the term "memory device(s)." In at least one example, one class of capacitors including perovskite materials have been implemented in capacitors for high density memory applications owing to their low power consumption and high on/off ratio. Perovskite based capacitors may be useful over other forms of memory, such as magnetic tunnel junction (MTJ)-based devices, due to relatively low number of layers within perovskite-based capacitors compared to MTJ-based devices. A typical perovskite-based capacitor may be fully operational with at least three layers, where at least one dielectric is contained between two electrode layers. Electrode layers may also include perovskite materials to enable lattice matching with the dielectric and to reduce electrical resistance of perovskite-based capacitors. Implementation of lead-free perovskite materials may offer additional environmental benefits without sacrificing device performance. In at least one example, the capacitor includes a non-linear polar material of which perovskite is one example. Non-linear polar material may include paraelectric, ferroelectric, anti-ferroelectric, or relaxor ferroelectric materials.

In at least one example, deposition process utilized to form a multi-layer stack for fabricating capacitors can be performed at high temperatures to achieve desired crystallinity. In at least one example, temperatures greater than 450 degrees Celsius can be considered high. In at least one example, the multi-layer stack includes at least three layers to form a capacitor, a non-linear polar material between two conductive layers. In at least one example, where capacitors are integrated with transistors, capacitors can be formed after fabrication of transistors, and at a level above transistors. In at least one example, temperatures utilized to deposit multi-layer stack is greater than temperature tolerances in fabrication of transistors. In at least one example, thermal anneal may be performed post stack deposition to obtain crystallinity of one or more layers. Annealing may be beneficial to device operation and may be carried out at temperatures that exceed 1100 degrees. In at least one such example, transistors can suffer from thermal degradation if a multi-layer stack is deposited above a transistor on a same substrate.

In at least one example, to prevent transistor degradation, a multi-layer stack may be formed on a first substrate and annealed to high temperatures, and transistors may be formed on or above a second distinct substrate. In at least one example, high temperatures (such as temperatures between at least 450 and 700 degrees Celsius) may be utilized for depositing and annealing multi-layer stack formed on the first substrate without affecting transistors formed on or above the second substrate.

In at least one example, the first and the second substrates may be bonded together. In at least one example, uppermost layers of the two substrates include insulator materials and can be appropriately prepared for bonding two insulator layers. Bonding blanket insulator layers on two different substrates can be relatively straight forward as nanometer level alignment may not be imposed during the bonding process. Bonding of blanket insulator layers herein refers to bonding of insulator layers that are not patterned into a structure. In at least one example, each insulator layer can include a same or substantially the same material, such as silicon dioxide or silicon nitride.

After the bonding process the multi-layer stack may be patterned to form one or more capacitors. In at least one example, the capacitor includes three layers, for example a dielectric layer between two electrode layers. In at least one example, an upper electrode layer and the dielectric layer may be patterned into a shape of a capacitor and a lower electrode layer may be patterned at a later operation to form a plate electrode. Here the term "upper electrode and lower electrode" may be defined relative to orientation at patterning. For example, the upper electrode is above the lower electrode when it is first patterned. Here, the term "plate electrode" may refer to a structure that has a larger footprint or a plan view cross section than the dielectric layer and the upper electrode. In at least one such example, sidewalls of the plate electrode extend beyond a perimeter of the dielectric layer. In at least one example, the plate electrode extends laterally over at least a portion above a terminal of a transistor below. In at least one example, when the capacitor includes three layers, combinedly the upper electrode, the dielectric layer and the plate electrode form a capacitor.

In at least one example, to provide electrical conductivity between capacitor and transistors, a via may be formed after formation of the capacitor. The via may extend from above the plate electrode down to a terminal of the transistor. In at least one example, the via can extend through at least a portion of the plate electrode, such as, through an edge region of the plate electrode. In at least one example, a via that extends through at least a portion of the plate electrode may be referred to as a "through via." In at least one example, the through via extends through a region within a perimeter of the plate electrode. In at least one example, the via can be in contact with the plate electrode, such as on a top surface and on a sidewall, but not extend through the plate electrode. Here the term "through via" may be used more generally to refer to a single conductive structure that extends orthogonally to the plate electrode and couples the plate electrode with the terminal of the transistor. In at least one example, the through via may not necessarily go through any portion of the plate electrode but may be tangentially in contact with a sidewall of the plate electrode. In at least one example, the through via may be in contact with on a portion of a top surface of the plate electrode and also be in contact with a sidewall of the plate electrode but not extend through any portion of the plate electrode.

In at least one example, the via can be coupled with a source or a drain region of the transistor. Forming the via, to couple the capacitor with the transistor after the bonding process can provide added integration process flexibility. In at least one example, coupling a prefabricated via electrode coupled with a transistor to a capacitor can be challenging for bonding. For example, the via can be surrounded by an insulator, and bonding process would include bonding between a via and an insulator on a first substrate with a blanket metal or a blanket insulator on a second substrate. Forming the via after the bonding process can remove a need to perform hybrid bonding.

In at least one example, the multi-layer stack described above can include more than three layers, for example, a conductive layer above and below the multi-layer stack. Such additional layers can be implemented as hardmask for etching, templating during deposition, or to provide a diffusion barrier during fabrication. In at least one example, the plate electrode is an additional conductive layer below the bottom electrode. In either example, after bonding, the multi-layer stack can be patterned to form a capacitor including at least a top electrode, a non-linear polar material, and a bottom electrode. Additionally, a conductive layer below the bottom electrode can be patterned into a plate electrode. In at least one example, the conductive layer implemented to form a plate electrode (distinct from the bottom electrode) may have an arbitrary thickness and may include materials that may be easier to pattern than a material of the bottom electrode.

In at least one example, patterning multi-layer stack to fabricate a capacitor can roughen and damage sidewalls of the capacitor causing charge leakage and memory loss during operation. In at least one example, annealing a capacitor can be useful. In at least one example, annealing temperatures can exceed 1100 degrees Celsius depending on materials within multi-layer stack and annealing methods utilized. In at least one such example, multi-layer stack can be patterned into a capacitor prior to bonding with second substrate to avoid subjecting transistor to temperatures above approximately 600 degrees Celsius. In at least one example, the multi-layer stack is formed above an insulator layer. In at least one example, forming a capacitor prior to bonding can be useful because thickness of the insulator layer under multi-layer stack can be arbitrary and provide over etch margin. In at least one example, the insulator layer can be removed prior to the bonding process. In at least one example, when a capacitor, on a first substrate, is bonded to one or more transistors on a second substrate, bonding can constitute hybrid bonding where more than two different layers are bonded together.

In at least one example, capacitors may be integrated with transistors in a first region of a substrate. In some examples, first region may be a memory region and a second region may be a logic region. In at least one example, capacitors can be ferroelectric capacitors formed, in a memory level, above one or more transistors, in a transistor level, within memory region. In at least one example, there can be one or more layers of conductive interconnects between capacitors and one or more transistors.

To facilitate individual programing of capacitors while connecting to a single transistor, an architecture such as cross point memory has been used elsewhere. In at least one example, cell size in cross point memory is dependent on size of transistors and increase in device density can drive shrinking of transistor size. In at least one example, it is useful to simultaneously couple multiple capacitors in a memory level with a single transistor directly below. In at least one example, coupling two or more capacitors on a single plane with a single transistor below can present challenges. In at least one example, immediate vicinity of transistor is often replete with interconnect circuitry comprising intersecting lines that present tight spaces to route multiple lines to individual capacitors above.

In at least one example, challenge of tight spaces may be overcome by implementing a device structure where two or more capacitors are coupled by a plate electrode. In at least one example, two or more capacitors may be coupled through plate electrode to one or more transistors below. In at least one example, fabricating plate electrode at a level directly below two or more capacitors may offer additional flexibility. In at least one example, shape and size of plate electrode can be determined just before or after fabricating capacitors. In at least one example, shape and size of plate electrode can also be adjusted by number of capacitors to be coupled and an arrangement of capacitors. In at least one example, depending on where the source or drain region of a transistor is located, a single through via can be positioned between adjacent capacitors or in a vicinity of an end of the plate electrode. In at least one example, to increase total number of programmable capacitors, the device structure can include multiple levels, where each level includes a plate electrode and a plurality of capacitors. In at least one example, to route signal between plate electrodes on different levels, device structure may include a through via that extend vertically between the plate electrodes that are on two different levels. Lateral position of the through via may be determined by geometrical and electrical considerations. In at least one example, multiple through vias can be positioned between plate electrodes to reduce electrical resistance. In at least one such example, one through via of the multiple through vias is coupled with a transistor below.

In at least one example, a first multi-layer stack can be deposited on a first substrate, and a second multi-layer stack can be deposited on a second substrate. In at least one example, the first substrate can be bonded with a third substrate including transistors, and first multi-layer stack can be patterned into a first level comprising a first one or more capacitors and a first plate electrode. A respective contact electrode can be formed on the one or more capacitors. In at least one example, an insulator layer can be formed above the respective contact electrode. In at least one example, the second substrate can be bonded to the insulator layer. The second multi-layer stack can be patterned into a second level comprising a second one or more capacitors and a second plate electrode. In at least one example, a through via can be formed through the second plate electrode and through the first plate electrode and connect with a terminal of a transistor below.

In at least one example, a single transistor may be coupled with plate electrode. In at least one example, two transistors can be simultaneously coupled to plate electrode. In at least one example, plate electrode may extend over both transistors. In at least one such example, a gate contact of one transistor may be coupled with a drain contact of another transistor, where gate and drain contacts are physically connected by a bridge structure. The through via may be coupled with the bridge structure. In at least one example, transistors may be in close proximity, such as side by side and on same horizontal plane to minimize electrical resistance. In at least one example, two transistors can be coupled to as many as 128 capacitors. In at least one example, fewer or more capacitors can be coupled to two transistors than 128 capacitors.

In at least one example, to enable high density FeRAM devices, non-lead-based perovskite materials can be utilized, which are environmentally friendly for mass production. In at least one example, a stack for ferroelectric capacitors can include one or more hardmask materials. In at least one example, one or more hardmask materials can include dielectric materials, metallic materials, or a combination thereof.

In at least one example, FeRAM devices, including lead-free perovskite materials, can be prone to damage from reaction with hydrogen during processing. Specifically, damage may be a result of hydrogen atoms traveling along grain boundaries between or along electrodes coupled with two terminals of a FeRAM device. In at least one example, hydrogen can cause reduction when it reacts with one or more materials of FeRAM device, such as electrodes or ferroelectric material itself. In at least one example, FeRAM devices can lose their polarization hysteresis characteristics as a result of hydrogen reduction. During fabrication, sources of hydrogen may be present during anneal operations carried out to eliminate dangling bonds. In at least one example, such sources may be unavoidable.

In at least one example, FeRAM devices have a planar structure where individual layers are sequentially layered one on top of another and patterned into cylindrical (circular or elliptical) or rectangular shapes. In at least one example, it is useful to protect sidewalls, top, and bottom surfaces of a FeRAM device from reacting with hydrogen. In at least one example, solutions against hydrogen diffusion include forming an encapsulation layer that includes an insulating material, such as, silicon nitride to protect sidewalls and top surfaces of the FeRAM device. In at least one example, encapsulation layer can provide protection against hydrogen and oxygen diffusion into different layers of the FeRAM device. In at least one example, contact or via electrode may be formed at a top portion of the FeRAM device by piercing through insulating barrier layer and exposing one or more top electrode materials. In at least one example, barrier layer itself may be further surrounded by additional insulating material such as an interlayer dielectric (ILD). ILD materials such as silicon oxide or silicon oxide doped with carbon in general may not act as a hydrogen diffusion barrier and are less useful when in contact with one or more layers of FeRAM device.

In other examples, hydrogen may diffuse through one or more materials of contact electrode towards FeRAM device stack through a top electrode. To protect against hydrogen diffusion through a top surface of top electrode, noble metals have been implemented as part of contact electrode structure. In at least one example, noble metals can have crystalline structures due to strong metallic bonding, and also because their amorphous phase may be thermodynamically unstable and favoring transformation into a crystalline phase.

In at least one example, hydrogen can also diffuse from layers below a bottom electrode of ReRAM device. In at least one example, bottom electrode is physically separated from an electrode structure by a plate electrode that includes metallic materials described above. In at least one example, electrode structure may be laterally surrounded by an insulator layer that can act as a barrier against hydrogen diffusion. In at least one example, plate electrode may be directly adjacent to an ILD. In at least one example, an interface between plate electrode and bottom electrode can be a pathway for hydrogen diffusion.

To provide a barrier against hydrogen diffusion towards a capacitor, an encapsulation layer can be implemented. In at least one example, encapsulation layer may be formed on sidewalls of capacitor and on surfaces of plate electrode. In at least one example, additional encapsulation can be formed against sidewalls of plate electrode.

FIG. 1A illustrates a cross-section of a device 100, in at least one example. In at least one example, device 100 includes a transistor 102 within a die 101A above a substrate 104. Device 100 further includes a capacitor 106 above a transistor 102, where capacitor 106 includes at least one dielectric, such as a dielectric 108 having a non-linear polar material. In at least one example, dielectric 108 is between an electrode 110 and an electrode 112.

In at least one example, device 100 further includes a dielectric layer 114, where dielectric layer 114 is in contact with an electrode 112. In at least one example, dielectric layer 114 and capacitor 106 are collectively part of a die 101B. In at least one example, device 100 further includes a dielectric layer 116, where dielectric layer 116 is in contact with dielectric layer 114. In at least one example, dielectric layer 116 is part of die 101A. In at least one example, dielectric layer 114 and dielectric layer 116 include a same material. In at least one example, dielectric layer 114 and dielectric layer 116 include a different material. In at least example, dielectric layer 114 includes silicon and one or more of oxygen, nitrogen, or carbon, and dielectric layer 116 includes silicon and one or more of oxygen, nitrogen, or carbon. In at least one example, a surface 114A and a surface 116A are substantially planar, for example having a surface roughness of less than 1 nm. In at least one example, surface 114A and surface 116A are in contact with each other.

Figures 1B, 1C, 1D, 1E, 1F, 1G, 1H:
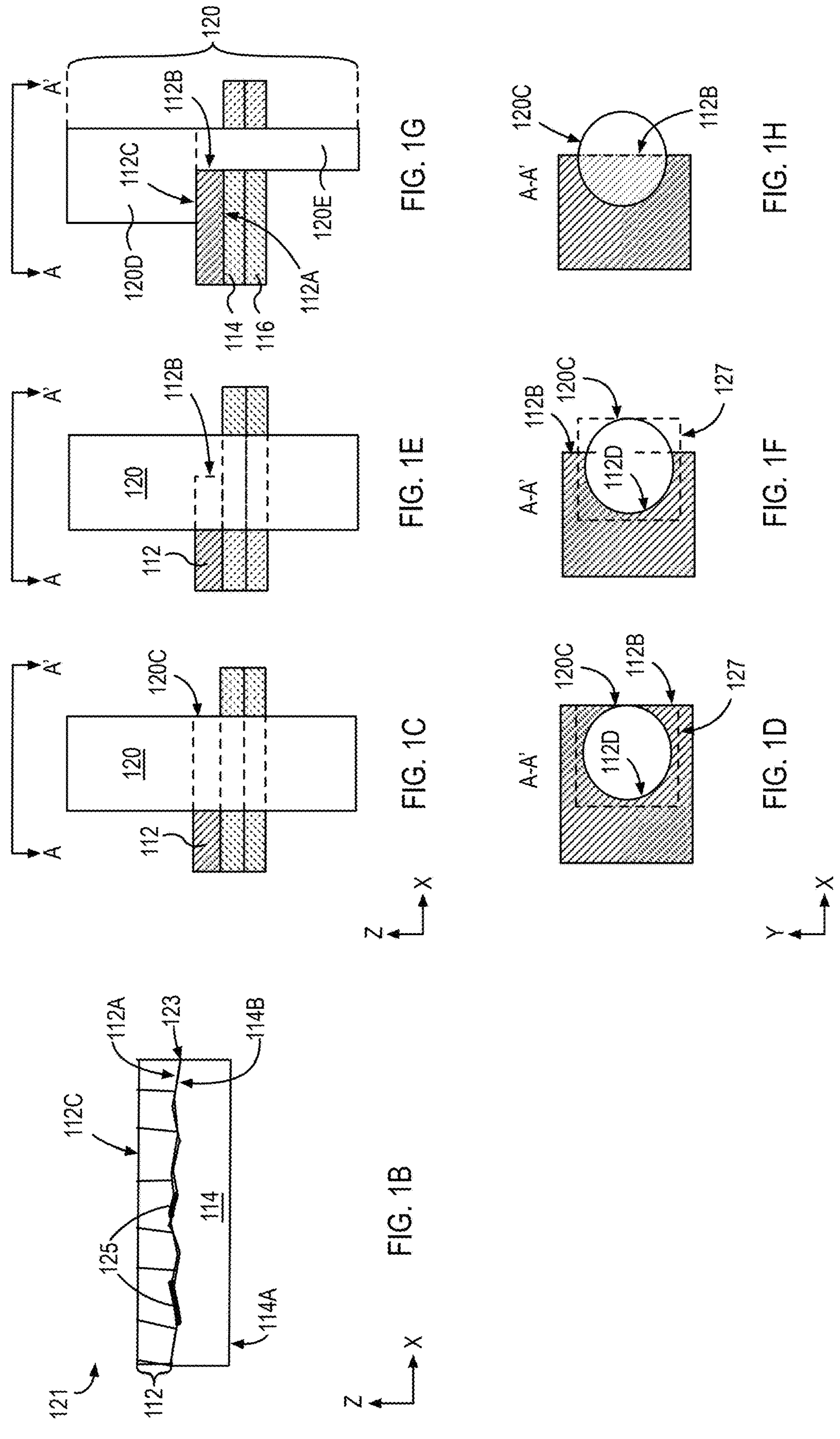
FIG. 1B illustrates an enhanced cross-sectional illustration of a portion of an interface between a dielectric and an electrode, in at least one example.
FIG. 1C illustrates an enhanced cross-sectional illustration of an electrode that extends through an edge region of a bottom electrode of a capacitor, in at least one example.
FIG. 1D is a plan-view illustration of the structure in FIG. 1C through a line A-A'.
FIG. 1E illustrates an enhanced cross-sectional illustration of an electrode that extends through and beyond an edge region of a bottom electrode of a capacitor, in at least one example.
FIG. 1F is a plan-view illustration of the structure in FIG. 1E through line A-A'.
FIG. 1G illustrates an enhanced cross-sectional illustration of an electrode that has a portion that extends below an edge region of a bottom electrode of a capacitor, in at least one example.
FIG. 1H is a plan view illustration of the structure in FIG. 1G through line A-A'.

An enhanced cross-sectional illustration of a portion 121 illustrating an interface 123 between electrode 112 and dielectric layer 114 is illustrated in FIG. 1B. In at least one example, surface 112A of electrode 112 may include surface irregularities due to a granular structure of the material of electrode 112. In at least one example, a surface 114B of dielectric layer 114 is substantially aligned with irregularities in surface 112A. In at least one example, surface 114A is substantially planar as shown. In at least one example, where dielectric includes silicon and one or more of nitrogen or carbon, an interface 123 between dielectric layer 114 and dielectric layer 116 can include oxygen. In at least one example, oxygen can exist in pockets within the surface irregularities. In at least one example, a surface 112C can also be granular and have surface irregularities. In at least one example, surface 112C can be atomically smooth, with pockets of surface irregularities or micro voids that are at least 1 nm wide.

Referring again to FIG. 1A, in at least one example, device 100 further includes an electrode 120 that couples electrode 112 with a terminal of transistor 102. In at least one example, electrode 120 extends across multiple levels and may be referred to as a via electrode. In at least one example, electrode 120 extends from above electrode 112, through at least a portion of electrode 112, dielectric layer 114, dielectric layer 116, and a dielectric 118. In at least one example, electrode 120 has a tapered profile (illustrated by lines 129) where a portion 120A, above electrode 112, is wider than a portion 120B, below electrode 112.

In at least one example, electrode 112 has a planar cross section (in the X-Y plane) that is greater than a planar cross section of electrode 110. In at least one such example, electrode 112 extends beyond sidewall 108A of dielectric 108. In at least one example, electrode 112 is sufficiently wide so that electrode 120 extends through electrode 112, as shown in the Figure. In at least one example, electrode 120 extends through an edge region of electrode 112, as shown in FIGS. 1C and 1D. FIG. 1D is a plan-view illustration of the structure in FIG. 1C through line A-A'. In at least one example, electrode 120 is cylindrical and has a substantially circular plan view cross section. In at least one example, electrode 120 is confined within an edge region of electrode 112. In at least one such example, at least a portion of a sidewall 120C is aligned with at least one sidewall of electrode 112 such as a sidewall 112B. In at least one such example, an entire perimeter of sidewall 120C is in contact with a sidewall 112D of electrode 112, as shown in FIG. 1D. In at least one example, sidewall 112D is confined within electrode 112. In at least one example, sidewall 112D that is fully or partially confined within electrode 112, may be considered to be an inner sidewall. In at least one example, conductivity between electrode 112 and electrode 120 is dependent on thickness of electrode 112.

In at least one example, electrode 120 can have a different shape than a circular cylindrical conductor. In at least one example, electrode 120 is cylindrical with an elliptical plan-view cross-section. In at least one example, electrode 120 has a rectangular plan-view cross section (dashed lines 127).

In at least one example, part of electrode 120 extends beyond a perimeter of electrode 112. In at least one such example, sidewall 120C extends beyond sidewall 112B of electrode 112, such as is shown in FIGS. 1E and 1F. FIG. 1F is a plan-view illustration of the structure in FIG. 1E through line A-A'. In at least one example, at least a portion of electrode 120 overlaps with electrode 112 as shown. In at least one example, a portion of a perimeter of sidewall 120C is in contact with sidewall 112D. In at least one example, portion of sidewall 120C that is in contact with sidewall 112D is sufficient for electrical conduction. As shown in FIG. 1F sidewall 112D is partially confined within a perimeter of electrode 112, where perimeter of electrode 112 is defined by the sides along 'X' and 'Y' axis in the plan-view illustration.

In at least one example, electrode 120 does not extend through electrode 112, but is in contact with electrode 112, as shown in FIG. 1G. In at least one such example, electrode 120 includes two portions, a portion 120D and a portion 120E. In at least one example, portion 120D is partially on and in contact with surface 112C and partially extends beyond sidewall 112B. In at least one example, portion 120E is in contact with sidewall 112B and extends below surface 112A, through dielectric layer 114 and dielectric layer 116, towards a terminal of a transistor (not shown).

In at least one example, portion 120D is wider than portion 120E. In at least one example, electrode 120 is not in contact with surface 112C but only in contact with sidewall 112B. In at least one such example, electrode 120 can have a rectangular plan view cross section to have sufficient electrical connectivity with sidewall 112B.

FIG. 1H is a plan view illustration of the structure in FIG. 1G. In at least one example, sidewall of electrode 120 is partially on electrode 112. At least a portion of sidewall 120C of electrode 120 is not in contact with electrode 112. In at least one example, where electrode 120 has a cylindrical plan-view profile, sidewall 120C is substantially cylindrically shaped.

Referring again to FIG. 1A, electrode 120 includes a liner layer 124 and a conductive fill material 125. In at least one example, conductive fill material 125 includes one of Ru, Ti, Co, Mo, Co, Ni, W, or Ta; or nitrides of Ti, W, or Ta. In at least one example, liner layer 124 includes one of TiN, TaN, Ru, or WN. In at least one example, liner layer 124 or conductive fill material 125 can include a material that is the same or substantially the same as the material of electrode 112.

In at least one example, dielectric layer 116 is on dielectric 118. In at least one example, dielectric 118 can be an interlayer dielectric that is utilized to provide electrical isolation for components of transistor 102. In at least one example, dielectric 118 includes silicon and one or more of oxygen or carbon. In at least one example, dielectric 118 includes a material that is the same or substantially the same as a material of dielectric layer 116, for example silicon and one or more of oxygen or carbon. In other examples, dielectric 118 includes a material that is different from a material of dielectric layer 116, where dielectric 118 includes silicon and one or more of oxygen or carbon and where dielectric layer 116 includes silicon and nitrogen, or a compound of silicon, nitrogen, and carbon.

In at least one example, dielectric 108 is in contact with and laterally surrounded by a spacer 122. In at least one example, spacer 122 laterally surrounds dielectric 108 and electrode 110. In at least one example, spacer 122 is a dielectric that is designed to protect layers within capacitor 106 by providing a hermetic seal. In at least one example, spacer 122 may act as an insulative barrier against hydrogen or oxygen diffusion. In at least one example, spacer 122 includes a combination of metal and oxygen, such as, for example, $Al_xO_y$, $HfO_x$, $ZrO_x$, $TaO_x$, $TiO_x$, $AlSiO_x$, $HfSiO_x$, or $TaSiO_x$, or a mixture including silicon and nitrogen, or silicon, nitrogen, and carbon, where x is equal to 2 and y is equal to 3.

In at least one example, transistor 102 is an example of a transistor that is non-planar. In at least one example, transistor 102 may be, for example, an NMOS or a PMOS transistor. In at least one example, transistor 102 includes a gate structure 126 between a source region 128 and a drain region 130. In at least one example, source region 128 includes an epitaxial source structure (herein a source structure 132) and drain region 130 includes an epitaxial drain structure (herein a drain structure 134). In at least one example, source structure 132 and drain structure 134 are separated from gate structure 126 by a spacer 146. In at least one example, source structure 132 and drain structure 134 have faceted sidewall surfaces 132A and 134A, respectively. Not all faceted surfaces of source structure 132 and drain structure 134 are shown. In at least one example, a portion of gate electrode 142 is on a gate dielectric layer 140 that separates gate electrode 142 from substrate 104. In at least one example, electrode 120 is coupled to drain structure 134. In at least one example, a channel 144 is part of a fin structure 145 of a non-planar transistor. In at least one example, source structure 132 and drain structure 134 are epitaxial to fin structure 145, where fin structure 145 is part of substrate 104.

In at least one example, gate dielectric layer 140 has a base portion on channel 144 and sidewall portions that are adjacent to spacer 146. In at least one example, gate electrode 142 is laterally confined within gate dielectric layer 140. In at least one example, gate dielectric layer 140 includes a suitable gate dielectric material. In at least one example, the gate dielectric material includes one of: an oxide of one or more of Si, Hf, Zr, La, Ti, Ta, Ga, or Al, such as $SiO_2$, $HfO_2$, $ZrO_2$, $HfSiO_x$, $HfZrO_2$, $Ta_2O_5$, $Al_2O_3$, $La_2O_3$, $TaSiO_x$, or $Ga_2O_5$. In at least one example, gate electrode 142 can include one or more of: Ti, Al, W, Pt, Co, Ni, or Pd; nitrogen and one or more of Ti, Ta, Al, Hf, or Zr; or carbon and one or more of Ti, Al, Ta, Hf, or Zr. In at least one example, source structure 132 and drain structure 134 can include amorphous Si, SiC, SiGe, or Ge, and may be doped with As, P, or B depending on a mobile charge carrier implemented. In at least one example, spacer 146 includes silicon nitride, or silicon nitride doped with carbon.

In at least one example, gate structure 126, source structure 132, drain structure 134 and spacer 146, are at least laterally surrounded by a dielectric 136. In at least one example, dielectric 136 is directly on dielectric layer 114 and electrode 112, and laterally surrounds electrode 112 and spacer 122. In at least one example, dielectric 118 and dielectric 136 include a same material. In at least one example, dielectric 136 includes silicon and one or more of oxygen, nitrogen, or carbon.

In at least one example, capacitor 106 (e.g., a memory or logic device) can be coupled with a gate structure 126 of transistor 102 through a gate contact (not shown). In at least one example, a single transistor such as transistor 102 can be coupled with more than one capacitor such as capacitor 106.

In at least one example, electrode 110 of capacitor 106 is coupled with an electrode 148. In at least one example, electrode 148 includes a conductive hydrogen barrier material. In at least one example, electrode 148 includes a conductive material such as Ru, Ti, Co, Mo, Co, Ni, W, or Ta; or nitrides of Ti, W, or Ta.

In at least one example, device 100 further includes a source contact 170 coupled with source structure 132 and a gate contact 172 coupled with gate structure. In at least one example, one or more intervening structures may be present within dielectric 118 that extend in/or out of the plane of the Figure. In at least one example, the one or more intervening structures enable coupling source contact 170 and gate contact 172 with respective terminals without shorting with electrode 112.

Figure 1I:
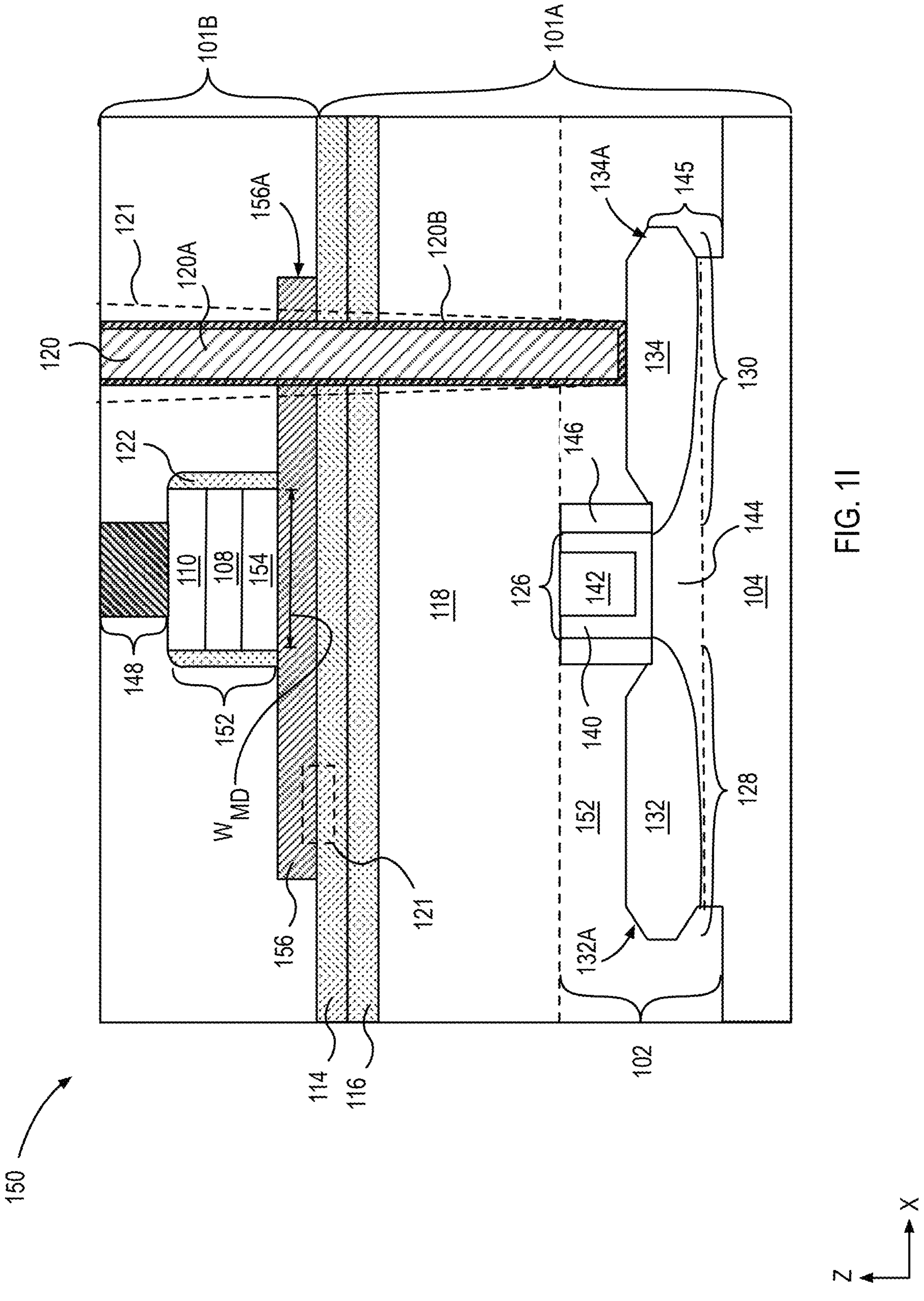
FIG. 1I is a cross-sectional illustration of device structure that includes a capacitor that is further coupled with a plate electrode that laterally extends above a transistor, in at least one example.

FIG. 1I is a cross-sectional illustration of a device structure 150 that includes a capacitor 152 that is further coupled with an electrode that laterally extends above transistor 102. In at least one example, capacitor 152 includes electrode 110 and dielectric 108, as well as an electrode 154 that includes the material of electrode 112 (FIG. 1A). Capacitor 152 is different from capacitor 106 (FIG. 1A), in that electrode 154 does not extend laterally above and couple with electrode 120. In at least one example, electrode 154 is a bottom electrode of device structure 150.

Capacitor 152 is coupled with an electrode 156 that extends laterally above at least a portion of transistor 102. In at least one such example, electrode 156 includes a material that is substantially different from material of electrode 154. In at least one example, electrode 156 includes a conductive polycrystalline, or an amorphous material. In at least one example, electrode 156 includes a refractory metal. In at least one example, electrode 156 includes a nitride of a refractory metal such as Ti, Ta or W, TiAlN with >30 atomic percent AlN; TaN with >30 atomic percent N; TiSiN with >20 atomic percent SiN; tantalum carbide (TaC), titanium carbide (TiC); tungsten carbide (WC); tungsten nitride (WN); carbonitrides of Ta, Ti, W, i.e., TaCN, TiCN, WCN; titanium monoxide (TiO or $Ti_2O$); tungsten oxide ($WO_3$); tin oxide ($SnO_2$); indium tin oxide (ITO); iridium oxide ($IrO_2$); indium gallium zinc oxide (IGZO); zinc oxide or METGLAS series of alloys, e.g., $Fe_{40}Ni_{40}P_{14}B_6$. In at least one example, electrode 156 includes a material that can act as a hydrogen barrier layer. In at least one example, electrode 156 includes a material that provides a template for electrode 154.

In at least one example, electrode 120 extends through at least a portion of electrode 156. In at least one example, electrode 156 includes structural features of electrode 112 described above (FIG. 1A). In at least one example, electrode 156 can have a thickness that is dependent on a material chosen. In at least one example, the thickness can be dependent on a sheet resistivity of the material chosen. In at least one example, typical thicknesses can range from 5 nm to 50 nm. In at least one example, the thickness of electrode 156 can vary along the X direction, where the thickest portion is directly under device structure 150 and thinner portions are outside of spacer 122. In at least one example, electrode 120 includes the features of electrode 120 described above (FIGS. 1C-1H). In at least one example, features include electrode 120 in contact with a sidewall 156A of electrode 156. In at least one example, electrode 120 may extend between two adjacent capacitors 302.

In at least one example, spacer 122 laterally surrounds electrode 110, electrode 154 and dielectric 108. In at least one example, spacer 122 hermetically seals sidewall interfaces of the constituents layers of device structure 150. In at least one example, device structure 150 may include further layers above electrode 110 and below electrode 154, where the further layers have a substantially similar lateral dimension as electrode 110 or electrode 154. In at least one such example, spacer 122 can laterally surround additional layers. In at least one example, additional layers can include barrier layers implemented for diffusion against hydrogen or oxygen and for templating during fabrication.

Figure 2B:
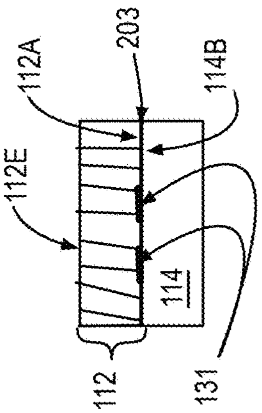
FIG. 2B in an enhanced cross sectional illustration of portion of the structure in FIG. 2A, in at least one example.
Figure 2A:
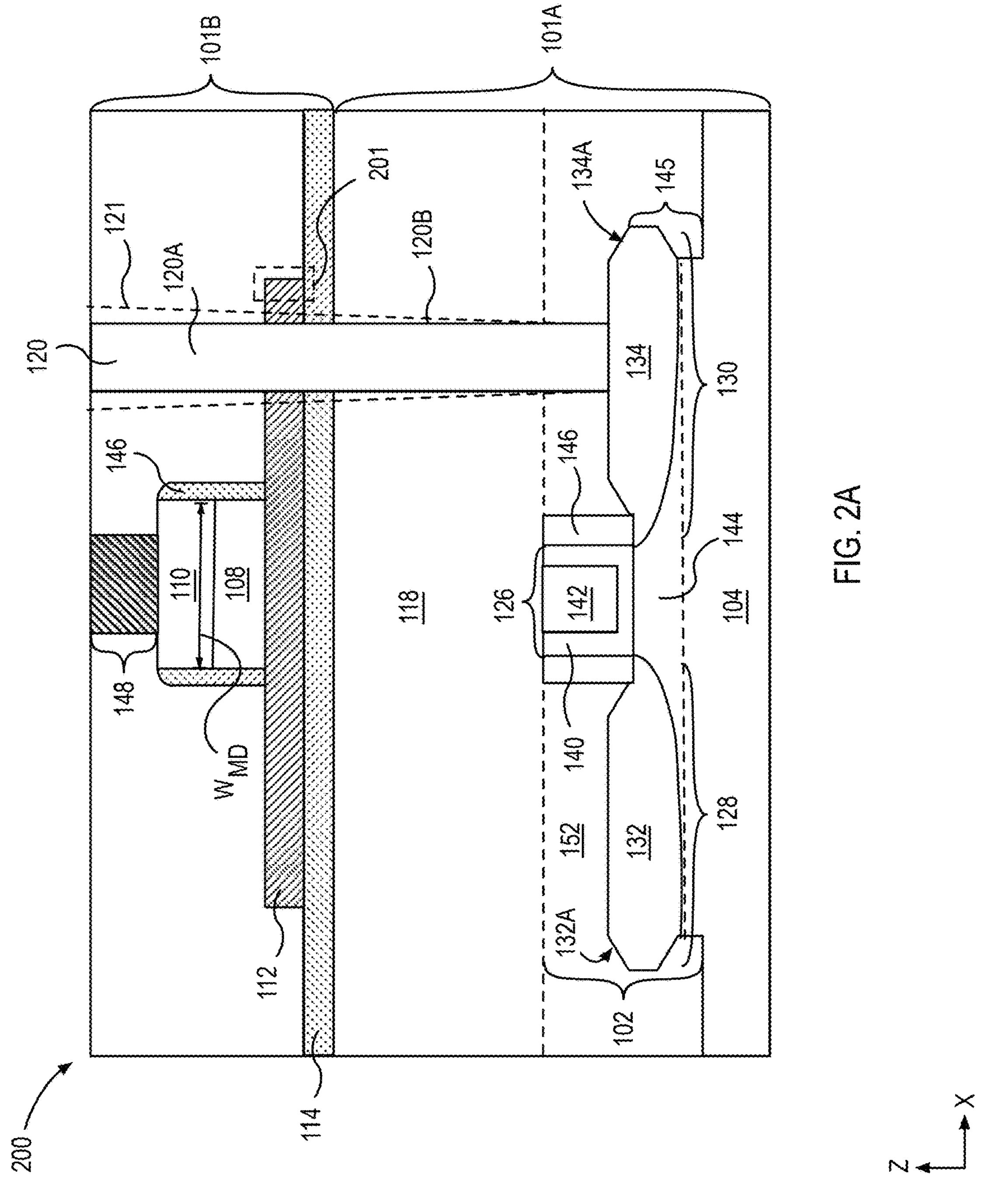
FIG. 2A illustrates a cross-section of a device structure including a memory device of a first substrate coupled with a transistor of a second substrate, in at least one example.

In at least one example, die 101A does not include dielectric layer 116, but die 101A includes dielectric layer 114, as shown in the cross-sectional illustration of a device 200 in FIG. 2A. Device 200 includes many of the same features as device 100, except for dielectric layer 116. In at least one example, electrode 120 is laterally surrounded by electrode 112, dielectric layer 114 and dielectric 118. In at least one example, dielectric layer 116 includes a same material as dielectric 118. In at least one example, dielectric layer 116 and dielectric 118 include silicon and one or more of oxygen or carbon.

FIG. 2B in an enhanced cross-sectional illustration of a portion 201 (FIG. 2A). An interface 203 between electrode 112 and dielectric layer 116 is shown. In at least one example, interface 203 between surface 112A and surface 114B is substantially planar and indicative of a planarization processing operation that will be discussed further below. In at least one example, the granular structure, of the material illustrated, is an example of a refractory metal. In at least one such example, the nucleation site of the material is at a surface 112E. In at least one example, oxygen 131 may be present scattered at an interface 203. In at least one example, surface 112E may be rough in contrast to surface 112A. In at least one example, surface 112E may have surface irregularities of up to 5 nm, whereas surface 112A may have a surface roughness of less than 1 nm.

Figure 3B:
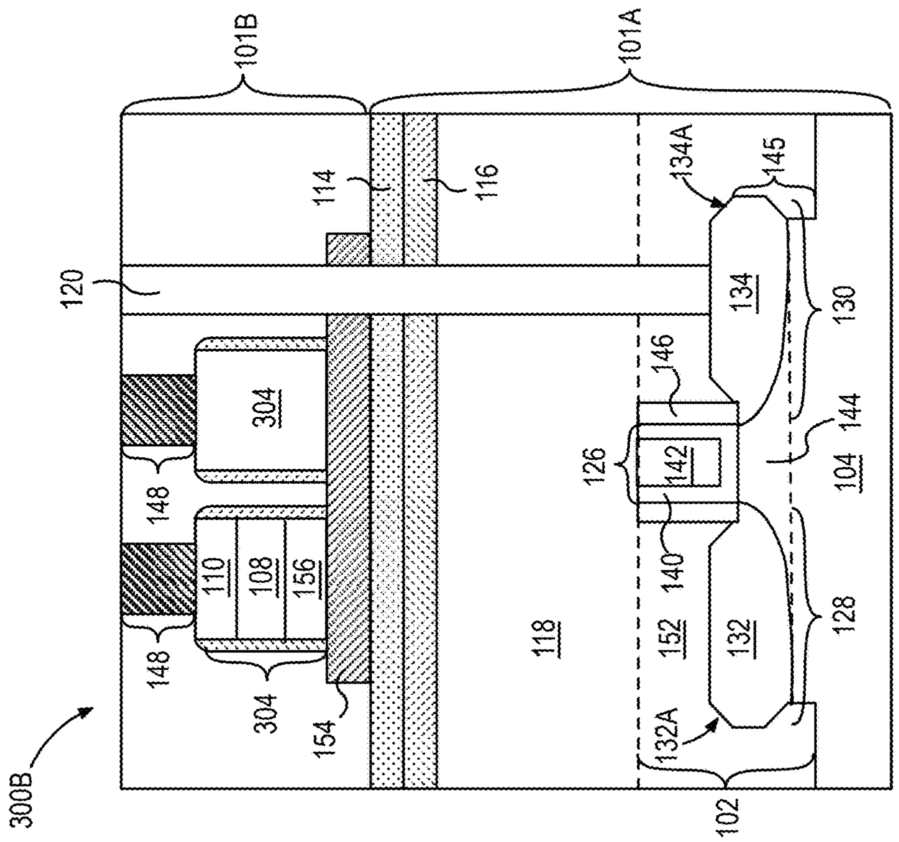
FIG. 3B is a cross-sectional illustration of device that includes a plurality of capacitors within a first die, coupled through electrode with a transistor of a second die, in at least one example.
Figure 3A:
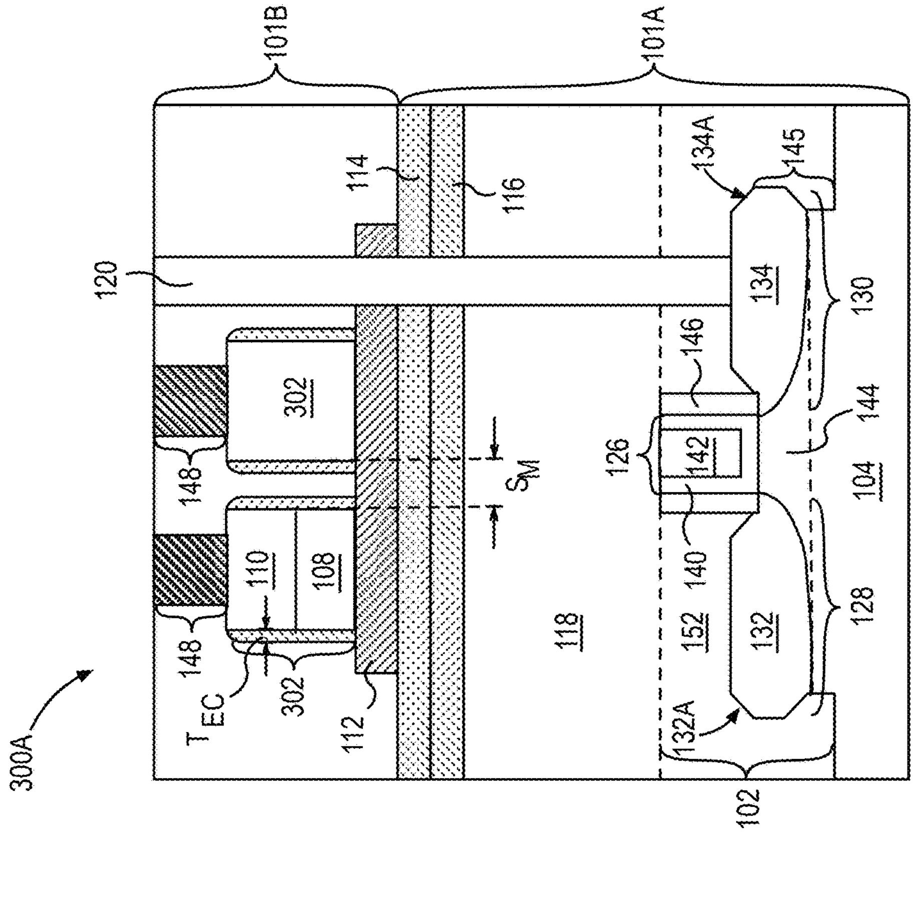
FIG. 3A is a cross-sectional illustration of device that includes a plurality of capacitors within a first die, coupled through electrode with a transistor of a second die, in at least one example.

FIG. 3A is a cross-sectional illustration of a device 300A, that includes a plurality of capacitors 302 within die 101B, coupled through electrode 112, in at least one example. In at least one example, electrode 112 is connected to transistor 102 of die 101A through electrode 120. In at least one example, device 300A includes features of device 100 (FIG. 1A), such as transistor 102, dielectric layer 114, 116//, dielectric 118, spacer 122, electrode 148, electrode 110, dielectric 108, and electrode 112.

Capacitor(s) 302 is, herein, used to describe a single or multiple capacitors that include a same composition. In at least one example, individual capacitors 302 may vary in surface area (as measured in the X-Y plane). In at least one example, each capacitor 302 includes the components of capacitor 106, such as electrode 110 and dielectric 108 and electrode 112. In at least one example, capacitors 302 are arranged side by side on a same level. In at least one example, while two capacitors 304 are shown, the number of capacitors can be greater than 128 on a single level. In at least one example, while capacitors 302 are shown directly above transistor 102, capacitors 302, in general, can be on a plane that is in front or behind the plane of transistor 102. In at least one example, electrode 112 is asymmetrical about capacitors 302, i.e., electrode 112 extends away (along x-direction) from one of the capacitors. In at least one example, electrode 112 can extend away (along y-axis) from both of the capacitors. In at least one example, electrode 112 is elongated to accommodate coupling with electrode 120. As shown, electrode 120 is coupled with electrode 112 and drain structure 134 of transistor 102. In at least one example, electrode 120 includes features described above in association with FIGS. 1A, 1C-1H. In at least one example, electrode 120 may extend vertically between two adjacent capacitors 302.

In at least one example, spacer 122 has a lateral thickness $T_{EC}$, that is sufficiently less than a spacing $S_M$, between adjacent capacitors 302. In at least one example, the lateral thickness $T_{EC}$ is less than spacing $S_M/2$. In at least one example, spacer 122 is on an entire uppermost surface of electrode 112, as will be discussed below.

FIG. 3B is a cross-sectional illustration of a device 300B, that includes capacitors 304 within die 101B, in at least one example. Capacitor(s) 304 is, herein, used to describe a single or multiple capacitors that include a same composition. In at least one example, capacitors 304 are coupled through electrode 156 to transistor 102 of die 101A, in at least one example. In at least one example, device 300B includes many of features of device structure 150 (FIG. 1I), such as electrode 110, dielectric 108, electrode 154, transistor 102, electrode 120, dielectric layer 114, dielectric layer 116, dielectric 118, spacer 122, electrode 148, and electrode 156.

In at least one example, capacitor 304 is, herein, used to describe a single or multiple capacitors that include a same composition. In at least one example, individual capacitors 304 may vary in surface area (as measured in the X-Y plane). In at least one example, capacitor 304 includes one or more features of capacitor 152 such as electrode 110, dielectric 108, and electrode 156. In at least one example, capacitors 304 are arranged side by side on a same level. In at least one example, while two capacitors 304 are shown, number of capacitors can be greater than 128 on a single level. In at least one example, capacitors 304 can be directly above transistor 102 (as shown), or on a plane that is in front or behind the plane of transistor 102. In at least one example, electrode 154 is asymmetrical about capacitors 304, where electrode 154 can extend away (along x-direction) from one of the capacitors. In at least one example, electrode 154 can extend away (along y-axis) from both of the capacitors. In at least one example, electrode 154 is elongated to accommodate coupling with electrode 120. In at least one example, electrode 120 is coupled with electrode 154 and drain structure 134 of transistor 102. In at least one example, electrode 120 includes features described above (FIG. 1I). In at least one example, electrode 120 may extend between two adjacent capacitors 304.

In at least one example, electrode 154 may extend over gate structure 126. In at least one such example, electrode 154 may be coupled with a gate electrode 142 on a plane that is into, or out of plane of the figure. In at least one example, more than two capacitors 304 may extend along x-axis. In at least one example, capacitors 304 may be coupled with a plurality of transistors.

Figure 4:
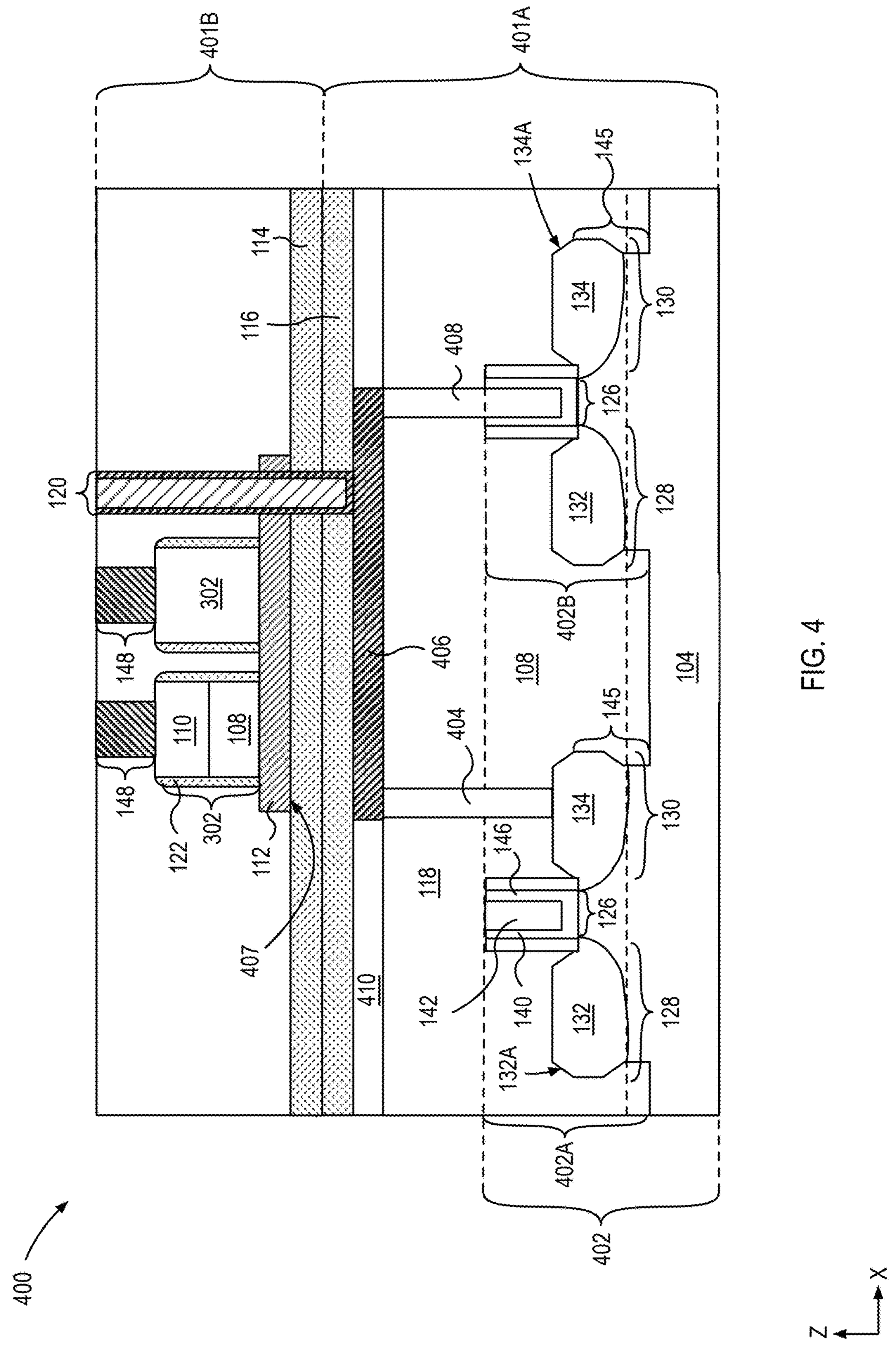
FIG. 4 illustrates a cross-section of a device including a pair of capacitors of a first die, coupled to a pair of transistors of a second die, by a through electrode, in at least one example.

FIG. 4 illustrates a cross-section of a device 400 including a pair of transistors 402 of a die 401A coupled to a pair of capacitors of a die 401B, by electrode 120, in at least one example. In at least one example, pair of transistors 402 includes a transistor 402A and a transistor 402B.

In at least one example, transistors 402A and 402B may be on a same plane, as shown. In at least one example, transistors 402A and 402B may be arranged side by side along x-direction, as shown, or along y-direction. In at least one example, arrangement of transistors 402A and 402B may depend on geometry of structures that are utilized to electrically connect with transistors 402A and 402B. In at least one example, transistor 402A further includes a drain contact 404 on drain structure 134 and transistor 402B includes a gate contact 408 coupled with gate electrode 142 of transistor 402B. In at least one example, a bridge structure 406 is coupled between gate contact 408 of transistor 402B and drain contact 404 of transistor 402A. In at least one example, a gate contact of transistor 402A can be coupled with a drain contact of transistor 402B (not shown). In at least one example, bridge structure 406 includes a material that is same or substantially same as material of electrode 120.

In at least one example, bridge structure 406 is coupled between gate contact 408 of transistor 402B and drain contact 404 of transistor 402A. In at least one example, a gate contact of transistor 402A can be coupled with a drain contact of transistor 402B (not shown). In at least one example, bridge structure 406 includes a material that is the same or substantially the same as the material of electrode 120.

In at least one example, device 400 further includes dielectric layer 114 and dielectric layer 116 between bridge structure 406 and electrode 112. An interface 407 between electrode 112 and dielectric layer 114 has one or more properties of interface 123 described above (FIG. 1B). In at least one example, electrode 120 extends through dielectric layer 114 and dielectric layer 116, and couples with bridge structure 406. In at least one example, electrode 120 has one or more features of electrode 120 described above (FIGS. 1A, 1C-1H).

In at least one example, transistors 402A and 402B may be stacked. In at least one example, transistors 402A and 402B are same or substantially same as transistor 102 (FIG. 1A). In at least one example, transistors 402A and 402B share substrate 104. In at least one example, transistors 402A and 402B are non-planar transistors. In at least one example, transistors 402A and 402B may be an NMOS or a PMOS transistor, respectively, or vice versa.

In at least one example, bridge structure 406 is laterally surrounded by a dielectric 410. In at least one example, dielectric 410 includes silicon and one or more of oxygen, nitrogen, or carbon. In at least one example, dielectric 410 and dielectric 118 include a same material.

Figure 5:
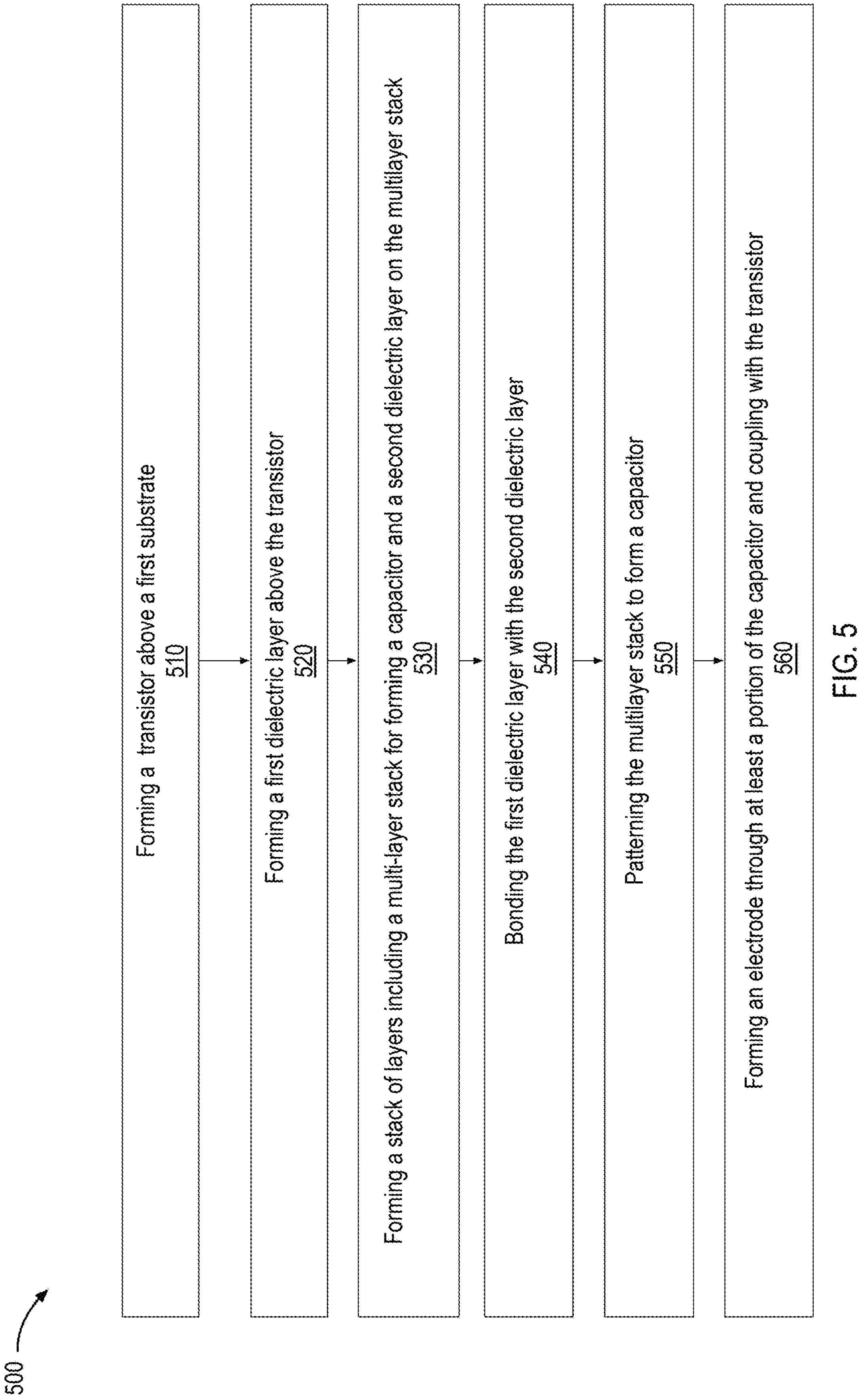
FIG. 5 is a flow diagram for method to fabricate a device structure by bonding a first layer formed above a transistor of a first substrate with a second layer of a stack of layers formed on a second substrate, in at least one example.

FIG. 5 is a flow diagram for a method 500 to fabricate a device structure by bonding a first layer formed above a transistor of a first substrate with a second layer of a stack of layers formed on a second substrate, in at least one example. In at least one example, method 500 begins at operation 510 with forming of a transistor above a first substrate. In at least one example, method 500 continues at operation 520 with formation of a first dielectric layer above transistor where the first dielectric layer is coupled with transistor. In at least one example, method 500 continues at operation 530 with formation of a stack of layers including multi-layer stack to form at least a capacitor and a second dielectric layer on the multi-layer stack on a second substrate. In at least one example, a second dielectric layer may not be formed on the multi-layer stack. In at least one example, method 500 continues at operation 540 by bonding the first dielectric layer with the second dielectric layer. In at least one example, method 500 continues at operation 550 by patterning the multilayer stack to form a capacitor including a plate electrode. In at least one example, method 500 ends at operation 560 by forming an electrode through at least a portion of the capacitor and coupling the electrode with a terminal of the transistor.

While method 500 describes a method to fabricate an example. Other methods can be implemented to supplement/or alter components of method 500 to fabricate structures described in FIGS. 1A-4.

Figures 6A, 6B, 6C:
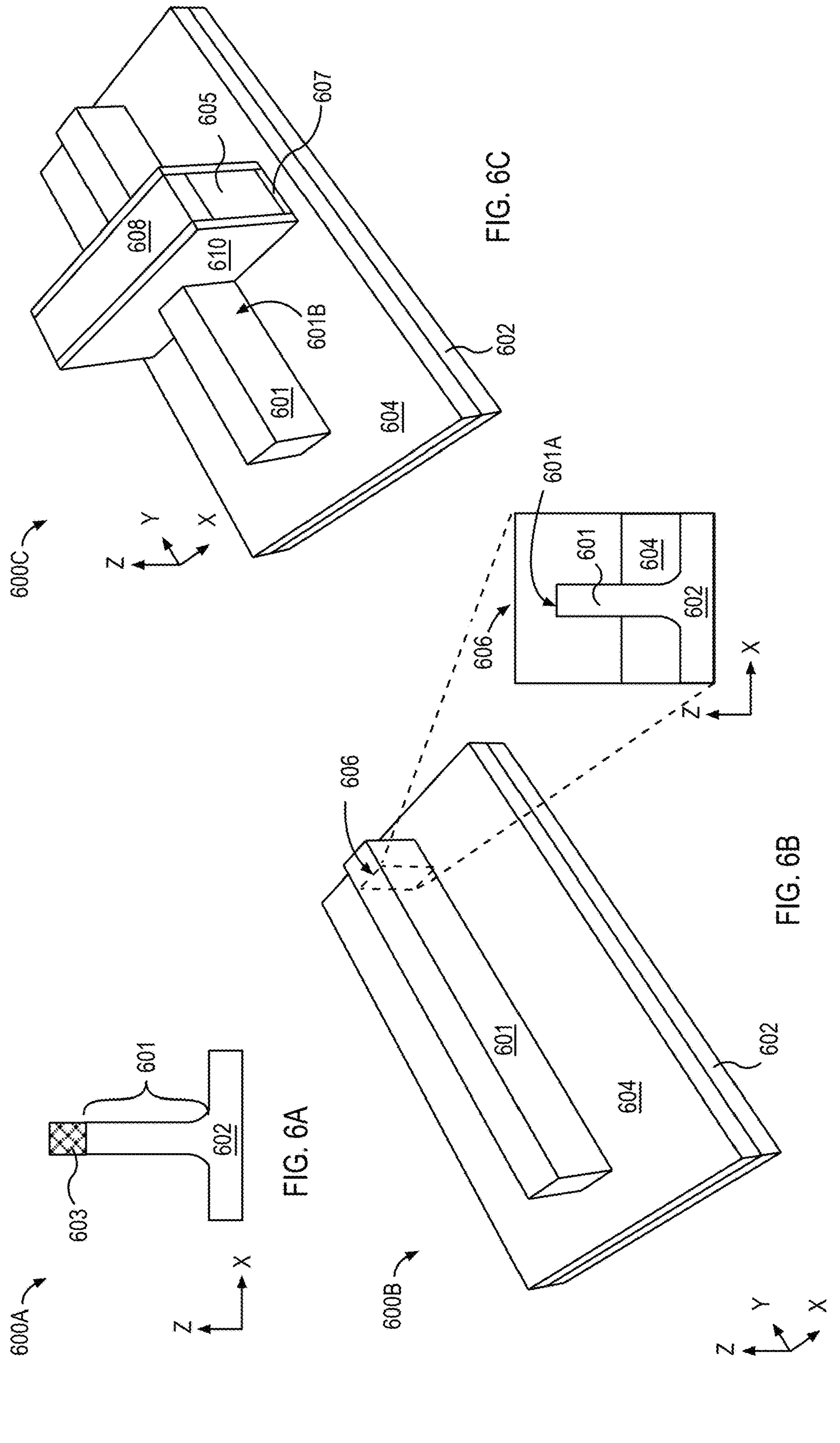
FIG. 6A illustrates a cross-section of a fin structure formed on a substrate, in at least one example.
FIG. 6B is an isometric illustration of the structure in FIG. 6A following process to form a dielectric adjacent to a portion of fin structure, in at least one example.
FIG. 6C is an isometric illustration of the structure in FIG. 6B following formation of a dummy gate on fin, in at least one example.

FIG. 6A illustrates a cross-section of a structure 600A. In at least one example, structure 600A is a cross sectional illustration of a fin 601, formed on a substrate 602. In at least one example, a mask 603 is formed on substrate 602. In at least one example, mask 603 includes a dielectric material. In at least one example, mask 603 may be formed by a lithographic pattern on dielectric material. In at least one example, a plasma etch process is utilized to etch material of substrate 602 to form fin 601. In at least one example, fin 601 may be substantially vertical as is shown. In at least one example, substrate 602 includes silicon, silicon germanium, germanium, or a suitable material that can be utilized to pattern and dope to form source and drain structures applicable for a transistor.

FIG. 6B illustrates an isometric view of a structure 600B. In at least one example, structure 600B is an isometric illustration of structure 600A in FIG. 6A following process to form a dielectric 604 adjacent to a portion of fin 601. In at least one example, dielectric 604 is blanket deposited on mask 603 (not shown), on sidewalls of fin 601, and on substrate 602. In at least one example, dielectric 604 is planarized post deposition. In at least one example, planarization process includes a chemical mechanical planarization process (CMP). In at least one example, CMP process removes mask 603 from above fin 601. In at least one example, dielectric 604 is then recessed to obtain a desired height of fin 601. Dielectric 604 can provide electrical isolation for portions of a gate electrode to be formed. A profile of dielectric 604 that is recessed relative to an uppermost surface 601A of fin 601, is shown in enhanced cross-sectional illustration 606.

FIG. 6C illustrates an isometric view of a structure 600C. In at least one example, structure 600C is an isometric illustration of structure 600B in FIG. 6B following formation of a dummy gate 605 on fin 601, in at least one example. In at least one example, a dummy gate dielectric layer 607 is deposited on fin 601 and on dielectric 604. In at least one example, dummy gate dielectric layer 607 is grown by a plasma enhanced chemical vapor deposition (PECVD) process, chemical vapor deposition (CVD), or an atomic layer deposition (ALD) process. In at least one example, dummy gate dielectric layer 607 includes a layer of silicon dioxide adjacent to fin 601.

In at least one example, a dummy gate material is blanket deposited on dummy gate dielectric layer 607. In at least one example, dummy gate material includes a chemical vapor deposition process to deposit a material such as polysilicon, amorphous silicon, or silicon germanium. In at least one example, deposition process can take place at temperatures of approximately 600 degrees Celsius or less. In at least one example, such as is shown, a planarization process may be performed to planarize dummy gate material after deposition.

In at least one example, a mask material is deposited on dummy gate material. In at least one example, mask material includes a silicon nitride or a silicon oxynitride. In at least one example, mask material is patterned by a lithographic process and etched by a plasma etch process to form a hardmask 608. In at least one example, hardmask 608 is subsequently utilized to etch dummy gate material to form dummy gate 605. In at least one example, dummy gate dielectric layer 607 is removed from surfaces of fin 601 after formation of dummy gate 605.

In at least one example, after formation of dummy gate 605, a spacer 610 is formed on sidewalls of dummy gate 605. In at least one example, an encapsulation layer is blanket deposited on fin 601, and on dummy gate 605. In at least one example, encapsulation layer is then etched to form spacer 610 on sidewalls of dummy gate 605. In at least one example, encapsulation layer may be removed from sidewalls of fin 601 by a masking and etching process so that spacer 610 is substantially formed on sidewalls of dummy gate 605 and on a portion of sidewalls of fin 601 adjacent to dummy gate 605. In at least one example, it is useful to remove encapsulation layer from sidewalls 601B of fin 601 to provide effective growth of epitaxial source and drain material in a downstream operation.

FIG. 6D illustrates an isometric view of a structure 600D. In at least one example, structure 600D is an isometric illustration of structure 600C in FIG. 6C following process to form a source structure 612 and a drain structure 614, in at least one example. In at least one example, portions of fin 601 are etched and removed. In at least one example, shape of remaining portion of fin 601 under source structure 612 is indicated by dashed lines 609.

In at least one example, an epitaxial growth process is utilized to selectively grow source structure 612 and drain structure 614 on fin 601 as shown. In at least one example, source structure 612 and drain structure 614 are grown to have faceted sidewalls by an epitaxial growth process. In at least one example, dopants may be implanted during epitaxial growth process or implanted at a later operation. In at least one example, spacer 610 and hardmask 608 can prevent epitaxial growth from taking place on dummy gate 605. In at least one example, a sidewall 605A of dummy gate 605 is exposed for illustrative purposes only, spacer 610 encapsulates all sidewalls 605A of dummy gate 605. In at least one example, epitaxial growth process may be carried out at temperatures between 200 degrees Celsius and 700 degrees Celsius to grow source structure 612 and drain structure 614 doped with silicon, amorphous silicon or SiGe.

FIG. 6E illustrates an isometric view of a structure 600E. In at least one example, structure 600E is an isometric illustration of structure 600D in FIG. 6D following process to remove hardmask 608, dummy gate 605, and dummy gate dielectric layer 607, in at least one example. In at least one example, a dielectric 616 is blanket deposited on source structure 612 and drain structure 614, on dielectric 604, spacer 610, and hardmask 608 (FIG. 6D). In at least one example, dielectric 616 can include silicon and one or more of oxygen, nitrogen, or carbon, and may be deposited by a chemical vapor deposition (CVD), or a plasma enhanced chemical vapor deposition (PECVD) process. In at least one example, dielectric 616 is planarized by a CMP process. In at least one example, CMP process may remove hardmask

608. In at least one example, an etch process may be utilized to remove hardmask 608, and portions of dummy gate 605 after partial competition of CMP process. In at least one example, a wet chemical process is utilized to selectively remove dummy gate 605, as well as dummy gate dielectric layer 607 selective to dielectric 604, spacer 610, fin 601, and dielectric 616. In at least one example, process of removing dummy gate 605 forms an opening 611.

Figure 6F:
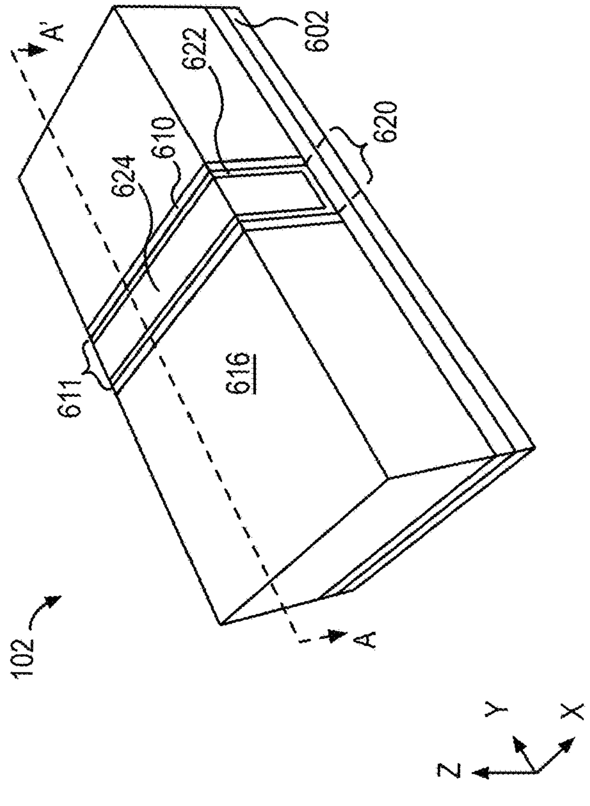
FIG. 6F illustrates a cross-section of the structure in FIG. 6E following process to form a gate structure in gate opening in at least one example.

FIG. 6F illustrates an isometric view of transistor 102. In at least one example, transistor 102 is formed following process to form a gate structure 620 in opening 611 of structure 600E in FIG. 6F. Referring collectively to FIGS. 6E and 6F, in at least one example, a gate dielectric layer 622 is blanket deposited in opening 611 after a high temperature process utilized to grow source structure 612 and drain structure 614. In at least one example, an atomic deposition process is utilized to deposit a gate dielectric layer 622 on fin 601, on sidewalls of spacer 610 and on dielectric 604 in opening 611. Depending on an MOS characteristic, in at least one example, a PMOS or an NMOS material is deposited on gate dielectric layer 622 to form a gate electrode 624. Depending on material, and desired size of transistor gates, a variety of deposition processes can be utilized. In at least one example, deposition process may include a CVD, a physical vapor deposition (PVD), or an atomic layer deposition (ALD) method. In at least one example, after deposition, a planarization process can be performed to remove excess material of gate electrode 624 and gate dielectric layer 622 from above spacer 610 and dielectric 616. In at least one example, transistor 102 is formed above substrate 602. In at least one example, a plurality of transistors that are identical or substantially identical to transistor 102 can be formed on a same level or plane (Y-Z) of transistor 102, within substrate 602.

Figure 7A:
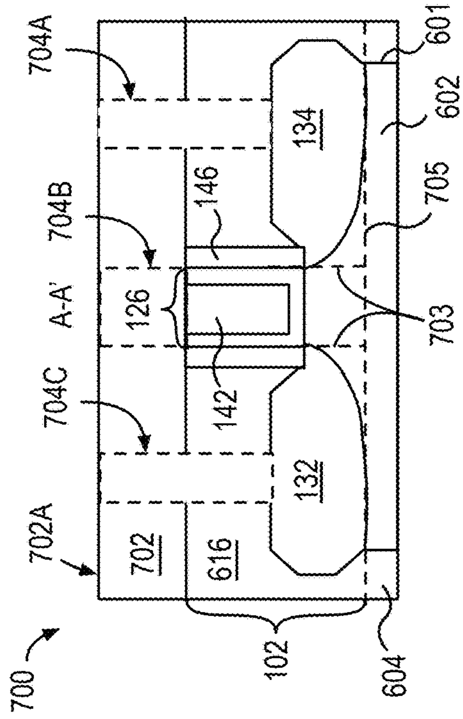
FIG. 7A illustrates a cross-section of the structure in FIG. 6F through a line A-A' following process to form a drain contact on a drain structure, in at least one example.

FIG. 7A illustrates a cross-section of a structure 700 following process to deposit a dielectric 702 on dielectric 616 of transistor 102 in FIG. 6F, in at least one example. Structure 700 is a cross section through line A-A' of transistor 102 in FIG. 6F. In at least one example, dielectric 702 is blanket deposited on dielectric 616, on spacer 146 and on gate structure 126. In at least one example, dielectric 702 includes a material that is same or substantially same as material of dielectric 616. In at least one example, dielectric 702 may be deposited by a PECVD or a CVD process. The illustration depicts a portion of gate electrode 142 on fin 601. In at least one example, lines 703 denote extensions of gate electrode 142 on dielectric 604, below dashed line 705.

In at least one example, transistor 102 includes three contacts, of which two contacts can be fabricated prior to the bonding process and a third contact can be fabricated by forming electrode 120 after the bonding process. In at least one example, a drain contact 704A (dashed lines) can be formed on drain structure 134 and a gate contact 704B can be formed on gate electrode 142. In at least one such example, electrode 120 can be connected with source structure 132 after bonding. In at least one example, a source contact 704C (dashed lines) can be formed on source structure 132 and gate contact 704B can be formed on gate electrode 142. In at least one such example, electrode 120 can be connected with drain structure 134 after bonding.

In at least one example, fabrication of either drain contact 704A or source contact 704C can include forming an opening in dielectric 702 and dielectric 616 to expose drain structure 134 or source structure 132. In at least one example, a conductive material is deposited into the opening and on a 702surface 702A of dielectric 702. In at least one example, conductive material is removed via planarization from 702surface 702A to fabricate drain contact 704A or source contact 704C. In at least one example, the conductive material includes materials of liner layer 124 and conductive fill material 125 (FIG. 1A).

In at least one example, gate contact 704B can be formed on gate structure 126 as indicated by dashed lines. In at least one example, gate contact 704B (indicated by dashed lines) can be formed by etching dielectric 702 to form an opening in dielectric 702 and, and depositing materials that are same or substantially same as materials of drain contact 704A in the opening.

Figure 7B:
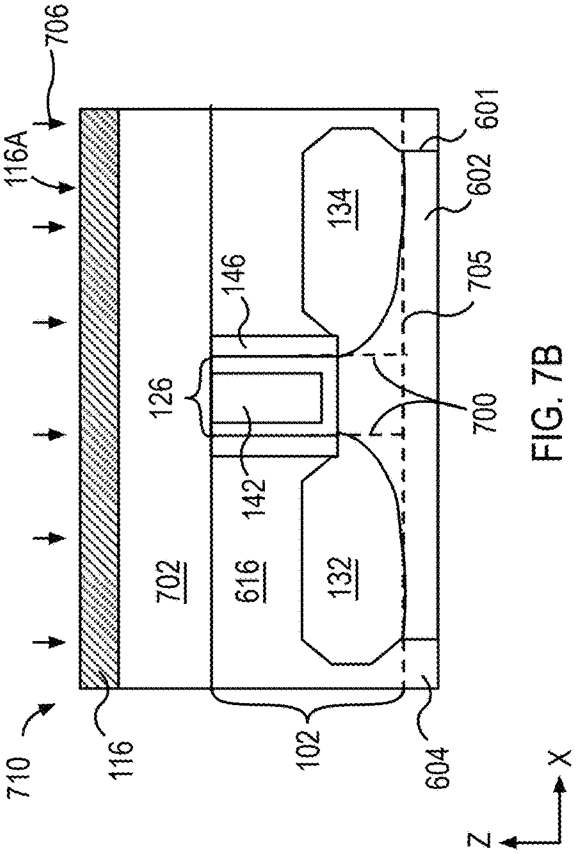
FIG. 7B illustrates a cross-section of the structure in FIG. 7A, following process to form a conductive interconnect coupled with the drain contact, in at least one example.

FIG. 7B illustrates a cross-section of a wafer 710 following process to deposit dielectric layer 116 on dielectric 702 of structure 700 in FIG. 7A, in at least one example. In at least one example, dielectric layer 116 includes a material that is same or substantially same as material of dielectric 702. Materials of dielectric layer 116 have been described above. In at least one example, dielectric layer 114 is deposited by a PVD, PECVD, or an ALD deposition process and may be deposited to a thickness of at least 2 nm for continuity in film.

In at least one example, after smoothing surface 116A of dielectric layer 116 an implantation process (denoted by arrows 706) can be performed in preparation for bonding with a second wafer.

FIG. 8A illustrates a cross-section of a wafer 800A that includes a multi-layer stack 802 formed on a substrate 803, followed by formation of dielectric layer 114 on multi-layer stack 802. In at least one example, process to form multi-layer stack 802 includes blanket deposition of at least three material layers. In at least one example, number of layers can depend on a type of capacitor to be fabricated. In at least one example, multi-layer stack 802 includes deposition of layers for a ferroelectric capacitor. In at least one example, multi-layer stack 802 includes deposition of layers for a paraelectric capacitor. In at least one example, multi-layer stack 802 includes deposition of layers for an anti-ferroelectric capacitor. In at least one example, deposition process includes depositing at least four layers as shown. In at least one example, at least four layers may be implemented because multi-layer stack 802 is designed to be inverted to bond with structure (in FIG. 7A), and a layer 804 may be sacrificial or used for patterning.

In at least one example, formation of multi-layer stack 802 begins by blanket deposition of a layer 804 on substrate 803. In at least one example, deposition temperatures will depend on material of layer 804. In at least one example, layer 804 is a conductive layer, where conductive layer may be advantageously utilized for planarization or act as a hardmask for patterning multi-layer stack 802 to form capacitors. In at least one example, layer 804 is an insulative layer that may be advantageously utilized for planarization. In at least one example, layer 804 includes a material, for example, $SiO_2$, $Si_3N_4$, DLC (Diamond Like Carbon), or $Al_2O_3$. In at least one example, some or all of layer 804 is designed to be planarized and removed. In at least one example, layer 804 is designed to be removed after completing pattering of multi-layer stack 802. In at least one example, layer 804 is a bilayer stack, where a lower level is an insulator, and an upper layer is a conductive material. In at least one example, the conductive material can include a hydrogen barrier layer.

In at least one example, deposition process is continued with deposition of a conductive layer 805 on layer 804, as shown. In at least one example, individual layers of multi-layer stack 802 are deposited in situ, i.e., without breaking vacuum. Multi-layer stack 802 may be deposited by an ALD, a PECVD, a CVD, a PVD process, or a combination thereof. In at least one example, ALD deposition process may be performed at a process temperature between 160 degrees Celsius and 400 degrees Celsius, PVD deposition process may be performed at a process temperature between 23 degrees Celsius (room temperature) and 400 degrees Celsius, and CVD deposition process may be performed at a process temperature between 160 degrees Celsius and 800 degrees Celsius.

In at least one example, conductive layer 805 includes a conductive ferroelectric oxide. In at least one example, conductive ferroelectric oxide includes one of a non-Pb perovskite metal oxides, such as but not limited to, (La,Sr)$FeO_3$, (La,Sr)$CoO_3$, (La,Ca)$MnO_3$, (La,Sr)$MnO_3$, $SrRuO_3$, $Sr_2RuO_4$, (Ba,Sr)$RuO_3$, $SrMoO_3$, (La,Sr)$MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, or $CaRuO_3$. In at least one example, conductive layer 805 includes Ir, $Ir_2O_x$, Ru, $RuO_x$, Mo, $MoO_x$, Ta, Cr, Nb, Rh, Ti, W or $WO_x$, or nitrogen doped variants of Ir, $Ir_2O_x$, Ru, $RuO_x$, Mo, $MoO_x$, Ta, Cr, Nb, Rh, Ti, W, conductive doped AlN, or conductive doped SiN. In at least one example, conductive layer 805 includes hexagonal compounds including one or more of $PtCoO_2$, $PdCoO_2$, delafossite structured hexagonal conductive oxides including Al-doped ZnO, spinels including one or more of $Fe_3O_4$, $LiV_2O_4$, or cubic oxides including indium tin oxide or Sn-doped $In_2O_3$. In at least one example, conductive layer 805 includes a material that is different from a material of layer 804.

In at least one example, conductive layer 805 is deposited to thickness $T_1$, that is suitable for minimizing electrical resistance as well as reducing taper of sidewalls during patterning to form capacitors. In at least one example, conductive layer 805 has a thickness that ranges between 3 nm and 30 nm. In at least one example, a thickness of less than 30 nm can be useful to prevent significant tapering of sidewalls formed during patterning process.

In at least one example, deposition process is continued with deposition of a dielectric layer 806. In at least one example, dielectric layer 806 is blanket deposited on conductive layer 805. In at least one example, dielectric layer 806 has a thickness, $T_2$, between (and inclusive of) 1 nm and 30 nm.

In at least one example, dielectric layer 806 can be doped, e.g., by one or more elements from lanthanide series of periodic table, or one or more elements of 3d, 4d, 5d, 6d, 4f, or 5f series of periodic table. In at least one example, perovskites can be suitably doped to achieve a spontaneous distortion in a range of 0.3% to 2%. In at least one example, in chemically substituted lead titanate such as Zr in Ti site or La, Nb in Ti site, concentration of these substitutes is such that it achieves spontaneous distortion in range of 0.3% to 2%.

In at least one example, dielectric layer 806 has a form ABB'$O_3$, and wherein "A" includes one of: Ba, K, Bi, Y, La, Sc, Ce, Pr, Nd, Pm, Sm, Eu, Gd, Tb, Dy, Ho, Er, Yb, Lu, Li, Bi, K, or Na, wherein "B" includes one of Mn, Fe, Ta, or Nb, and wherein "B'" includes one of: Sc, Ti, V, Cr, Mn, Fe, Co, Ni, Cu, or Zn.

In at least one example, dielectric layer 806 has a form AA'$BO_3$, and wherein "A" includes one of: Ba, K, Bi, Y, La, Sc, Ce, Pr, Nd, Pm, Sm, Eu, Gd, Tb, Dy, Ho, Er, Yb, Lu, Li, Bi, K, or Na, wherein "B" includes one of Mn, Fe, Ta, or Nb, and wherein "A'" includes one of Y, La, Sc, Ce, Pr, Nd, Pm, Sm, Eu, Gd, Tb, Dy, Ho, Er, Yb, Lu, wherein A' comprises a valency of site A, but different ferroelectric polarizability from A.

In at least one example, dielectric layer 806 has a form $ABO_3$, and wherein "A" includes one of: Ba, K, Bi, Y, La, Sc, Ce, Pr, Nd, Pm, Sm, Eu, Gd, Tb, Dy, Ho, Er, Yb, Lu, Li, Bi, K, or Na, wherein "B" includes one of Mn, Fe, Ta, or Nb.

In at least one example, dielectric layer 806 comprises bismuth ferrite (BFO), or BFO with a first doping material, wherein the first doping material is one of lanthanum, elements from lanthanide series of a periodic table, or elements of 3d, 4d, 5d, 6d, 4f, or 5f series of periodic table.

In at least one example, the dielectric layer 806 includes a lead-based perovskite material which includes lead zirconium titanate (PZT) or PZT with a first doping material, wherein the first doping material is one of La or Nb. In at least one example, the non-linear polar material includes non-Pb perovskites that can also be doped, e.g., by La or lanthanides. Non-Pb perovskite material can include one or more of: La, Sr, Co, Cr, K, Nb, Na, Sr, Ru, Y, Fe, Ba, Hf, Zr, Cu, Ta, Bi, Ca, Ti, or Ni. In at least one example, non-Pb perovskite material includes one of: $BaTiO_3$, $KNbO_3$, or $NaTaO_3$.

In at least one example, dielectric layer 806 includes bismuth ferrite (BFO) with a doping material, wherein doping material is one of lanthanum, elements from lanthanide series of a periodic table, or elements of 3d, 4d, 5d, 6d, 4f, or 5f series of periodic table. In at least one example, BFO is doped with Mn or Sc, wherein Mn or Sc achieves a spontaneous distortion in BFO in a range of 0.3% to 2%.

In at least one example, dielectric layer 806 includes a relaxor ferroelectric material. In at least one example, relaxor ferroelectric material is a $BaTiO_3$ (BTO) based relaxor which includes one of: $BaTiO_3$—$Bi(Zn_{1/2}Ti_{1/2})O_3$ (BTO-BZT), $BaTiO_3$—$BiScO_3$ (BTO-BS): $BiScO_3$, $Ba_{(1-x)}Sr_xTiO_3$ (BST), $BaTiO_3$—$Pb(Mg_{1/3}Nb_{2/3})O_3$ (BTO-PMN), $BaTi_{(1-x)}Zr_xO_3$ (BTZ), $BaTiO_3$—$Pb(Zn_{1/3}Nb_{2/3})O_3$ (BTO-PZN), $BaTiO_3$—$Pb(Sc_{1/2}Nb_{1/2})O_3$ (BTO-PSN).

In at least one example, relaxor ferroelectric material is a PZT based relaxor which includes one of: PZT-$Pb(Mg_{1/3}Nb_{2/3})O_3$ (PZT-PMN), PZT-$Pb(Ni_{1/3}Nb_{2/3})O_3$ (PZT-PNN), PZT-$Pb(Zn_{1/3}Nb_{2/3})O_3$ (PZT-PZN), PZT-$Pb(Sc_{1/2}Nb_{1/2})O_3$ (PZT-PSN), PZT-$Pb(Fe_{1/2}Nb_{1/2})O_3$ (PZT-PFN), PZT-$Pb_xLa_{1-x}(Zr_yTi_{1-y})O_3$ (PZT-PLZT), where $0 \le x \le 1$ and where $0 \le y \le 1$, or PZT-$PbTi_{(1-x)}Mn_{(x)}O_3$ (PZT-PTM), where $0 \le x \le 1$.

In at least one example, a relaxor ferroelectric material includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST).

In at least one example, relaxor ferroelectric material is a $SrBi_2Ta_2O_9$ (SBT) based relaxor which includes one of: paraelectric SBT-$SrBi_2(Nb,Ta)_2O_9$ (SBT-SBNT), SBT doped with transition metals such as Mn, Fe, Co, SBT doped with one of: La, Ce or Nd, or SBT doped with one of: Ba or Ca.

In at least one example, dielectric layer 806 includes hexagonal ferroelectrics of a type h-$RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y). In at least one example, dielectric layer 806 includes a hexagonal ferroelectric which includes one of: $YMnO_3$ or $LuFeO_3$.

In at least one example, dielectric layer 806 includes a hafnium oxide of form $Hf_{(1-x)}E_{(x)}O_z$, where 'x' and 'z' are respective compositional fractions, and E includes one of Al, Ca, Ce, Dy, Er, Gd, Ge, La, Sc, Si, Sr, Sn, Zr, or Y.

In at least one example, dielectric layer 806 includes $Al_{(1-x)}Sc_{(x)}N$, $Ga_{(1-x)}Sc_{(x)}N$, $Al_{(1-x)}Y_{(x)}N$, or $Al_{(1-x-y)}Mg_{(x)}Nb_{(y)}N$ where 'x' and 'y' are respective compositional fractions or $Al_{(a)}Mg_{(b)}Nb_{(c)}N$, where a, b, and c are respective compositional fractions.

In at least one example, dielectric layer 806 includes one of: $LiNbO_3$, $LiTaO_3$, $LiTaO_2F_2$, $Sr_{(x)}Ba_{(1-x)}Nb_2O_6$ where $0.32 \le x \le 0.8$, or $KSr_2Nb_5O_{15}$.

In at least one example, non-linear polar material includes one of: Pb(Zr,Sn,Ti)$NbO_3$ (PNZST), $(NH_4)H_2PO_4$(ADP), $La_{0.2}Sr_{0.7}Fe_{12}O_{19}$, $AgBiP_2Se_6$, $CuInP_2S_6$ $CuBiP_2Se_6$ $[Na_{(1-x/2)}La_{(x/2)}][Nb_{(1-y)}Ti_{(y)}]O_3$, $(Ag_{0.90}Ca_{0.05})(Nb_{0.95}Ta_{0.05})O_3$, (1-z)$NaNbO_3$-zBi$(Ni_{1/2}Sn_{1/2})O_3$, (1-z) $Bi_{0.5}Na_{0.5}TiO_3$-z$Ag_{0.91}Sm_{0.03}NbO_3$, 0.90$NaNbO_3$-0.10$BiFeO_3$, (1-z)$NaNbO_3$-zBi$(Zn_{2/3}Nb_{1/3})O_3$, (1-z) $NaNbO_3$-zBi$(Zn_{0.5}Ti_{0.5})O_3$, $Ag_{0.76}La_{0.08}NbO_3$, $Ag_{0.97}Nd_{0.01}Ta_{0.20}Nb_{0.8}O_3$, $Lu_2O_3$ modified $AgNbO_3$, or (La)Pb(Zr,Ti)$O_3$ (Zr-rich), where 'x' is less than or equal to 1, 'y' is less than or equal to 1, and 'z' is less than or equal to 1.

In at least one example, non-linear polar material includes $CsGeX_3$, with bandgap of 1.6 to 3.3 eV, wherein X is a halide, $CuInP_2S_6$, $WTe_2$, $LiOsO_3$, $Ca_3Ru_2O_7$, $In_2Se_3$, SnTe, SnS, SnSe, $MoTe_2$, $Bi_{(1-x)}La_xTi_3O_{12}$, $SrBi_2Ta_2O_9$, $Bi_4Ni_3Ti_{12}$, $Bi_4Na_{0.5}TiO_3$, $CH_3NH_3PbI_3$, $CH_3NH_3PbI_{(3-x)}Cl_x$, $PbZr_{0.2}Ti_{0.8}O_3$, where 'x' is a compositional fraction, $(CH_3(CH_2)_3NH_3)_2(CH_3NH_3)_{n-1}Pb_nI_{3n+1}$, where 'n' is a positive integer, $(Sr_{0.96}La_{0.04})(Zr_{0.90}Ti_{0.10})O_3$, $La_{0.7}Sr_{0.3}MnRu_{0.05}O_3$, $Ca_{0.99}Ce_{0.11}MnO_3$, $H_xSrRuO_3$, $SrRuO_3$, or EuO.

In at least one example, dielectric layer 806 comprises multiple layers, for example, alternating layers of $[Bi_2O_2]2+$, and pseudo-Perovskite blocks ($Bi_4Ti_3O_{12}$ and related Aurivillius phases), with perovskite layers that are 'n' octahedral layers. In at least one example, layered perovskite includes materials comprising a Dion-Jacobson phase, for example a tri-layered material where outer layers comprise an $ABO_3$ described above, and an intervening layer comprising an alkali earth metal, where the composite layer has a formula $M^+A_{(n-1)}B_2O_7$, where n is the number of $ABO_3$ layers.

In at least one example, improper ferroelectric material includes an epitaxial stack of two or more materials. The representation of a form $[A_n/B_n]_m$ is a superlattice which refers to a bilayer including a material 'A' stacked adjacent to a material 'B', where 'n' represents a number of layers of material 'A' and material 'B' in the superlattice, wherein 'n' is at least 1, where 'm' represents a number of bilayers, and where 'm' is at least 1. In at least one example, 'A' comprises one of: $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, wherein 'B' comprises one of: $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, where 'A' is different from 'B'.

In at least one example, improper ferroelectric material includes an epitaxial stack of two or more materials. The representation of a form $[A_n/B_n/Cn]_m$ is a superlattice which refers to a trilayer including material 'A' stacked adjacent to a material 'B', and material 'B' stacked adjacent to a material 'C', where 'n' represents a number of unit cells or layers of material 'A', material 'B', and material 'C' in the superlattice, where m is the number of trilayers, and where 'n' is at least 1, and where is 'm' is at least 1. Numbers 'n' and 'm' can be same or different. In at least one example, 'A', B', and 'C' can each be deposited as 'n' individual layers, where the trilayer includes equal number of layers of materials 'A', B', and 'C'. In at least one example, the stack can be repeated between 1 and 100 times. In at least one example, 'A' comprises one of: $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, where 'B' comprises one of: $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, where 'C' comprises one of: $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$. In at least one example, materials 'A', B', and 'C' are unique. In at least one example, 'A' and 'C' are the same, but different from 'B'.

In at least one example, dielectric layer 806 includes an anti-ferroelectric material. In at least one example, antiferroelectric material may include one of: an antiferroelectric material comprising one of: $HfSiO_2$ doped with >30% Si or >30% Zr; $HfZrO_2$ doped with >30% Si or >30% Zr; $ZrO_2$ or $NaNbO_3$; $NaNbO_3$, $PbZrO_3$, or $PbZrO_3$ doped with >5% K; a first solid solution including one of: $PbTiO_3$, $SrTiO_3$, $PbHfO_3$, $PbHfO_3$, $Pb(Lu_{0.5}Nb_{0.5})O_3$, $Pb(Lu_{0.5}Nb_{0.5})O_3$, $Pb(Yb_{0.5}Nb_{0.5})O_3$, $(AgNa)NbO_3$, $AgNbO_3$, or $NaNbO_3$; or a second solid solution including $PbTiO_3$ and one of: $SrTiO_3$, $PbHfO_3$, $PbHfO_3$, $Pb(Lu_{0.5}Nb_{0.5})O_3$, $Pb(Lu_{0.5}Nb_{0.5})O_3$, $Pb(Yb_{0.5}Nb_{0.5})O_3$, $AgNbO_3$, $NaNbO_3$, $(Na_{0.5}Bi_{0.5})TiO_3$ (NBT).

While various examples here are described with reference to ferroelectric material for storing charge state, at least one example may also be applicable for paraelectric material, anti-ferroelectric material, or a combination of them.

In at least one example, dielectric layer 806 includes $LuFeO_3$ class of materials or super lattice of ferroelectric and paraelectric materials. In at least one example, f-orbital materials (e.g., lanthanides) are doped to ferroelectric material of dielectric layer 806 to make a paraelectric material.

In at least one example, dielectric layer 806 includes a paraelectric material. In at least one example, paraelectric material is a $BaTiO_3$ (BTO) based paraelectric which includes one of: $BaTiO_3$—$Bi(Zn_{1/2}Ti_{1/2})O_3$ (BTO-BZT), $BaTiO_3$—$BiScO_3$ (BTO-BS): $BiScO_3$, $Ba_{1-x}Sr_xTiO_3$ (BST), $BaTiO_3$—$Pb(Mg_{1/3}Nb_{2/3})O_3$ (BTO-PMN), $BaTi_{1-x}Zr_xO_3$ (BTZ), $BaTiO_3$—$Pb(Zn_{1/3}Nb_{2/3})O_3$ (BTO-PZN), $BaTiO_3$—$Pb(Sc_{1/2}Nb_{1/2})O_3$ (BTO-PSN).

In at least one example, paraelectric material is a PZT based paraelectric which includes one of: PZT-$Pb(Mg_{1/3}Nb_{2/3})O_3$ (PZT-PMN), PZT-$Pb(Ni_{1/3}Nb_{2/3})O_3$ (PZT-PNN), PZT-$Pb(Zn_{1/3}Nb_{2/3})O_3$ (PZT-PZN), PZT-$Pb(Sc_{1/2}Nb_{1/2})O_3$ (PZT-PSN), PZT-$Pb(Fe_{1/2}Nb_{1/2})O_3$ (PZT-PFN), PZT-$Pb_xLa_{1-x}(Zr_yTi_{1-y})O_3$ (PZT-PLZT), where $0 \le x \le 1$ and where $0 \le y \le 1$, or PZT-$PbTi_{(1-x)}Mn_{(x)}O_3$ (PZT-PTM), where $0 \le x \le 1$.

In at least one example, paraelectric material is a $SrBi_2Ta_2O_9$ (SBT) based paraelectric which includes one of: SBT-$SrBi_2[Nb_{(1-x)}Ta_{(x)}]_2O_9$ (SBT-SBNT), where $0 \le x \le 1$, SBT doped with transition metals such as Mn, Fe, Co; SBT doped with rare earth ions such as La, Ce, or Nd; or SBT doped with alkaline earth metals with Ba or Ca. In at least one example, room temperature paraelectric materials include: $SrTiO_3$, $Ba_xSr_yTiO_3$, $HfZrO_2$, or Hf—Si—O.

In at least one example, dielectric layer 806 includes an anti-ferroelectric material. In at least one example, antiferroelectric material may include one of: an antiferroelectric material comprising one of: $HfSiO_2$ doped with >30% Si or >30% Zr; $HfZrO_2$ doped with >30% Si or >30% Zr; $ZrO_2$ or $NaNbO_3$; $NaNbO_3$, $PbZrO_3$, or $PbZrO_3$ doped with >5% K;

a first solid solution including one of: $PbTiO_3$, $SrTiO_3$, $PbHfO_3$, $PbHfO_3$, $Pb(Lu_{0.5}Nb_{0.5})O_3$, $Pb(Lu_{0.5}Nb_{0.5})O_3$, $Pb(Yb_{0.5}Nb_{0.5})O_3$, $AgNbO_3$, $AgNb_{0.85}Ta_{0.15}O_3$, $0.75Na_{0.5}Bi_{0.5}TiO_3$-$0.25SrTiO_3$, or $NaNbO_3$; or a second solid solution including $PbTiO_3$ and one of: $SrTiO_3$, $PbHfO_3$, $PbHfO_3$, $Pb(Lu_{0.5}Nb_{0.5})O_3$, $Pb(Lu_{0.5}Nb_{0.5})O_3$, $Pb(Yb_{0.5}Nb_{0.5})O_3$, $AgNbO_3$, or $NaNbO_3$.

In at least one example, process is continued with blanket deposition of a conductive layer 807 on dielectric layer 806. In at least one example, conductive layer 807 includes a conductive ferroelectric oxide. In at least one example, conductive ferroelectric oxide includes one of a non-Pb perovskite metal oxides, such as but not limited to, (La,Sr)$FeO_3$, (La,Sr)$CoO_3$, (La,Ca)$MnO_3$, (La,Sr)$MnO_3$, $SrRuO_3$, $Sr_2RuO_4$, (Ba,Sr)$RuO_3$, $SrMoO_3$, (La,Sr)$MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$ or $CaRuO_3$. In at least one example, conductive layer 805 includes Ir, $Ir_2O_x$, Ru, $RuO_x$, Mo, $MoO_x$, Ta, Cr, Nb, Rh, Ti, W or $WO_x$ or nitrogen doped variants of Ir, $Ir_2O_x$, Ru, $RuO_x$, Mo, $MoO_x$, Ta, Cr, Nb, Rh, Ti, W, conductive doped AlN, or conductive doped SiN. In at least one example, conductive layer 805 includes hexagonal compounds including one or more of $PtCoO_2$, $PdCoO_2$, delafossite structured hexagonal conductive oxides including Al-doped ZnO, spinels including one or more of $Fe_3O_4$, $LiV_2O_4$ or cubic oxides including Indium tin oxide or Sn-doped $In_2O_3$.

In at least one example, conductive layer 807 includes a material that is same or substantially same as material of conductive layer 805. In at least one example, when conductive layers 805 and 807 include same material, multi-layer stack can be substantially symmetric in device voltage/current characteristics. In at least one example, conductive layer 807 is deposited to thickness $T_3$. In at least one example, it is useful for conductive layer 807 to be as thin as possible to facilitate fabrication. In at least one example, thickness $T_3$ is between 3 nm and 30 nm. In at least one example, conductive layer 807 can have a different thickness than conductive layer 805. In at least one example, thickness $T_3$ is substantially equal to thickness $T_1$.

In at least one example, when conductive layer 805 and conductive layer 807 include a same material, multi-layer stack 802 is symmetric. In at least one example, conductive layer 807 can have a different thickness than conductive layer 805. In at least one example, conductive layer 807 is deposited to a thickness, $T_3$, between 3 nm and 30 nm. In at least one example, conductive layer 807 between 3 nm and 30 nm can facilitate patterning process.

In at least one example, as-deposited grain size of conductive layers 805 and 807 and in dielectric layer 806 is less than 15 nm. Grain size refers to an average length of longest dimension of a grain within conductive layers 805 and 807.

In at least one example, deposition process to form multi-layer stack 802 continues with formation of dielectric layer 114 on conductive layer 807. In at least one example, dielectric layer 114 is blanket deposited by a CVD or PVD process. In at least one example, dielectric layer 114 includes a material that has a favorable bond adhesion affinity to material of dielectric layer 116 (FIG. 7A).

In at least one example, dielectric layer 114 is deposited on conductive layer 807 by a PVD, an ALD, PECVD, or a plasma enhanced atomic layer deposition (PEALD) process. In at least one example, dielectric layer 114 and dielectric layer 116 (FIG. 7A) include a same material. In at least one example, a same material can facilitate bonding process.

In at least one example, deposition process also includes formation of a capping layer on conductive layer 807 prior to deposition of dielectric layer 114. In at least one example, capping layer is blanket deposited by a CVD or a PVD process. In at least one example, capping layer includes a material that has a favorable etch selectivity compared to ferroelectric materials in multi-layer stack 802. In at least one example, capping layer includes a conductive material that is different from conductive material of ferroelectric material.

In at least one example, point defects in dielectric layer 806, and in conductive layers 805 and 807 post deposition but prior to anneal can be greater than 1e22 atoms/$cm^3$. In at least one example, a post deposition anneal can reduce point defects by at least an order of magnitude. In at least one example, point defects in dielectric layer 806, conductive layers 805 and 807, post anneal, can have a defect density of less than 1e20 atoms/$cm^3$.

In at least one example, a post deposition anneal process is formed after deposition of multi-layer stack 802. A post deposition anneal (PDA) may be characterized by an anneal after deposition process, in contrast to an in-situ anneal which takes place during deposition. In at least one example, PDA can take place after deposition of all layers in multi-layer stack 802, or at least after dielectric layer has been deposited. In illustrative example, a PDA is performed after completing deposition of multi-layer stack 802.

In at least one example, anneal temperatures can be as high as 1300 degrees Celsius, where anneal durations are limited to less than or equal to 60 seconds. In at least one example, specific temperature, and time duration are dependent on annealing technique utilized. Because multi-layer stack 802 is deposited on substrate 803 in absence of any transistors, metallurgical reaction between gate dielectric layer and gate electrode can be prevented, in at least one example.

In at least one example, post deposition anneal can include a rapid thermal annealing process, wherein the rapid thermal annealing process comprises heating to a temperature of more than 700 degrees Celsius, for a time duration between 1 s and 60 s, at a pressure range between vacuum and 760 Torr. In at least one such example, the rapid thermal annealing process further comprises flowing oxygen, nitrogen, or argon gas while operating at the pressure range between vacuum and 760 Torr.

In at least one example, post deposition anneal can include a rapid thermal processing or rapid thermal annealing (RTP/RTA) that can be performed at temperatures above >1000 degrees Celsius. In at least one example, duration of anneal is on order of a minimum of a few seconds. In at least one example, PDA includes a flash anneal process. In at least one example, flash and laser anneal is performed at temperatures above 1001 C. In at least one example, flash and laser anneal can include spot heating or beam rastering for increased throughput. In at least one example, processing pressures range from 1 Torr to 760 Torr while flowing in $O_2$, $N_2$, or Argon gases, or in air. In at least one example, flash anneal processes are carried out in vacuum at pressure less than 1 Torr. In at least one example, processing temperatures range from 500 degrees Celsius to 1300 degrees Celsius, where heating and cooling rate is approximately $10^6$ degrees C./s. In at least one example, processing times/cycle is 10 ms or less, where number of cycles can be up 100.

In at least one example, after smoothing surface 114A of dielectric layer 114 an implantation process (denoted by arrows 809) can be performed in preparation for bonding with wafer 710 (FIG. 7B). In at least one example, dielectric layer 114 comprises a thickness $T_4$ that is at least 2 nm.

In at least one example, an additional layer is deposited above conductive layer 807. FIG. 8B illustrates a cross section of a wafer 800B. In at least one example, wafer 800B includes a multi-layer stack 810 that includes an electrode layer 811. In at least one example, multi-layer stack 810 is designed for implementation to fabricate capacitor 152 and electrode 156 (FIG. 1I). In at least one such example, electrode layer 811 is designed to be patterned into a plate electrode. In at least one example, dielectric layer 114 is deposited on electrode layer 811 in preparation for bonding. In at least one example, electrode layer 811 includes a material that is the same or substantially the same as the material of electrode 156. In at least one example, electrode layer 811 includes a material that is different from a material of conductive layer 807.

In at least one example, electrode layer 811 includes a conductive ferroelectric oxide. In at least one example, conductive ferroelectric oxide includes one of a non-Pb perovskite metal oxides, such as but not limited to, (La,Sr)$FeO_3$, (La,Sr)$CoO_3$, (La,Ca)$MnO_3$, (La,Sr)$MnO_3$, $SrRuO_3$, $Sr_2RuO_4$, (Ba,Sr)$RuO_3$, $SrMoO_3$, (La,Sr)$MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_7$, or $CaRuO_3$. In at least one example, when electrode layer 811 includes a conductive ferroelectric oxide, the conductive ferroelectric oxide includes a material that is different from a material of conductive layer 807.

In at least one example, electrode layer 811 includes Ir, $Ir_2O_x$, Ru, $RuO_x$, Mo, $MoO_x$, Ta, Cr, Nb, Rh, Ti, W or $WO_x$, or nitrogen doped variants of Ir, $Ir_2O_x$, Ru, $RuO_x$, Mo, $MoO_x$, Ta, Cr, Nb, Rh, or Ti. In at least one example, conductive layer 805 includes hexagonal compounds including one or more of $PtCoO_2$, $PdCoO_2$, delafossite structured hexagonal conductive oxides including Al-doped ZnO, spinels including one or more of $Fe_3O_4$, $LiV_2O_4$, or cubic oxides including indium tin oxide or Sn-doped $In_2O_3$.

In at least one example, electrode layer 811 includes a nitride of a refractory metal such as TiAlN with greater than 30 atomic percent AlN; TaN with greater than 30 atomic percent N; TiSiN with greater than 20 atomic percent SiN; tantalum carbide (TaC), titanium carbide (TiC); tungsten carbide (WC); tungsten nitride (WN); carbonitrides of Ta, Ti, W, i.e., TaCN, TiCN, WCN; titanium monoxide (TiO or $Ti_2O$); tungsten oxide ($WO_3$); tin oxide ($SnO_2$); indium tin oxide (ITO); iridium oxide ($IrO_2$); indium gallium zinc oxide (IGZO); zinc oxide or METGLAS series of alloys, e.g., $Fe_{40}Ni_{40}P_{14}B_6$.

Referring collectively to FIGS. 7B, 8A, and 8B, in at least one example, dielectric layers 114 and 116 are deposited to thicknesses that are sufficient to be planarized. In at least one example, planarization processes may be implemented to minimize interfacial voids after bonding and to reduce mechanical stress that can lead to delamination in downstream operations. In at least one example, dielectric layers 114 and 116 include a same material. In at least one example, a same material can be planarized to produce substantially similar surfaces 114A and 116A. In at least one example, a wet chemical treatment can be performed to smoothen surface 116A and/or remove residue generated from planarization process. In at least one example, wet chemical treatment can smoothen by removing microscopic irregularities present on surface 116A. In at least one example, surfaces 116A and 114A can be prepared for bonding after planarization (and optionally after process to smoothen surfaces 116A and 114A). In at least one example, same or substantially same methods of surface preparation can be implemented when dielectric layers 114 and 116 are the same or substantially the same.

In at least one example, after performing operation to smoothen surfaces 114A and 116A, an implantation process or a plasma activation process (denoted by arrows 706 and 809) can be performed in preparation for bonding. In at least one example, bonding technique utilizes a surface activated bonding (SAB) method. In at least one example, preparation includes performing Ar fast atom bombardment (Ar-FAB) or plasma activation. In at least one example, plasma activation further utilizes oxygen and/or nitrogen. In at least one example, plasma activation can affect bond strength through the formation of dangling bonds on bonding surfaces 116A and 114A. In at least one example, a wet chemical treatment, including deionized water, can be implemented to clean surfaces 114A and 116A immediately pre-bonding after the plasma activation process.

In at least one example, in the absence of layer 804, formation of multi-layer stack 802 includes blanket deposition of conductive layer 805 on substrate 803. In at least one such example, dielectric layer 114 is deposited after formation of multi-layer stack 802. In at least one example, dielectric layer 114 comprises a thickness $T_4$ that is at least 2 nm.

Figure 9:
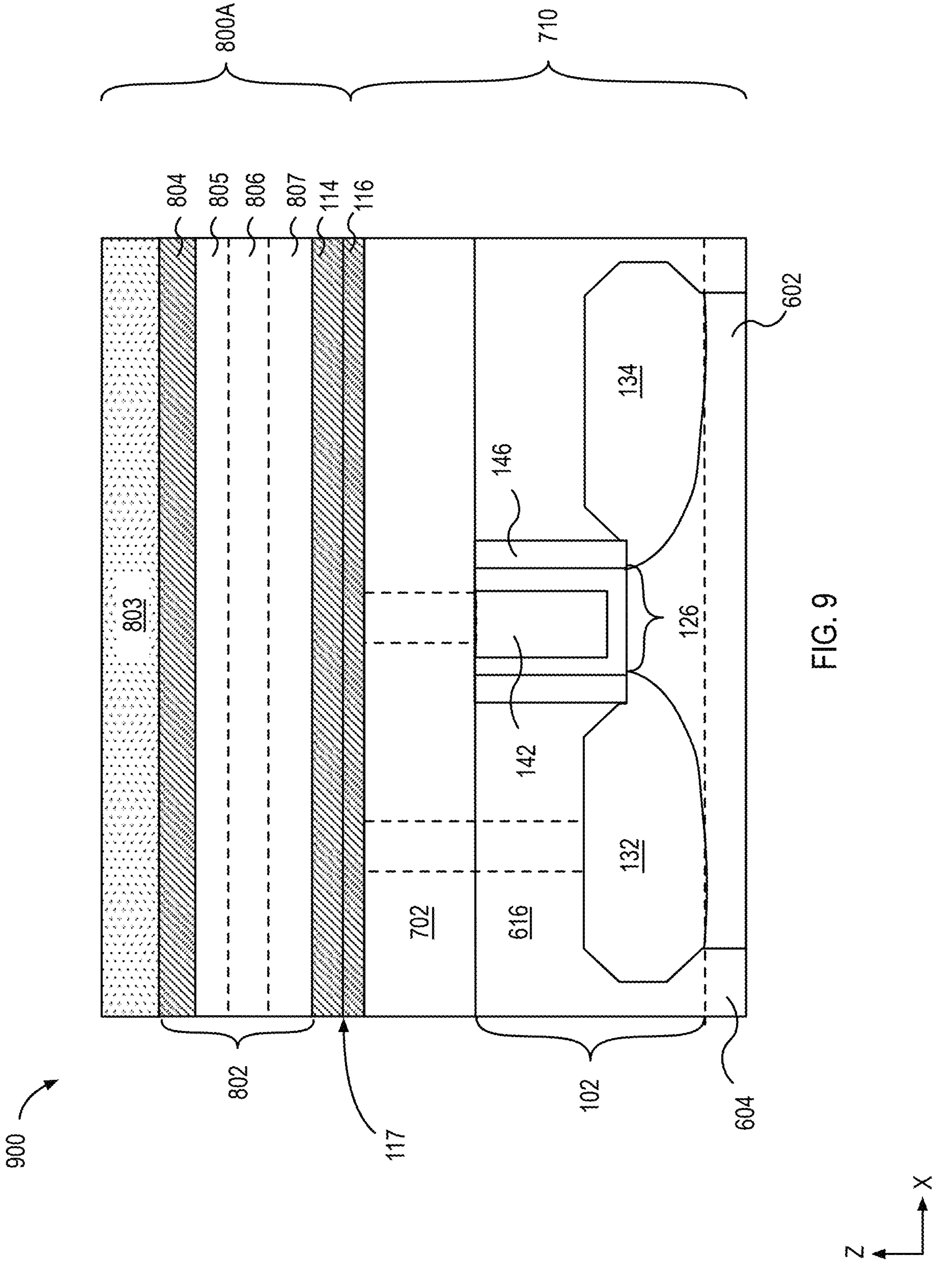
FIG. 9 illustrates a cross-section of a structure following a process to bond wafers illustrated in FIG. 7B and FIG. 8A, in at least one example.

FIG. 9 illustrates a cross-section of a structure 900. In at least one example, structure 900 is a cross-sectional illustration following process to bond wafer 710 and wafer 800A illustrated in FIG. 7B and FIG. 8A, respectively. In at least one example, the bonding process, brings into contact surface 114A into contact with surface 116A and forms an interface 117. In at least one example, process of bonding dielectric layer 114 and dielectric layer 116 can be useful because wafer 710 can have features that have different temperature tolerances from wafer 800A, as discussed above. In at least one example, wafer 710 and wafer 800A can separately undergo thermal treatment at substantially different process temperatures prior to bonding process. In at least one example, the difference in process temperature experienced by wafer 800A compared to wafer 710 can be greater than as 3:2.

In at least one example, during the bonding process, where dielectric layers 114 and 116 include at least silicon and oxygen, dangling bonds and bonds between hydroxyl groups and water molecules can be formed. In at least one such example, Van der Waals forces can enable bonding between hydrogen contained in a few monolayers of water molecules, and polar OH groups that can terminate on surfaces 114A and 116A. In at least one example, bonding process is performed at room temperature, but structure 900 comprising wafer 710 and wafer 800A bonded together may be annealed at higher temperatures for a short time period to increase bond strength. In at least one example, the short time period can be at least 60 s at temperatures of at least 200 degrees Celsius, in a pulsed mode. In at least one example, bonding process is performed at atmospheric pressure.

In at least one example, dielectric layers that do not include a same material such as silicon oxide and silicon nitride can be bonded together by plasma activation. In at least one example, different surface treatments may be performed on different materials during the plasma activation process performed prior to bonding. In at least one example, annealing temperatures implemented when different dielectric materials are bonded may be different from annealing temperatures utilized for bonding same or similar materials.

In at least one example, one or more materials utilized in bonding process may form an interface 117 between dielectric layer 114 and dielectric layer 116. In at least one example, when there are slight differences between material of dielectric layers 114 and 116 interface 117 may be present across the entire structure 900. In at least one example, traces of materials other than that of dielectric layer 114 and dielectric layer 116 may be present at interface 117.

Figure 10A:
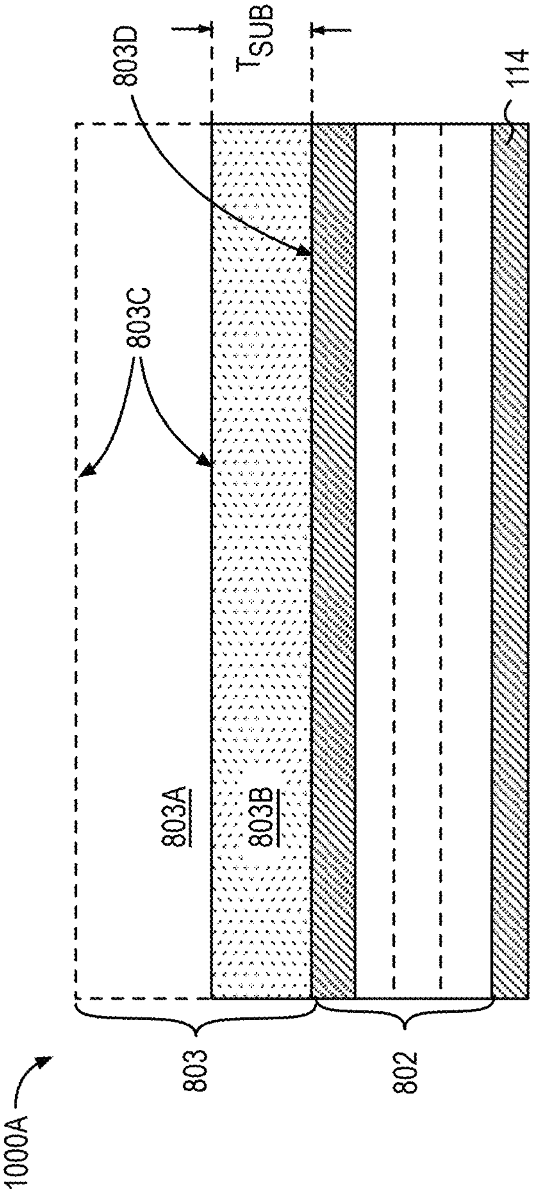
FIG. 10A illustrates a cross-section of a portion of the structure in FIG. 9 following a process to remove a portion of the first substrate, in at least one example.

FIG. 10A illustrates a cross-section of a structure 1000A. In at least one example, structure 1000A is a cross-sectional illustration of structure 900 in FIG. 9 following process to remove at least a portion of substrate 803, in at least one example. For clarity, wafer 800A is illustrated, and layers below dielectric layer 114 are not illustrated. An outline of substrate 803 prior to any processing is indicated by dashed lines. In at least one example, a portion of substrate 803 (indicated by dashed lines) can be removed by a process of wafer thinning. In at least one example, for substrate 803 including silicon and having a diameter of 300 mm, wafer thinning can include a mechanical process, such as mechanical grinding.

In at least one example, mechanical grinding process can include a combination of rough and fine grinding. In at least one example, mechanical grinding process includes utilizing a coarse rotating diamond pad that is brought into contact with a surface 803C of substrate 803. In at least one example, coarse rotating diamond pad can perform rough grinding and remove at least 300 microns of substrate 803. In at least one example, a fine rotating diamond pad is brought into contact with planarized surface 803C. In at least one example, fine rotating diamond pad can perform fine grinding and remove less than 100 microns of substrate 803. In at least one example, a portion 803A of substrate 803 is removed by mechanical grinding process including a combination of coarse and fine grinding. In at least one example, mechanical grinding process leaves portion 803B of substrate 803. In at least one example, portion 803B has a thickness $T_{SUB}$, as measured from a surface 803D to surface 803C, where thickness $T_{SUB}$ can be less than 100 microns. In at least one example, portion 803B can be removed by an additional mechanical process, a plasma etch process, a wet chemical etch process or a combination thereof.

Figure 10B:
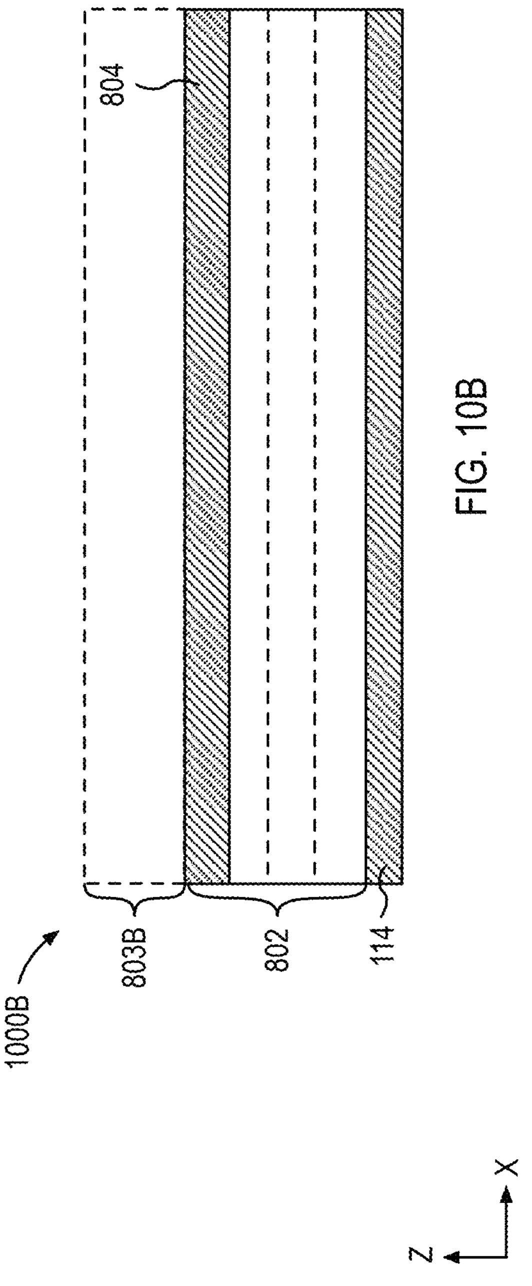
FIG. 10B illustrates a cross-section of a portion of the structure in FIG. 10A following a process to remove the first substrate, in at least one example.

FIG. 10B illustrates a cross-section of a structure 1000B. In at least one example, structure 1000B is a cross-sectional illustration of structure 1000A in FIG. 10A following process to remove portion 803B. In at least one example, additional mechanical processes can include chemical mechanical planarization (CMP). In at least one example, a CMP process can be utilized to selectively remove portion 803B relative to layer 804 of multi-layer stack 802. In at least one example, where substrate 803 includes crystalline silicon, a plasma etch process including gaseous compounds, that include species such as Cl, Br, or F, can be utilized to etch silicon. In at least one example, selectivity to layer 804 can be obtained by adding oxygen into the gaseous mixture. In at least one example, a wet chemical compound including TMAH, or a mixture of hydrofluoric acid, nitric acid, and acetic acid (HNA) may be utilized to etch portion 803B that includes silicon. In at least one example, a combination of plasma etch, and wet chemical etch may be utilized to remove portion 803B. In at least one example, a CMP process may be utilized to remove a first portion of portion 803B, and plasma etch and/or wet chemical etch may be utilized to remove a remaining second portion of portion 803B. After removal of portion 803B, wafer 800A illustrated in FIG. 10B can be further processed to fabricate capacitors, as will be discussed below. In at least one example, the method to remove a substrate after the bonding process can include implanting through a top surface of the bonded substrate, as is discussed in FIGS. 11A-12.

FIG. 11A illustrates a cross-section of a structure 1100A. In at least one example, structure 1100A is a cross-sectional illustration of structure 1000A in FIG. 10A following process to perform ion implantation into portion 803B. In at least one example, ion implantation process (indicated by arrows 1102) includes implanting ions 1104 such as hydrogen or helium into portion 803B. In at least one example, ions 1104 are implanted through surface 803C. In at least one example, performing ion implantation process comprises using an ion energy (or a range of ion energies) that can target dopant implantation at depth $D_S$ away from surface 803D. As shown, surface 803D is at an interface between multi-layer stack 802 and substrate 803. In at least one example, ions 1104 can penetrate depth $D_S$, that is at least 100 nm.

In at least one example, after ion implantation process, a thermal anneal may be performed to activate or move implanted ions. In at least one example, thermal anneal can be performed at temperatures that are less than 400 degrees Celsius. In at least one example, ion implantation and thermal anneal are performed within a same process chamber. In at least one example, thermal anneal is different from thermal anneal that is performed after deposition of multi-layer stack 802. In at least one example, thermal anneal process performed after deposition of multi-layer stack 802 is designed to crystalize layers within multi-layer stack 802 and may be referred to as crystallization anneal. In at least one example, crystallization anneal can be performed at temperatures as much as 450 degrees Celsius. In at least one example, ion implantation causes lattice dislocations within portion 803B. In at least one example, lattice dislocations are produced in a vicinity of ions 1104.

FIG. 11B illustrates a cross-section of a structure 1100B. In at least one example, structure 1100B is a cross-sectional illustration of structure 1100A in FIG. 11A following process to split portion 803B. In at least one example, splitting portion 803B comprises mechanically tapping or imparting a mechanical force to a sidewall (along z-direction) of portion 803B. In at least one example, a sidewall of portion 803B is tapped by a wafer cleaver creating physical breakage of portion 803B, where the breakage propagates along the x-direction.

In at least one example, breakage occurs at positions of ion implantation within portion 803B. In at least one example, the positions of ion implantation extends substantially along the x-axis. In at least one example, portion 803B is split into portions 803E and 803F, where portion 803F is connected to layer 804. In at least one example, where lattice dislocations are spread over an infinitesimal thickness along the z-direction, the breakage creates portions 803E and 803F having surfaces that are not smooth, as illustrated in a structure 1200 of FIG. 12. In at least one example, surface 803G and surface 803H are jagged, as shown. In at least one example, the extent of jaggedness or non-uniformity (between crest and trough) in surfaces 803G and 803H can be in the range of 10 nm to 1000 nm. In at least one example, the process to cleave substrate 803 includes heating wafer 800A to temperatures of at least 300 degrees Celsius. In at least one example, temperatures can range between (inclusive of) 400 and 500 degrees Celsius.

Referring again to FIG. 11B, in at least one example, portion 803E is mechanically lifted and removed after the breakage process. In at least one example, portion 803F may be removed by a process described above in association with FIG. 10B. In at least one example, a CMP, a plasma etch, a wet chemical process, or a combination thereof may be used to remove portion 803F.

While the implant and cleaving or breakage process followed by a CMP and/or etch process can be utilized to remove substrates, in at least one example, as much of substrate 803 as possible may be removed without performing a mechanical grinding process. In at least one example, implantation depth of ions 1104 may be controlled. In at least one example, it may be useful to implant ions 1104 closer to surface 803D of substrate 803. In at least one such example, a greater portion of original wafer (such as wafer 800A) may be removed by mechanically tapping and remaining portion, such as portion 803F, may be removed by the one or more process described above.

In at least one example, implanting ions 1104 closer to surface 803D can also inadvertently cause hydrogen to diffuse into electrode material such as layer 805. In at least one example, an additional layer can be formed between substrate 803 and multi-layer stack 802 prior to bonding, as is discussed below.

Figure 13B:
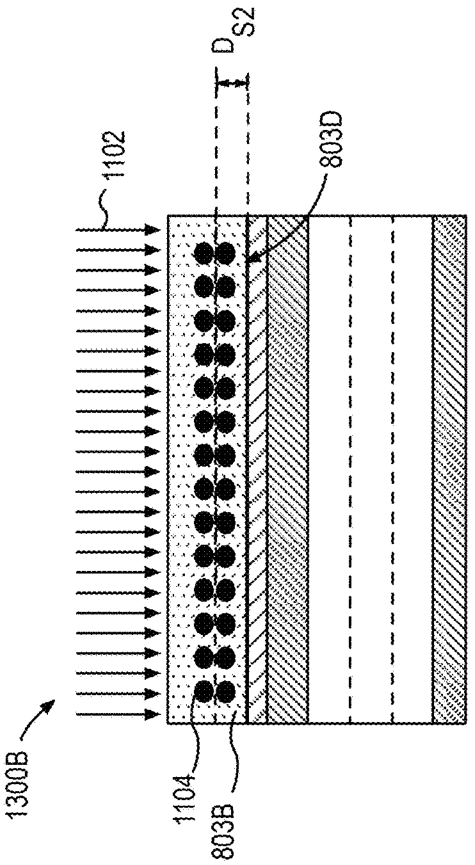
FIG. 13B illustrates a cross-section of structure in FIG. 13A following process to perform ion implantation into portion of a substrate, in at least one example.
Figure 13D:
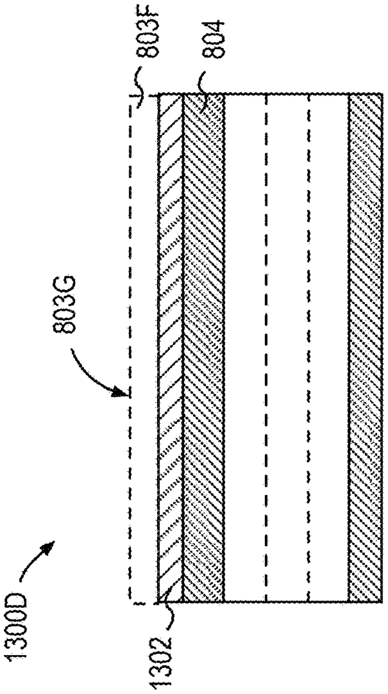
FIG. 13D illustrates a cross-section of structure in FIG. 13C following process to remove the substrate selectively to the implant barrier layer, in at least one example.
Figure 13A:
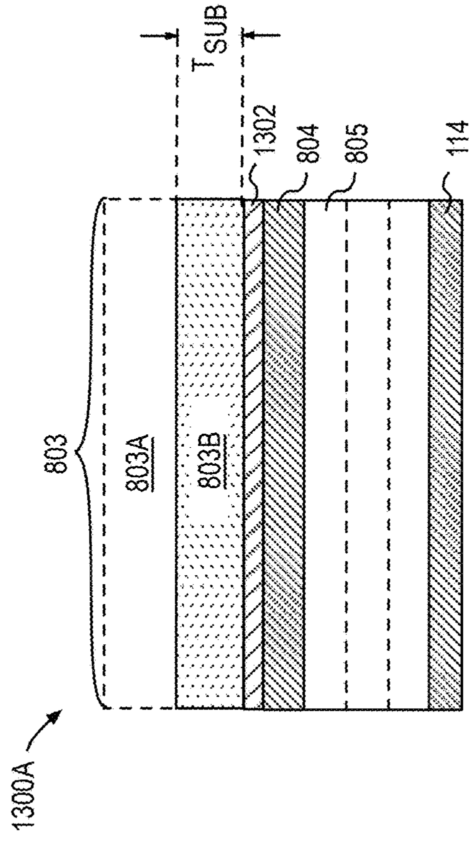
FIG. 13A illustrates a cross-section of a wafer that includes an implant barrier layer between the substrate and a multi-layer stack for forming a capacitor, in at least one example.

FIG. 13A illustrates a cross section of a wafer 1300A that includes one or more properties of wafer 800A described in association with FIG. 8A. Transistor is not shown in the illustration for clarity. In at least one example, wafer 1300A includes a layer 1302 formed above substrate 803 or between layer 804 and substrate 803. In at least one example, layer 1302 can be a dielectric or a conductor. In at least one example, layer 1302 can act as an implant barrier. In at least one example, layer 1302 can remain as part of the capacitor or be removed during the fabrication process.

In at least one example, where layer 1302 is a conductor, layer 1302 can be used as a mask for patterning and forming capacitors. In at least one example, layer 804 may be latticed matched with layer 1302, where layer 804 and layer 1302 are conductors. In at least one example, layer 1302 includes a conductor such as titanium, tantalum, or nitrides of tantalum or titanium, iridium, ruthenium, or compound including titanium, aluminum, and nitrogen. In at least one example, layer 1302 may be a conductive hydrogen barrier material. In at least one example, where layer 1302 is an insulator, layer 1302 can be removed during or after the process to form capacitors.

In at least one example, after deposition of layer 1302, layers within multi-layer stack 802 can be blanket deposited as described above (FIG. 8A). In at least one example, multi-layer stack 802 is capped by dielectric layer 114. In at least one example, the method utilized to remove portion 803A (within dashed lines) is the same or substantially the same as the process described above (FIG. 10A). In at least one example, remaining portion 803B has a thickness $T_{SUB}$ that is less than 100 microns. In at least one example, $T_{SUB}$ that is less than 10 microns.

FIG. 13B illustrates a cross-section of a wafer 1300B. In at least one example, wafer 1300B is a cross-sectional illustration of wafer 1300A in FIG. 13A following process to perform ion implantation into portion 803B, in at least one example. In at least one example, the method utilized to implant ions 1104 is substantially the same as the process described above (FIG. 11A). In at least one example, implementing layer 1302 can be useful as higher implant energies can be utilized to obtain ion penetration depth $D_{S2}$ of at least 100 nm from surface 803D. In at least one example, there may be differences in targeted ion penetration depth depending on whether the ion implant species includes hydrogen or helium.

Figure 13C:
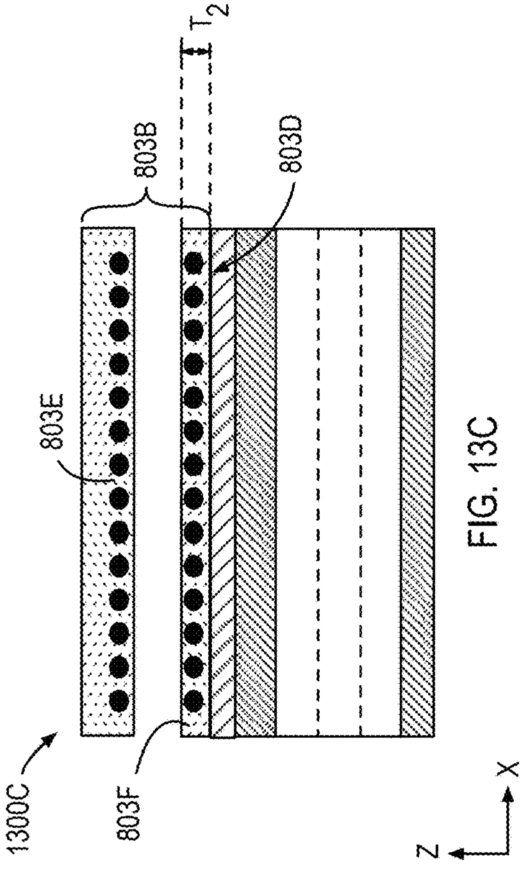
FIG. 13C illustrates a cross-section of structure in FIG. 13B following process to cleave the portion of substrate sub into further portions, in at least one example.

FIG. 13C illustrates a cross-section of a wafer 1300C. In at least one example, wafer 1300C is a cross-sectional illustration of wafer 1300B in FIG. 13B following process to cleave portion 803B into portions 803E and 803F, in at least one example. In at least one example, the method to cleave portion 803B is the same or substantially the same as the method described above (FIG. 11B). In at least one example, portion 803F has thickness $T_2$ that can be less than half a thickness of portion 803E because the implanted ions are closer to surface 803D. In at least one example, thickness $T_2$ can be substantially close to 500 nm or less.

FIG. 13D illustrates a cross-section of a wafer 1300D. In at least one example, wafer 1300D is a cross-sectional illustration of wafer 1300C in FIG. 13C following process to remove portion 803F selectively to layer 1302, in at least one example. In at least one example, a wet chemical process may be utilized to remove portion 803F (within dashed lines). In at least one example, a combination of plasma etch, and a wet chemical process may be utilized to remove portion 803F. In at least one example, a CMP process may be utilized to smoothen surface 803G of portion 803F prior to utilizing a plasma etch or wet chemical etch. After removal of portion 803F, wafer 1300D can be processed to fabricate capacitors. In at least one example, layer 1302 may be removed prior to forming a mask on layer 804.

In at least one example, ion implantation process can be performed prior to deposition of multi-layer stack utilized to fabricate capacitors as discussed in association with FIGS. 14A-14B.

FIG. 14A illustrates a cross section of a structure 1400A. Structure 1400A illustrates process of ions implanting into substrate 803, in at least one example. In at least one example, ion implantation (denoted by arrows 1102) is performed by a process that is the same or substantially the same as the process described above (FIG. 11B). In at least one example, ions 1104 are implanted into substrate 803 through surface 803D. In at least one example, surface 803D is a front surface on which deposition is performed in one or more downstream operations. In at least one example, ions 1104 are implanted to depth $T_3$, as measured from surface 803D, where depth $T_3$ is at least 100 nm.

FIG. 14B illustrates a cross-section of a structure 1400B. In at least one example, structure 1400B is a cross-sectional illustration of structure 1400A in FIG. 14A following process to deposit multi-layer stack 802 on substrate 803, in accordance with at least one example. In at least one example, the process to deposit multi-layer stack 802 is described above (FIG. 8A). In at least one example, multi-layer stack 802 is deposited on surface 803D. In at least one example, multi-layer stack 802 includes layers to form capacitor 106 (FIG. 1A) or capacitor 152 and electrode 156 (FIG. 1I). In at least one example, dielectric layer 806 includes a non-linear polar material described above. In at least one example, dielectric layer 114 is blanket deposited on multi-layer stack 802. In at least one example, structure 1400B may be wafer or a die. In at least one example, structure 1400B is a wafer 1402, where wafer 1402 is bonded with wafer 710 (FIG. 7B) to form capacitors. In at least one example, bonding process utilized is the same or substantially the same as the process described to bond wafer 800A with wafer 710 (FIG. 7B). In at least one example, after bonding, substrate 803 is removed by processes described above (FIG. 11B or 13C).

In at least one example, prior to bonding, a crystallization anneal is performed of wafer 1402. In at least one example, crystallization anneal is performed at temperatures of at least 400 degrees Celsius but can reach temperatures as much as 800 degrees Celsius. In at least one example, crystallization anneal can create dislocations in the vicinity of ions 1104. In at least one example, crystallization anneal does not adversely impact an interface 1403 between substrate 803 and layer 804. In at least one example, some dislocations can propagate towards interface 1403 during crystallization anneal and a secondary anneal of substrate 803 post cleaving may not be performed during a downstream processing operation. In at least one example, cleaving may be performed along dashed line 1401.

Figure 15:
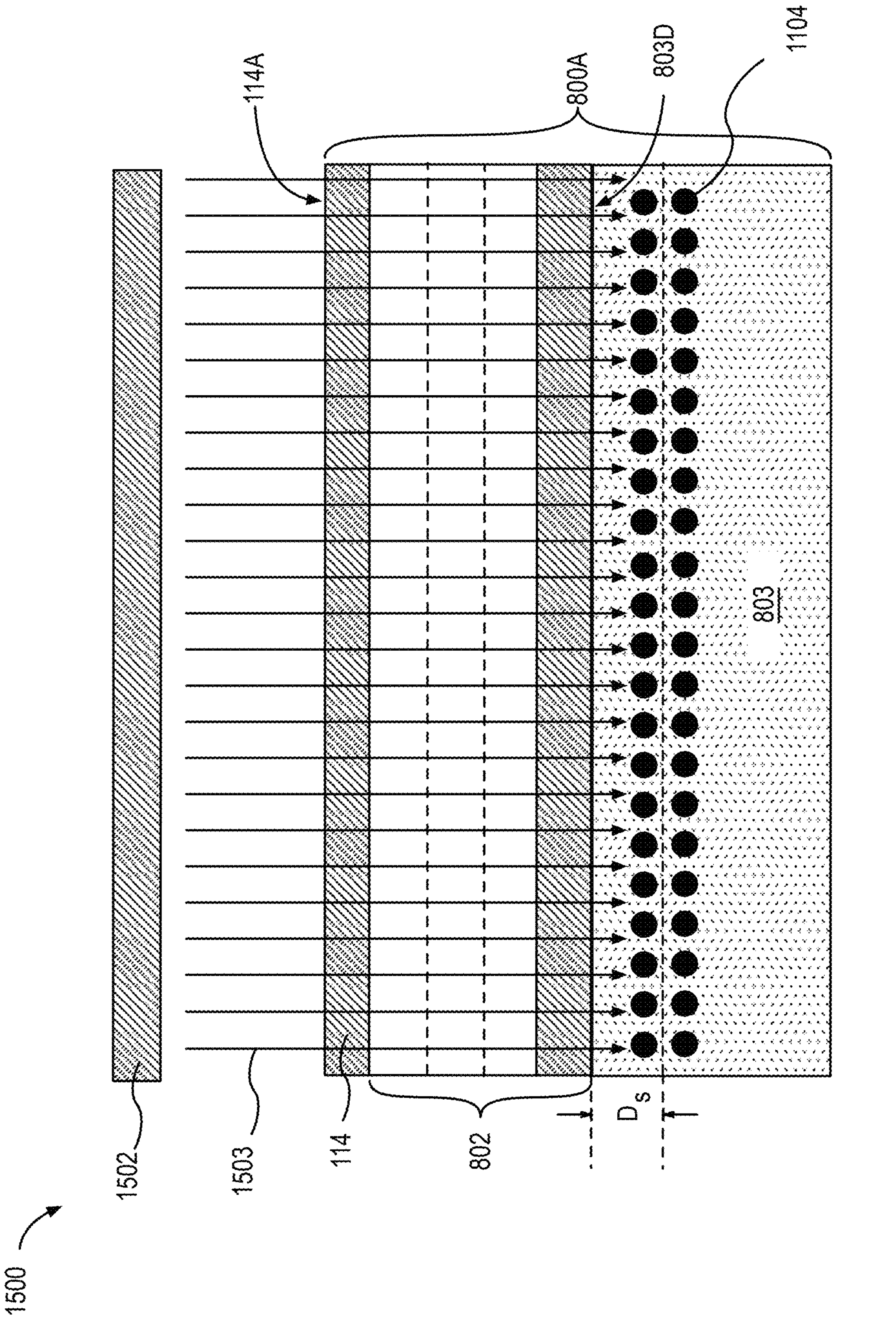
FIG. 15 illustrates process of ions implanting through dielectric layer and multi-layer stack into a substrate, in at least one example.

FIG. 15 illustrates a cross-section of a structure 1500. In at least one example, FIG. 15 illustrates process of ions implanting through dielectric layer 114 and multi-layer stack 802 into substrate 803, in at least one example. In at least one example, wafer 800A is inserted into an ion implanter with dielectric layer 114 facing towards an ion energy source 1502. In at least one example, ion implantation process accelerates ions 1104 (indicated by arrows 1503) toward surface 114A, where ions 1104 transmit through dielectric layer 114 and multi-layer stack 802. In at least one example, ions 1104 include helium, as helium is not known to reduce remnant polarization hysteresis or cause fracture of dielectric layer 806. In at least one example, implantation process utilizes an ion energy sufficient to penetrate substrate 803 after passing through dielectric layer 114 and multi-layer stack 802. In at least one example, ion energy is tuned depending on thickness and constituents of multi-layer stack 802. In at least one example, ions 1104 are targeted to reach a depth $D_S$, within substrate 803, relative to surface 803D. In at least one example, depth $D_S$ can be at least 1000 nm. In at least one example, ion implantation can take place before annealing wafer 800A.

In at least one example, after ion implantation, wafer 800A can be bonded with wafer 710 (FIG. 9). In at least one example, the bonding process can include heating wafers 710 and 800A to room temperature, for example between 20 and 25 degrees Celsius. In at least one example, implant-explode process described above (FIGS. 11B and 13C) may be carried out to split out a portion of substrate 803 before further process fabrication is carried out, for example patterning multi-layer stack 802 to form capacitors.

Figure 16:
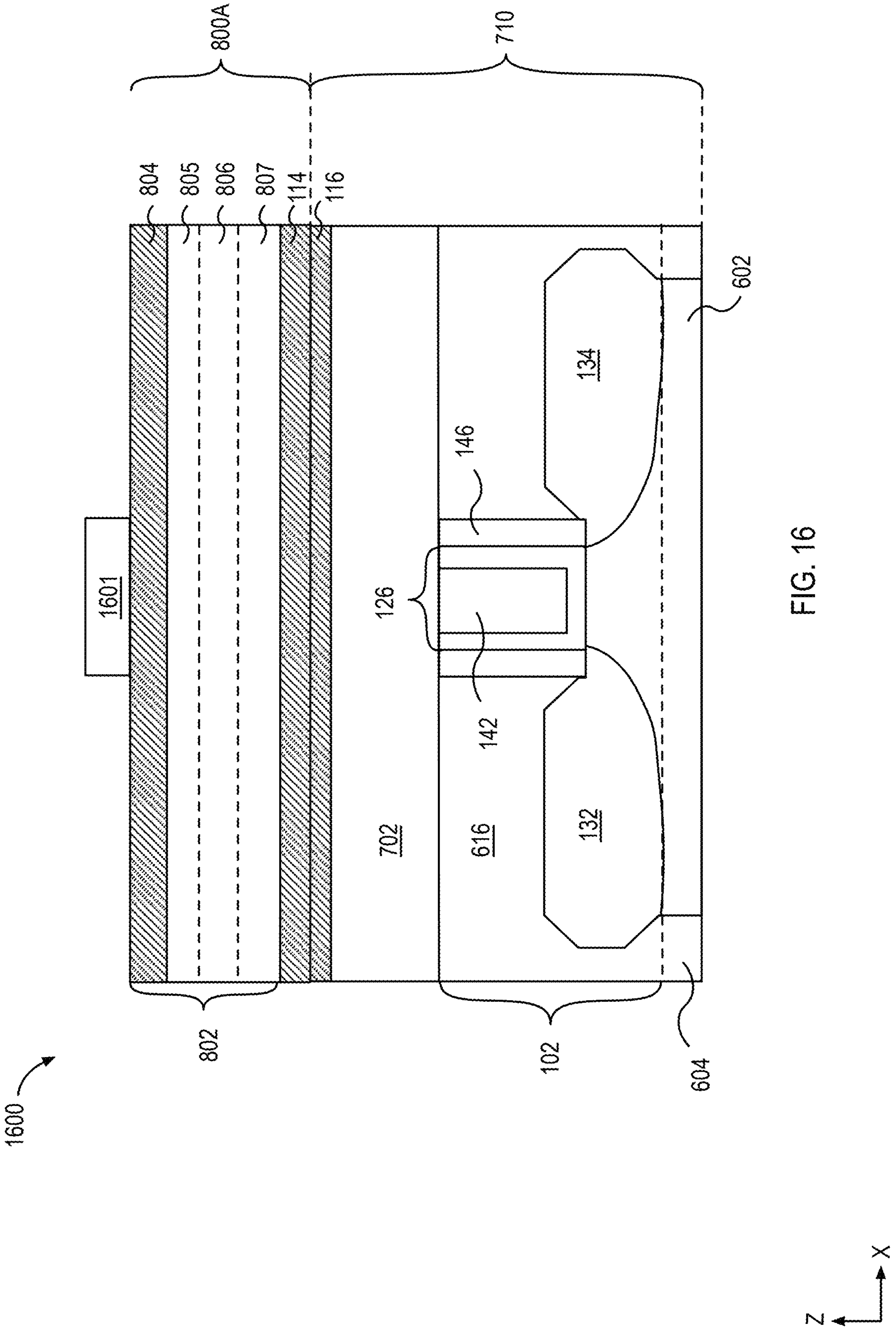
FIG. 16 illustrates a cross-section of the structure in FIG. 9 following process to remove the substrate and form a mask, in at least one example.

FIG. 16 illustrates a cross-section of a structure 1600. Structure 1600 illustrates a cross-section of structure 900 in FIG. 9 following process to remove substrate 803 and form a mask 1601, in at least one example. In at least one example, substrate 803 is removed by mechanical process or implant and cleaving process described in association with FIGS. 10A-15. Referring again to FIG. 16, in at least one example, layer 804 is a bilayer, where an upper layer is a dielectric or insulator, and a lower layer includes a conductive material. In at least one example, CMP process removes insulator and leaves conductive material.

To define an effective size of the dielectric of a capacitor, in at least one example, mask 1601 is formed on layer 804. In at least one example, mask 1601 is designed to pattern multi-layer stack 802 and form a capacitor. In at least one example, the shape and size of mask 1601 depends on a process flow adopted to pattern and form a capacitor. In least one example, the shape and size of mask 1601 depends on the layers within multi-layer stack 802. In at least one example, part of the capacitor that defines an effective size of the dielectric is first formed and then a plate electrode having a greater plan view area is patterned next. In at least one example, two masking processes are utilized to fabricate a single capacitor, as will be discussed below.

FIG. 17A illustrates a cross-section of a structure 1700A. In at least one example, structure 1700A is a cross-section of structure 1600 in FIG. 16 following process to etch multi-layer stack 802 and form a partial capacitor structure 1704, in at least one example. In at least one example, conductive layer 807 which extends in the X-Y plane will be patterned into a plate with finite dimensions in a downstream operation. Formation of plate electrode constitutes fabrication of an isolated capacitor. In at least one example, a plasma etch process is utilized. In at least one example, plasma etch process may include a discharge produced by a magnetic enhanced reactive ion etching mechanism, an electron cyclotron resonance discharge or an inductively coupled plasma discharge.

Referring collectively to FIGS. 16 and 17A, in at least one example, plasma etch process etches layer 804 to form a hardmask 1702. In at least one example, hardmask 1702 may be consumed during plasma etch process or can be removed after etching multi-layer stack 802. In at least one example, plasma etch process utilizes hardmask 1702 to mask and etch conductive layer 805 to form electrode 110. In at least one example, dielectric layer 806 is etched to form dielectric 108. In at least one example, conductive layer 807 is not etched.

In at least one example, a sidewall 1704A of partial capacitor structure 1704 can be substantially vertical with respect to a surface 807A, as shown. In at least one example, sidewall 1704A is tapered as indicated by dashed lines 1709. In at least one example, sidewall 1704A is curved as indicated by dashed lines 1711. In at least one example, hardmask 1702 can have a curved upper surface.

In at least one example, an over etch can be performed during plasma etching to adequately expose conductive layer 807. In at least one example, plasma etch process utilized to form dielectric 108 may be selective to conductive layer 807. In at least one such example, conductive layer 807 may be un-etched. In at least one example, a portion of conductive layer 807 may be etched as indicated by dashed lines 1713. In at least one such example, etching portions of conductive layer 807 forms a sidewall below sidewall 108A and a surface 807A that is recessed relative to a lowermost surface of dielectric 108.

FIG. 17B illustrates a cross-section of a structure 1700B. In at least one example, structure 1700B is a cross-section of structure 1700A in FIG. 17A following process to form spacer 122. In at least one example, an encapsulation layer is blanket deposited on structure 1700A. In at least one example, thickness of encapsulation layer depends on material utilized, and on a thickness of dielectric 108 and electrode 110. In at least one example, encapsulation layer is formed on sidewall 1704A and on conductive layer 807.

In at least one example, it is useful to prevent hydrogen exposure to one or layers within partial capacitor structure 1704 to preserve polarization properties of dielectric 108. In at least one example, deposition process utilized to deposit encapsulation layer does not include flowing hydrogen or ammonia containing chemicals. In at least one example, depending on a deposition process, encapsulation layer can be deposited by non-hydrogen or ammonia containing chemicals. In at least one example, encapsulation layer can be deposited by a CVD, a PVD, or an ALD process. In at least one example, different deposition processes can have different deposition rates and deposition conformality. In at least one example, encapsulation layer includes a metal containing insulator material. In at least one example, encapsulation layer includes a metal and oxygen, such as, but not limited to $Al_xO_y$, $HfO_x$, $AlSiO_x$, $ZrO_x$, or $TiO_x$. In at least one example, encapsulation layer can include a metal and nitrogen such as, but not limited to, AlN, ZrN, or HfN. In at least one example, encapsulation layer can include a combination of metal and oxygen, such as, for example, $Al_xO_y$, $HfO_x$, $ZrO_x$, $TaO_x$, $TiO_x$, $AlSiO_x$, $HfSiO_x$, or $TaSiO_x$, or a mixture including silicon and nitrogen, or silicon, nitrogen, and carbon, where x is equal to 2 and y is equal to 3.

In at least one example, encapsulation layer can be deposited by an ALD process to a thickness between 0.5 nm and 10 nm. In at least one example, encapsulation layer can be deposited to a thickness of less than 5 nm. In at least one example, an approximately 2 nm thickness of encapsulation layer comprising a material density of at least 90% can be sufficient to prevent hydrogen diffusion.

In at least one example, encapsulation layer can be etched from surface of conductive layer 807 and from above partial capacitor structure 1704 to form spacer 122. In at least one example, a plasma etch process is utilized to etch encapsulation layer to form spacer 122. In at least one example, encapsulation layer is not etched after deposition. In at least one such example, spacer 122 can be removed from above hardmask 1702 during a planarization process or during formation of a via electrode to couple with electrode 110.

FIG. 17C illustrates a cross-section of a structure 1700C. In at least one example, structure 1700C is a cross-section of structure 1700B in FIG. 17A following process to form a dielectric 1732 adjacent to spacer 122. Collectively referring to FIGS. 17B and 17C, in at least one example, dielectric 1732 is blanket deposited on structure 1700B. In at least one example, dielectric 1732 includes silicon and one or more of oxygen, nitrogen, or carbon. In at least one example, a planarization process is utilized to polish and remove rough upper portions of dielectric 1732. In at least one example, the planarization process includes a chemical mechanical polish (CMP) process. In at least one example, the CMP process removes excess dielectric 1732 from above hardmask 1702. In at least one example, the CMP process also removes hardmask 1702 and portions of spacer 122. In at least one example, where encapsulation layer is not formed into a spacer, the encapsulation layer remains on surface of conductive layer 807 as indicated by dashed lines 1721. In at least one example, when conductive layer 807 is recessed (FIG. 17A), encapsulation layer can extend below dielectric 108. In at least one example, portions of encapsulation layer can also remain above hardmask 1702, when hardmask 1702 includes a conductive material. In at least one such example, portions of encapsulation layer can be etched to expose electrode 110 when forming a via electrode above partial capacitor structure 1704.

FIG. 18A illustrates a cross-section of a structure 1800A. In at least one example, structure 1800A is a cross-section of structure 1700C in FIG. 17C following process to etch dielectric 1732, and conductive layer 807 to form electrode 112. Collectively referring to FIGS. 17B and 17C, in at least one example, a mask 1801 is formed on structure 1700C. In at least one example, mask 1801 includes a photoresist or a hardmask that has been patterned by a photoresist. In at least one example, mask 1801 can include a conductive material. A conductive material such as Ta, TaN, TiN, W can be patterned with photoresist and can offer protection against patterning conductive layer 807. In at least one example, mask 1801 determines shape and size of electrode 112.

In at least one example, a plasma etch process is utilized to etch dielectric 1732 and conductive layer 807. In at least one example, plasma etch process utilized to etch conductive layer to form electrode 112 may be substantially same as plasma etch process utilized to form electrode 110. In at least one example, an encapsulation layer (indicated by dashed lines 1803) can be formed around structure 1800A, after removing mask 1801. In at least one example, if mask 1801 is a hardmask then the encapsulation layer can be formed on mask 1801. In at least one example, mask 1801 can be removed prior to forming encapsulation layer. In at least one example, the encapsulation layer can be formed on a sidewall 1732A and on sidewall 112B to prevent hydrogen from diffusing into electrode 112 and towards an interface 1805 between dielectric 108 and electrode 112. In at least one example, the encapsulation layer can extend at least partially on surface of dielectric layer 114.

FIG. 18B is an illustration of a structure 1800B. In at least one example, structure 1800B is a plan view illustration of structure 1800A in FIG. 18A. In at least one example, electrode 112 has a rectangular profile that overlaps with at least a portion of transistor 102 (shown within dashed lines). In at least one example, electrode 112 has a length (along x-direction) that is parallel to transistor 102. In at least one example, to facilitate coupling with transistor 102, electrode 112 has a length that overlaps with a source or a drain region of transistor 102. In at least one such example, electrode 120 (FIG. 1A) can be coupled with source or drain of transistor 102 as will be discussed below. In at least one example, electrode 110 is symmetrically positioned about electrode 112, such as is shown. In at least one example, electrode 110 is not symmetrically positioned about electrode 112. In at least one example, a thermal anneal can be performed after the etch process. In at least one example, a rapid thermal anneal (RTA) process can be carried out at temperatures of 450 degree Celsius or more.

FIG. 18C is an illustration of a structure 1800C. In at least one example, structure 1800C is a plan view illustration of structure 1800A in FIG. 18A. In at least one example, electrode 112 has a rectangular profile that overlaps with at least a portion of transistor 102 (shown within dashed lines). In at least one example, electrode 112 can have a different plan view shape and/or area compared to electrode 112 in structure 1800B (FIG. 18B). In at least one example, electrode 112 has a length (along y-axis) that is substantially orthogonal to transistor 102. In at least one example, to facilitate coupling with transistor 102, electrode 112 has a length that overlaps with either a source structure or a drain structure of transistor 102. In the illustrative example, electrode 112 extends over drain structure 134. In at least one such example, electrode 120 (FIG. 1A) can be coupled with electrode 112 and source or drain of transistor 102, as will be discussed below. In at least one example, electrode 110 is not symmetrically positioned about electrode 112 to provide space for electrode 120 (FIG. 1A). In at least one example, electrode 112 can extend over multiple source or drain structures of different transistors that are spaced apart along the y-axis.

Figure 19B:
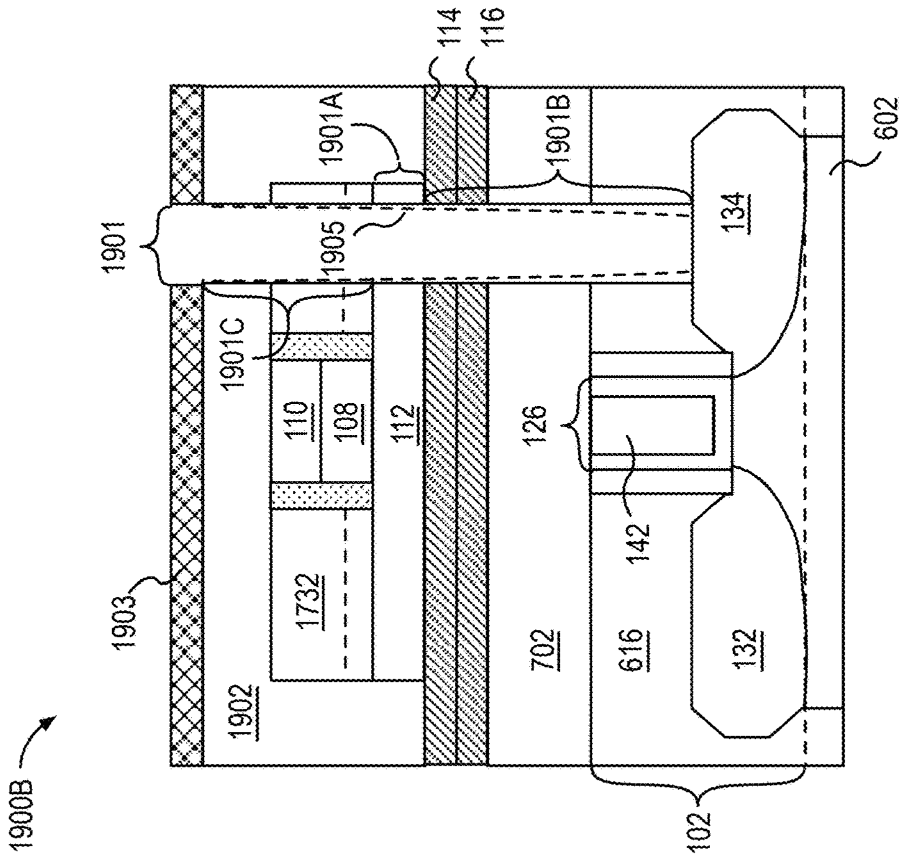
FIG. 19B illustrates a cross-section of structure in FIG. 19A following process to extend the opening, in at least one example.
Figure 19A:
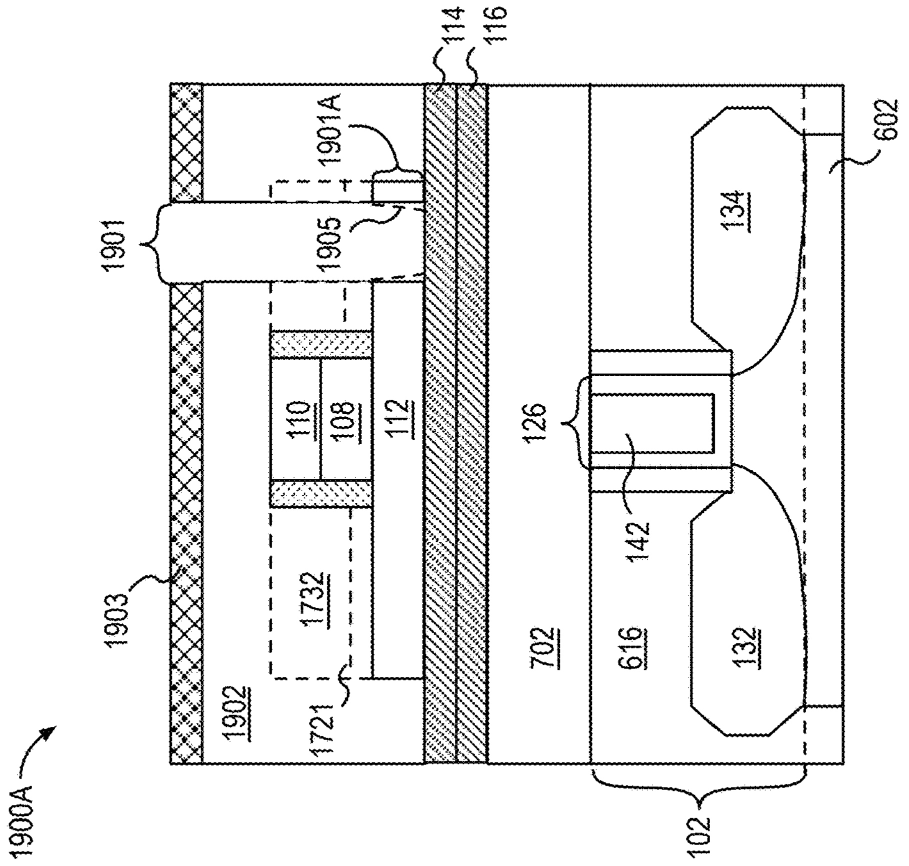
FIG. 19A illustrates a cross-section of structure in FIG. 18A following process to deposit a dielectric and following process to form an opening in the dielectric, in at least one example.

FIG. 19A illustrates a cross-section of a structure 1900A. In at least one example, structure 1900A is a cross-section of structure 1800A in FIG. 18A following process to deposit a dielectric 1902, and following process to form an opening 1901. In at least one example, dielectric 1902 includes silicon and one or more of oxygen, nitrogen, or carbon and may be deposited by a chemical vapor deposition (CVD), Physical vapor deposition (PVD), or a plasma-enhanced chemical vapor deposition (PECVD) process. In at least one example, dielectric 1902 includes a material that is the same or substantially the same as dielectric 1732.

In at least one example, a mask 1903 is formed on dielectric 1902 by a lithographic process. In at least one example, mask 1903 includes photoresist material or hardmask material that has been patterned by a photoresist. In at least one example, mask 1903 can include a conductive material. In at least one example, a conductive material including Ta, TaN, TiN, or W can be patterned with photoresist and can offer protection against patterning conductive layer 807. In at least one example, a plasma etch process is utilized to etch through dielectric 1902 and 1732 and may be continued to etch through electrode 112. In at least one example, the plasma etch process may form opening 1901 with substantially vertical sidewalls. In at least one example, a portion 1901A of opening 1901 within electrode 112 can be tapered, as indicated by dashed lines 1905.

In at least one example, encapsulation layer (within dashed lines 1721) is also etched prior to etching portion 1901A. In at least one example, as discussed above (in FIG. 18A), mask 1801 and optionally encapsulation layer surrounds mask 1801. In at least one such example, dielectric 1902 is formed on encapsulation layer, and forming opening 1901 also includes etching through mask 1801 and optionally through encapsulation layer above mask 1801.

FIG. 19B illustrates a cross-section of a structure 1900B. In at least one example, structure 1900B is a cross-section of structure 1900A in FIG. 19A following process to extend opening 1901. In at least one example, plasma etch process is continued and etches through dielectric layers 114 and 116, dielectric 702 and dielectric 616. In at least one example, opening 1901 exposes drain structure 134.

In at least one example, portion 1901A of opening 1901 within electrode 112 is tapered as indicated (dashed lines 1905). In at least one example, portion 1901A comprising a taper can cause a portion 1901B, below electrode 112, to have a different width (along the X and/or Y directions) than a portion 1901C which is above electrode 112. In at least one example, portion 1901B has a smaller width (along X and/or Y directions) than portion 1901C.

Figure 19C:
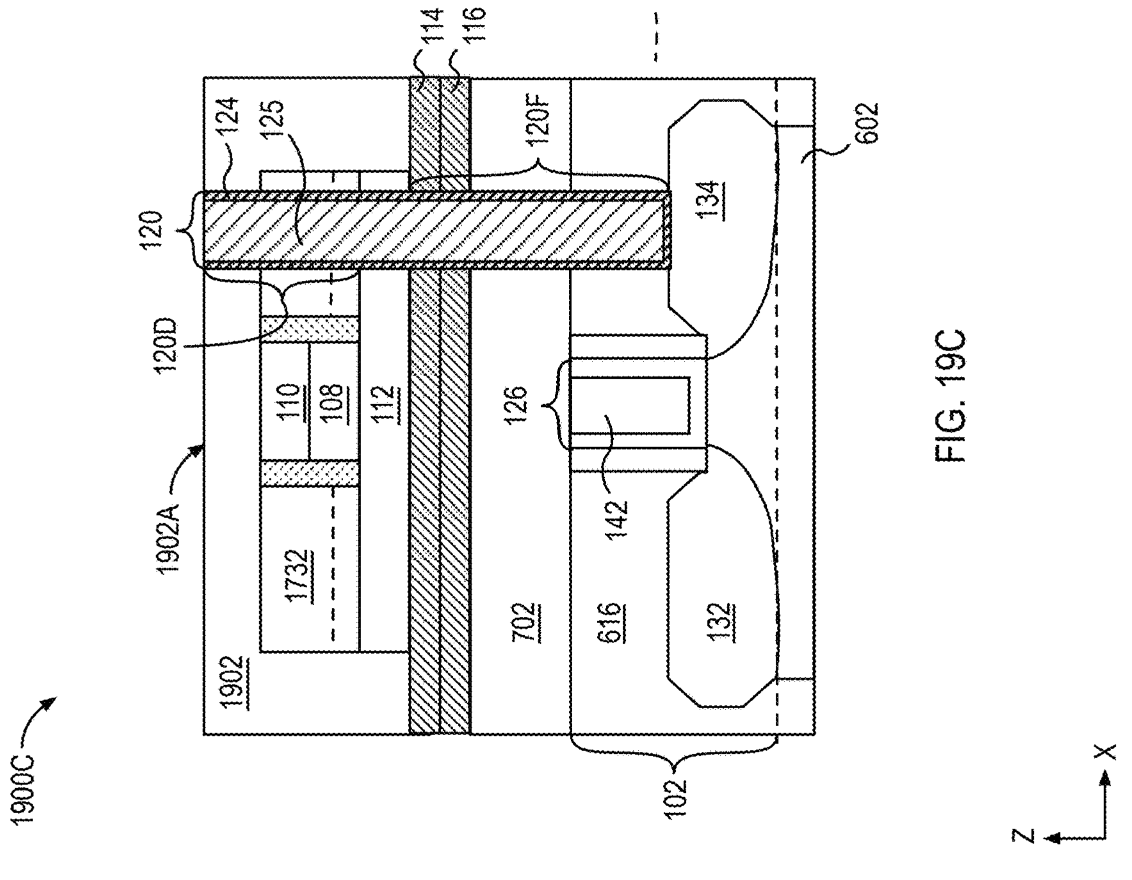
FIG. 19C illustrates a cross-section of structure in FIG. 19B following process to form an electrode, in at least one example.

FIG. 19C illustrates a cross-section of a structure 1900C. In at least one example, structure 1900C is a cross-section of structure 1900B in FIG. 19B following process to form electrode 120. Collectively referring to FIGS. 19B and 19C, in at least one example, two or more materials are deposited into opening 1901, on sidewalls of dielectric 1902, dielectric 1732, dielectric layer 114, dielectric layer 116, dielectric 702, dielectric 616, and drain structure 134. In at least one example, liner layer 124 is deposited in opening 1901, on drain structure 134, sidewalls of dielectric 1902, dielectric 1732, dielectric layer 114, dielectric layer 116, dielectric 702, dielectric 616, and on uppermost surface of dielectric 1902. In at least one example, conductive fill material 125 is deposited on liner layer 124. In at least one example, a planarization process is utilized to polish and remove conductive fill material 125 and liner layer 124 from above a surface 1902A to form electrode 120. In at least one example, the planarization process includes a chemical mechanical polish (CMP) process. In at least one example, when opening 1901 is tapered, electrode 120 includes portions that are above and below electrode 112 that have different widths. For example, a portion 120F below electrode 112, can have a different width (along the X and/or Y directions) than portion 120D that is above electrode 112. In at least one such example, portion 120F has a smaller width (along the X and/or Y directions) than portion 120D.

Examples of electrodes discussed above extend though electrode 112. In at least one example, opening 1901 can be positioned towards an edge portion of electrode 112, as discussed above in association with FIGS. 1E and 1G. In at least one example, it is useful to form an opening partially on and partially off electrode 112 when, electrode 112 includes a material that is difficult to etch with dielectric 1902 and dielectric 1732 as masks.

Figure 20A:
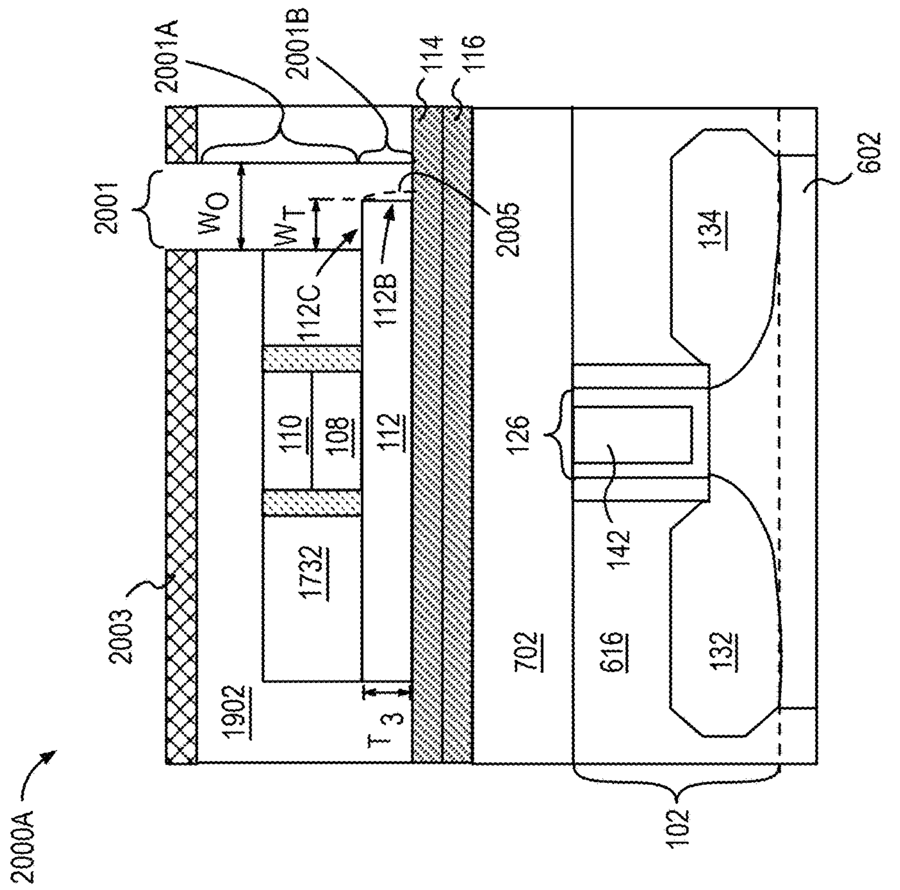
FIG. 20A illustrates a cross-section of structure in FIG. 19A in at least one example, where the opening is formed at an edge region of the electrode.

FIG. 20A illustrates a cross-section of a structure 2000A. In at least one example, structure 2000A is a cross-section of structure 1900A in FIG. 19A, where opening 1901 is formed at an edge region of electrode 112. In at least one example, plasma etch process is utilized to form an opening 2001 through a mask 2003. In at least one example, opening 2001 is formed by etching dielectric 1902 and dielectric 1732. In at least one example, the plasma etch process utilized is selective to electrode 112.

In at least one example, opening 2001 includes a portion 2001A above electrode 112 and a portion 2001B adjacent to electrode 112. In at least one example, plan view profile of opening 2001 may be similar to plan view profile of electrode 120 (FIG. 1H). In at least one example, portions 2001A and 2001B are of unequal lateral widths (along the X and/or Y directions), as shown. In at least one example, depending on vertical thickness $T_3$, portions of dielectric 1902 may be present on at least a portion of sidewall 112B. In at least one such example, portions of dielectric 1902 adjacent to sidewall 112B may be removed while etching dielectric layer 114 and dielectric layer 116. In at least one example, portion 2001B may become wider with over etch to remove dielectric 1902 from sidewall 112B. In at least one example, portion 2001A has a lateral width $W_O$, and exposes a lateral width $W_T$ of electrode 112. In at least one example, lateral width $W_O$ is at least 25% of lateral width $W_T$ to provide sufficient electrical conductivity after formation of electrode 120 (FIG. 1H).

In at least one example, where encapsulation layer is adjacent to sidewall 112B, and between dielectric 1732 and electrode 112, the plasma etch process can remove at least a substantial portion of encapsulation layer while forming opening 2001. In at least one example, a portion of encapsulation layer can remain (dashed lines 2005) adjacent to sidewall 112B. In at least one example, sidewall 112B is tapered. In at least one example, removal of encapsulation layer from sidewall 112B that is tapered is easier than when sidewall 112B is substantially vertical. In at least one such example, encapsulation layer is removed from surface 112C. In at least one example, removing encapsulation layer from surface 112C facilitates contact between electrode to be formed in opening 2001 and electrode 112.

Figure 20C:
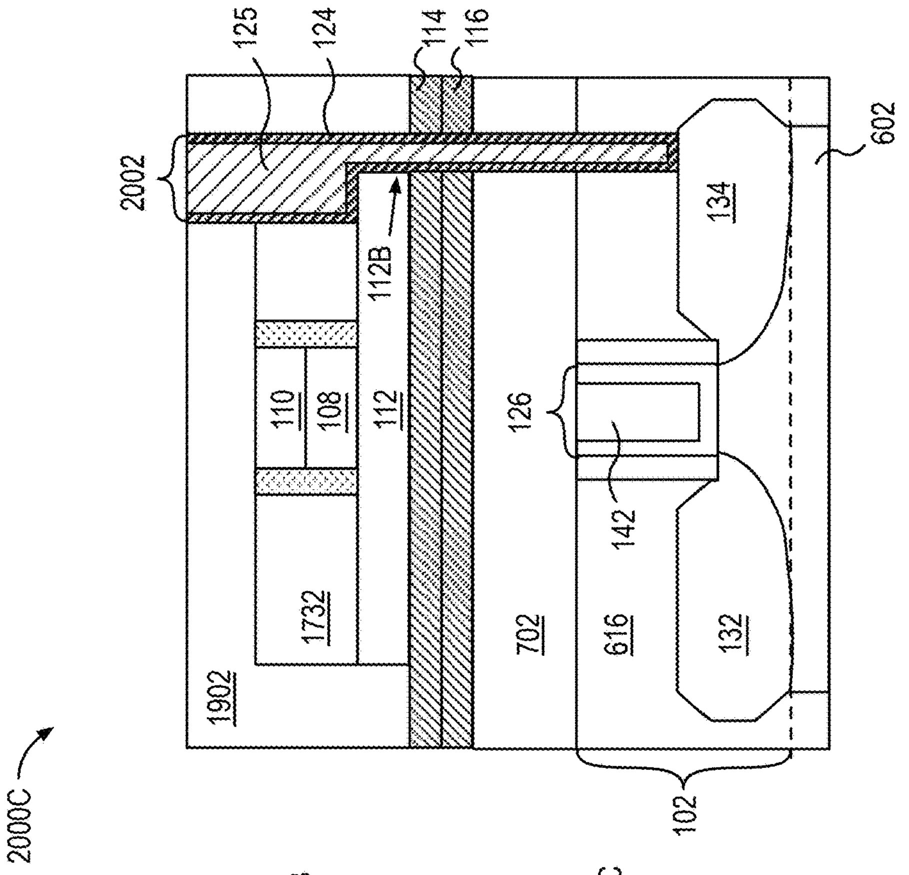
FIG. 20C illustrates a cross-section of structure in FIG. 20B following process to form an electrode, in at least one example.
Figure 20B:
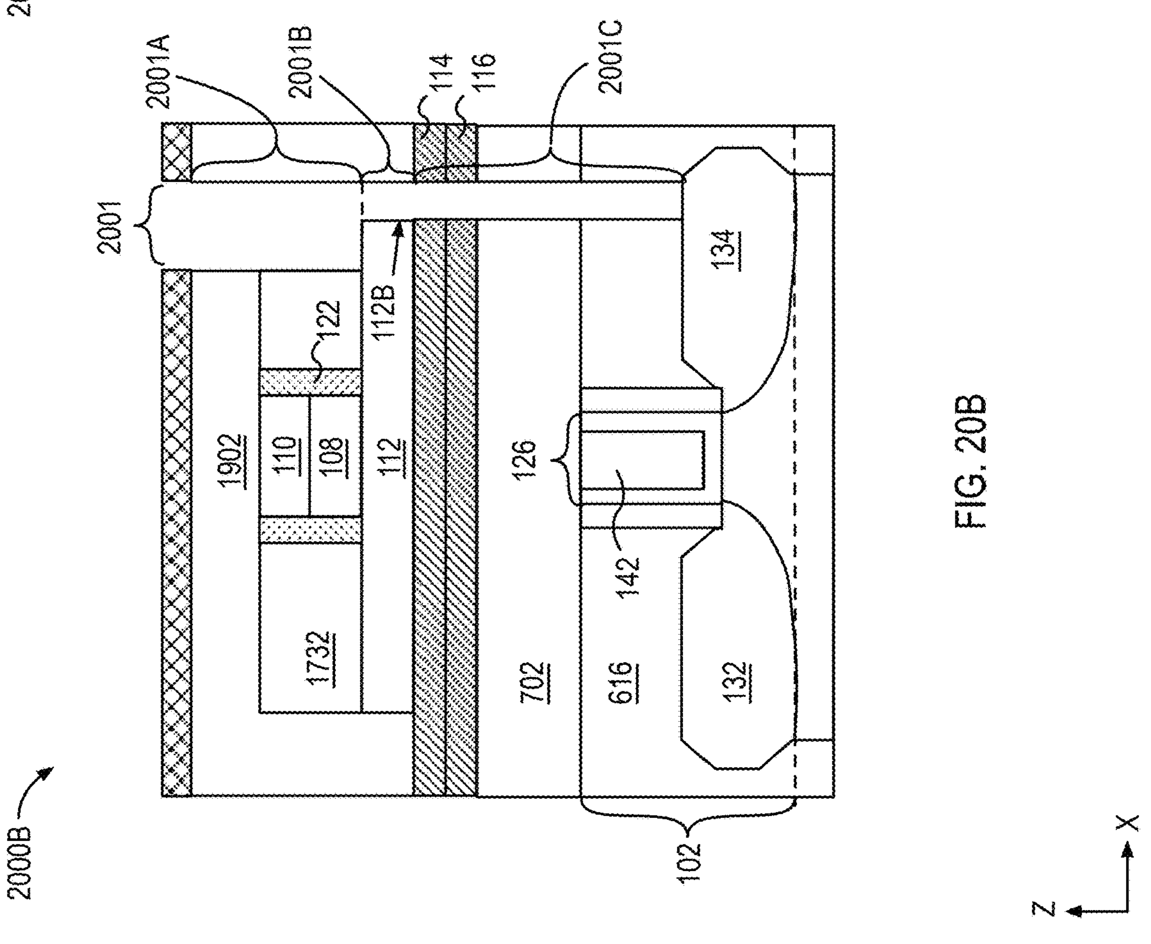
FIG. 20B illustrates a cross-section of structure in FIG. 20A, in at least one example where the opening is extended below the electrode.

FIG. 20B illustrates a cross-section of a structure 2000B. In at least one example, structure 2000B is a cross-section of structure 2000A in FIG. 20A, where opening 2001 is extended below electrode 112. In at least one example, plasma etch process is continued, and opening 2001 is extended by etching through dielectric layer 114, dielectric layer 116, dielectric 702, and dielectric 616. In at least one example, opening 2001 exposes drain structure 134. In at least one example, where dielectric 1732 and dielectric 1902 include a same material, a boundary between them may not affect the etch process or profile of opening 2001.

In at least one example, opening 2001 extends above at least an edge region of electrode 112. In at least one such example, a plasma etch that is not fully selective to electrode 112 can be implemented where the plasma etch can also remove a portion of an edge of electrode 112 as shown in FIGS. 1E and 1F. In other examples, etching through an edge region of electrode 112 may not be useful. Referring again to FIG. 20B, in at least one example, depending on etch selectivity between dielectric 1902 and electrode 112, etching a portion of an edge of electrode 112 can cause a blowout or expansion of portion 2001A. In at least one example, depending on lateral width of electrode 112, expansion of portion 2001A may cause exposure of spacer 122. In at least one such example, to prevent blowout or expansion, a selective etch process may be utilized to extend opening 2001 below electrode 112 resulting in the structure illustrated in the Figure.

In at least one example, a combination of forming opening at edge region of electrode 112 and a plasma etch that is selective to electrode 112 can cause a portion 2001C, below electrode 112, to have a different width (along the X and/or Y directions) than portion 2001A which is above electrode 112. In at least one example, portion 2001C has a smaller width (along the X and/or Y directions) than portion 2001A. In at least one example, sidewall 112B can be tapered. A tapered sidewall can influence etching of portion 2001C, such as causing portion 2001C to be tapered. In at least one example, opening 2001 can be formed adjacent to sidewall 112B, and surface 112A may not be exposed.

In at least one example, where dielectric 1732 and dielectric 1902 include a different material, a boundary between them may affect the etch process or profile of opening 2001. In at least one example, dielectric 1732 may etch faster than dielectric 1902 and may experience lateral etching while etching portion 2001C. In at least one example, dielectric 1732 may etch slower than dielectric 1902 and may experience no substantial lateral etching while etching portion 2001C. In at least one example, differing percentages of carbon concentration may be implemented to tailor the etch selectivity between dielectric 1732 and dielectric 1902 to prevent blowout of portion 2001A, and to a lesser extent of portion 2001B, while forming portion 2001C.

FIG. 20C illustrates a cross-section of a structure 2000C. In at least one example, structure 2000C is a cross-section of structure 2000B in FIG. 20B following process to form an electrode 2002. In at least one example, process utilized to form electrode 2002 is the same or substantially the same as process utilized to form electrode 120 (FIG. 19C). In at least one example, liner layer 124 is deposited by an atomic layer deposition process, where liner layer 124 follows a contour of electrode 112 within opening 2001. In at least one example, liner layer 124 is deposited on sidewall 112B.

Figure 21:
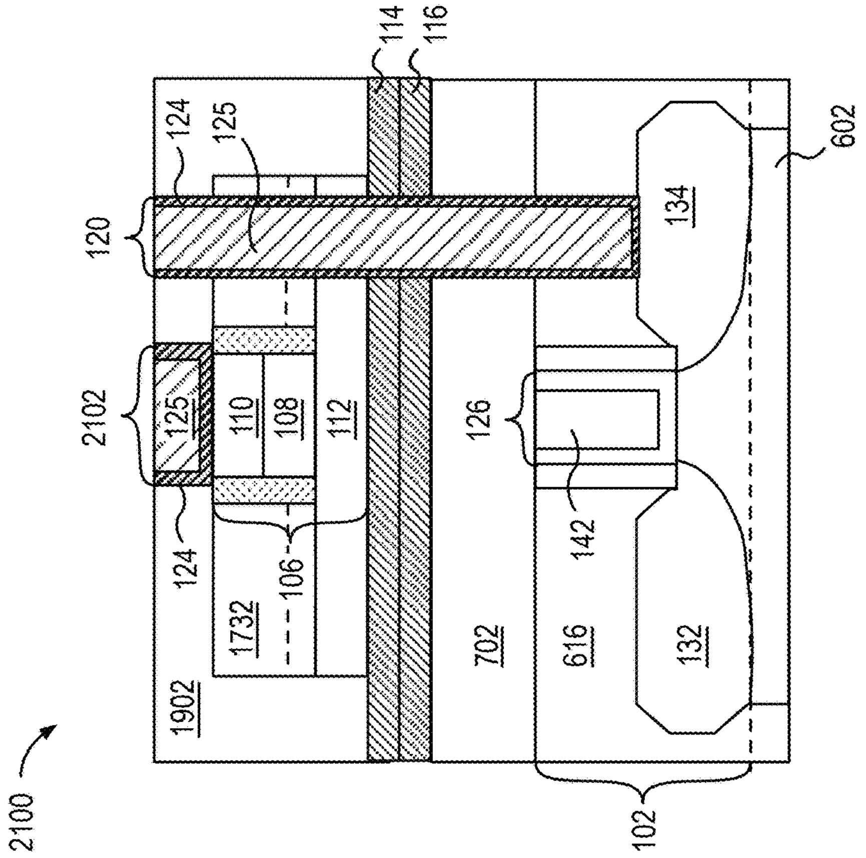
FIG. 21 illustrates a cross-sectional illustration of structure in FIG. 19C following process to form an electrode on a capacitor, in at least one example.

FIG. 21 illustrates a cross-sectional illustration of a structure 2100. In at least one example, structure 2100 is a cross-sectional illustration of structure 1900C in FIG. 19C following process to form an electrode 2102 on capacitor 106. Referring collectively to FIGS. 19C and 21, in at least one example, an opening is formed in dielectric 1902 by etching though a mask formed on dielectric 1902. In at least one example, the opening exposes electrode 110. In at least one example, electrode 2102 is formed in opening in dielectric 1902 by a process that is the same or substantially the same as process utilized to form electrode 120. In at least one example, electrode 2102 includes liner layer 124 and conductive fill material 125 formed on the liner layer.

In examples above, part of the capacitor that defines an effective area of the capacitor is formed first and then a plate electrode having a greater plan view area is patterned next. In at least one example, a reverse method can be implemented, where a block is patterned first, and depending on the number of layers either part of or the entire capacitor is patterned from a block next. In at least one example, the block defines locations of where capacitors are to be formed relative to underlying transistors and shape and location of electrode 112 relative to an underlying transistor, as illustrated in FIGS. 18B and 18C.

Figure 22A:
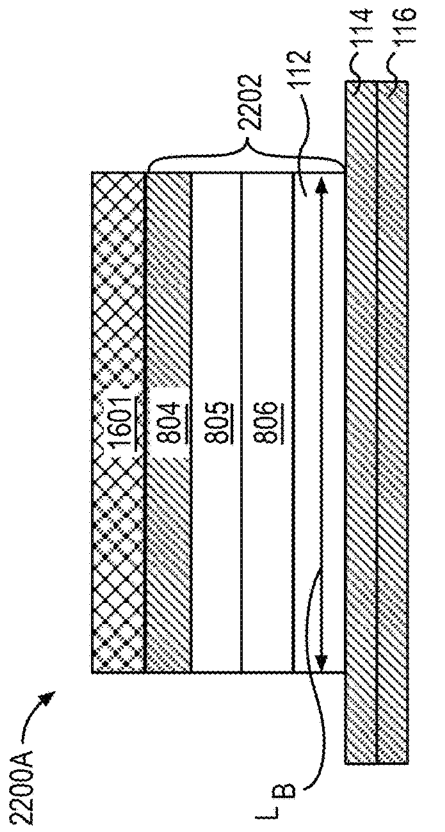
FIG. 22A illustrates a cross-section of structure in FIG. 16 following process to etch a multi-layer stack and form a block, in at least one example.

FIG. 22A illustrates a cross-section of a structure 2200A. In at least one example, structure 2200A is a cross-section of structure 1600 in FIG. 16 following process to etch multi-layer stack 802 and form a block 2202. In at least one example, a plasma etch process is utilized. In at least one example, plasma etch process may include a discharge produced by a magnetic enhanced reactive ion etching mechanism, an electron cyclotron resonance discharge or an inductively coupled plasma discharge.

Referring collectively to FIGS. 16 and 22A, in at least one example, plasma etch process etches layer 804. In at least one example, mask 1601 may be consumed during plasma etch process or can be removed after etching multi-layer stack 802. In at least one example, plasma etch process utilizes layer 804 to act as a mask while etching conductive layer 805 and dielectric layer 806. In at least one example, conductive layer 807 is patterned to form electrode 112. In at least one example, portions of dielectric layer 114 can be etched during formation of electrode 112. In at least one example, electrode 112 has one or more properties of electrode 112 (described in FIGS. 18B and 18C), such as plan view shape, length, width, and alignment relative to a transistor on a plane below (not shown). In at least one example, electrode 112 is patterned to have a length $L_B$ that is designed to couple with an electrode structure, such as electrode 120 (FIG. 1A). In at least one example, length $L_B$ is sufficiently long to include a capacitor and couple with electrode 120 (after patterning conductive layer 805 and dielectric layer 806). In at least one example, length $L_B$ is at least 60 nm.

Figure 22B:
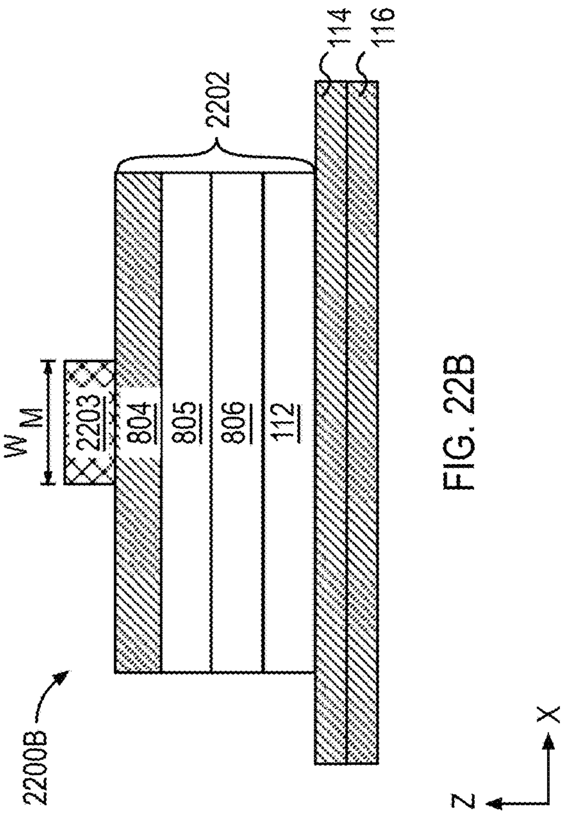
FIG. 22B illustrates a cross-section of structure in FIG. 22A following process to form a mask on the block, in at least one example.

FIG. 22B illustrates a cross-section of a structure 2200B. In at least one example, structure 2200B is a cross-section of structure 2200A in FIG. 22A following process to form a mask 2203 on block 2202. In at least one example, mask 2203 has a width WM that is a fraction of length $L_B$. A plan view area of mask defines area of capacitor to be formed. In at least one example, mask 2203 is positioned at or substantially at a center of block 2202. In at least one example, mask 2203 may be offset toward one end (as illustrated in FIG. 18C). In at least one example, layer 804 has a sufficient thickness to act as a mask for etching conductive layer 805, conductive layer 807, and dielectric layer 806 to form a capacitor.

Figure 22C:
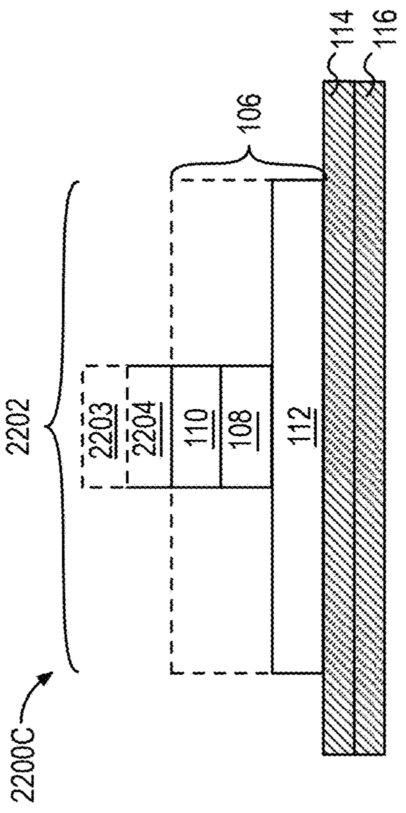
FIG. 22C illustrates a cross-section of structure in FIG. 22B following process to etch layers within the block to form capacitor, in at least one example.

FIG. 22C illustrates a cross-section of a structure 2200C. In at least one example, structure 2200C is a cross-section of structure 2200B in FIG. 22B following process to etch layers within block 2202 to form capacitor 106. In at least one example, a plasma etch process is utilized to pattern portions of block 2202 (within dashed lines) through mask 2203 to form capacitor 106. In at least one example, the plasma etch process utilized has one or more characteristics of the plasma etch process utilized to pattern multi-layer stack 802 to form capacitor 106 (FIG. 17A). In at least one example, layer 804 is patterned to form a hardmask 2204, and hardmask 2204 is subsequently used to etch underlying layers. In at least one example, the plasma etch process is selective to dielectric layer 114. In at least one example, dielectric layer 114 and dielectric layer 116 may be etched exposing dielectric 702.

Figure 22D:
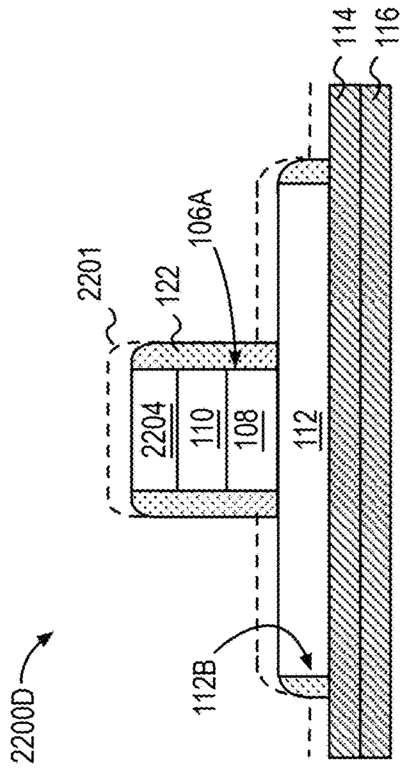
FIG. 22D illustrates a cross-section of structure in FIG. 22C following process to form spacer, in at least one example.

FIG. 22D illustrates a cross-section of a structure 2200D. In at least one example, structure 2200D is a cross-section of structure 2200C in FIG. 22C following process to form spacer 122. In at least one example, an encapsulation layer is blanket deposited on a sidewall 106A, conductive layer 807, sidewall 112B, and dielectric layer 114. In at least one example, thickness of encapsulation layer depends on material utilized, and on a height of capacitor 106. In at least one example, methods to deposit encapsulation layer and materials utilized are described above (FIG. 17B). In at least one example, encapsulation layer is etched to form spacer 122. In at least one example, when an etch is performed, encapsulation layer is removed from top surface of electrode 112 and spacer 122 is formed on sidewall 106A and sidewall 112B. In at least one example, encapsulation layer is not etched and hermetically seals electrode 112. In at least one example, hardmask 2204 is removed while forming capacitor 106. In at least one example, encapsulation layer may not be etched and remain on electrode 110. In at least one example, encapsulation layer may also remain on hardmask 2204 and on electrode 112, as indicated by dashed lines 2201.

Figure 22E:
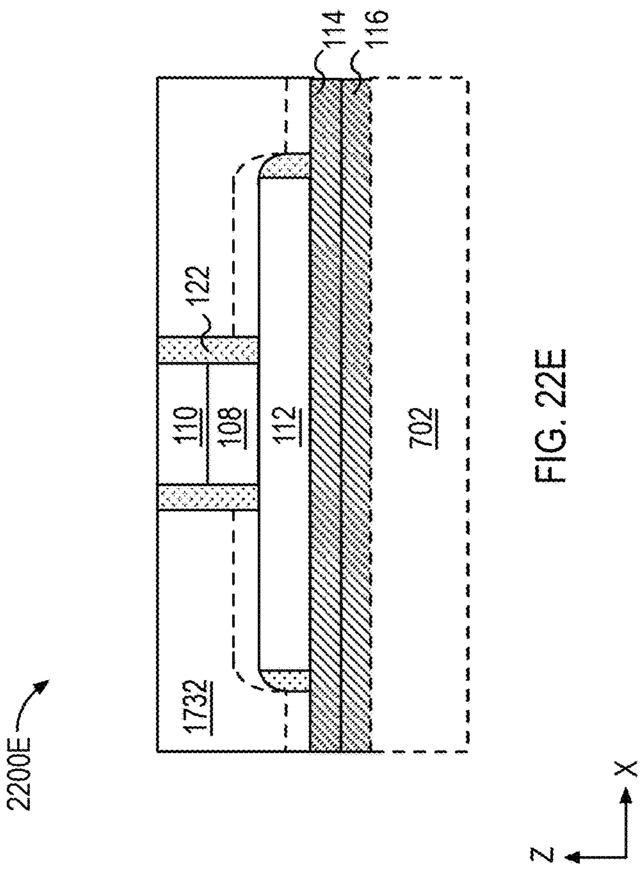
FIG. 22E illustrates a cross-section of structure in FIG. 22C following process to form dielectric, in at least one example.

FIG. 22E illustrates a cross-section of a structure 2200E. In at least one example, structure 2200E is a cross-section of structure 2200C in FIG. 22C following process to form dielectric 1732. In at least one example, the process to form dielectric 1732 is the same as process described above (FIG. 17C). In at least one example, where dielectric layer 114 and, optionally, dielectric layer 116 is also etched, dielectric 1732 is further deposited on dielectric 702. In at least one example, structure 2200C may be undergo further processing operations described in association with FIGS. 19A-21.

Figure 23:
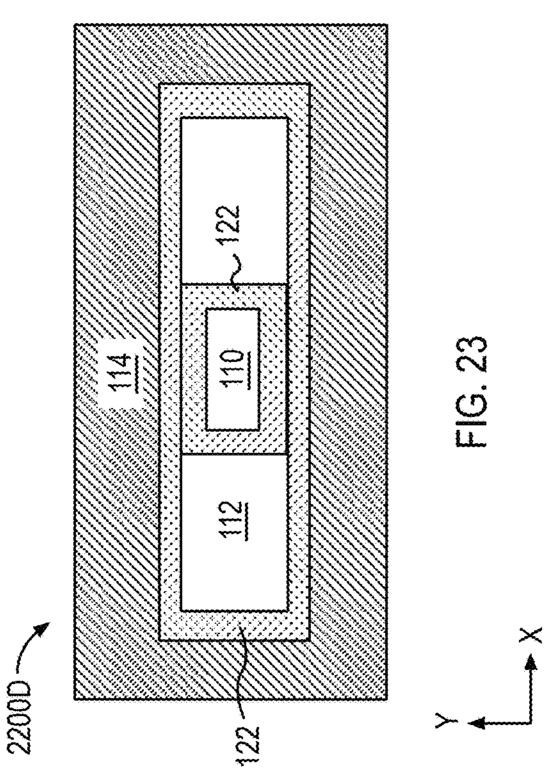
FIG. 23 illustrates a plan-view of structure in FIG. 22D, in at least one example.

FIG. 23 illustrates a plan view of structure 2200D. In at least one example, spacer 122 laterally surrounds electrode 112.

Figures 24A, 24B, 24C, 25A, 25B, 26A:
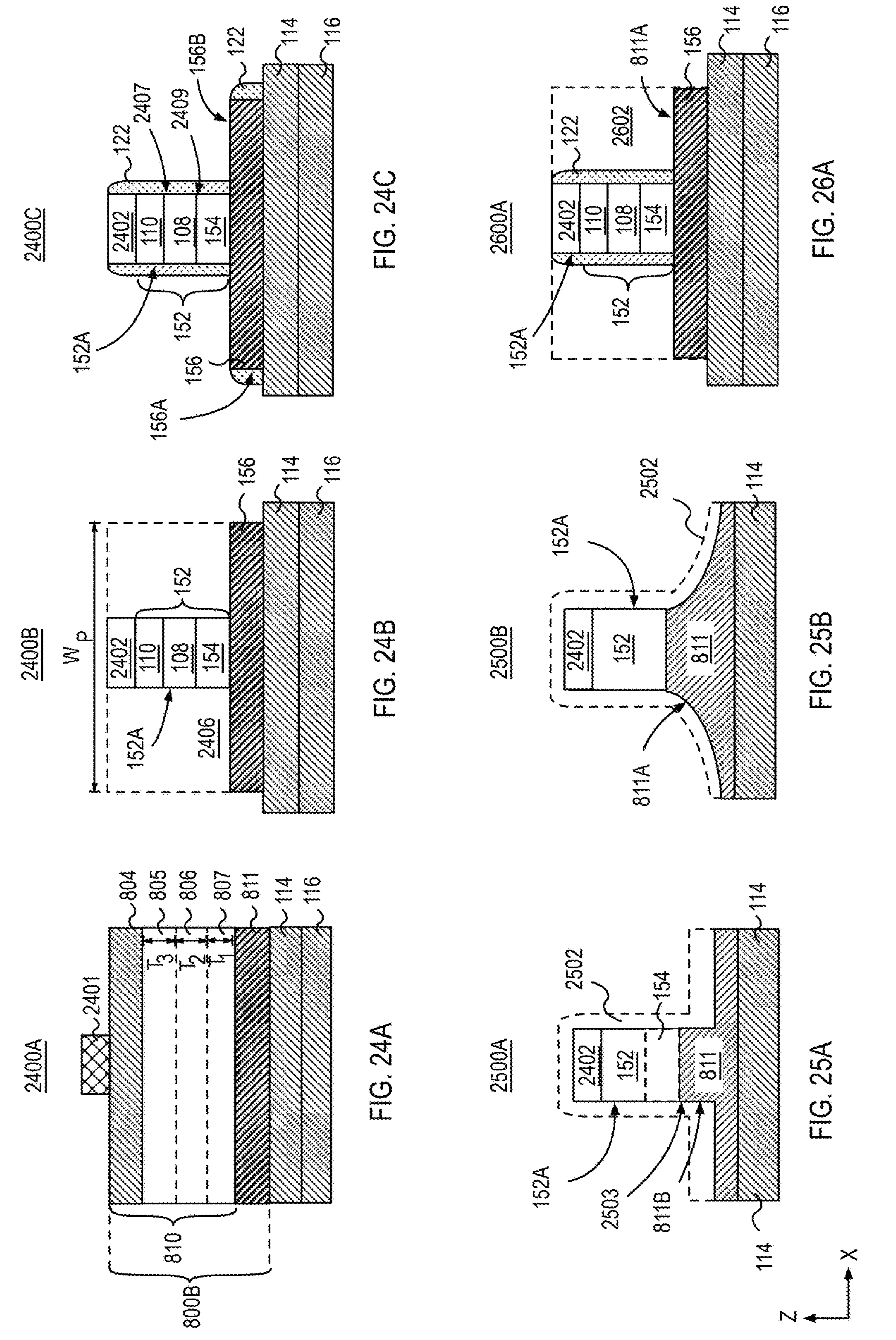
FIG. 24A illustrates a cross-section of a structure formed after bonding a first wafer with a second wafer, and after removing substrate, in at least one example.
FIG. 24B illustrates a cross-section of structure in FIG. 24A following a process to pattern multi-layer stack and form a capacitor, in at least one example.
FIG. 24C illustrates a cross-section of structure in FIG. 24B following a process to remove sacrificial material and form a spacer, in at least one example.
FIG. 25A illustrates a cross-section of structure in FIG. 24A following processes to form a capacitor and a spacer on sidewall of the capacitor, in at least one example.
FIG. 25B illustrates a cross-section of structure in FIG. 24B, where a conductive layer is gradually tapered, in at least one example.
FIG. 26A illustrates a cross-section of structure in FIG. 24A following processes to form capacitor and a spacer on sidewall of the capacitor, in at least one example.

FIG. 24A illustrates a cross-section of a structure 2400A. Collectively referring to FIGS. 7B, 8B, and 24A, in at least one example, structure 2400A illustrates a structure formed after bonding wafer 800B with wafer 710, after removing substrate 803 from above layer 804, and after forming a mask 2401 on layer 804. In at least one example, mask 2401 is designed to define a shape and size of a capacitor. In at least one example, the process of bonding and that of removing substrate 803 (not shown) have been described above.

FIG. 24B illustrates a cross-section of a structure 2400B. In at least one example, structure 2400B is a cross-section of structure 2400A in FIG. 24A following a process to pattern multi-layer stack 810 and form capacitor 152. Collectively referring to FIGS. 24A and 24B, in at least one example, a plasma etch process is utilized to pattern multi-layer stack 810 and form a hardmask 2402, electrode 110, dielectric 108, and electrode 154. In at least one example, electrode 154 has a substantially same width as dielectric 108. In at least one example, the plasma etch process can cause electrode 154 to be tapered, (increasing in width towards electrode 156). In at least one example, plasma etch process etches conductive layer 807 to form electrode 154. In at least one example, electrode 154 includes a material that is the same or substantially the same as the material of electrode 112.

Referring collectively to FIG. 24A and FIG. 24B, in at least one example, a sacrificial material 2406 can be formed on electrode layer 811 (after capacitor 152 has been formed), on hardmask 2402, and on a sidewall 152A. In at least one example, sacrificial material 2406 can be masked and etched. In at least one example, electrode layer 811 can be etched to form electrode 156 by a process similar to mask and etch process described above (FIG. 22C). In at least one example, electrode 156 has one or more structural properties of electrode 112 (FIGS. 18B and 18C), such as having width $W_P$, that is greater than widths of capacitor 152 or electrode 154. In at least one example, sacrificial material 2406 is removed after formation of electrode 154.

FIG. 24C illustrates a cross-section of a structure 2400C. In at least one example, structure 2400C is a cross-section of structure 2400B in FIG. 24B following a process to remove sacrificial material 2406 and form spacer 122 on sidewall 152A. The method to form spacer 122 is same or substantially same as process described above (FIG. 17B). In at least one example, encapsulation layer is blanket deposited on hardmask 2402, sidewall 152A, on electrode 156 (including sidewall 156A). In at least one example, the encapsulation layer is etched and removed from above hardmask 2402 and from above a surface 156B. In at least one example, process of anisotropic plasma etching can form spacer 122 on sidewall 152A and on sidewall 156A. In at least one example, encapsulation layer is not etched. In at least one such example, encapsulation layer can act as a hermetic seal around capacitor 152 and electrode 156. In either example, spacer 122 or unetched encapsulation layer forms a seal around interfaces 2407 and 2409, where interface 2407 is an interface between electrode 110 and dielectric 108, and interface 2409 is an interface between dielectric 108 and electrode 154.

FIG. 25A illustrates a cross-section of a structure 2500A. In at least one example, structure 2500A is a cross-section of structure 2400A in FIG. 24A following a process to etch and form capacitor 152. In at least one example, while forming capacitor 152 plasma etch process may not be as selective to electrode layer 811. In at least one example, material of electrode layer 811 can be easier to pattern compared to material of electrode 154. In at least one example, some portions of electrode layer 811 can be etched while forming capacitor 152, and in particular while forming electrode 154. In at least one example, electrode layer 811 is etched anisotropically to form a sidewall 811B, where sidewall 811B is substantially aligned with sidewall 152A. In at least one example, sidewall 152A is tapered, whereas sidewall 811B can be vertical. In at least one example, an encapsulation layer 2502 is blanket deposited on capacitor 152, hardmask 2402 and on electrode layer 811. In at least one example, encapsulation layer 2502 is deposited below an interface 2503, where interface 2503 is between electrode 154 and electrode layer 811.

In at least one example, a surface 811A of electrode layer 811 is gradually tapered, as shown in a structure 2500B in FIG. 25B. In at least one such example, recess in surface 811A begins at periphery of capacitor 152, as shown. In at least one example, electrode layer 811 can be recessed, as shown in FIGS. 25A and 25B, but not fully etched. In at least one example, electrode layer 811 is fabricated into a plate electrode, that is designed to couple with a terminal of transistor 102 through a via electrode (not shown). In at least one example, despite being partially recessed, thickness of plate electrode formed by masking and etching electrode layer 811 is sufficient for electrical conductivity.

FIG. 26A illustrates a cross-section of a structure 2600A. In at least one example, structure 2600A is a cross-section of structure 2400A in FIG. 24A following processes to form capacitor 152 and spacer 122 on sidewall of capacitor 152. In at least one example, capacitor 152 is formed by a process described above (FIG. 24B). Referring collectively to FIGS. 24A and 26A, in at least one example, spacer 122 is formed on sidewall 152A of capacitor 152. In at least one example, after forming spacer 122, a dielectric 2602 can be deposited on hardmask 2402, on sidewall of capacitor 152 and on surface 811A. In at least one example, dielectric 2602 includes a material that is the same or substantially the same as the material of dielectric 1732 (FIG. 17C). In at least one example, electrode 156 is formed by processes of masking dielectric 2602 and etching dielectric 2602 and electrode layer 811 by a plasma etch process. In at least one example, after depositing dielectric 2602, a planarization process can be performed that removes hardmask 2402 and portions of spacer 122. In at least one example, after formation of electrode 156, a coupling electrode can be formed as discussed below.

Figure 26C:
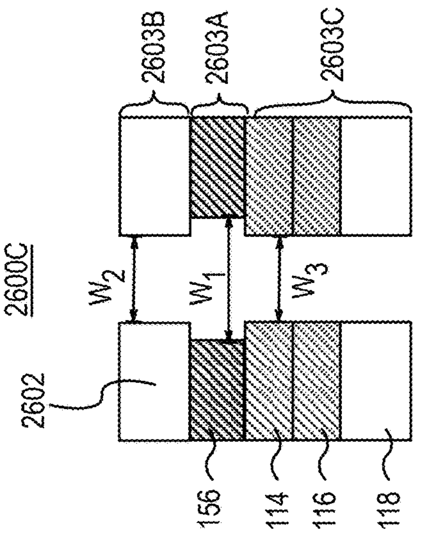
FIG. 26C illustrates an enhanced cross-section of a portion structure in FIG. 26B where the opening has variable widths along a height of the opening, in at least one example.
Figure 26B:
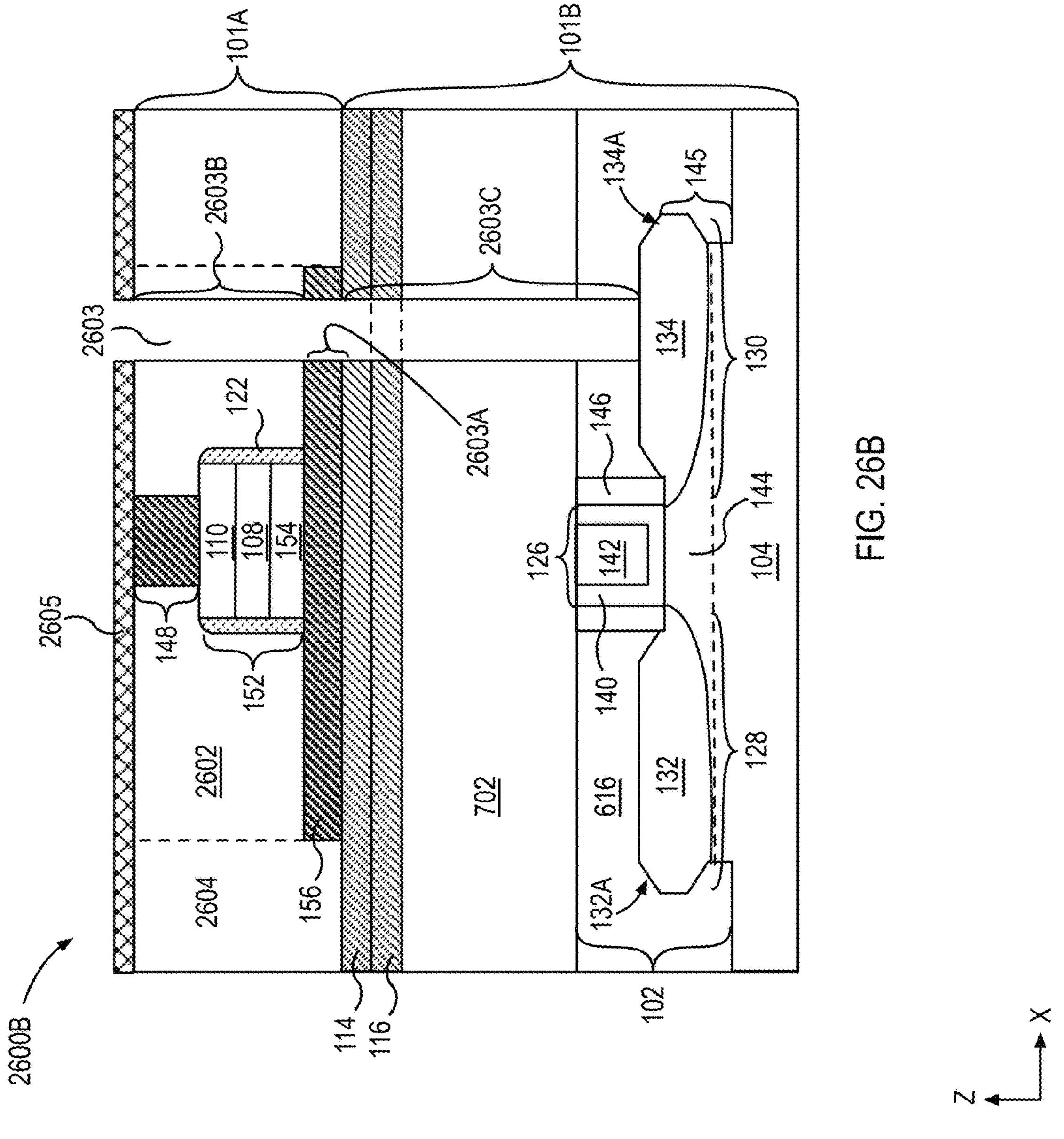
FIG. 26B illustrates a cross-section of structure in FIG. 26A following process to form opening through the electrode and expose a drain structure of a transistor below the electrode, in at least one example.

FIG. 26B illustrates a cross-section of a structure 2600B. In at least one example, structure 2600B is a cross-section of structure 2600A in FIG. 26A following process to form an opening 2603. In at least one example, a dielectric 2604 is blanket deposited on dielectric 2602 and on dielectric layer 114, and planarized. In at least one example, a mask 2605 is formed on dielectric 2602 and dielectric 2604, where a hole in mask 2605 defines a location for an opening to be formed. In at least one example, a plasma etch process is utilized to form an opening 2603 through dielectric 2602, electrode 156, dielectric layer 114, dielectric layer 116, dielectric 702, and dielectric 616. In at least one example, plasma etch process utilized may have different characteristics such as, gas combinations, power, pressure etc., as different materials in the conductive and dielectric layers are etched. In at least one example, the plasma etch process can etch layers selectively to each other. In at least one example, the plasma etch process can cause enhanced lateral etching of one layer compared to a layer immediately above or below it. In at least one example, as shown in cross-sectional illustration of a portion of opening 2603 in FIG. 26C, a portion 2603A of opening 2603 through electrode 156 can be of a different size compared to a portion 2603B, and a portion 2603C that are, respectively, above and below electrode 156. In at least one example, different sizes in portions of opening 2603 can be due to differences in materials between dielectric 2602 and electrode 156. In at least one example, the plasma etch process utilized to etch electrode 156 can be selective to dielectric 2602 and dielectric layer 114, and over etching electrode 156 can cause portion 2603A to laterally increase in size compared to portion 2603B. In at least one such example, portion 2603A can have a width $W_1$, where $W_1$ is greater than width $W_2$ of portion 2603B, or width $W_3$ of portion 2603C. In at least one example, even where $W_1$ is greater than width $W_2$, width $W_3$ can be substantially the same as width $W_2$. In at least one such example, portion 2603B acts as a mask for etching dielectric layer 114 and dielectric layer 116, when portion 2603C is formed. In at least one example, edges of dielectric layer 114 and dielectric 2602 in vicinity of interfaces with electrode 156 can be eroded and rounded.

Referring again to FIG. 26B, in at least one example, an electrode can be formed in opening 2603 by deposition and planarization processes described above (FIG. 19C). In at least one example, material of electrode can fill opening 2603 in a structure 2600C (FIG. 26C), when materials are deposited using a conformal deposition method such as ALD or PEALD are used.

Figure 27A:
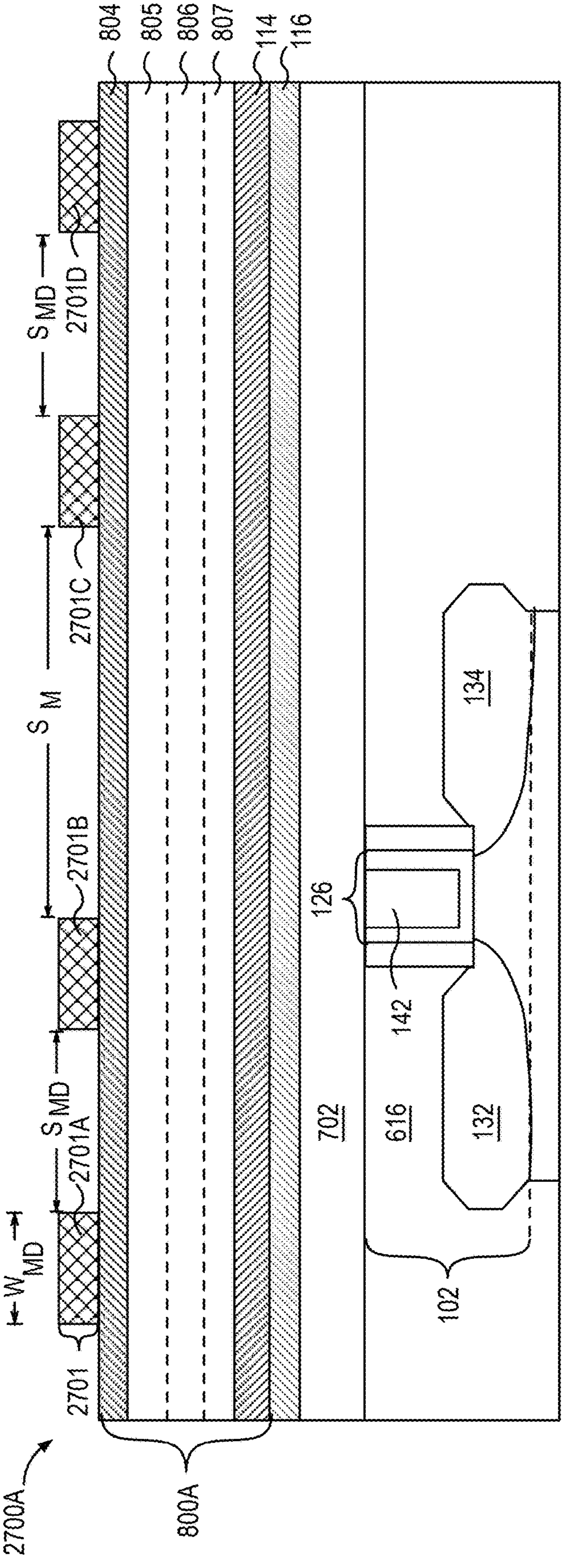
FIG. 27A illustrates a cross-section of structure in FIG. 16 following formation of a mask on the multi-layer stack, in at least one example.

FIG. 27A illustrates a cross-section of a structure 2700A. In at least one example, structure 2700A is a cross-section of structure 1600 in FIG. 16 following formation of a mask 2701, in at least one example. In at least one example, mask 2701 includes a pattern that defines locations for fabricating of a plurality capacitors. In at least one example, capacitors to be formed are fabricated from multi-layer stack 802 and include a shared bottom electrode.

In at least one example, mask 2701 is formed by a lithographic technique. In at least one example, mask 2701 includes mask portions 2701A, 2701B, 2701C, and 2701D. In at least one example, mask portions 2701A and 2701B are laterally spaced apart by a distance $S_{MD}$, and mask portions 2701C and 2701D are laterally spaced apart by a distance $S_{MD}$. In at least one example, mask portions 2701B and 2701C are separated by a distance $S_M$. In at least one example, distance $S_M$ is greater than distance $S_{MD}$. In at least one example, distance $S_M$ is less than distance $S_{MD}$. In at least one example, distance $S_M$ is sufficient to form a via electrode to couple with a drain or source structure of transistor 102. In at least one example, distance $S_M$ is greater than distance $S_{MD}$. In at least one such example, the via electrode is formed in the vicinity of mask portion 2701D.

Figure 27B:
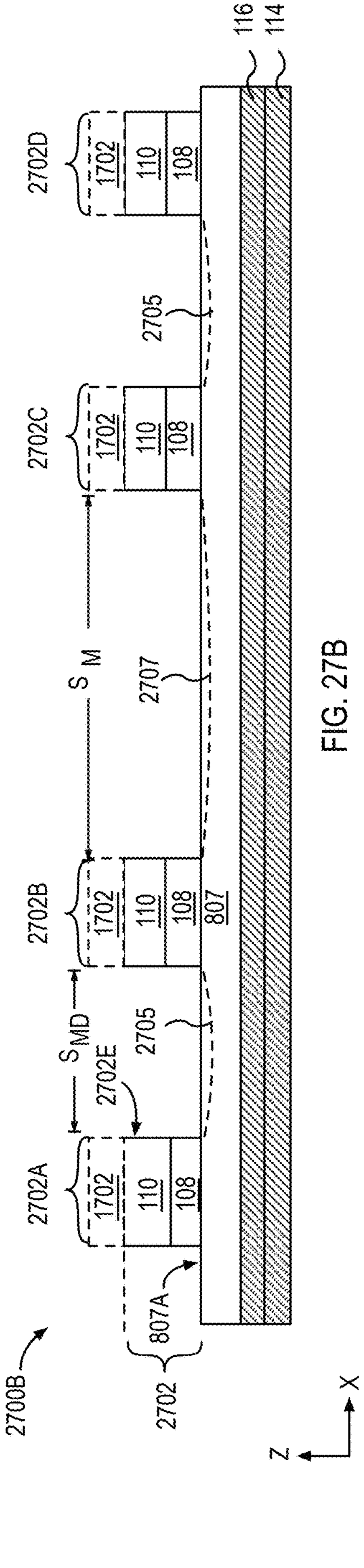
FIG. 27B illustrates a cross-section of structure in FIG. 27A following process to etch the multi-layer stack to form a plurality of partial capacitor structures, in at least one example.

FIG. 27B illustrates a cross-section of a structure 2700B. In at least one example, structure 2700B is a cross-section of structure 2700A in FIG. 27A following process to etch multi-layer stack 802 to form a plurality of partial capacitor structures 2702, in at least one example. In at least one example, process to etch multi-layer stack 802 is same or substantially same as process utilized to etch and form capacitor 106 in FIG. 17A.

Referring collectively to FIGS. 27A and 27B, in at least one example, a plasma etch process is utilized to etch multi-layer stack 802 to form partial capacitor structures 2702A, 2702B, 2702C, and 2702D on conductive layer 807. In at least one example, conductive layer 807 is patterned into a plate electrode in a manner described above (FIG. 18A) after formation of spacers. In at least one example, a plasma etch process is utilized to etch layer 804 to form hardmask 1702, conductive layer 805 to form electrode 110, and etch dielectric layer 806 to form dielectric 108. In at least one example, hardmask 1702 may be removed during plasma etch process, as indicated by dashed lines.

In at least one example, process of forming partial capacitor structures 2702A-D can form recesses 2705 and 2707 in conductive layer 807, (indicated by dashed lines). In at least one example, depth in recess 2705 between adjacent partial capacitor structures 2702A and 2702B or between adjacent partial capacitor structures 2702C and 2702D may be greater than recess 2707 between adjacent partial capacitor structures 2702B and 2702C. Depth in recess may be measured relative to surface 807A. In at least one example, variation in depth of recess can occur due to enhanced ion etching within smaller spacing, such as when $S_{MD}$ is less than $S_M$. In at least one example, profiles of electrode 110 and dielectric 108 may be as described above (FIG. 17A). In at least one example, conductive layer 807 is sufficiently thick that recesses 2705 and 2707, or variations in depths of recesses 2705 and 2707 does not impact electrical conductivity of conductive layer 807.

FIG. 27C illustrates a cross-section of a structure 2700C. In at least one example, structure 2700C is a cross-section of structure 2700B in FIG. 27B following process to form an encapsulation layer 2709 on partial capacitor structures 2702A-2702D. In at least one example, process utilized to deposit encapsulation layer 2709 depends on material utilized, on height of and relative spacing between adjacent partial capacitor structures 2702A-2702D. In at least one example, deposition process utilized to deposit encapsulation layer 2709 does not include hydrogen or ammonia containing chemicals to prevent hydrogen exposure to layers within partial capacitor structures 2702A-2702D. In at least one example, encapsulation layer 2709 can be deposited by a method utilized to deposit encapsulation layer (FIG. 17B). In general, a combination of ALD, PEALD, PVD, or CVD processes may be utilized depending on spacing between adjacent partial capacitor structures 2702A-2702D.

In at least one example, encapsulation layer 2709 is blanket deposited and includes a same or substantially same material as material of encapsulation layer (FIG. 17B). In at least one example, a PVD process may not provide a substantially conformal deposition or uniform thickness $T_{EC}$ along sidewall 2702E. In at least one such example, portions of encapsulation layer 2709 adjacent to uppermost surface of partial capacitor structures 2702A-2702D can be wider at top and narrower at bottom (illustrated by dashed lines 2711).

In at least one example, $S_M$ is approximately equal to two times $T_{EC}$, as shown in structure a 2700D of FIG. 27D. In at least one such example, encapsulation layer 2709 formed on sidewalls 2702E of two adjacent partial capacitor structures, such as partial capacitor structures 2702A and 2702B, can merge. In at least one example, sidewalls 2702E face each other. In at least one such example, encapsulation layer 2709 formed conformally on sidewalls 2702E can merge, where merged portion includes no defects or voids. In at least one such example, an ALD deposition process can be used to provide uniform coverage.

In at least one example, encapsulation layer 2709 is etched to form a spacer 2713, as illustrated in a structure 2700E of FIG. 27E. In at least one such example, encapsulation layer 2709 is removed from a surface 2702F and from surface 807A of conductive layer 807. In at least one example, where hardmask 1702 includes an insulator, hardmask 1702 may be removed or recessed by the spacer etch process.

Referring again to FIG. 27C, in at least one example, where hardmask 1702 includes an insulator, hardmask 1702 may be removed prior to depositing encapsulation layer 2709. In at least one example, hardmask 1702 may be removed during plasma etch process utilized to form electrode 110 and dielectric 108. In at least one example, a planarization process during subsequent operations may be utilized to remove encapsulation layer 2709 from above surface 2702F but not from conductive layer 807.

Figure 28A:
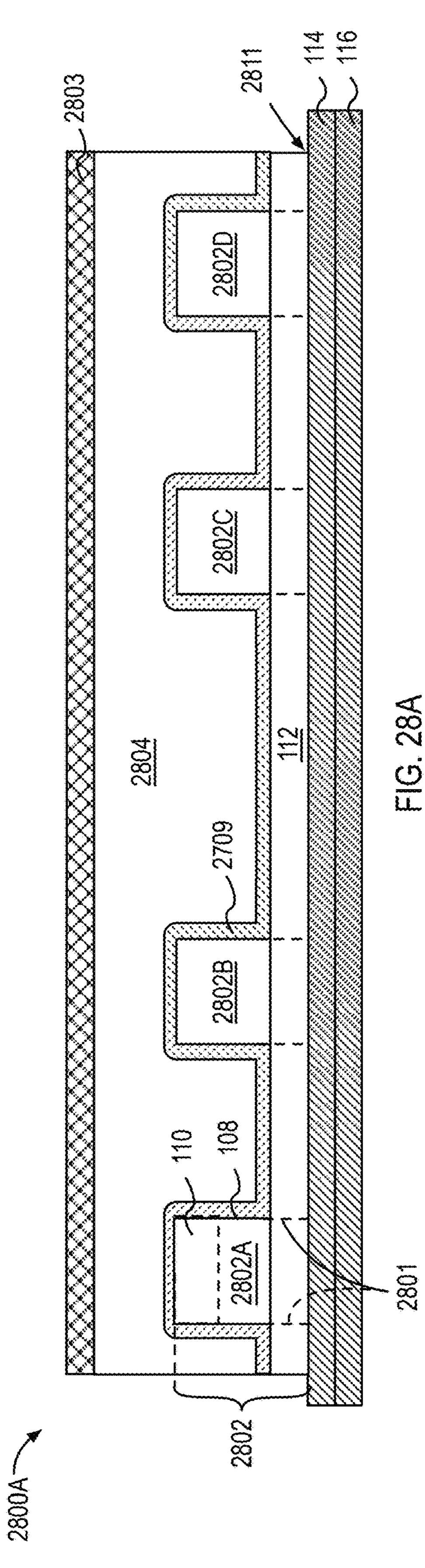
FIG. 28A illustrates a cross-section of structure in FIG. 27C following process to etch conductive layer to form electrode of capacitors, in at least one example.

FIG. 28A illustrates a cross-section of a structure 2800A. In at least one example, structure 2800A is a cross-section of structure 2700C in FIG. 27C following process to etch conductive layer 807 to form electrode 112 of capacitors 2802, in at least one example. Referring collectively to FIGS. 27C and 28A, in at least one example, a dielectric 2804 is deposited on surface of encapsulation layer 2709. In at least one example, dielectric 2804 includes silicon and one or more of oxygen, nitrogen, or carbon. In at least one example, dielectric 2804 includes a material that is different from material of encapsulation layer 2709. In at least one example, a planarization process is performed after deposition of dielectric 2804. In at least one example, a mask 2803 is formed by a lithographic process on dielectric 2804. In at least one example, mask 2803 defines a shape of electrode 112 as discussed above (FIGS. 18B and 18C).

In at least one example, dielectric 2804 and encapsulation layer 2709 are sequentially etched by a plasma etch process. In at least one example, conductive layer 807 is etched by a plasma etch process to form electrode 112. The process of forming electrode 112 converts partial capacitor structures 2702A-D into capacitors 2802 (or capacitor 2802A, capacitor 2802B, capacitor 2802C, and capacitor 2802D). In at least one example, as capacitor 2802A, capacitor 2802B, capacitor 2802C, or capacitor 2802D include electrode 110, dielectric 108, and portion of electrode 112 within dashed lines 2801. In at least one example, capacitors 2802A-D include a shared bottom electrode in the form of electrode 112.

In at least one example, by forming an electrode that extends through electrode 112 to a terminal of transistor 102 (not shown), one terminal of capacitors 2802 such as capacitor 2802A, capacitor 2802B, capacitor 2802C, and capacitor 2802D are programmed to single voltage bias during operation.

In at least one example, encapsulation layer 2709 is formed into spacer 2713 (FIG. 27E). In at least one such example, dielectric 2804 is deposited directly on conductive layer 807 and plasma etch process utilized to form electrode 112 has one or more characteristics of the plasma etch process utilized to form electrode 112 in FIG. 18A. In at least one example, etching to form electrode 112 exposes dielectric layer 114. In at least one example, plasma etch does not recess dielectric layer 114. In at least one example, portions of dielectric layer 114 can be recessed relative to an interface 2811 between dielectric layer 114 and electrode 112.

Figure 28B:
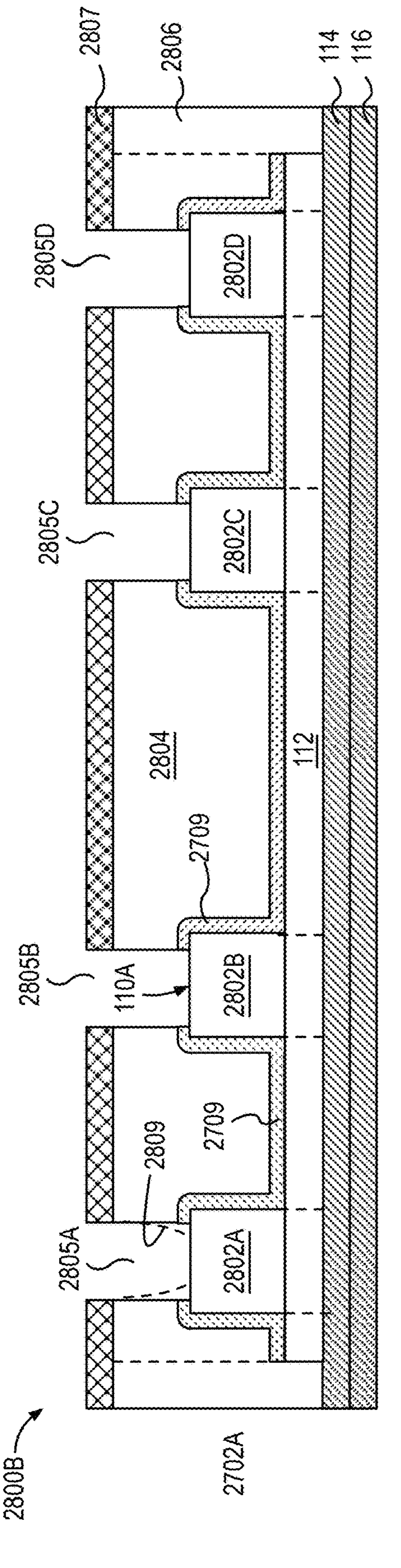
FIG. 28B illustrates a cross-section of structure in FIG. 27A following process to form openings in a dielectric deposited above the capacitors, in at least one example.

FIG. 28B illustrates a cross-section of a structure 2800B. In at least one example, structure 2800B is a cross-section of structure 2800A in FIG. 27A following process to form openings 2805A-D in dielectric 2804, in at least one example. In at least one example, openings 2805A, 2805B, 2805C, and 2805D are formed, respectively, above respective capacitors 2802A-D, in at least one example. Collectively referring to FIGS. 28A and 28B, in at least one example, a dielectric 2806 is blanket deposited on structure 2800A, after removal of mask 2803. In at least one example, dielectric 2806 includes a material that is the same or substantially the same as the material of dielectric 2804. In at least one example, dielectric 2806 is planarized.

In at least one example, a mask 2807 is formed above dielectric 2804 and on dielectric 2806. In at least one example, a plasma etch process is utilized to etch and form openings 2805A-D in dielectric 2804 above respective capacitors 2802A-D. The plasma etch process etches portions of encapsulation layer 2709 after etching dielectric 2804 and exposes surface 110A of individual capacitors 2802A-D. In at least one example, where hardmask (not shown) remains on electrode 110, portions of hardmask are removed to expose surface 110A. Removal of portions of hardmask can ensure that there is electrical contact between via (to be formed) in openings 2805A-D and electrode 110.

In at least one example, openings 2805A-D are substantially vertical, as shown. In at least one example, walls of dielectric 2804 in openings 2805A-D are slanted as indicated by dashed lines 2809.

Figure 28C:
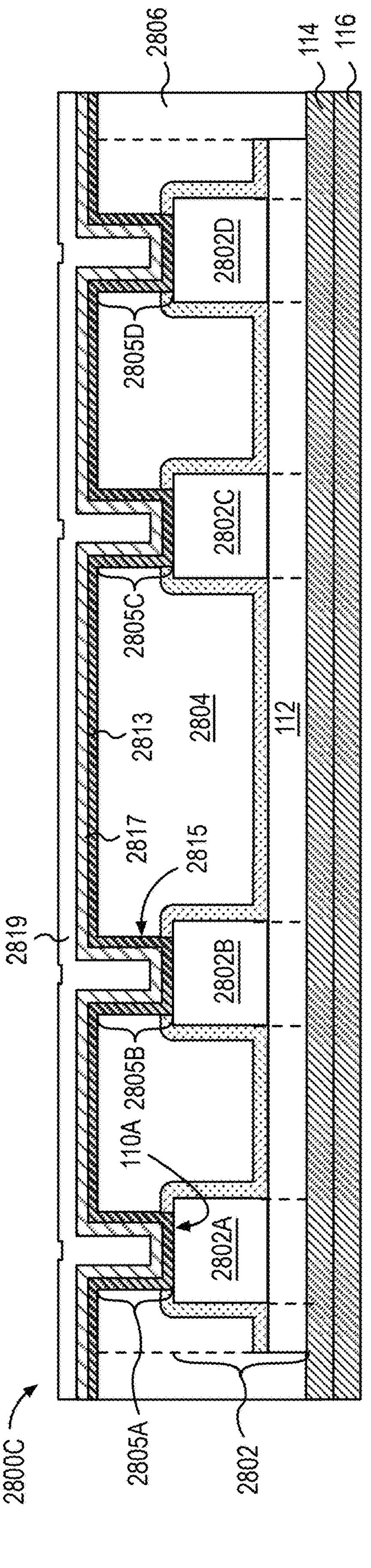
FIG. 28C illustrates a cross-section of structure in FIG. 28B following process to deposit one or more conductive materials in openings, in at least one example.

FIG. 28C illustrates a cross-section of a structure 2800C. In at least one example, structure 2800C is a cross-section of structure 2800B in FIG. 28B following process to deposit one or more conductive materials in openings 2805A-D, in at least one example. In at least one example, a conductive hydrogen barrier material 2813 is blanket-deposited into openings 2805A-D, on surface 110A (of electrode 110) of partial capacitor structures 2702A-D and on sidewall of dielectric 2804 in openings 2805A-D. In at least one example, conductive hydrogen barrier material 2813 includes a material that is chemically compatible with dielectric 2804 so that an interface 2815 between conductive hydrogen barrier material 2813 and dielectric 2804 is not a source of dislocations.

In at least one example, a liner layer material 2817 is blanket deposited in openings 2805A-D, and on a conductive hydrogen barrier material 2813. In at least one example, a layer of conductive fill material 2819 is deposited on liner layer material 2817 into remaining portions of openings 2805A-D. In at least one example, conductive hydrogen barrier material 2813, liner layer material 2817, and layer of conductive fill material 2819 are deposited by an ALD, a PEALD, a PVD, or a sputter deposition process.

In at least one example, conductive hydrogen barrier material 2813 includes a material that is amorphous. In at least one example, amorphous materials lack defined grain boundaries that can facilitate hydrogen diffusion and may be useful to form a via electrode. In at least one example, conductive hydrogen barrier material 2813 includes materials such as, but not limited to: TiAlN with >30 atomic percent AlN; TaN with >30 atomic percent N; TiSiN with >20 atomic percent SiN; tantalum carbide (TaC), titanium carbide (TiC); tungsten carbide (WC); tungsten nitride (WN); carbonitrides of Ta, Ti, W, i.e., TaCN, TiCN, WCN; titanium monoxide (TiO or $Ti_2O$); tungsten oxide ($WO_3$); tin oxide ($SnO_2$); indium tin oxide (ITO); iridium oxide ($IrO_2$); indium gallium zinc oxide (IGZO); zinc oxide or METGLAS series of alloys, e.g., $Fe_{40}Ni_{40}P_{14}B_6$. In at least one example, conductive hydrogen barrier material 2813 is deposited to a thickness of less than 2 nm. In at least one example, liner layer material 2817 includes Ti, Ta, TiN, TaN, Ru, or any other conductive material that can provide adhesion for conductive fill material 2819. In at least one example, conductive fill material 2819 includes tantalum, titanium, ruthenium, tungsten, molybdenum, or copper. In at least one example, liner layer material 2817 may not be deposited. In at least one such example, layer of conductive fill material 2819 is directly deposited onto conductive hydrogen barrier material 2813.

Figure 28D:
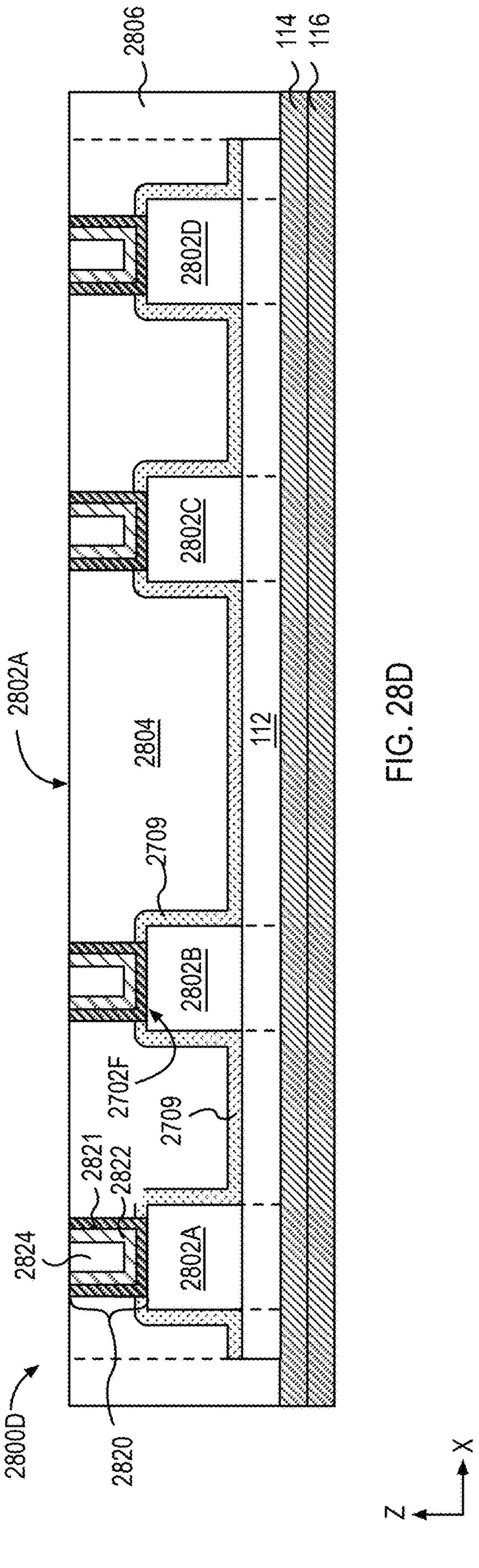
FIG. 28D illustrates a cross-section of structure in FIG. 28C following a process to form via electrodes on the capacitors, in at least one example.

FIG. 28D illustrates a cross-section of a structure 2800D. In at least one example, structure 2800D is a cross-section of structure 2800C in FIG. 28C following a process to form via electrodes 2820. In at least one example, a respective via electrode 2820 is formed on a respective capacitor 2802A, capacitor 2802B, capacitor 2802C, and capacitor 2802D, in at least one example.

Collectively referring to FIGS. 28C and 28D, in at least one example, CMP process removes layer of conductive fill material 2819, liner layer material 2817, and conductive hydrogen barrier material 2813 from an uppermost surface 2804A of dielectric 2804. In at least one example, CMP process isolates conductive hydrogen barrier material 2813 to form a conductive hydrogen barrier 2821, CMP process isolates liner layer material 2817 to form a liner 2822 and isolates layer of conductive fill material 2819 to form a conductor 2824. In at least one example, CMP process may also reduce as-deposited thickness of dielectric 2804 and dielectric 2806.

Figure 28E:
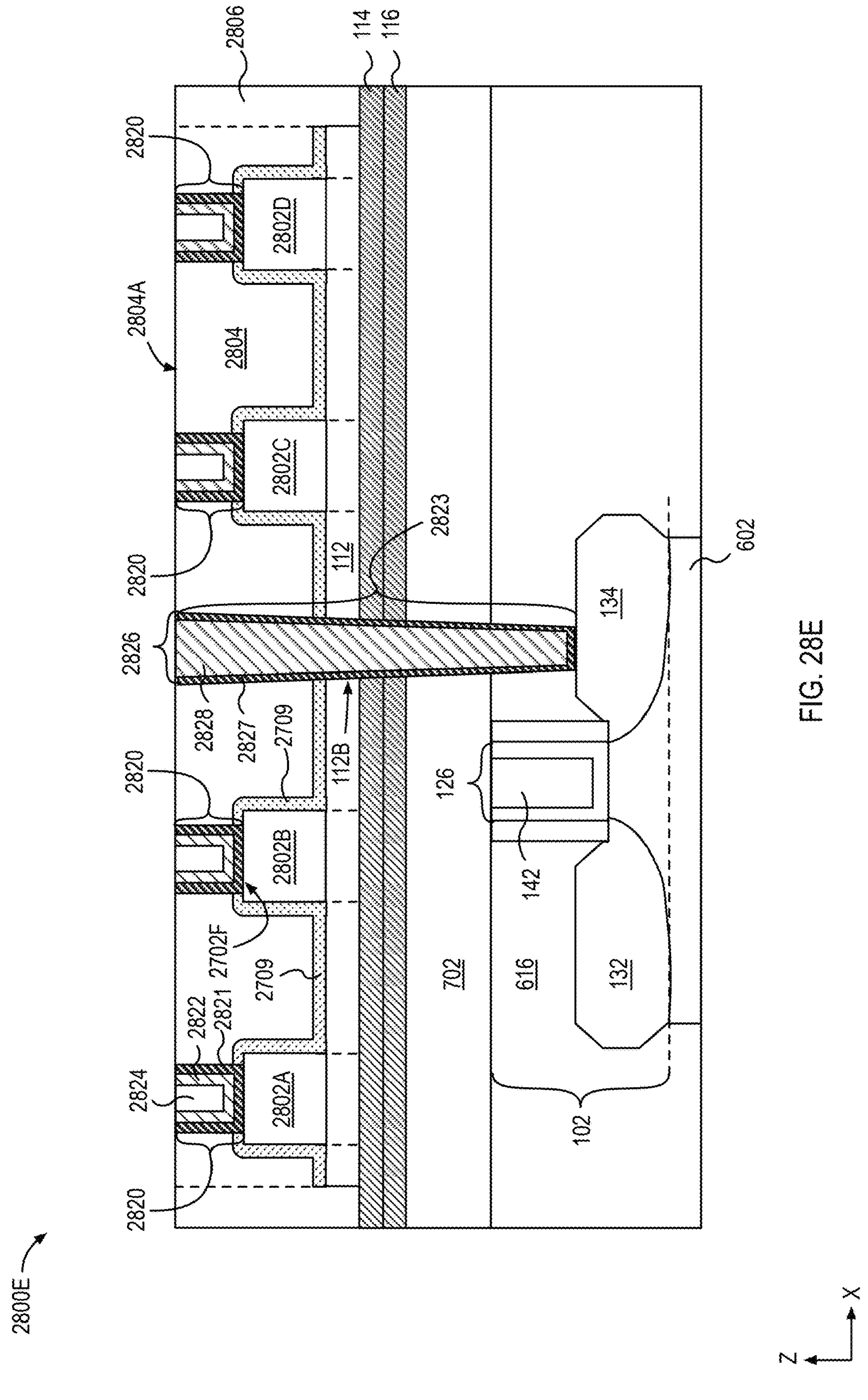
FIG. 28E illustrates a cross-section of structure in FIG. 28D following process to form an electrode to couple with a transistor below the capacitors, in at least one example.

FIG. 28E illustrates a cross-section of a structure 2800E. In at least one example, structure 2800E is a cross-section of structure 2800D in FIG. 28D following process to form an electrode 2826, in at least one example. In at least one example, an opening 2823 is formed in dielectric 2804 by etching through a mask formed above dielectric 2804, dielectric 2806 and via electrodes 2820.

In at least one example, a plasma etch process is utilized to form opening 2823 in dielectric 2804, encapsulation layer 2709, through electrode 112, dielectric layer 114, dielectric layer 116, dielectric 702, and dielectric 616 through a mask to expose drain structure 134. In at least one example, two or more materials are deposited into opening 2823, on drain structure 134, on dielectric 2804, and on via electrode 2820. In at least one example, a liner layer 2827 is deposited on sidewall 112D of electrode 112, and on sidewalls of: dielectric 2804, encapsulation layer 2709, dielectric layer 114, dielectric layer 116, dielectric 702, and dielectric 616, and on surface of drain structure 134. In at least one example, a conductive fill material 2828 is deposited on liner layer 2827. In at least one example, liner layer 2827 includes a material that is same or substantially same as material of liner layer material 2817 (FIG. 28C). In at least one example, conductive fill material 2828 includes a material that is same or substantially same as material of conductive fill material 2819 (FIG. 28C).

In at least one example, CMP process removes portions of conductive fill material 2828 and liner layer 2827 from uppermost surface 2804A to form electrode 2826. In at least one example, a planarization process includes a chemical mechanical planarization (CMP) process. In at least one example, upper surface of electrode 2826 and via electrodes 2820 are co-planar or substantially co-planar.

Figure 29A:
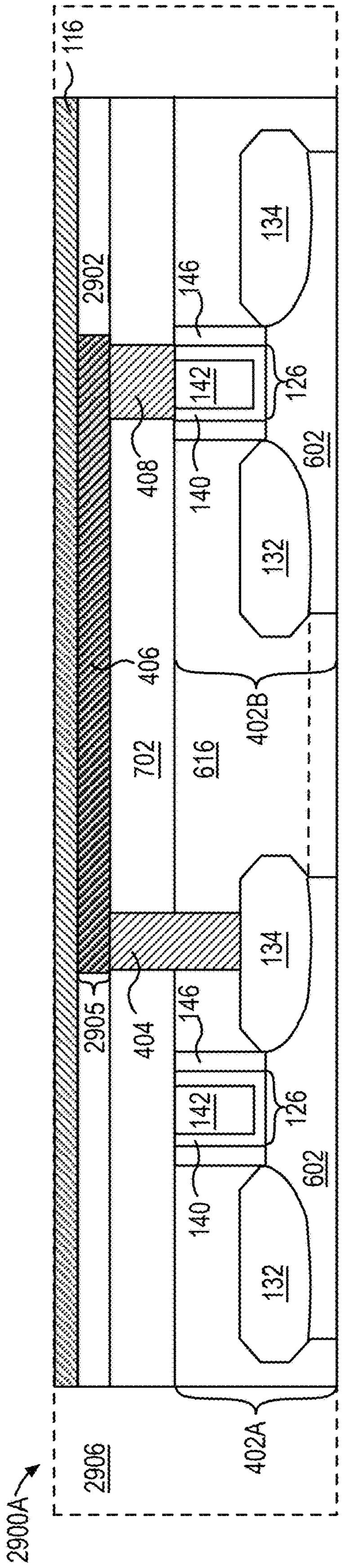
FIG. 29A illustrates a cross-section of structure including a plurality of transistors formed above a substrate, in at least one example.

FIG. 29A illustrates a cross-section of a structure 2900A including a plurality of transistors such as transistors 402A and 402B. In at least one example, structure 2900A is within a portion of a wafer 2906. In at least one example, transistors 402A and 402B are formed above substrate 602. In at least one example, transistors 402A and 402B include properties described above (FIG. 4). In at least one example, transistors 402A and 402B are formed adjacent to each other and separated by dielectric 616. In at least one example, transistors 402A and 402B are co-fabricated on substrate 602 by a method described in association with FIGS. 6A-7A.

Referring again to FIG. 29A, in at least one example, after fabrication of transistors 402A and 402B, and deposition of dielectric 702, drain contact 404 is fabricated on gate electrode 142 of transistor 402A. In at least one example, drain contact 404 can be fabricated by forming a mask on dielectric 702, forming an opening in dielectric 702 and dielectric 616, where the opening exposes drain structure 134 of transistor 402A. In at least one example, one or more materials for forming drain contact is deposited into the opening, on drain structure 134 and on dielectric 702. In at least one example, excess drain contact material is removed from above dielectric 702 by a planarization process such as CMP to form drain contact 404. In at least one example, drain contact 404 includes a conductive material such as Ru, Ti, Co, Mo, Co, Ni, Mo, W, or Ta; or nitrides of Ti, W, or Ta. In at least one example, drain contact 404 includes a liner layer including TiN, TaN, Ti, or Ta and a fill metal on the liner layer.

In at least one example, gate contact 408 may be formed before or after forming drain contact 404. In at least one example, an opening is formed in dielectric 702 above gate structure 126 of transistor 402B. In at least one example, gate contact material is deposited on at least a portion of gate structure 126, where the gate contact material is in contact with gate electrode 142 of transistor 402B. In at least one example, excess gate contact material is removed from above dielectric 702 by a planarization process such as CMP to form gate contact 408. In at least one example, gate contact 408 includes a conductive material such as Ru, Ti, Co, Mo, Co, Ni, W, Mo, or Ta; or nitrides of Ti, W, or Ta. In at least one example, gate contact 408 includes a liner layer including TiN, TaN, Ti, or Ta and a fill metal on the liner layer.

In at least one example, bridge structure 406 is fabricated above transistors 402A and 402B. In at least one example, a dielectric 2902 is blanket deposited on dielectric 702, on gate contact 408 and on drain contact 404. In at least one example, dielectric 2902 includes a material that is same or substantially same as material of dielectric 702.

In at least one example, a mask is formed on a dielectric 2902 and an opening 2905 is formed in dielectric 2902 by a plasma etch process. In at least one example, opening 2905 extends continuously above gate contact 408 and drain contact 404 and exposes portions of dielectric 702 in between. In at least one example, conductive material is deposited into opening 2905, on gate contact 408, drain contact 404, on dielectric 702, and on sidewalls and upper surfaces of dielectric 2902. In at least one example, a CMP process is utilized to remove excess conductive material from above dielectric 2902 to form bridge structure 406. In at least one example, conductive material includes a material that is same or substantially same as material of gate contact 408 and/or drain contact 404. In at least one example, bridge structure 406 extends partially above drain structure 134 of transistor 402A and above both source structure 132 and gate structure 126 of transistors 402B.

In at least one example, after formation of bridge structure 406, dielectric layer 116 is deposited on dielectric 2902. In at least one example, dielectric layer 116 can undergo surface treatment for bonding with another substrate. Methods of surface treatment and preparation for bonding are described above (FIG. 7B).

Figure 29B:
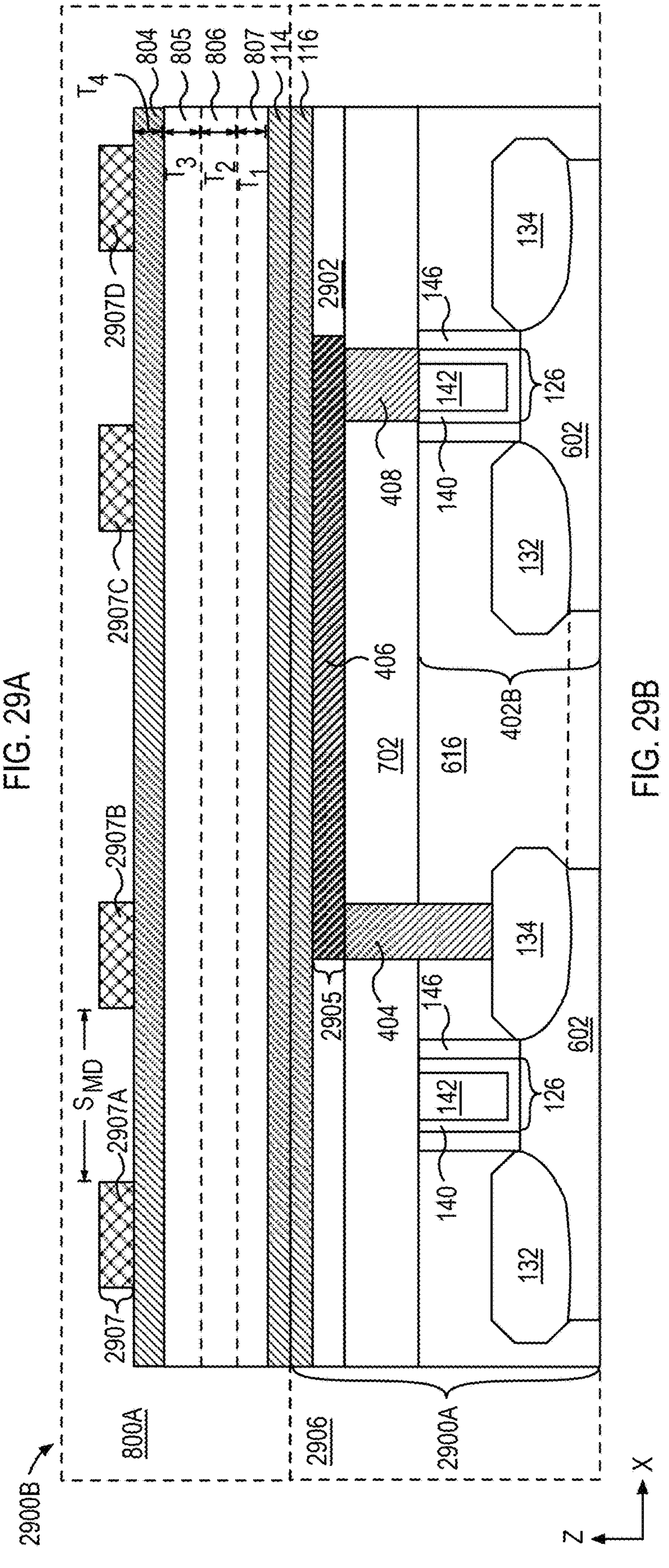
FIG. 29B illustrates a cross-section of structure following process to bond dielectric layer of a first wafer illustrated in FIG. 8A with a dielectric layer of a second wafer illustrated in FIG. 29A, in at least one example.

FIG. 29B illustrates a cross-section of a structure 2900B. In at least one example, structure 2900B illustrates a cross section following process to bond dielectric layer 114 of wafer 800A (FIG. 8A) with dielectric layer 116 of a wafer 2906 (FIG. 29A). In at least one example, the bonding process is the same or substantially the same as the bonding process described in association with FIG. 9.

In at least one example, substrate 803 (FIG. 8A) is removed after bonding by one or more methods described in association with FIGS. 10A-15. In at least one example, a mask 2907 is formed on layer 804. In at least one example, mask 2907 is formed by a lithographic process. In at least one example, mask 2907 includes mask portions 2907A, 2907B, 2907C and 2907D which are utilized to define a shape, size, and location of capacitors to be formed, relative to transistors 402A and 402B. In at least one example, mask portion 2907A is separated from mask portion 2907B by distance $S_{MD}$. In at least one example, mask portion 2907C is separated from mask portion 2907D by distance $S_{MD}$. In at least one example, distance $S_{MD}$ is sufficient to form an encapsulation layer or a spacer adjacent to sidewall of capacitors.

Figure 29C:
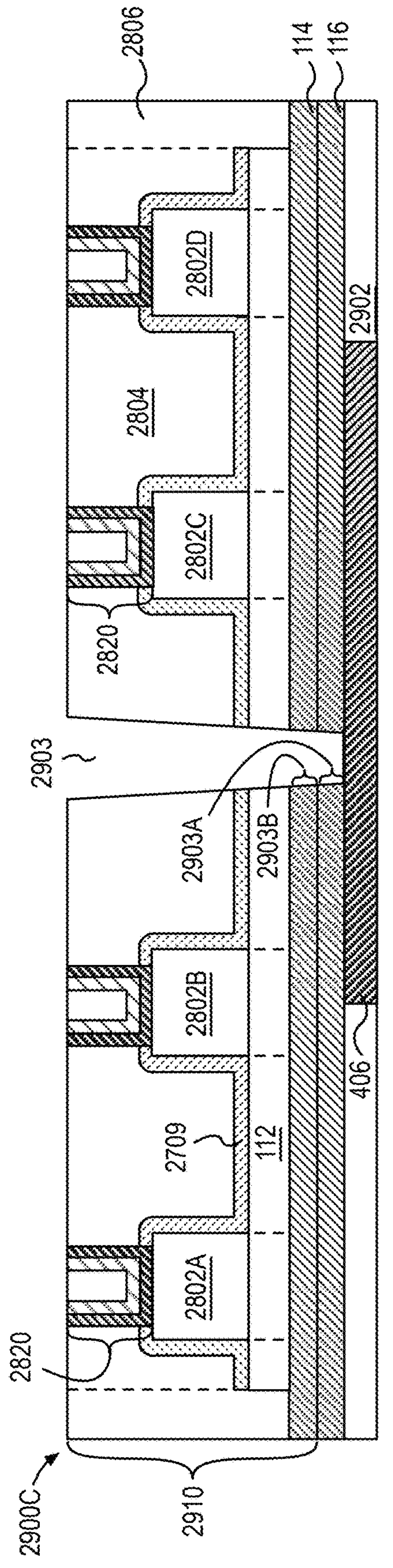
FIG. 29C illustrates a cross-section of structure in FIG. 29B following processes to fabricate capacitors and a via electrode on individual capacitors, in at least one example.

FIG. 29C illustrates a cross-section of structure 2900C. In at least one example, structure 2900C illustrates a cross section of structure 2900B in FIG. 29C following processes to fabricate capacitors 2802A-D (including individual portions of electrode 112), and via electrode 2820 on individual capacitors 2802A-D, in at least one example.

Referring collectively to FIGS. 29B and 29C, in at least one example, process operations described above (FIGS. 28B-28D) can be utilized to form capacitors 2802A, 2802B, 2802C, and 2802D (including forming electrode 112). In at least one example, the process can include depositing encapsulation layer 2709 on capacitors 2802A, 2802B, 2802C, and 2802D and depositing dielectric 2804 on encapsulation layer 2709 prior to patterning and forming electrode 112. In at least one example, dielectric 2806 is deposited after formation of electrode 112. In at least one example, via electrode 2820 is formed above individual capacitors 2802A, 2802B, 2802C, and 2802D. In at least one example, individual via electrodes 2820 can extend in and/or out of the plane away from electrode 112 to couple with programming electrodes. In at least one example, electrodes 2820 can extend in and/or out of the plane when further layers of capacitors are formed above a structure 2910.

In at least one example, one electrode is designed to be coupled between bridge structure 406 and electrode 112. In at least one such example, an opening 2903 is formed in dielectric 2804, in encapsulation layer 2709, electrode 112, dielectric layer 114, and dielectric layer 116. In at least one example, opening 2903 exposes a portion of bridge structure 406. In at least one example, the opening 2903 has one or more characteristics of opening 1901 (FIG. 19B). In at least one example, opening 2903 can be formed to be wider within dielectric layer 116 compared to within dielectric layer 114. In at least one example, removal of dielectric layer 116 from surface of bridge structure 406, within opening 2903, is needed to provide electrical connectivity. In at least one example, an extended etch that is selective to bridge structure 406 and electrode 112 to be performed. In at least one example, the over etch process can widen a portion 2903A of opening 2903 compared to a portion 2903B. In at least one example, over etch can widen portion 2903B, but to a lesser extent than portion 2903A.

Figure 29D:
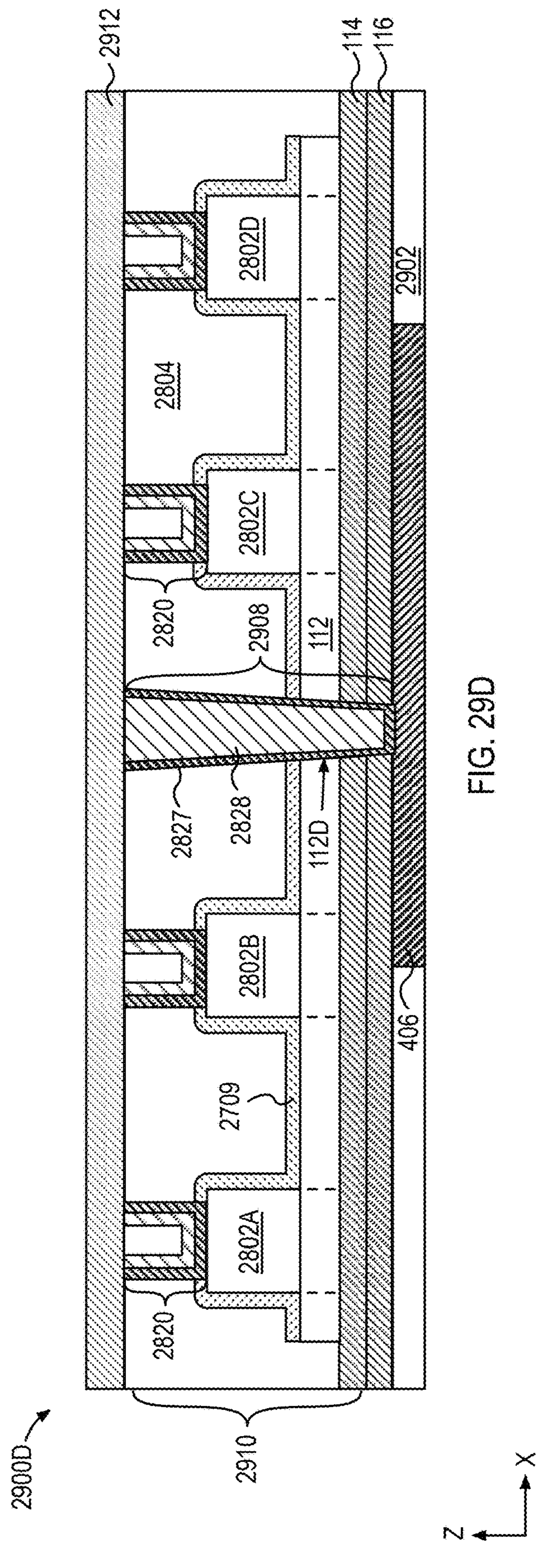
FIG. 29D illustrates a cross-section of structure in FIG. 29C following formation of an electrode coupling the individual capacitors with a bridge structure formed above the plurality of transistors, in at least one example.

FIG. 29D illustrates a cross-section of a structure 2900D. In at least one example, structure 2900D illustrates a cross section of structure 2900C in FIG. 29C following formation of an electrode 2908. Referring collectively to FIGS. 29C and 29D, in at least one example, one or more conductive materials are deposited into opening 2903, on bridge structure 406, and on dielectric 2804. In at least one example, deposition methods and one or more conductive materials utilized are described above (FIG. 28E). In at least one example, electrode 2908 is laterally surrounded by electrode 112, where liner layer 2827 is in contact with sidewall 112D. In at least one example, a planarization process is utilized to polish and remove conductive materials deposited above dielectric 2804. In at least one example, the planarization process includes a chemical mechanical polish (CMP) process and may remove upper portions of electrodes 2820. In at least one example, a plurality of electrode structures can be coupled between bridge structure 406 and electrode 112. In at least one example, a plurality of electrodes can increase electrical conductivity between electrode 112 and bridge structure 406. In at least one such example, bridge structure 406 extends along x-axis, at least parallel to electrode 112.

In at least one example, to prepare for a bonding process, a dielectric 2912 is deposited on electrode 2908. In at least one example, dielectric 2912 includes a material that is same or substantially same as dielectric layer 114. In at least one example, dielectric 2912 can be prepared for bonding to a dielectric formed on a separate wafer, by using one or more methods described above (FIG. 7B). In at least one example, dielectric 2912 can be planarized by a CMP process. In at least one example, dielectric 2912 includes silicon and one or more of oxygen, or carbon. In at least one example, dielectric 2912 is not deposited and dielectric 2804 may be treated for hybrid bonding.

In at least one example, one or more layers of capacitors can be formed above capacitor 2802A-D. In at least one example, one or more layers of capacitors can be formed by forming a multi-layer stack on a separate substrate and then bonding with structure 2900D. In at least one example, it is useful to form a multi-layer stack on a separate substrate to prevent exposure of transistors (not shown) to high temperature deposition and/or anneal process utilized to form a multi-layer stack.

Figure 29E:
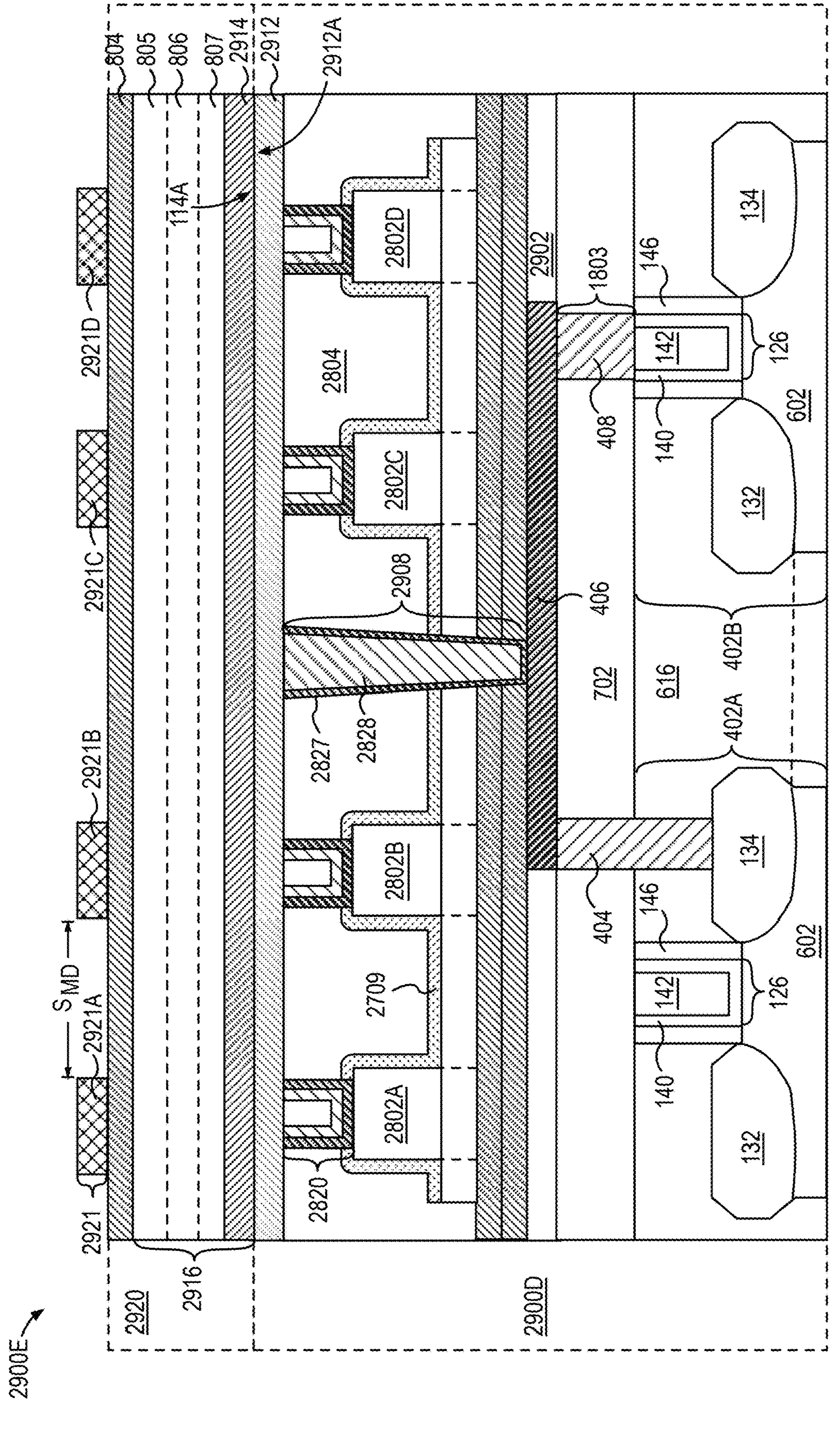
FIG. 29E illustrates a cross-section of structure in FIG. 29D following process to bond dielectric formed above the plurality of transistors, with a third wafer, in at least one example.

FIG. 29E illustrates a cross-section of a structure 2900E. In at least one example, structure 2900E illustrates a cross-section of structure 2900D in FIG. 29D following process to bond dielectric 2912 formed above transistors 402A and 402B, with a dielectric 2914 of a wafer 2920, in at least one example. In at least one example, wafer 2920 can be fabricated identically or substantially identically to wafer 800A (FIG. 8A). In at least one example, dielectric 2914 includes a material that is the same or substantially the same as material of dielectric layer 114. In at least one example, a multi-layer stack 2916 includes one or more layers that are described above in multi-layer stack 802 (FIG. 8A).

In at least one example, dielectric 2912 and dielectric 2914 are prepared and bonded together by one or more methods described above (FIG. 9). In at least one example, bonding process brings a surface 2912A of dielectric 2912 into contact with surface 114A of dielectric layer 114. In at least one example, bonding process is performed at temperatures lower than those required to form transistors 402A and 402B. In at least one example, bonding is performed at room temperature. In at least one example, after bonding process, substrate of wafer 2920 is removed and layer 804 can be planarized before further processing.

In at least one example, a mask 2921 is formed on layer 804. In at least one example, mask 2921 is formed by a lithographic process and includes mask portions 2921A, 2921B, 2921C, and 2921D which are utilized to define a shape, size, and location of capacitors to be formed relative to capacitors 2802A-D. In at least one example, mask portions 2921A, 2921B, 2921C, and 2921D are aligned in x and y directions with capacitors 2802A, 2802B, 2802C, and 2802D, respectively. In at least one example, mask portions 2921A and 2921B are separated by distance $S_{MD}$. In at least one example, distance $S_{MD}$ is utilized to form spacer adjacent to sidewall of capacitors to be formed. In at least one example, mask portions 2921A, 2921B, 2921C, and 2921D can be staggered relative to capacitors 2802A-D to enable a contact electrode to couple individually with respective electrode 2820.

Figure 29F:
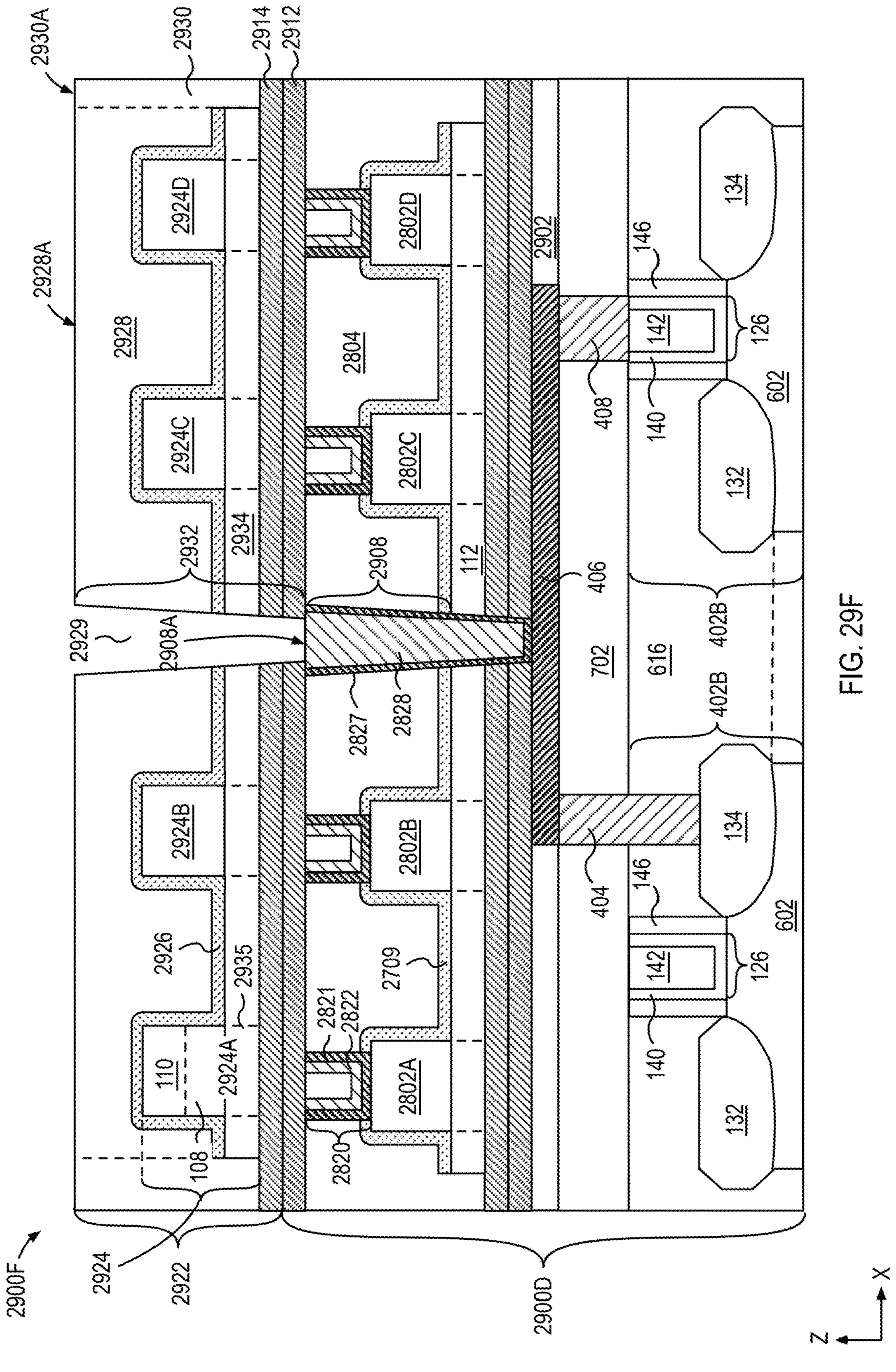
FIG. 29F illustrates a cross-section of structure in FIG. 29E following process to fabricate a second plurality of capacitors above a first plurality of capacitors, in at least one example.

FIG. 29F illustrates a cross-section of a structure 2900E. In at least one example, structure 2900E illustrates a cross-section of structure 2900D in FIG. 29E following process to fabricate a structure 2922 above capacitors 2802A-D, respectively, in accordance with at least one example. In at least one example, method utilized to fabricate structure 2922 is same or substantially same as method utilized to fabricate components of structure 2900C (FIG. 29C).

Referring collectively to FIGS. 29E and 29F, in at least one example, multi-layer stack 2916 (FIG. 29E) is etched to form partial capacitor structures with a top electrode and a dielectric. In at least one example, an encapsulation layer 2926 is deposited on partial capacitor structures. In at least one example, encapsulation layer 2926 includes a material that is same or substantially same as material of encapsulation layer 2709. In at least one example, a dielectric 2928 is deposited on encapsulation layer 2926. In at least one example, a mask is utilized to etch dielectric 2928 and encapsulation layer 2926, and conductive layer 807 to form an electrode 2934.

The process of forming electrode 2934 converts partial capacitor structures into a capacitors 2924. Collectively electrode 110, dielectric 108 and portion of electrode 2934 within dashed lines 2935 is, herein, referred to as a capacitor for example, a capacitor 2924A, a capacitor 2924B, a capacitor 2924C, or a capacitor 2924D. In at least one example, capacitors 2924A-D include a shared bottom electrode in a form of electrode 2934. In at least one example, electrode 2934 includes a material that is the same or substantially the same as the material of electrode 112. In at least one example, material of electrode 2934 can be different from material of electrode 112.

In at least one example, a dielectric 2930 is deposited on dielectric 2928 and on dielectric layer 114. In at least one example, a planarization process is utilized to polish dielectric 2930 so that an uppermost surface 2930A and an uppermost surface 2928A are coplanar or substantially coplanar. In at least one example, dielectric 2930 includes silicon and one or more of oxygen, nitrogen, or carbon. In at least one example, dielectric 2930 includes a material that is the same or substantially the same as the material of dielectric 2928.

In at least one example, opening 2929 is formed in dielectric 2928, an encapsulation layer 2926, conductive layer 807, dielectric 2914, and dielectric 2912. In at least one example, opening 2929 is fabricated by forming a mask on dielectric 2928 and an electrode 2932. In at least one example, opening 2929 has one or more features of opening 1901 (FIG. 19A) or opening 2603 (FIG. 26B). In at least one example, opening 2929 exposes a surface 2908A of electrode 2908. In at least one example, opening 2929 aligns vertically with electrode 2908. In at least one example, opening 2929 has a vertical axis that can be misaligned from a vertical axis of electrode 2908.

Figure 29G:
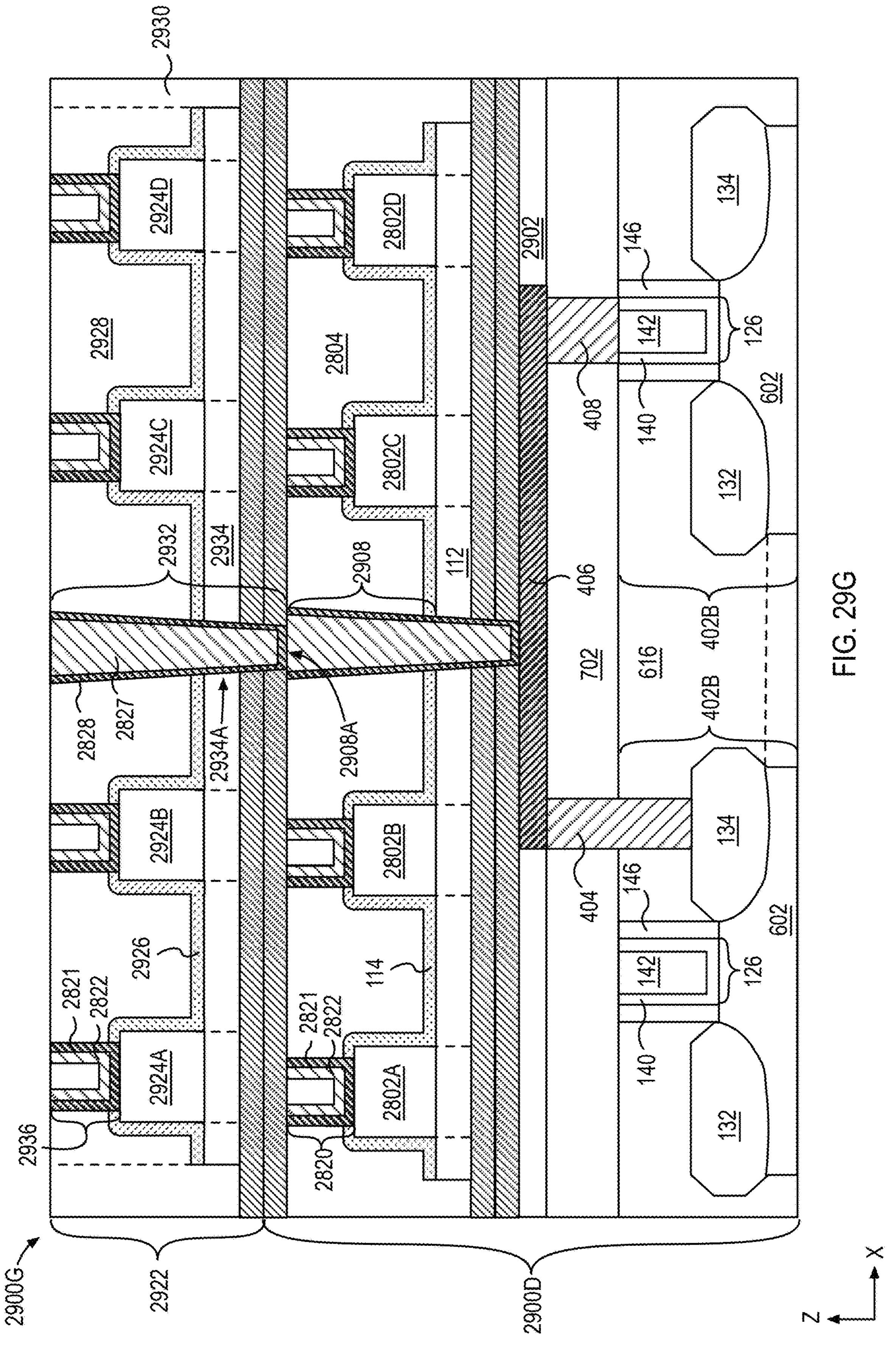
FIG. 29G illustrates a cross-section of structure in FIG. 29F following process to form a coupling electrode and via electrodes on the second plurality of capacitors, in at least one example.

FIG. 29G illustrates a cross-section of a structure 2900G. In at least one example, structure 2900G illustrates a cross-section of structure 2900F in FIG. 29F following process to form electrode 2932 and via electrodes 2936. Referring collectively to FIGS. 29F and 29G, one or more conductive materials are deposited into opening 2929. In at least one example, deposition processes include depositing liner layer 2827 on electrode 2908 and conductive fill material 2828 on liner layer 2827. In at least one example, one or more conductive materials and deposition methods utilized have been described above (FIG. 28E). In at least one example, a planarization process is utilized to polish and remove conductive fill material 2828 and liner layer 2827 from above dielectric 2928 and dielectric 2930, to form electrode 2932. In at least one example, electrode 2932 is formed through electrode 2934 and couples electrode 2934 with electrode 2908. In at least one example, electrode 2932 is laterally surrounded by electrode 2934, and is in contact with a sidewall 2934A. In at least one example, liner layer 2827 of electrode 2932 is in contact with sidewall 2934A.

In at least one example, a via electrode 2936 is formed on individual capacitors 2924A-D. In at least one example, via electrode 2936 is fabricated by a process utilized to fabricate via electrode 2820. In at least one example, via electrode 2936 includes conductive hydrogen barrier 2821, liner 2822, and a conductor 2824. In at least one example, via electrode 2936 can be formed prior to forming electrode 2932.

Figure 30A:
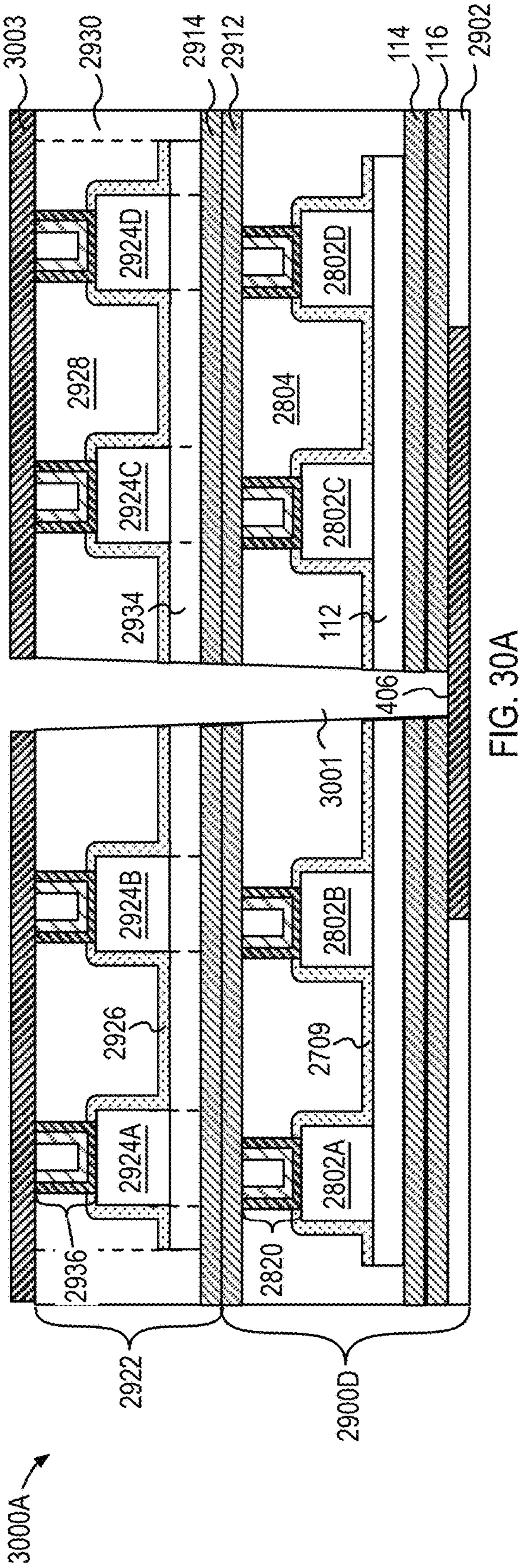
FIG. 30A illustrates a cross-section of structure in FIG. 29F following process to form an opening through two electrodes, in at least one example.

FIG. 30A illustrates a cross-section of a structure 3000A. In at least one example, structure 3000A is a cross-sectional illustration of structure 3000B in FIG. 29F following process to form a mask 3003 and form an opening 3001. In at least one example, mask 3003 may be lithographically formed. In at least one example, a plasma etch process is utilized to form opening 3001 in dielectric 2928, encapsulation layer 2926, electrode 2934, dielectric 2914, dielectric 2912, dielectric 2804, encapsulation layer 2709, dielectric layer 114, and dielectric layer 116. In at least one example, opening 3001 is tapered as illustrated. In at least one example, the plasma etch utilized comprises of multiple operations, where single etch operations comprises etchants that are suitable for etching a given layer. In at least one example, plasma etch process is utilized may form opening 3001, where different layers have features described in association with FIG. 26C.

Figure 30B:
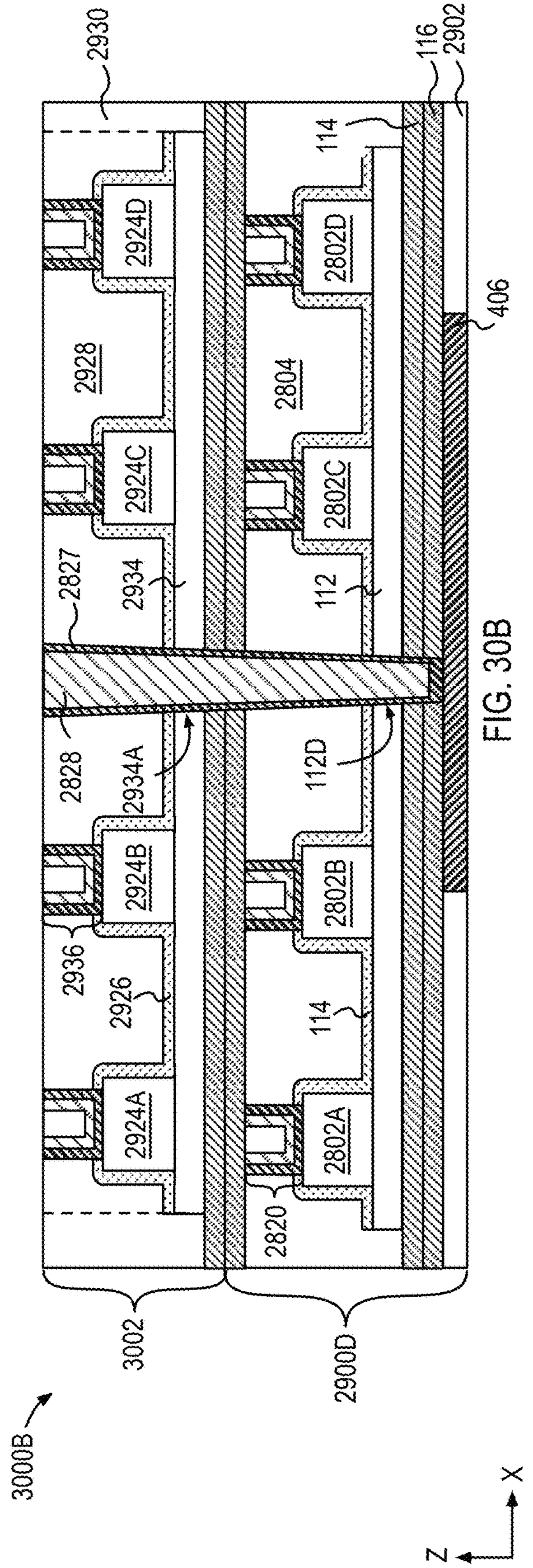
FIG. 30B illustrates a cross-section of structure in FIG. 30A following process to form electrode in the opening, in at least one example.

FIG. 30B illustrates a cross-section of a structure 3000B. In at least one example, structure 3000B illustrates a cross-section of structure 3000A in FIG. 30A following process to form an electrode 3002 in opening 3001. In at least one example, electrode 3002 is formed by processes utilized to form electrode 2932 (FIG. 29G). In at least one example, liner layer 2827 is deposited on bridge structure 406 within opening 3001, and on dielectric 2928, and dielectric 2930, followed by deposition of conductive fill material 2828 on liner layer 2827. In at least one example, liner layer 2827 is deposited adjacent to sidewall 2934A and sidewall 112D to provide electrical conductivity between electrode 2934, electrode 112 and bridge structure 406. In at least one example, a planarization process is utilized to polish and remove excess material of liner layer 2827 and conductive fill material 2828 from above dielectric 2928 and dielectric 2930. In at least one example, the planarization process includes a chemical mechanical planarization (CMP) process.

In at least one example, memory regions can be separated from logic regions for device operation so that capacitors can be coupled with select transistors in a memory region, and transistors with peripheral circuitry can be implemented for logic operation in an adjacent logic region within a chip. In at least one example, methods to form an electrode coupling one or more capacitors with at least one underlying transistor, as described in association with FIGS. 6A-30B, can be adopted to create memory regions and adjacent logic regions after a bonding process.

Figure 31A:
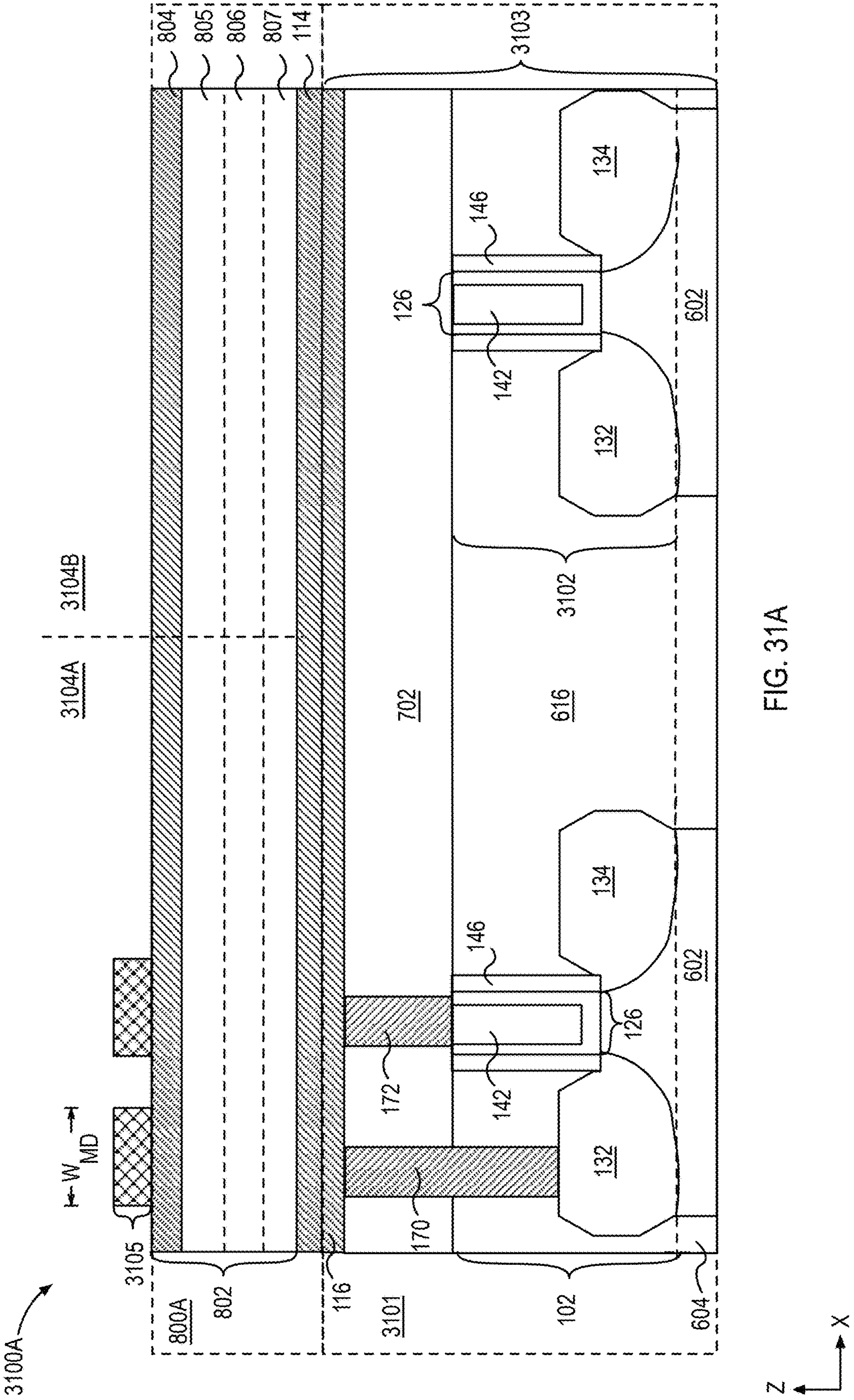
FIG. 31A illustrates a cross-section of structure where a first wafer comprising a plurality of transistors is bonded with wafer to form memory and logic devices, in at least one example.

FIG. 31A illustrates a cross-section of a structure 3100A. In at least one example, structure 3100A illustrates a wafer 3101 bonded with wafer 800A. In at least one example, substrate 803 of wafer 800A is removed by one or more processes described above. In at least one example, wafer 3101 includes a structure 3103, where structure 3103 includes features of wafer 710 (FIG. 7B), such as transistor 102, dielectric 702 and dielectric layer 116. In at least one example, structure 3103 further includes a logic region 3104B directly adjacent to a memory region 3104A. In at least one example, logic region 3104B includes a transistor 3102. In at least one example, transistors 102 and 3102 are co fabricated and are identical or substantially identical. In at least one example, transistors 102 and 3102 are co-fabricated but may not be identical, for example transistor 3102 may be tuned to perform logic operations and transistor 102 may be tuned to perform memory operations. In at least one example, transistor 102 and transistor 3102 may be examples of trigate, nanowire, fully depleted silicon-on-insulator transistors.

In at least one example, source contact 170 may be coupled with source structure 132 and gate contact 172 may be coupled with gate structure 126 of transistor 102 prior to the bonding process. In at least one example, one or more intervening structures may be present with dielectric 702 that extend in/or out of the plane of the Figure. In at least one example, transistor 3102 may not be coupled with gate, drain or source contact prior to deposition of dielectric layer 116 or bonding process.

In at least one example, a mask 3105 is formed on layer 804 by a lithographic process. In at least one example, mask 3105 includes photoresist material or hardmask material that has been patterned by a photoresist. In at least one example, mask 3105 can include a conductive material. In at least one example, a conductive material including Ta, TaN, TiN, or W can be patterned with photoresist and can offer protection against patterning conductive layers in multi-layer stack 802. In at least one example, mask for forming two capacitors are shown.

Figure 31B:
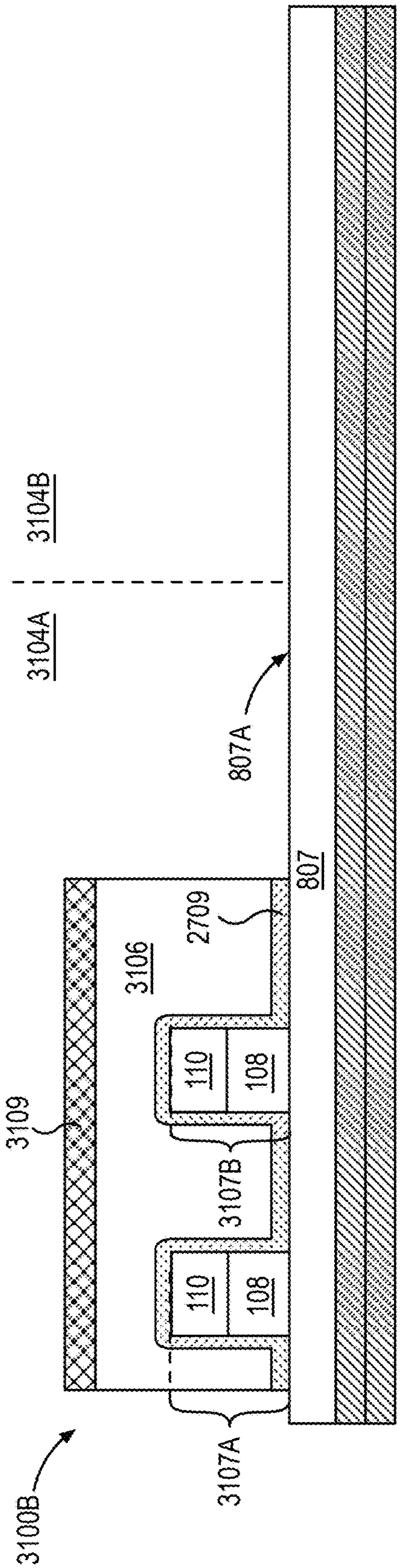
FIG. 31B illustrates a cross-section of structure in FIG. 31A following process to partially etch multi-layer stack, in at least one example.

FIG. 31B illustrates a cross-section of a structure 3100B. In at least one example, structure 3100B illustrates a cross-section of structure 3100A in FIG. 31A following process to partially etch multi-layer stack 802. Referring collectively to FIGS. 31A and 31B, in at least one example, a plasma etch process is utilized to etch conductive layer 805 and dielectric layer 806 to form electrode 110 and dielectric 108, respectively, of partial capacitor structures 3107A and 3107B.

In at least one example, encapsulation layer 2709 is blanket deposited on uppermost surface and on sidewalls of electrode 110, on sidewalls of dielectric 108 and on surface 807A. In at least one example, encapsulation layer 2709 includes silicon and one or more of oxygen, nitrogen, or carbon.

In at least one example, a dielectric 3106 is blanket deposited on encapsulation layer 2709 memory region 3104A and in logic region 3104B. In at least one example, dielectric 3106 includes silicon and one or more of oxygen, nitrogen, or carbon. In at least one example, dielectric 3106 includes material that is different from a material of encapsulation layer 2709. In at least one example, dielectric 3106 is planarized by a CMP process. In at least one example, a mask 3109 is formed on dielectric 3106 by a lithographic process. In at least one example, mask 3109 defines an outline of bottom electrode of capacitors to be formed. In at least one example, a plasma etch is utilized to etch and remove dielectric 3106 and encapsulation layer 2709 partially from memory region 3104A and from logic region 3104B.

Figure 31C:
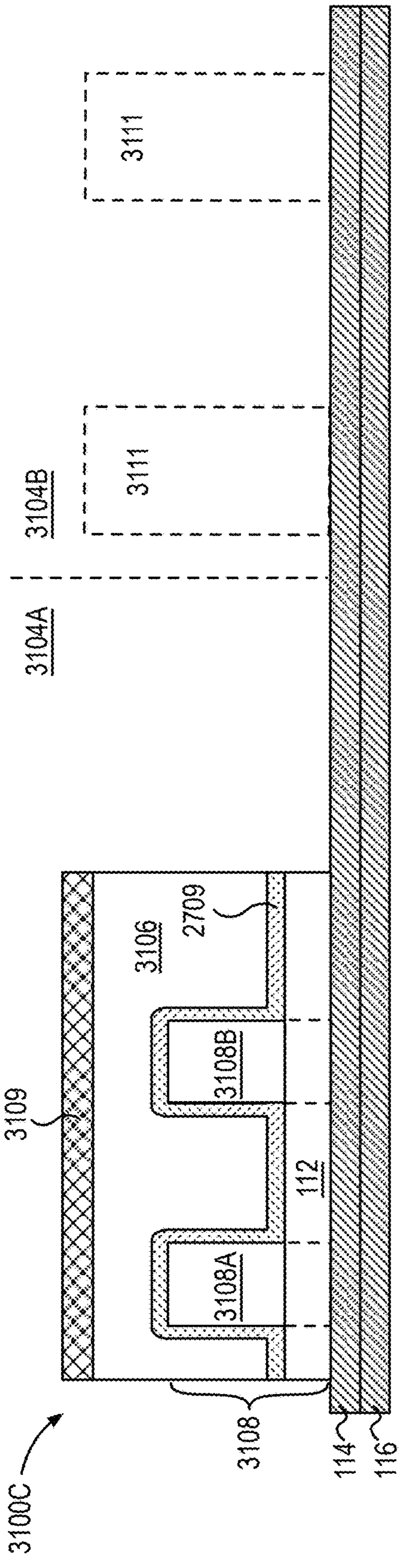
FIG. 31C illustrates a cross-section of structure in FIG. 31B following process to pattern a conductive layer to form a plurality of capacitors with a shared electrode in a memory region, in at least one example.

FIG. 31C illustrates a cross-section of a structure 3100C. In at least one example, structure 3100C illustrates a cross-section of structure 3100B in FIG. 31B following process to pattern conductive layer 807 to form electrode 112 in memory region 3104A. Referring collectively to FIGS. 31C and 31B, in at least one example, dielectric 3106 and encapsulation layer 2709 are used as a mask to etch layer 807 to form electrode 112. In at least one example, electrode 112 is confined to the memory region 3104A as shown. In at least one example, lateral thickness of electrode 112 can be chosen to provide a surface area to couple with at least one electrode. Patterning to form electrode 112 creates capacitors 3108 (such as a capacitor 3108A and a capacitor 3108B), where capacitors 3108 share electrode 112. In at least one example, portions of dielectric layer 114 and dielectric layer 116 may be etched during patterning to form electrode 112. In at least one example, plasma etch process that is utilized to form electrode 112 is selective to dielectric layer 114. In at least one example, it is useful for plasma etch to be selective to dielectric layer 114 to prevent etching of electrodes (not shown) in logic region 3104B. In at least one example, etching of electrodes in logic region can cause sputtering of conductive material and cause device degradation in memory region 3104A and in logic region 3104B. In at least one example, dummification masks can also be utilized to form dummy structures (dashed lines 3111) in open areas in logic region 3104B. In at least one example, dummy structures can help to maintain patterning density to prevent etch loading and preserve CMP over polishing.

Figure 31D:
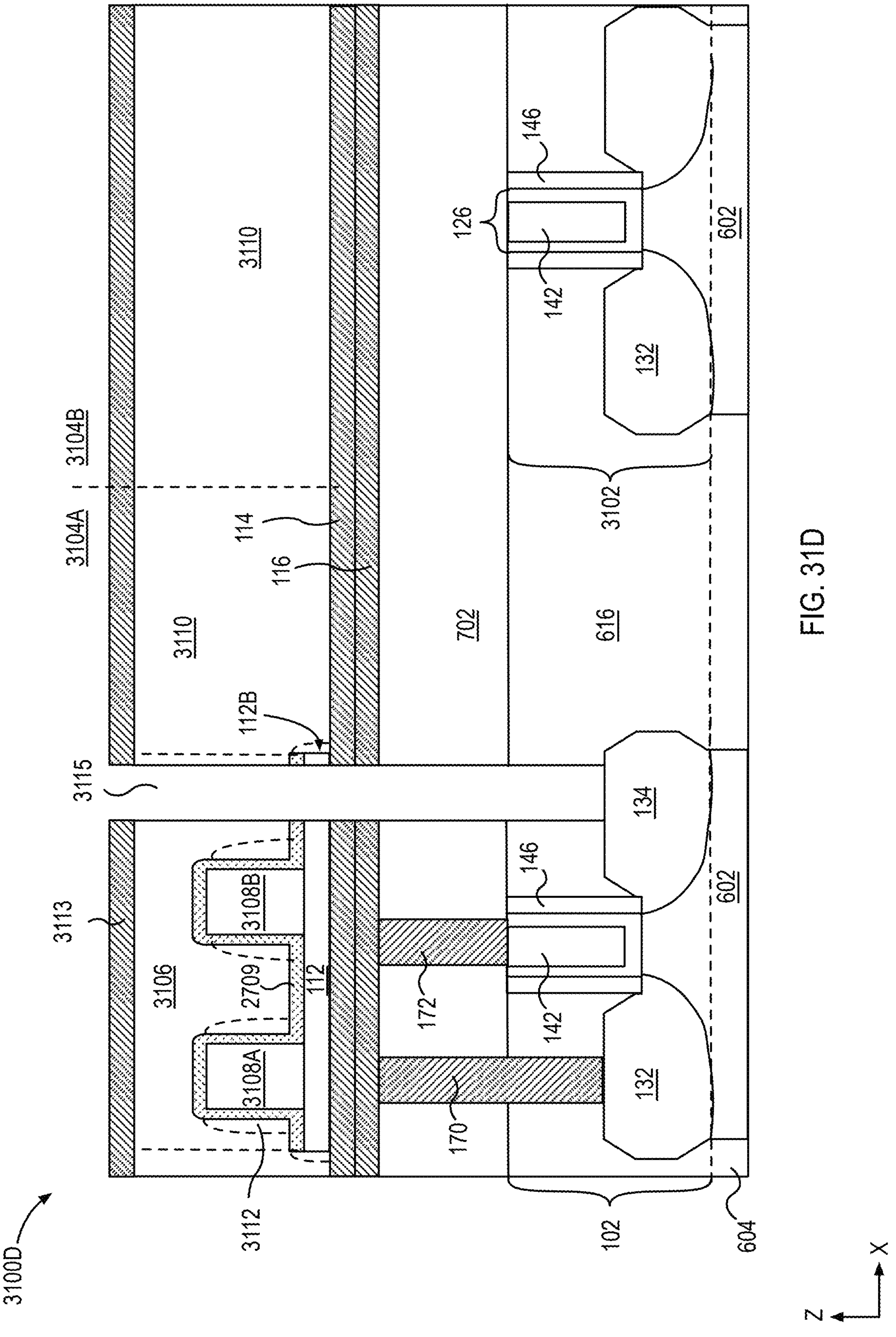
FIG. 31D illustrates a cross-section of structure in FIG. 31C following deposition of dielectric on a plurality of capacitors and following formation of opening through at least a portion of the electrode, in at least one example.

FIG. 31D illustrates a cross-section of a structure 3100D. In at least one example, structure 3100D illustrates a cross-section of structure 3100C in FIG. 31C following deposition of a dielectric 3110 and following formation of an opening 3115, in at least one example. In at least one example, dielectric 3110 is deposited on dielectric 3106 and within open areas of memory region 3104A and logic region 3104B. In at least one example, dielectric 3110 is planarized after deposition. In at least one example, dielectric 3110 and dielectric 3106 include a same material. In at least one example, dielectric 3106 and dielectric 3110 include a material having a theoretical material density of over 90% and include a material that can provide a barrier against oxygen or hydrogen diffusion to dielectric 108 through electrode 112.

In at least one example, prior to depositing dielectric 3110, a spacer 3112 (indicated by dashed lines) can be formed on sidewall 112B of electrode 112. In at least one example, spacer 3112 can provide a barrier against oxygen or hydrogen diffusion through electrode 112. In at least one example, a material of encapsulation layer 2709 is blanket deposited and a plasma etch process can be utilized to etch and form spacer 3112. In at least one example, spacer 3112 can be formed against encapsulation layer 2709 that is formed on sidewalls of capacitors 3108A and 3108B.

In at least one example, a mask 3113 may be lithographically formed on dielectric 3110. In at least one example, a plasma etch process is utilized to etch dielectric 3110, encapsulation layer 2709, electrode 112, dielectric layer 114, dielectric layer 116, dielectric 702 dielectric 616 and expose drain structure 134. In at least one example, opening 3115 may not extend through electrode 112, but is adjacent to it, as discussed above. In at least one such example, sidewall 112B may be exposed so that electrode to be formed can make an electrical connection with electrode 112. In at least one example, opening 3115 may extend through an edge region of electrode 112 as discussed above (FIGS. 1E and 1F).

Figure 31E:
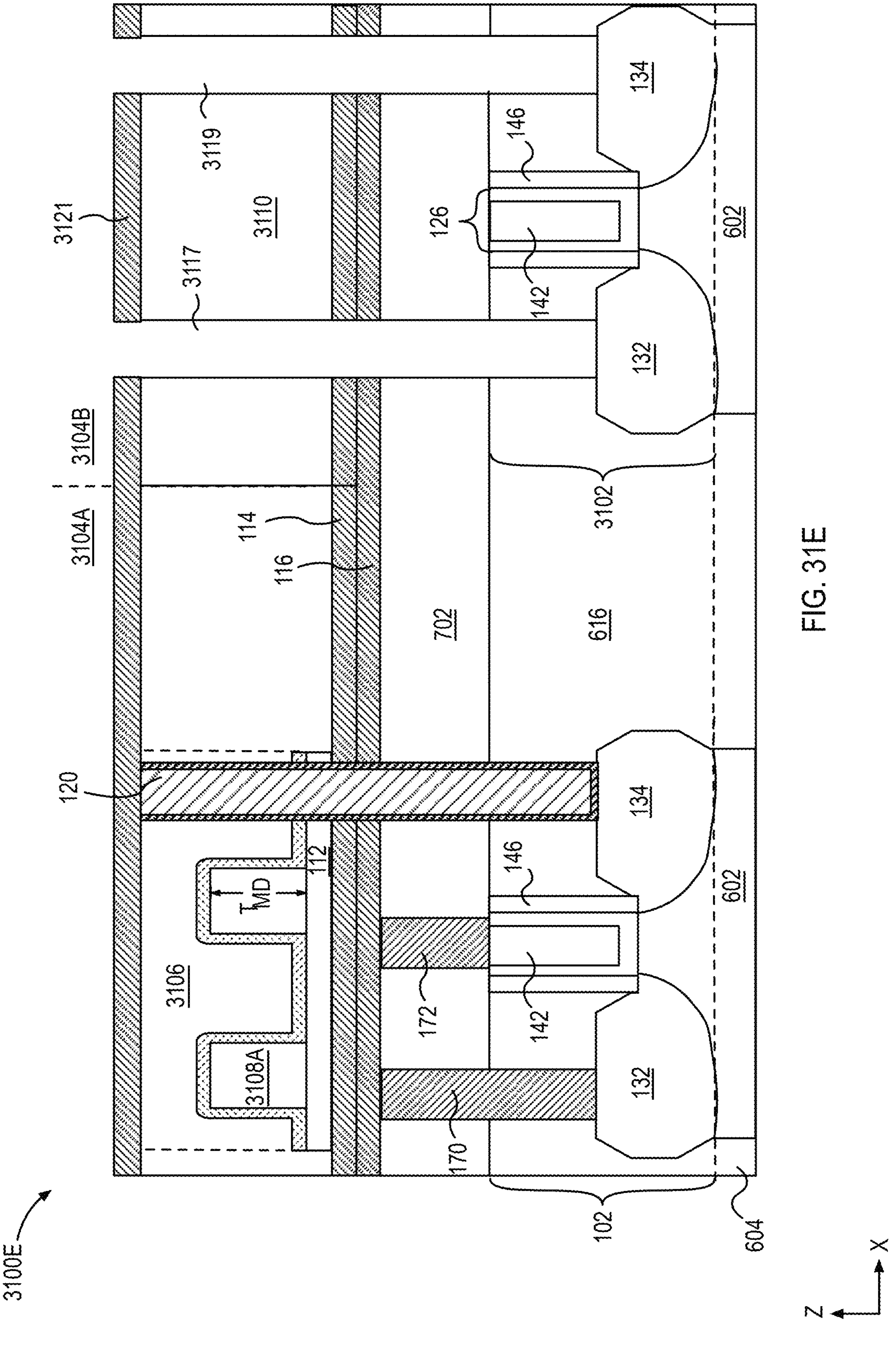
FIG. 31E illustrates a cross-section of structure in FIG. 31D following processes to form electrode coupling a terminal of the plurality of capacitors and following a process to form openings over a transistor in logic region, in at least one example.

FIG. 31E illustrates a cross-section of a structure 3100E. In at least one example, structure 3100E illustrates a cross-section of structure 3100D in FIG. 31D following processes to form electrode 120, and openings 3117 and 3119 over transistor 3102 in logic region 3104B, in at least one example. In at least one example, electrode 120 is formed by a process that is described above (FIG. 19C).

In at least one example, a mask 3121 is formed on dielectrics 3106 and 3110. In at least one example, mask 3121 may be formed by a lithographic pattern. In at least one example, a plasma etch process is utilized to etch dielectric 3110, dielectric layer 114, dielectric layer 116, dielectric 702, and dielectric 616, through mask 3121 to form openings 3117 and openings 3119. In at least one example, openings 3117 and 3119 can extend in or out of the plane of the Figure.

Figure 31F:
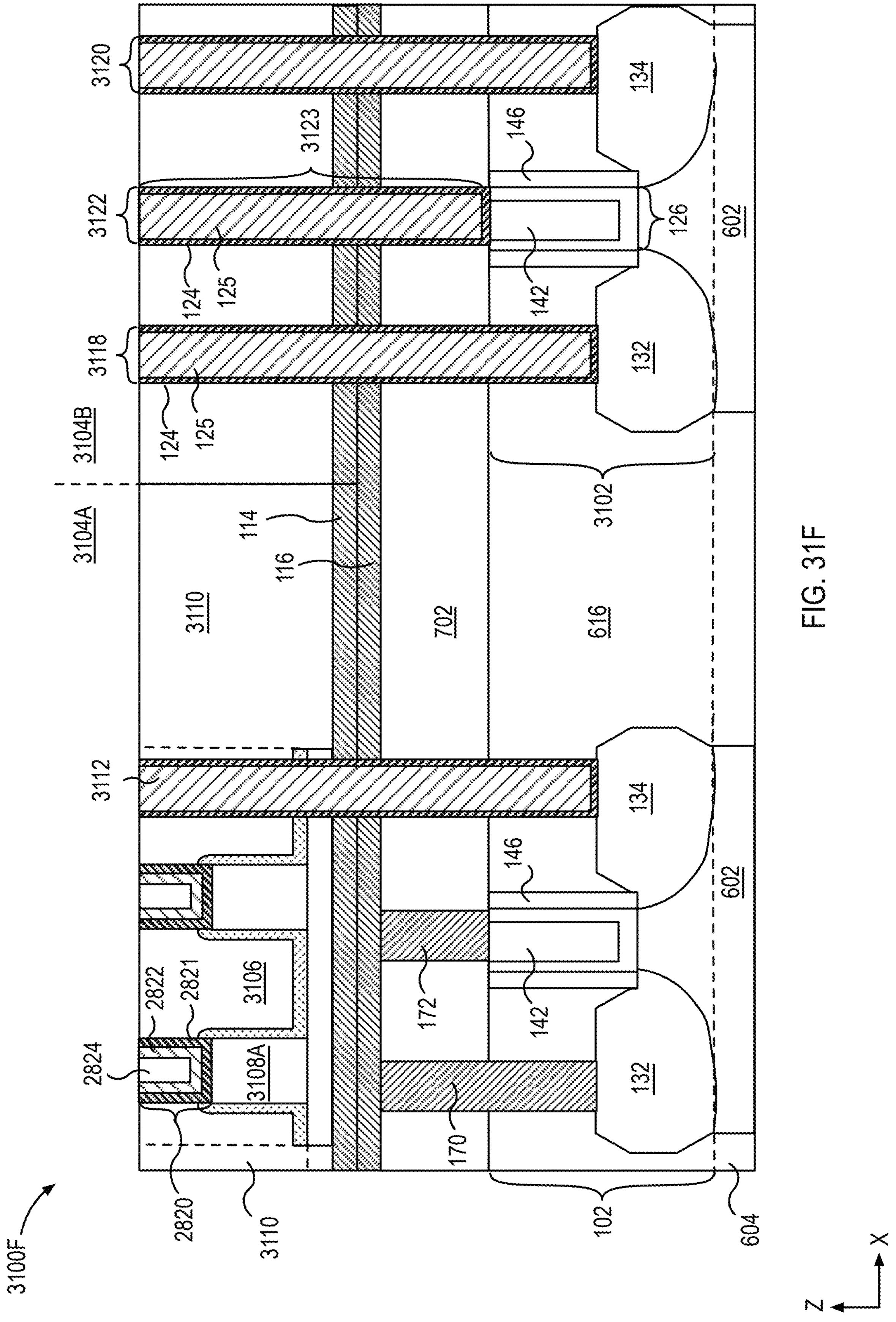
FIG. 31F illustrates a cross-section of structure in FIG. 31E following process to form source contact and drain contact to couple with transistor in logic region, in at least one example.

FIG. 31F illustrates a cross-section of a structure 3100F. In at least one example, structure 3100F illustrates a cross-section of structure 3100E in FIG. 31E following process to form a source contact 3118 and a drain contact 3120, in logic region 3104B, and form electrodes 2820 above capacitor 3108A and 3108B, in memory region 3104A.

In at least one example, methods described above describe formation of capacitor 106 coupled with electrode 120. In at least one example, such methods can be implemented to fabricate capacitor 152 formed above electrode 156 and coupled with electrode 120. In at least one such example, multi-layer stack utilized includes at least one additional layer as illustrated in FIG. 23.

Referring collectively to FIGS. 31E and 31F, in at least one example, liner layer 124 is blanket deposited in openings 3117 and openings 3119. In at least one example, conductive fill material 125 is blanket deposited on liner layer 124. In at least one example, liner layer 124 and conductive fill material 125 are deposited by one of: ALD, PEALD, a PVD, or a sputter deposition process. In at least one example, after deposition process, liner layer 124 and conductive fill material 125 are removed from uppermost surfaces of dielectric 3106 and dielectric 3110 by a planarization process. In at least one example, planarization process includes a CMP process. In at least one example, a gate contact 3122 can be formed prior to or after forming source contact 3118 and drain contact 3120. In at least one example, method to form gate contact is similar to formation of source contact 3118 and drain contact 3120. In at least one example, an opening 3123 is formed in dielectric 3110, dielectric layer 114, dielectric layer 116, and dielectric 702 to expose gate electrode 142 or gate structure 126. In at least one example, liner layer 124 is blanket deposited in opening 3123. In at least one example, conductive fill material 125 is blanket deposited on liner layer 124. In at least one example, liner layer 124 and conductive fill material 125 are deposited by one of: ALD, PEALD, a PVD, or a sputter deposition process. In at least one example, after deposition process, liner layer 124 and conductive fill material 125 are removed from uppermost surfaces of dielectric 3106 and dielectric 3110 by a planarization process. In at least one example, electrodes 2820 can be fabricated by methods that are the same or substantially the same as methods described above (FIGS. 28C and 28D).

In at least one example, capacitors can be fabricated, prior to bonding process described above (FIG. 12). In at least one example, it is useful to form capacitors prior to bonding because it is useful to anneal capacitors post fabrication. In at least one example, post fabrication anneal can passivate dangling bonds that can be cause of charge loss in capacitors. In at least one example, post fabrication anneal temperatures can be similar to anneal temperatures post stack deposition. In at least one example, post fabrication anneal can be performed at temperatures that can cause thermal degradation of transistors. In at least one example, temperatures above 800 degrees Celsius, for time periods of several minutes or more, can cause thermal degradation of transistors.

FIGS. 32A-32D illustrates cross sections of process flow utilized bond capacitors formed on one substrate with a transistor formed above a different substrate.

Figures 32A, 32B, 32C:
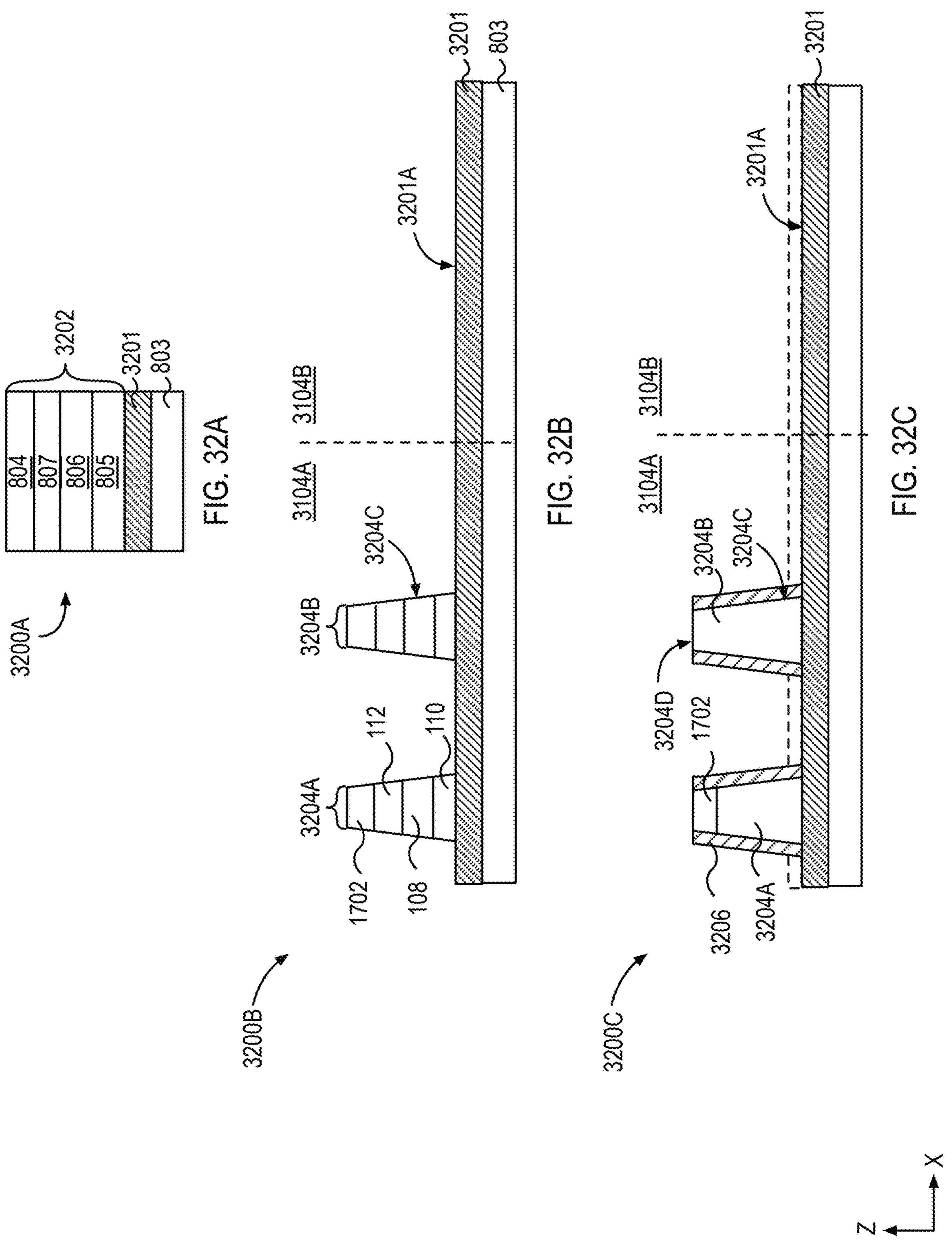
FIG. 32A is a cross-sectional illustration of a multi-layer stack formed above a substrate, in at least one example.
FIG. 32B illustrates a cross-section of structure in FIG. 32A following process to pattern the multi-layer stack to form plurality of capacitors, in at least one example.
FIG. 32C illustrates a cross-section of structure in FIG. 32B following process to form spacer on sidewalls of plurality of capacitors, in at least one example.

FIG. 32A illustrates a cross-section of a structure 3200A. In at least one example, structure 3200A is a cross-sectional illustration of a multi-layer stack 3202. In at least one example, a layer 3201 may be blanket deposited on substrate 803. In at least one example, layer 3201 includes a dielectric material. In at least one example, layer 3201 may be a sacrificial layer or retained after patterning and bonding process. In at least one example, layer 3201 may include material that can facilitate removal or substrate 803 after a bonding process to be formed.

In at least one example, multi-layer stack 3202 is formed on layer 3201. In at least one example, multi-layer stack 3202 comprises one or more properties of multi-layer stack 802, such as conductive layer 805, dielectric layer 806, conductive layer 807 and layer 804. In at least one example, layer 804 may be a bilayer with a lower layer that includes a conductive material and an upper layer that includes a dielectric. In at least one example, layers within multi-layer stack 3202 may be sequentially blanket deposited, and include materials described above (FIG. 8A). In at least one example, a templating layer may be formed above layer 3201 prior to depositing conductive layer 805.

FIG. 32B illustrates a cross-section of a structure 3200B. In at least one example, structure 3200B is a cross-sectional illustration of structure 3200A in FIG. 32A following process to pattern multi-layer stack 3202 to form capacitors 3204A and 3204B. In at least one example, capacitors 3204A and 3204B are fabricated in memory region 3104A. In at least one example, two capacitors are illustrated but an array of any number of capacitors can be formed. In at least one example, formation of capacitors 3204A and 3204B prior to wafer bonding can enable greater flexibility choices of materials implemented and size of electrode structures.

In at least one example, a plasma etch process is utilized to pattern multi-layer stack 3202 and form capacitors 3204A and 3204B. In at least one example, the plasma etch process forms hardmask 1702, electrode 112, dielectric 108 and electrode 154. In at least one example, capacitors 3204A and 3204B further includes hardmask 1702 on electrode 112, as shown. In at least one example, hardmask 1702 can be a bilayer as discussed above. In at least one example, a sidewall 3204C of respective capacitors 3204A and 3204B is tapered, as shown. In at least one example, sidewall 3204C of respective capacitor 3204A and capacitor 3204B is substantially vertical.

In at least one example, layer 3201 can have an arbitrary thickness because a portion of thickness can be removed after bonding. In at least one such example, layer 3201 having an arbitrary thickness is useful because capacitors 3204A and 3204B can be patterned with greater flexibility compared to when forming capacitors above electrode structures or conductive layers after the bonding process. In at least one example, patterning to form capacitors 3204A and 3204B above electrode structures or conductive layers can lead to damage of underlying structures during an over etch process. In at least one example, damage can result when there is loss of etch selectivity between material of electrode 154 and material of electrode structures, one or more conductive layer, and/or one or more dielectric layers, such as layer 3201. In at least one example, layer 3201 can be recessed or damaged with little to no impact to final memory device formed.

In at least one example, after fabrication of capacitors 3204A and 3204B a thermal anneal can be performed. In at least one example, thermal anneal can be performed in $O_2$ atmosphere. In at least one example, thermal anneal in $O_2$ atmosphere can be utilized to passivate dangling bonds. In at least one example, thermal anneal can also move point defects from interior of capacitors 3204A and 3204B to sidewall 3204C to reduce roughness within interfaces at dielectric 108. In at least one example, thermal anneal can include methods that are described in association with FIG. 11A.

FIG. 32C illustrates a cross-section of a structure 3200C. In at least one example, structure 3200C is a cross-sectional illustration of structure 3200B in FIG. 32B following process to form a spacer 3206 on capacitors 3204A and 3204B, in at least one example. In at least one example, materials and methods used to form spacer 3206 are same or substantially same as and materials and methods of formation utilized to form spacer 122 (FIG. 17B). In at least one example, an encapsulation layer is blanket deposited on sidewalls 3204C of capacitors 3204A and 3204B by ALD, PEALD, PVD process, or a combination thereof. In at least one example, the encapsulation layer is etched and removed from a surface 3204D and from a surface 3201A to form spacer 3206 adjacent to sidewall 3204C. In at least one example, when hardmask 1702 includes a bilayer, the lower conductive layer may remain after forming spacer 3206. In at least one example, the plasma etch process may remove the dielectric material in the bilayer. In at least one example, some portions of dielectric in the bilayer may remain, where the dielectric can be removed during a subsequent planarization process.

FIG. 32D illustrates a cross-section of a structure 3200D. In at least one example, structure 3200D is a cross-sectional illustration of structure 3200C in FIG. 32C following process to deposit a dielectric 3208 on sidewalls of spacer 3206 and following a process to planarize dielectric 3208, in at least one example. In at least one example, dielectric 3208 includes a material that is same or substantially same as material of dielectric 1732 (FIG. 17C). In at least one example, after deposition, dielectric 3208 is planarized by a CMP process. In at least one example, CMP process is utilized to remove spacer 3206 from above capacitors 3204A and 3204B and expose surface 3204D. In at least one example, when surface 3204D is curved, CMP process can make surface 3204D substantially co-planar with a surface 3208A of dielectric 3208. In at least one example, the CMP process removes hardmask 1702, when hardmask 1702 includes a dielectric material. In at least one example, when hardmask 1702 includes a bilayer, the CMP process removes the dielectric material within hardmask 1702 and exposes the lower layer which includes the conductive material. In at least one example, when hardmask 1702 includes a conductive material, depending on barrier properties of the conductive material, CMP process may or may not remove hardmask 1702.

In at least one example, after planarization, a conductive layer 3210 is deposited on capacitor 3204A and capacitor 3204B. In at least one example, conductive layer 3210 is deposited by a PVD, ALD, or a PEALD process to obtain uniform thickness. In at least one example, conductive layer 3210 is same or substantially same as material of dielectric layer 114 (FIG. 1A). In at least one example, conductive layer 3210 can include materials that can provide barrier against hydrogen and oxygen but are substantially difficult to etch selectively to insulator materials, for example, noble metals such as gold, platinum, palladium, silver or rhodium. In at least one example, conductive layer 3210 may be planarized after deposition to provide a surface that is atomically smooth for deposition of a dielectric. In at least one example, structure 3200D is a portion of a wafer 3220.

FIG. 33A illustrates a cross-section of a structure 3300A. In at least one example, structure 3300A illustrates a cross-section of portion within a dashed box 3211 in FIG. 32D. In at least one example, dielectric 3208 and/or spacer 3206 can be recessed. In at least one example, hardmask 1702 is a conductive material. In at least one example, spacer 3206 is not recessed relative to dielectric 3208. In at least one example, where dielectric 3208 is recessed relative to surface 3204D, portion of conductive layer 3210 is deposited adjacent to a sidewall 3206A of spacer 3206, as shown.

In at least one example, hardmask 1702 can be removed by planarization until electrode 112 is exposed. In at least one such example, top surfaces of spacer 3206 and electrode 112 can be co-planar or substantially co-planar as shown in the cross-sectional illustration of structure 3300B in FIG. 33B. In at least one example, conductive layer 3210 can be deposited on to surface 112C of electrode 112.

In at least one example, an encapsulation layer 3214 deposited is not etched as illustrated in cross-sectional illustration of structure 3300C in FIG. 33C. In at least one such example, encapsulation layer 3214 includes portions that extend on recessed portions of layer 3201. Depending on the level of recess, encapsulation layer 3214 may remain after a subsequent bonding process, discussed below.

Figure 34A:
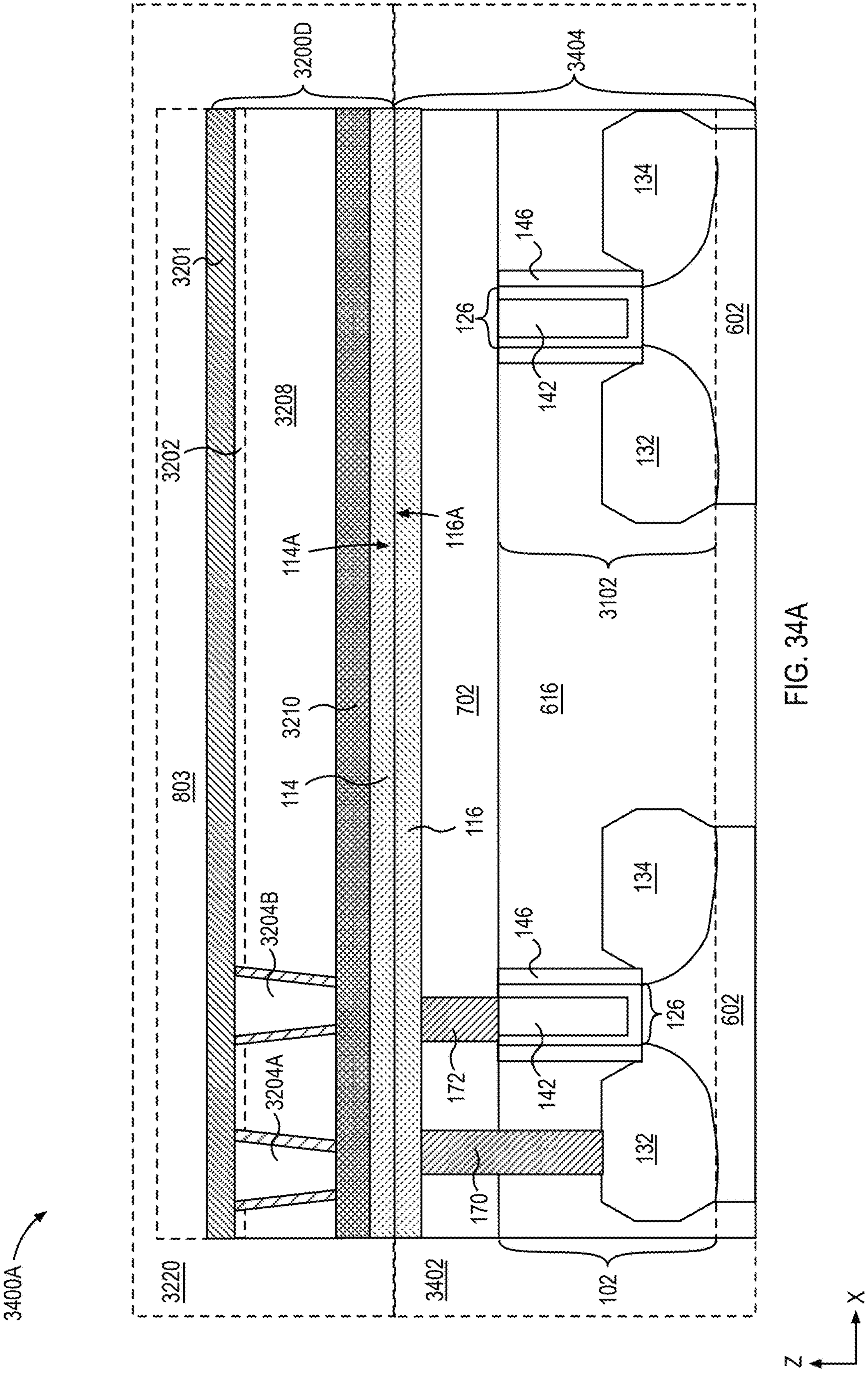
FIG. 34A illustrates a cross-section of structure in FIG. 32D bonded with a wafer comprising a plurality of transistors, in at least one example.

FIG. 34A illustrates a cross-section of a structure 3400A. In at least one example, structure 3400A illustrates a cross-section of structure 3200D in FIG. 32D bonded with a structure 3404. In at least one example, structure 3404 includes features of structure 3103 (FIG. 31A), such as transistor 102, dielectric 616, transistor 3102, and dielectric layer 116. In at least one example, structure 3404 is part of a wafer 3402 and structure 3200D is part of wafer 3220. In at least one example, wafer 3402 and wafer 3220 can include structures other than structure 3200D and structure 3404, respectively.

In at least one example, prior to bonding, dielectric layer 114 is deposited on layer 3201. In at least one example, dielectric layer 114 is prepared for bonding process. In at least one example, wafer 3220 is bonded with wafer 3402. In at least one example, bonding process includes bringing surface 114A into contact with surface 116A. Methods of preparing surfaces 114A and 116A and methods of bonding have been described above.

In at least one example, where capacitors 3204A and 3204B are fabricated and then bonded to structure 3404 that includes transistors 102 and 3102, bonding process results in physically inverting capacitors 3204A and 3204B relative to transistors 102 and 3102. In at least one such example, sidewalls of capacitors 3204A and 3204B can have a re-entrant shape relative to upper surface of gate structure 126. In at least one example, re-entrant shape can result in reduced spacing between adjacent capacitors 3204A and 3204B. In at least one example, where material of spacer 3206 is deposited but not etched (as indicated by dashed lines), unetched material of spacer 3206, remains above a dielectric 3208 (in the inverted configuration). In at least one example, substrate 803 is removed after the bonding process by one or more methods described above.

In at least one example, dielectric 702 and dielectric layer 116 can include a same material. In at least one such example, dielectric layer 116 is deposited on dielectric 702 after formation of source contact 170 and gate contact 172 but prior to a bonding process.

Figure 34B:
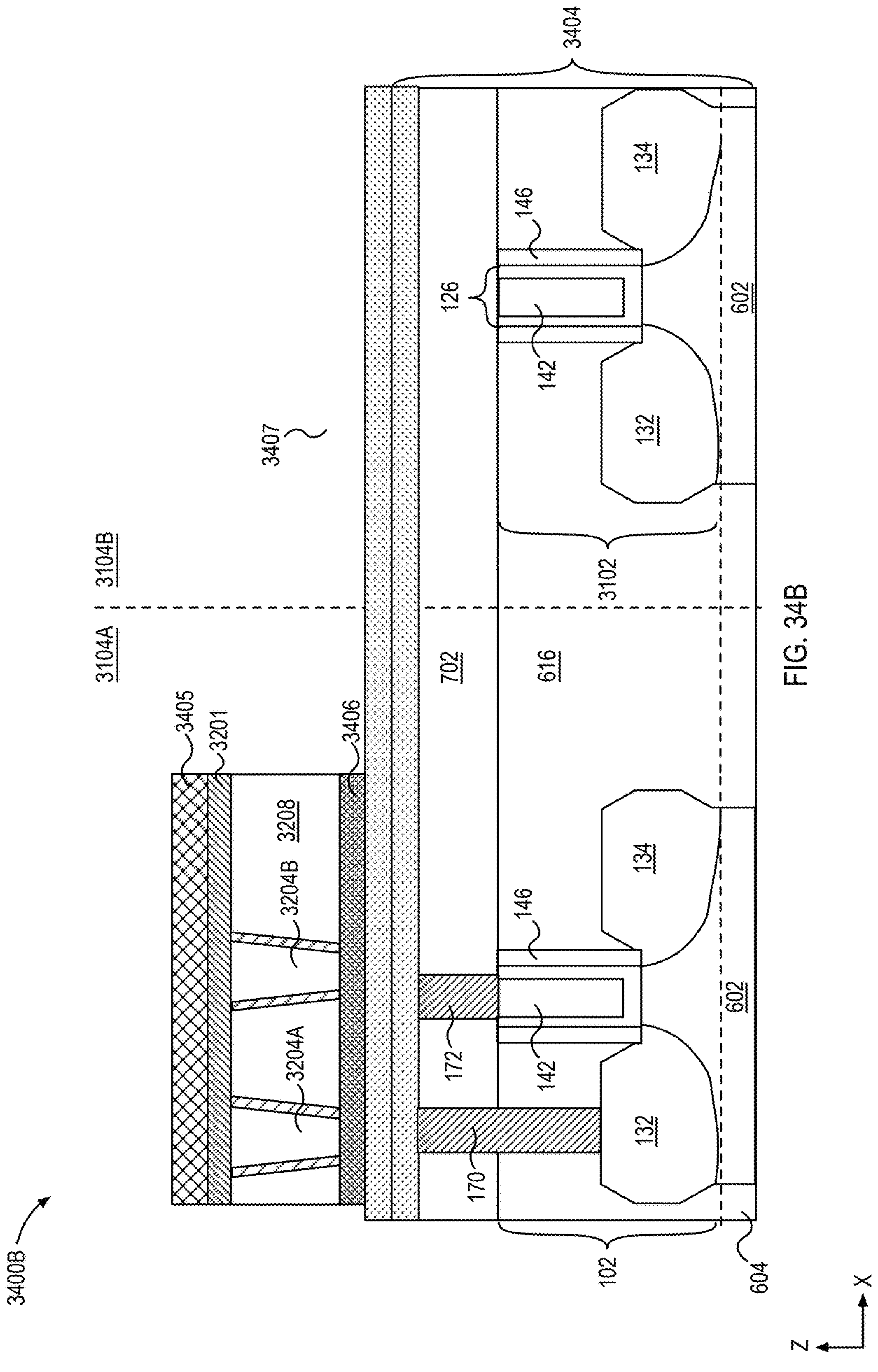
FIG. 34B illustrates a cross-section of structure in FIG. 34A following process to form plate electrode above a transistor in the plurality of transistors, in at least one example.

FIG. 34B illustrates a cross-section of a structure 3400B. In at least one example, structure 3400B is a cross-sectional illustration of structure 3400A in FIG. 34A following process to form a plate electrode 3406. Forming plate electrode 3406 includes removal of conductive material from all unmasked regions of structure 3400B. In at least one example, plate electrode includes features of electrode 154 (FIG. 1I). Removal of conductive material from all unmasked regions of structure 3400B is useful to prevent shorting between electrode structure to be formed above transistor 102 with one or more conductive interconnects to be formed above transistor 3102.

In at least one example, a mask 3405 is formed on layer 3201. In at least one example, mask 3405 is patterned by a lithographic process. In at least one example, a plasma etch process is utilized to etch layer 3201, dielectric 3208, and conductive layer 3210. In at least one example, the plasma etch process forms an opening 3407. In at least one example, opening 3407 can extend into portions of memory region 3104A.

Figure 34C:
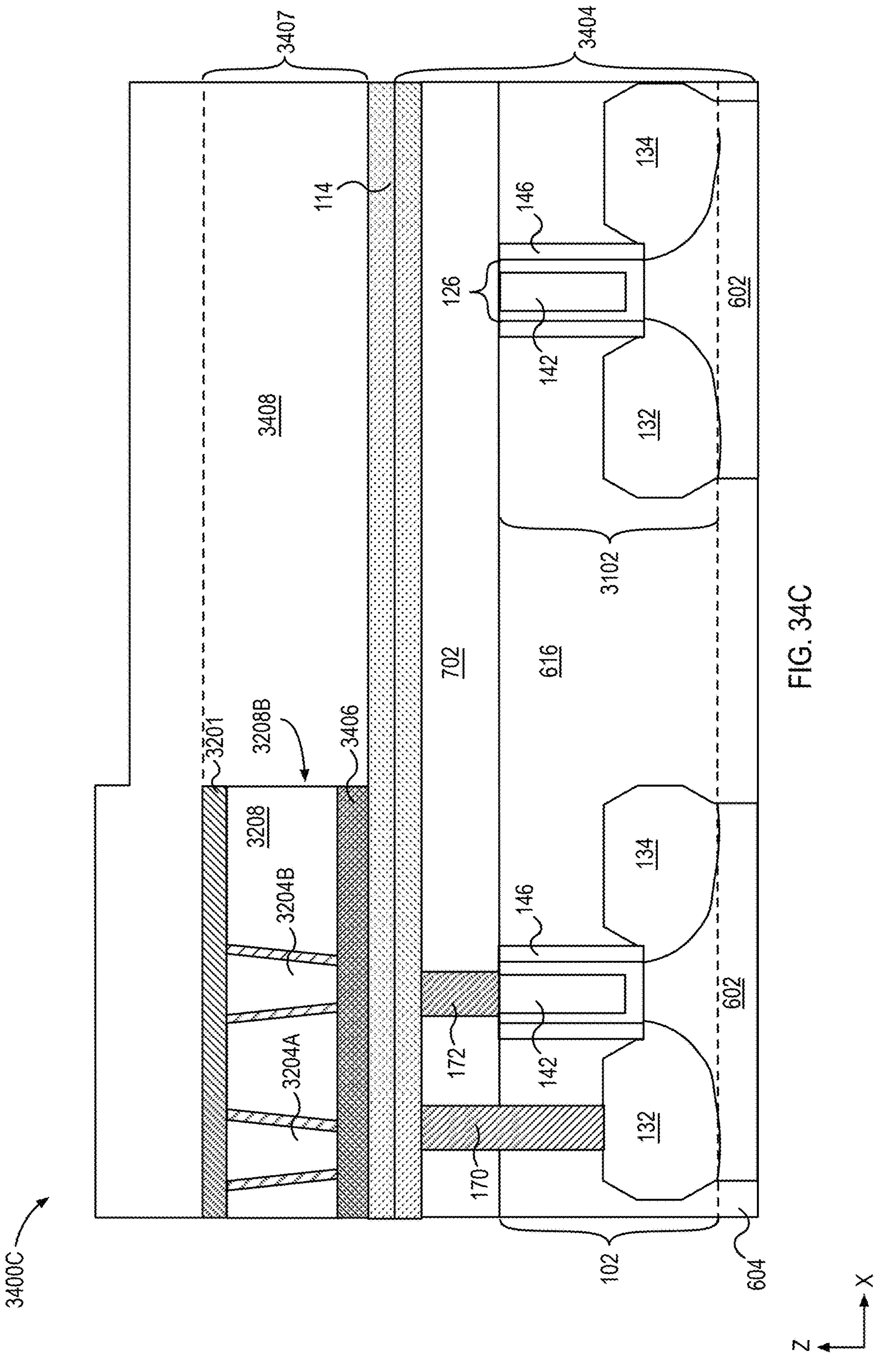
FIG. 34C illustrates a cross-section of structure in FIG. 34B following process to deposit a dielectric, in at least one example.

FIG. 34C illustrates a cross-section of a structure 3400C. In at least one example, structure 3400C is a cross-sectional illustration of structure 3400B in FIG. 34B following process to deposit a dielectric 3412 in opening 3407. In at least one example, a dielectric 3408 comprises a low K interlayer dielectric. In at least one example, dielectric 3412 comprises a material of dielectric 702. In at least one example, dielectric 3412 is blanket deposited on layer 3201, dielectric layer 114, a sidewall 3208B, and in contact with plate electrode 3406.

Figure 34D:
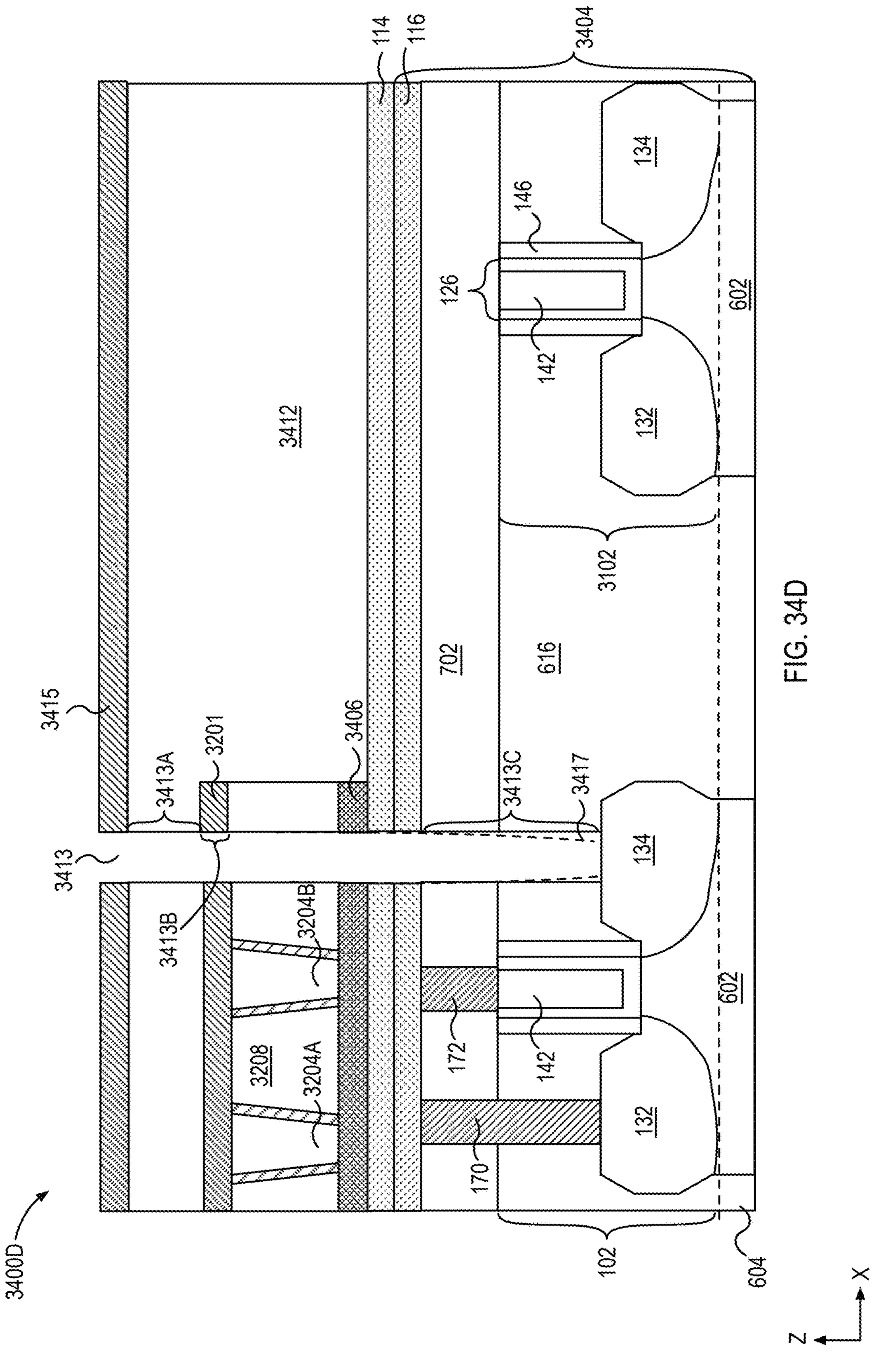
FIG. 34D illustrates a cross-section of structure in FIG. 34C following process to form opening through at least a portion of the plate electrode, in at least one example.

FIG. 34D illustrates a cross-section of a structure 3400D. In at least one example, structure 3400D is a cross-sectional illustration of structure 3400C in FIG. 34C following process to form an opening 3413. In at least one example, a planarization process is utilized to polish dielectric 3412. In at least one example, the planarization process includes a chemical mechanical polish (CMP) process. In at least one example, the CMP process removes excess dielectric 3412 from above layer 3201. In at least one example, the CMP process can also remove layer 3201.

In at least one example, a mask 3415 is formed on dielectric 3412. In at least one example, a plasma etch process is utilized to etch dielectric 3412, layer 3201, dielectric 3208, plate electrode 3406, dielectric layer 114, dielectric layer 116, dielectric 702, and dielectric 616 to form opening 3413. In at least one example, opening 3413 exposes drain structure 134. In at least one example, opening 3413 can have tapered profile within some layers and substantially vertical profiles within other layers. In at least one example, variation in profile of opening 3413 may be due to etch selectivity between different materials as discussed above (FIG. 26C).

In at least one example, layer 3201 can be an etch stop for etching dielectric 3412 and conductive layer 3210 can be an etch stop for etching dielectric 3208. In at least one example, a portion 3413A within dielectric 3412 and dielectric 3208 may be wider than a portion 3413B within layer 3201. In at least one example, portion 3413C within dielectric 702 and dielectric 616 may be tapered, as indicated by dashed lines 3417.

Figure 34E:
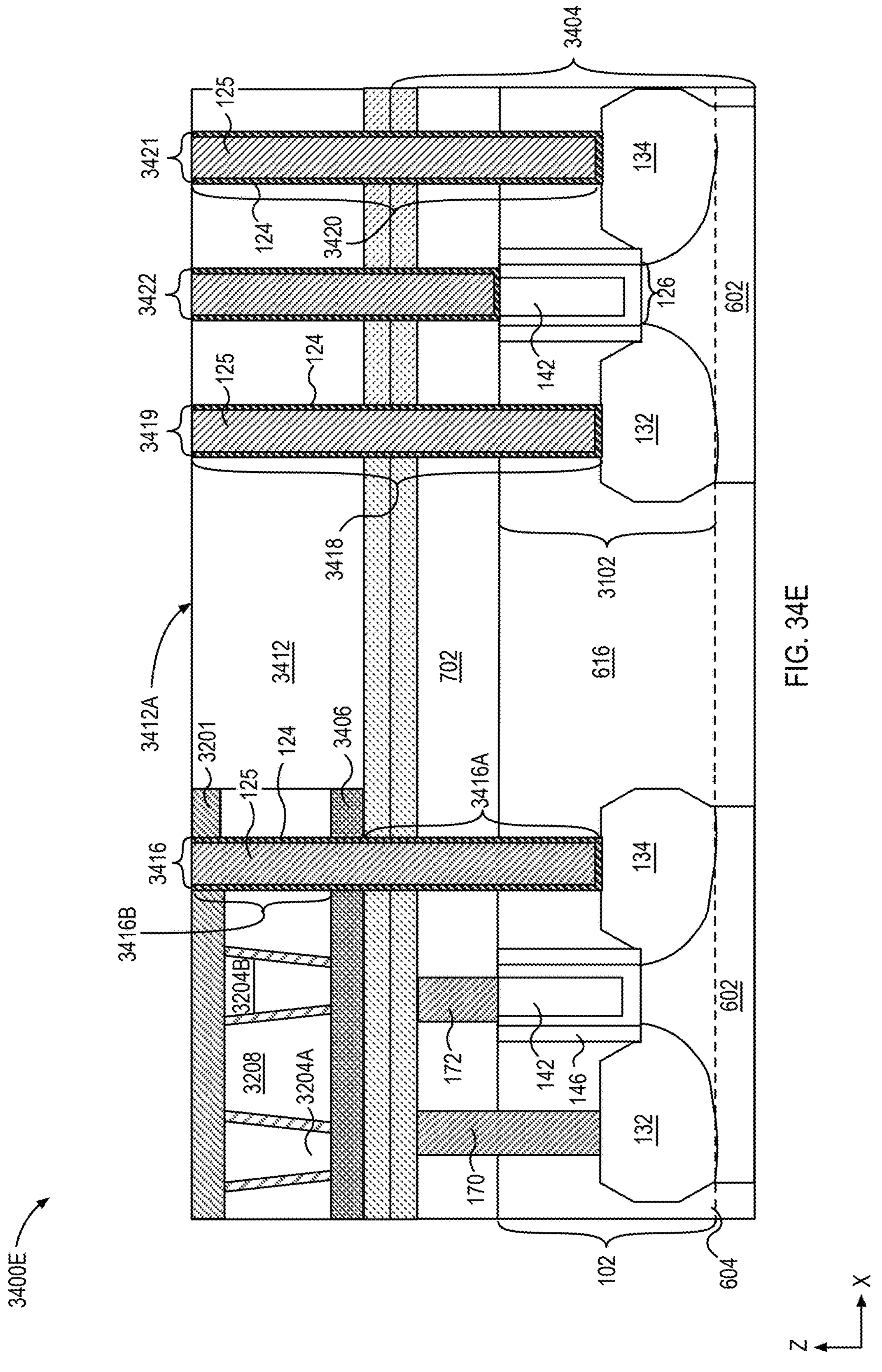
FIG. 34E illustrates a cross-section of structure in FIG. 34D following process to form electrode on a drain structure of the transistor, and form source contact and drain contact on source structure and drain structure, respectively of a transistor in a logic region, in at least one example.

FIG. 34E illustrates a cross-section of a structure 3400E. In at least one example, structure 3400E is a cross-sectional illustration of structure 3400D in FIG. 34C following process to form an electrode 3416 on drain structure 134 of transistor 102 and form a source contact 3418 and a drain contact 3420 on source structure 132 and drain structure 134, respectively of transistor 3102. In at least one example, method to make electrode 3416 is similar to method of fabricating electrode 120 described above (FIG. 31E).

Collectively referring to FIGS. 34D and 34E, in at least one example, two or more materials can be deposited into opening 3413, on sidewalls of dielectric 3412, dielectric 3208, plate electrode 3406, dielectric layer 114, dielectric layer 116, dielectric 702, and dielectric 616, and on drain structure 134. In at least one example, liner layer 124 is deposited in opening 3413, on sidewalls of dielectric 3412, dielectric 3208, plate electrode 3406, dielectric layer 114, dielectric layer 116, dielectric 702, and dielectric 616, on drain structure 134, and on uppermost surface of dielectric 3412. In at least one example, conductive fill material 125 is deposited on liner layer 124. In at least one example, a planarization process is utilized to polish and remove conductive fill material 125 and liner layer 124 from above a surface 3412A to form electrode 3416. In at least one example, the planarization process includes a chemical mechanical polish (CMP) process. In at least one example, when opening 3413 is tapered, electrode 120 includes a portion 3416A that is below plate electrode 3406, where portion 3416A has a different width (along the X and/or Y directions) than a portion 3416B that is above plate electrode 3406. In at least one example, portion 3416A has a minimum width (along the X and/or Y directions) that is less than a minimum width (along the X and/or Y directions) of portion 3416B.

In at least one example, source contact 3418 and drain contact 3420 may be formed within an opening 3419 and an opening 3421, respectively. Method of forming source contact 3418 and drain contact 3420 is substantially the same as fabricating source contact 3118, drain contact 3120 (FIGS. 31E and 31F). In at least one example, opening 3419 and drain contact 3420 are formed by etching dielectric 3412, dielectric layer 114, dielectric layer 116, dielectric 702, and dielectric 616. In at least one example, source contact 3418 and drain contact 3420 include liner layer 124 and conductive fill material 125. In at least one example, source contact 3418 and drain contact 3420 may be co-fabricated. In at least one example, source contact 3418 and drain contact 3420 may be fabricated prior to fabricating electrode 3416. In at least one example, a gate contact 3422 can be formed prior to or after forming source contact 3418 and drain contact 3420.

Figure 34F:
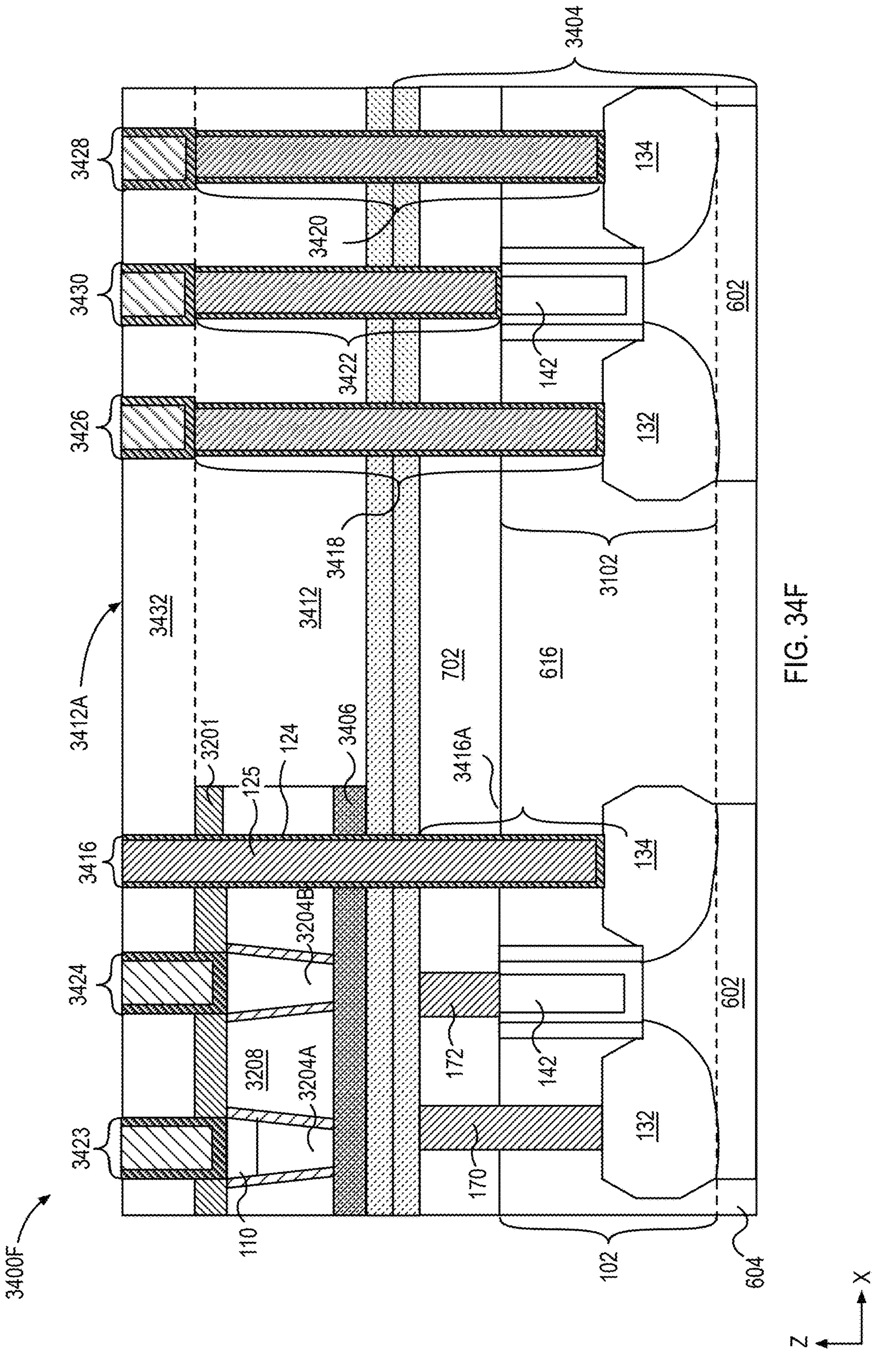
FIG. 34F illustrates a cross-section of structure in FIG. 34E following process to form electrodes on capacitors, and following process to form electrodes on source contact, drain contact, and gate contact of a transistor in a logic region, in at least one example.

FIG. 34F illustrates a cross-section of a structure 3400F. In at least one example, structure 3400F is a cross sectional illustration of structure 3400E in FIG. 34E following process to form an electrode 3423 and an electrode 3424 on capacitor 3204A and capacitor 3204B, respectively, and following process to form electrodes 3426, 3428, and 3430 on source contact 3418, drain contact 3420, and gate contact 3422, respectively. In at least one example, a dielectric layer 3432 is deposited on dielectric 3412, layer 3201, source contact 3418, drain contact 3420, and gate contact 3422. In at least one example, dielectric layer 3432 is blanket deposited by a CVD or a PVD process. In at least one example, a planarization process may be performed. In at least one example, openings may be formed in drain contact 3420, dielectric 3412, and layer 3201 above capacitors 3204A and 3204B. In at least one example, a plasma etch process is utilized to form openings in dielectric 3412 and in layer 3201. In at least one example, openings may be wider than a lateral thickness of electrode 112.

In at least one example, material of gate contact 3422 and electrode 3424 are deposited into the openings formed in dielectric 3412 and layer 3201 and a planarization process may be carried out. In at least one example, materials of gate contact 3422 and electrode 3424 and planarization process is described above (FIGS. 28C-28D). In at least one example, liner layer 124 and conductive fill material 125 may be deposited into openings, and on dielectric layer 3432. In at least one example, liner layer 124 and conductive fill material 125 deposited on surface of dielectric layer 3432 may be removed by planarization.

In at least one example, openings can be formed in dielectric layer 3432 to expose source contact 3418, drain contact 3420, and gate contact 3422. In at least one example, electrode 3426, electrode 3428, and electrode 3430 may be formed in the openings. In at least one example, liner layer 124 and conductive fill material 125 may be deposited into openings, and on dielectric layer 3432. In at least one example, excess liner layer 124 and conductive fill material 125 deposited on surface of dielectric layer 3432 may be removed by planarization.

In at least one example, where layer 3201 is not present, an etch stop layer may be deposited on dielectric 3208, capacitors 3204A and 3204B, and on encapsulation layer 3214. In at least one example, electrodes 3423, 3424, 3426, 3428, and 3430 may be formed simultaneously after etching dielectric layer 3432 and the etch stop layer.

Figure 35A:
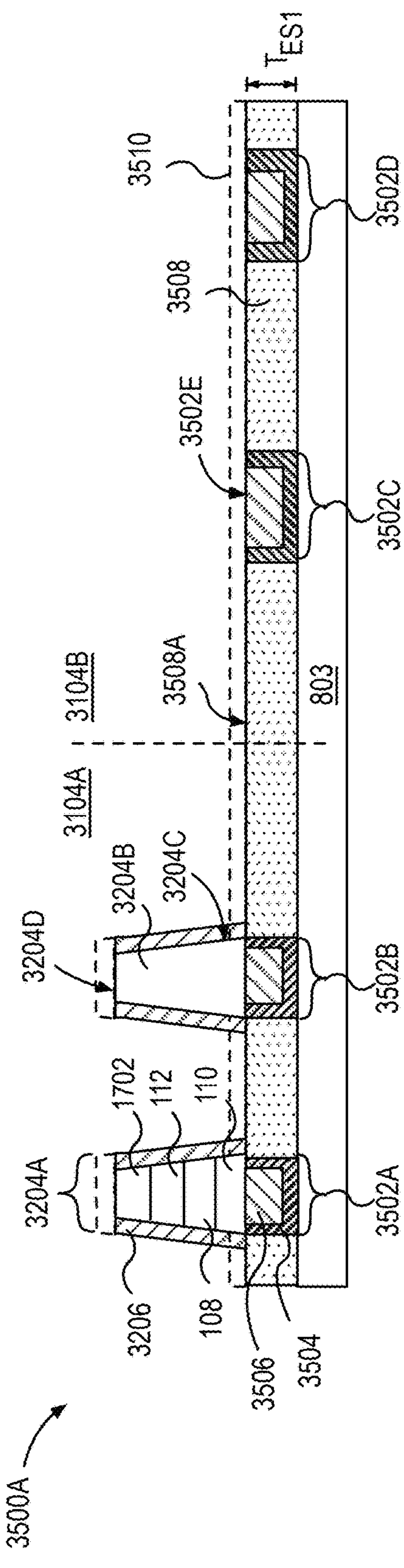
FIG. 35A illustrates a cross-section of a plurality of capacitors formed above a plurality of electrode structures in a memory region of a first substrate, in at least one example.
Figure 35B:
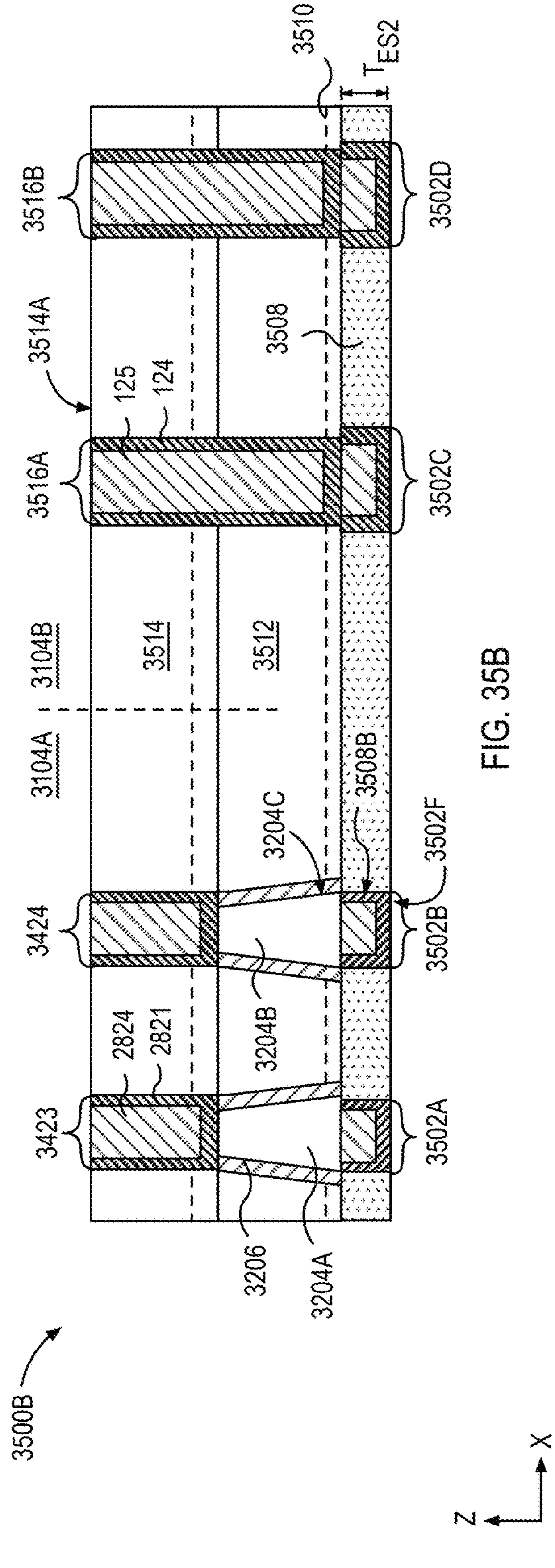
FIG. 35B illustrates a cross-section of structure in FIG. 35A following process to form via electrodes, in at least one example.

FIGS. 35A-35B illustrates cross sections of process flow utilized to bond capacitors formed on one substrate with at least one transistor formed above a different substrate.

FIG. 35A illustrates a cross-section of a structure 3500A. In at least one example, structure 3500A includes features of structure 3200B. In at least one example, structure 3500A includes a plurality of electrode structures such as electrode structures 3502A, 3502B, 3502C, and 3502D formed with layer 3201. In at least one example, electrode structures 3502A and 3502B are formed in memory region 3104A, and electrode structures 3502C and 3502D are formed in logic region 3104B.

In at least one example, electrode structures 3502A, 3502B, 3502C, and 3502D include a liner layer 3504 and a fill metal 3506. In at least one example, electrode structures 3502A, 3502B, 3502A, and 3502D are simultaneously fabricated by forming openings in a dielectric 3508, followed by deposition of liner layer 3504 in the openings. In at least one example, deposition process is continued with deposition of fill metal 3506 on liner layer 3504. In at least one example, a planarization may be performed to form a surface 3502E that is co-planar or substantially co-planar with a surface 3508A. In at least one example, liner layer 3504 is deposited to a thickness that is suitable for planarization at a downstream operation.

In at least one example, dielectric 3508 includes silicon, and one or more of carbon, nitrogen, or oxygen. In at least one example, spacer 3206 includes features described above. In at least one example, capacitors 3204A or capacitors 3204B has a lateral thickness that is greater than a lateral thickness of electrode structure 3502A or electrode structure 3502B. In at least one example, a larger lateral thickness can help to prevent sputtering of fill metal 3506 on liner layer 3504 during etching while etching to form electrode 110. In at least one example, preventing sputtering of material such as copper is useful to prevent electromigration and shorting between active devices.

In at least one example, structure 3500A further includes one or more capacitors such as capacitors 3204A and capacitors 3204B fabricated in memory region 3104A. In at least one example, two capacitors are illustrated but an array of any number of capacitors can be formed. In at least one example, method utilized to fabricate capacitors 3204A and capacitors 3204B is described above (FIGS. 32A and 32B). In at least one example, dielectric 3508 can have a thickness where a portion of the thickness may be designed to be removed after bonding. In at least one such example, dielectric 3508 having an arbitrary thickness is useful because capacitors 3204A and 3204B can be patterned with greater flexibility compared to when patterning above electrode structures or conductive layers. In at least one example, patterning to form capacitors 3204A and 3204B above electrode structures or conductive layers can lead to recess of dielectric 3508 during an over etch process.

In at least one example, an encapsulation layer 3510 is blanket deposited on sidewall 3204C of capacitors 3204A and 3204B by an ALD, PEALD, PVD process, or a combination thereof. In at least one example, encapsulation layer 3510 extends over electrode structures 3502C and 3502D in logic region 3104B. In at least one example, encapsulation layer 3510 is etched to form spacer 3206 adjacent to sidewall 3204C. In at least one such example, encapsulation layer 3510 is removed from surface 3204D. In at least one example, after deposition of encapsulation layer 3510 or fabrication of spacer 3206 a thermal anneal can be performed. In at least one example, thermal anneal can be performed in $O_2$ atmosphere. In at least one example, thermal anneal in $O_2$ atmosphere can be utilized to passivate dangling bonds. In at least one example, thermal anneal can also move point defects from interior of capacitors 3204A and 3204B to sidewall 3204C to reduce roughness at interfaces with dielectric 108. In at least one example, thermal anneal can include methods that are described above (FIG. 11A).

FIG. 35B illustrates a cross-section of a structure 3500B. In at least one example, structure 3500B is a cross-sectional illustration of structure 3500A in FIG. 35A following process to form via electrodes 3423 and 3424. Referring collectively to FIGS. 35A and 35B, in at least one example, a dielectric 3512 is blanket deposited on dielectric 3508, sidewalls of spacer 3206 and on capacitors 3204A and 3204B. In at least one example, dielectric 3512 is planarized by methods described above (FIG. 32D). In at least one example, a dielectric 3514 is blanket deposited on dielectric 3512. In at least one example, an intermediate etch stop layer including a material of dielectric 3508 may be deposited prior to depositing dielectric 3514.

In at least one example, via electrodes 3423 and 3424 may be formed in dielectric 3514 by methods described in FIG. 34F. In at least one example, via electrodes can be formed in logic region 3104B before or after forming via electrodes 3423 and 3424. In at least one example, via electrodes 3516A and 3516B can be formed on electrode structures 3502C and 3502D, respectively. In at least one example, a plasma etch process is utilized to form openings in dielectric 3514 and dielectric 3512. In at least one example, openings may be also formed optionally through encapsulation layer 3510 (dashed lines). In at least one example, openings expose electrode structures 3502C and 3502D. In at least one example, liner layer 124 is deposited in openings, on electrode structures 3502C and 3502D, on sidewalls of dielectric 3512 and dielectric 3514, and on a surface 3514A of dielectric 3514. In at least one example, conductive fill material 125 is deposited on liner layer 124. In at least one example, a planarization process is utilized to polish and remove conductive fill material 125 and liner layer 124 from above surface 3514A, to form electrode 3516A and electrode 3516B on electrode structures 3502C and 3502D, respectively. In at least one example, the planarization process includes a chemical mechanical polish (CMP) process.

In at least one example, after formation of via electrodes 3516A and 3516B, and via electrodes 3423 and 3424, substrate 803 is removed. In at least one example, substrate 803 is removed to expose a surface 3502F of electrode structures 3502A, 3502B, 3502A, and 3502D. In at least one example, removing at least a portion of substrate 803 comprises performing a mechanical grinding process. In at least one example, the mechanical grinding process removes a majority of substrate 803 and leaves less than 100 microns of substrate 803. In at least one example, removing the remaining portion of substrate 803 comprises performing at least a chemical mechanical planarization process or an etch process. In at least one example, there may be one or more intermediate layers between substrate 803 and dielectric 3508. In at least one such example, the one or more intermediate layers are also removed to expose surface 3502F of electrode structures 3502A, 3502B, 3502A, and 3502D. In at least one example, the CMP process removes portion of liner layer 3504 and dielectric 3508. In at least one example, liner layer 3504 has a thinner portion directly under fill metal 3506 compared on a sidewall 3508B of dielectric 3508. In at least one example, portion of liner layer 3504 directly under fill metal 3506 is at least 1 nm to prevent discontinuities from forming in liner layer 3504.

Figure 36A:
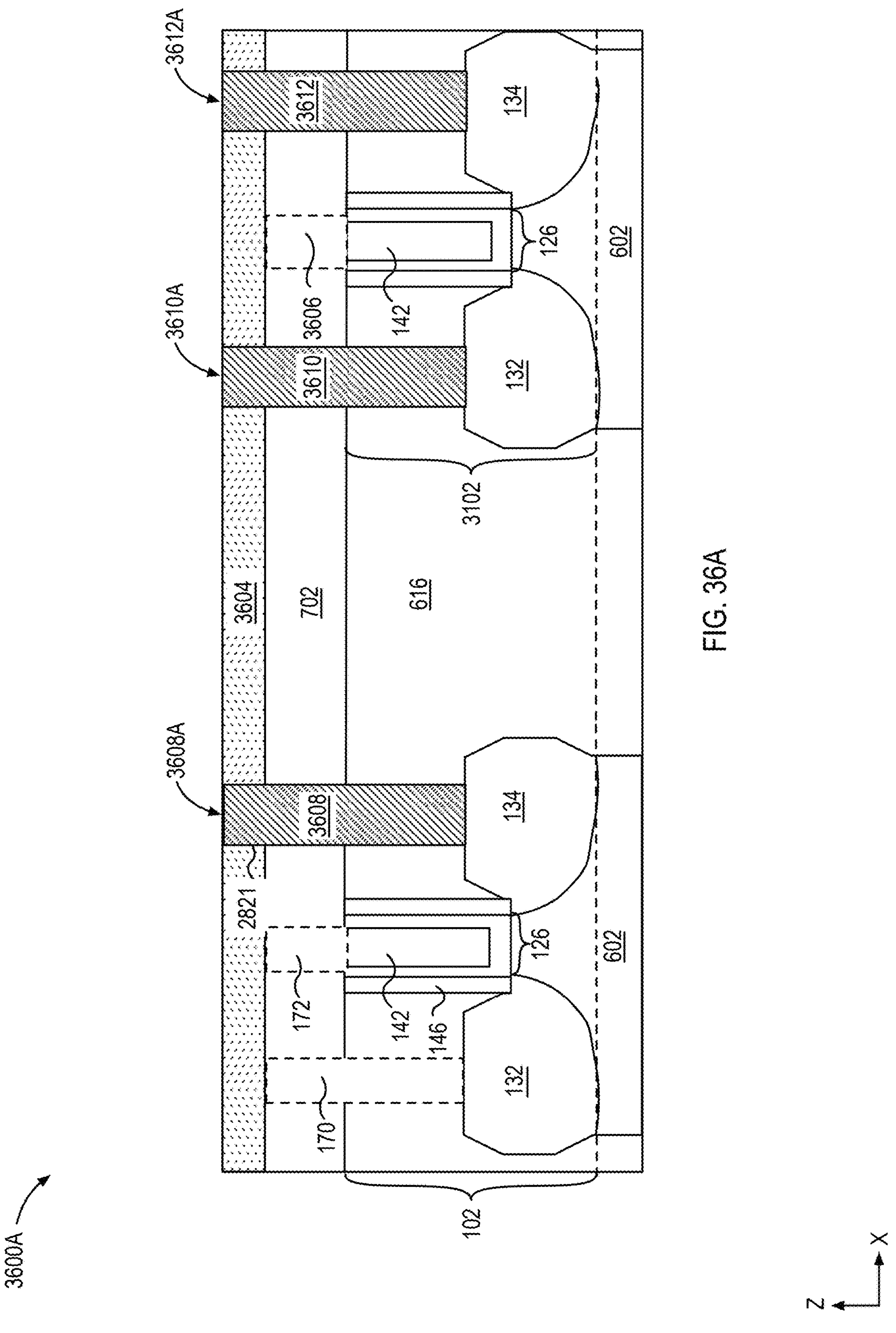
FIG. 36A is a cross-sectional illustration of a plurality of transistors formed above a second substrate, in at least one example.

FIG. 36A is a cross-sectional illustration of a structure 3600A. In at least one example, structure 3600A is a portion of a wafer 3602. In at least one example, structure 3600A includes features of structure 3103 (FIG. 31A), such as transistor 102, source contact 170, gate contact 172, dielectric 616, dielectric 702, transistor 3102. In at least one example, structure 3600A further includes a dielectric 3604 on dielectric 702. In at least one example, dielectric 3604 includes silicon and one or more of nitrogen, carbon, or oxygen. In at least one example, dielectric 3604 can include a material that is different from dielectric 702. In at least one example, source contact 170, gate contact 172, and a gate contact 3606 of transistor 3102 extend up to a lower surface of dielectric 3604. In at least one example, source contact 170, gate contact 172, and gate contact 3606 extend out of the plane of the figure and are coupled with conductive interconnects (that are not in the plane of the Figure).

In at least one example, transistor 102 is further coupled with a drain contact 3608, and transistor 3102 is further coupled with a source contact 3610 and a drain contact 3612. In at least one example, drain contact 3608, source contact 3610, and drain contact 3612 are formed after deposition of dielectric 3604. In at least one example, drain contact 3608, source contact 3610, and drain contact 3612 are formed by etching openings in in dielectric 3604, 702, and 616 and depositing one or more conductive materials. In at least one example, drain contact 3608, source contact 3610, and drain contact 3612 include a liner layer and fill metal. In at least one example, surfaces 3608A, 3610A, and 3612A are co-planar or substantially co-planar with surface 3514A. In at least one example, drain contact 3608, source contact 3610, and drain contact 3612 are designed to couple with electrode structures 3502B, 3502C, and 3502D, respectively (FIG. 35B).

Figure 36B:
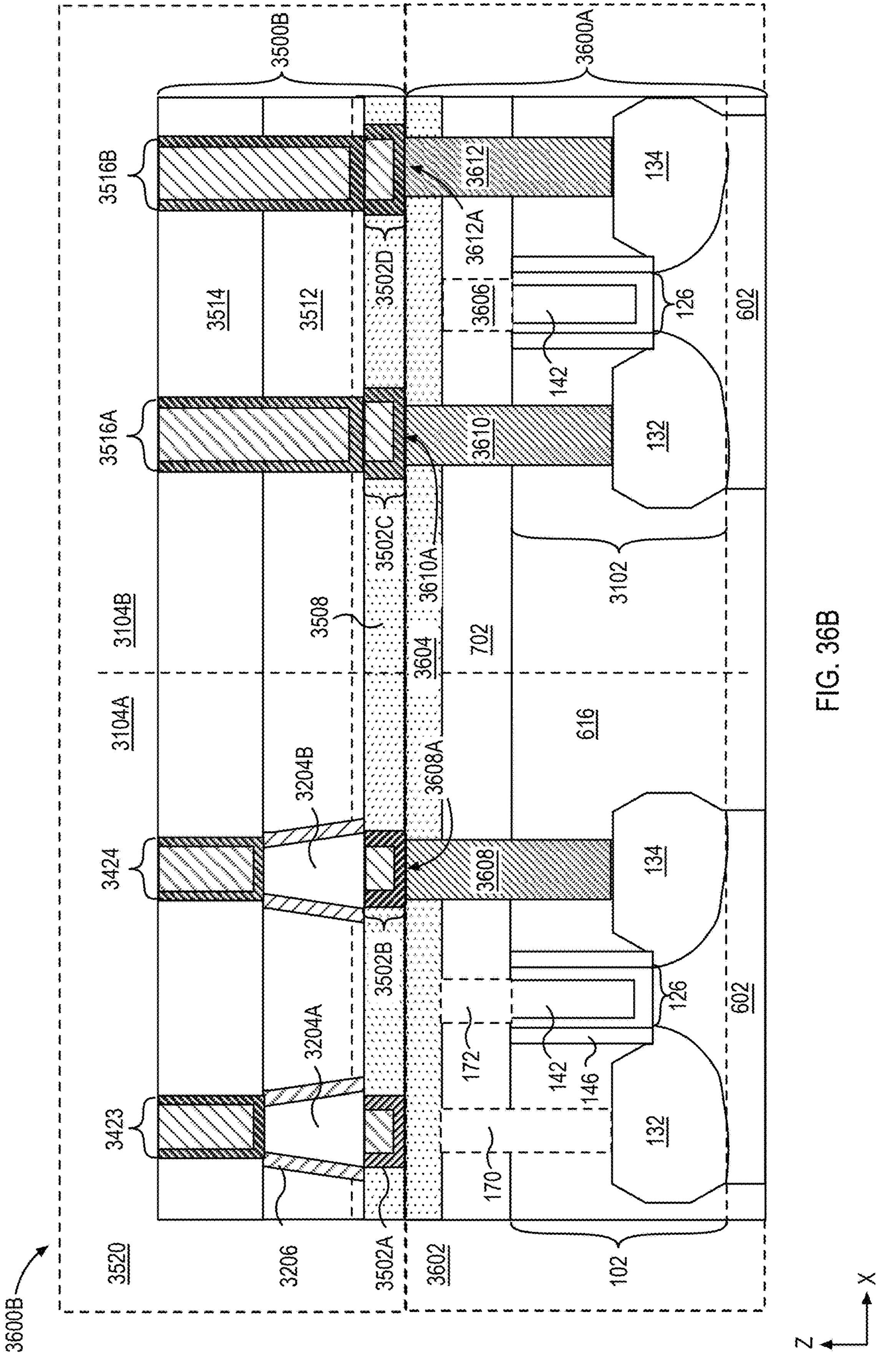
FIG. 36B illustrates a cross-section of structure in FIG. 36A following process to bond the plurality of electrode structures with one or more contacts formed above the plurality of transistors in the second substrate, in at least one example.

FIG. 36B illustrates a cross-section of a structure 3600B. In at least one example, structure 3600B is a cross-sectional illustration of structure 3600A in FIG. 36A following process of bonding. In at least one example, structure 3600A is a portion of wafer 3602, and structure 3500B is at least a portion of a wafer 3520. In at least one example, wafer 3520 is bonded with wafer 3602.

In at least one example, the bonding process brings into drain contact 3608, source contact 3610, and drain contact 3612 with electrode structures 3502B, 3502C, and 3502D, respectively and dielectric 3508 with dielectric 3604. In at least one example, widths of drain contact 3608, source contact 3610, and drain contact 3612 are same or substantially the same as widths of electrode structures 3502B, 3502C, and 3502D, respectively. In at least one example, widths of via drain contact 3608, source contact 3610, and drain contact 3612 are greater than widths of electrode structures 3502B, 3502C, and 3502D. Depending on relative widths between electrode structures and contact there may be some overlap between metals and dielectric during the wafer bonding process. In at least one example, overlap can also result from misalignment. In at least one example, at least a portion of electrode structures 3502B, 3502C, or 3502D is in contact with dielectric 3604. In at least one example, drain contact 3608, source contact 3610, or drain contact 3612 have a larger width than electrode structures 3502B, 3502C, or 3502D, respectively. In at least one such example, In at least one example, at least a portion of surfaces 3608A, 3610A, and 3612A of drain contact 3608, source contact 3610, and drain contact 3612, respectively are in contact with dielectric 3508.

In contrast with capacitors 3204A and 3204B (FIG. 34D), capacitors 3204A and 3204B in structure 3600B are not inverted relative to transistor 102. In at least one example, capacitor 3204A can be coupled with transistor behind the plane of transistor 102. In at least one example, capacitors 3204A and electrode structure 3502A can be dummification structures utilized for facilitating patterning fidelity. In at least one example, by removal of substrate 803 prior to the bonding process, structure 3500B can be bonded with wafer 3602 in the orientation shown in FIG. 36B, or in an upside down orientation. In at least one example, structure 3500B can include at least one layer of metallization prior to removal of substrate 803. In at least one example, all processing operations to form metallization and routing structures above capacitors 3204A and 3204B can be completed on wafer 3520 prior to removal of substrate 803.

In at least one example, capacitor 3204A or 3204B may not be formed above an electrode structure. FIG. 37A illustrates a cross-section of a structure 3700A where capacitor 3204B is not formed above an electrode structure. In at least one example, structure 3700A includes features of structure 3500A (FIG. 35A) and structure 3500B (FIG. 35B), such as electrodes 3516A and electrodes 3516B, dielectric 3512, dielectric 3514, and electrodes 3424. In at least one example, structure 3700A further includes a via electrode 3702 adjacent to capacitor 3204B. In at least one example, capacitor 3204B may be coupled with a source or a drain terminal of a transistor after bonding process.

In at least one example, structure 3700A further includes encapsulation layer 3510 between dielectric 3512 and a substrate 3704. In at least one example, substrate 3704 may include materials of substrate 803. In at least one example, substrate 3704 may include one or more layers of dielectric and/or conductive materials deposited above silicon, silicon germanium, or a III-V material. In at least one example, one or more layers may be deposited to facilitate bonding and mechanical grinding, polishing, or etch process.

FIG. 37B illustrates a cross-section of a structure 3700B within a wafer 3706. In at least one example, structure 3700B is a cross-sectional illustration of structure 3700A in FIG. 37A following process to remove substrate 3704. Referring collectively to FIGS. 37A and 37B, in at least one example, the process to remove substrate 3704 is the same or substantially the same as process to remove substrate 803, described above (FIG. 35B). In at least one example, the process can utilize a combination of mechanical and etch processes. In at least one example, one or more layers in substrate 3704 are removed to expose a lowermost layer of capacitor 3204B, via electrodes 3516A, 3516B, and 3702 after removal of substrate 3704. In at least one example, the lowermost layer of capacitor 3204B may be electrode 112 or a conductive barrier layer that is formed as an intermediate layer above substrate 3704. In at least one example, encapsulation layer 3510 is not removed from above substrate 3704. In at least one such example, when substrate 3704 is removed, encapsulation layer 3510 is exposed adjacent to capacitor 3204B, via electrodes 3516A, 3516B, and 3702.

Figure 37C:
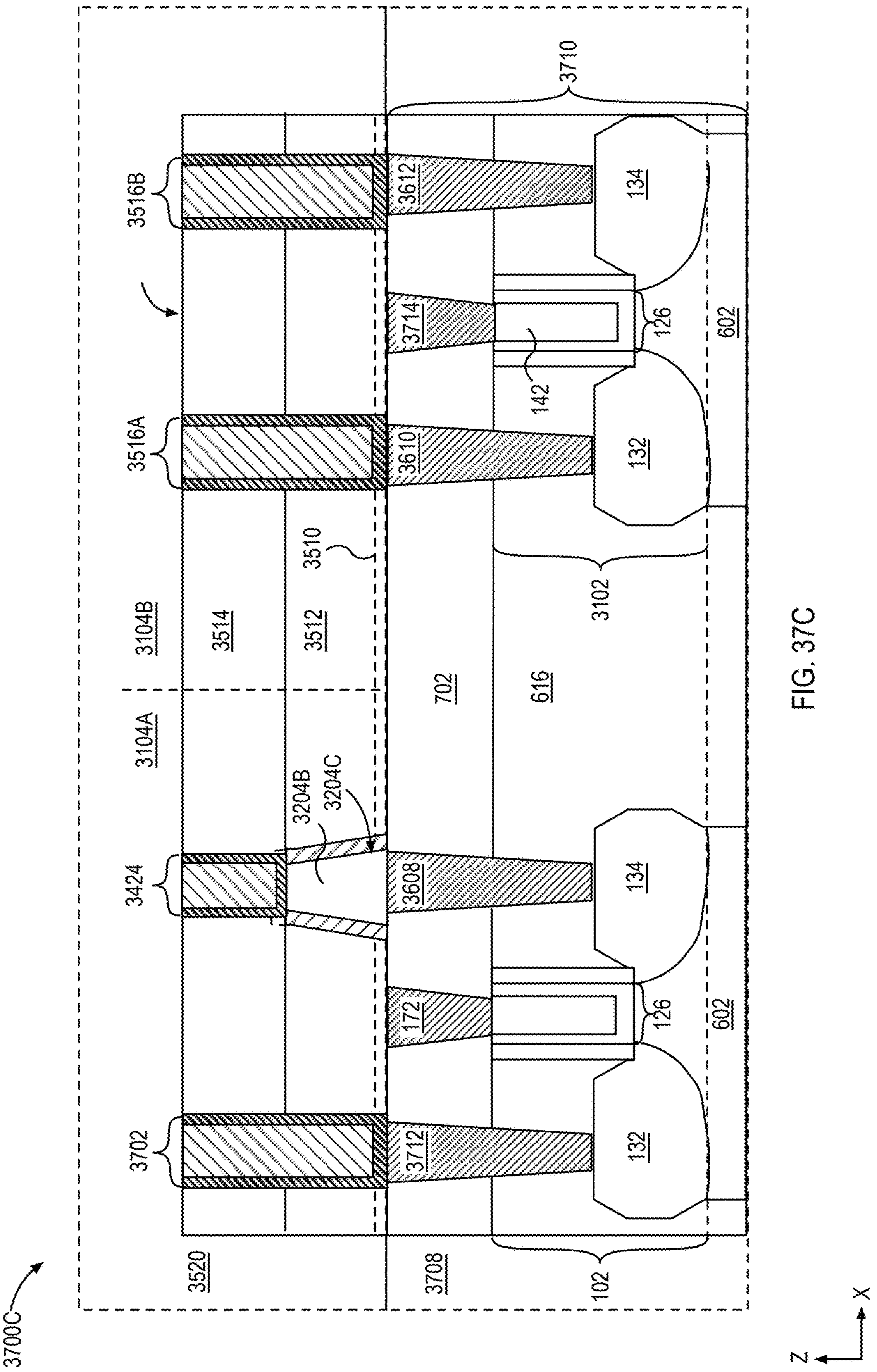
FIG. 37C illustrates a cross-section of the structure in FIG. 37B bonded with contact formed above a transistor of a second substrate, in at least one example.

FIG. 37C illustrates a cross-section of a structure 3700C. In at least one example, structure 3700C is a cross-sectional illustration of structure 3700B in FIG. 37B following process to bond wafer 3706 with a wafer 3708. In at least one example, wafer 3708 includes a structure 3710, where structure 3710 includes features of structure 3600A such as transistors 102 and 3102, dielectric 702, and dielectric 616. In at least one example, source structure 132 of transistor 102 is coupled with a source contact 3712, drain structure 134 is coupled with drain contact 3608, and gate contact 172 is coupled with gate structure 126. In at least one example, source structure 132 of transistor 3102 is coupled with source contact 3610, drain structure 134 is coupled with drain contact 3612, and a gate contact 3714 is coupled with gate structure 126 of transistor 3102. In at least one example, drain contact 3608, source contact 3712, source contact 3610, and drain contact 3612 may be fabricated prior to bonding process. In at least one example, gate contact 172 and 3714 can be formed simultaneously prior to bonding.

In at least one example, bonding of wafer 3708 and wafer 3520 is performed by a hybrid bonding process described above (FIG. 36B). In at least one example, the hybrid bonding process can be implemented to bond source contact 3712, drain contact 3608, source contact 3610 and drain contact 3612 to electrodes 3702, capacitor 3204B, electrodes 3516A and electrodes 3516B, respectively. In at least one example, gate contact 172 and gate contact 3714 may be bonded with conductive interconnects on a same plane or on a plane in front or behind the plane of the Figure.

Depending on relative widths between electrodes in wafer 3708 and wafer 3520 there may be some overlap between metals and dielectric during the wafer bonding process. In at least one example, overlap can also result from misalignment. In at least one example, at least a portion of electrode 3702, capacitor 3204B, electrode 3516A, or electrode 3516B may be in contact with dielectric 702. In at least one example, source contact 3712, gate contact 172, drain contact 3608, source contact 3610, gate contact 3714, and/or drain contact 3612 may have a larger width than electrode 3702, capacitor 3204B, electrode 3516A or electrode 3516B, respectively. In at least one such example, at least a portion of source contact 3712, gate contact 172, drain contact 3608, source contact 3610, gate contact 3714, and/or drain contact 3612 can be in contact with dielectric 3512, encapsulation layer 3510.

Figure 38:
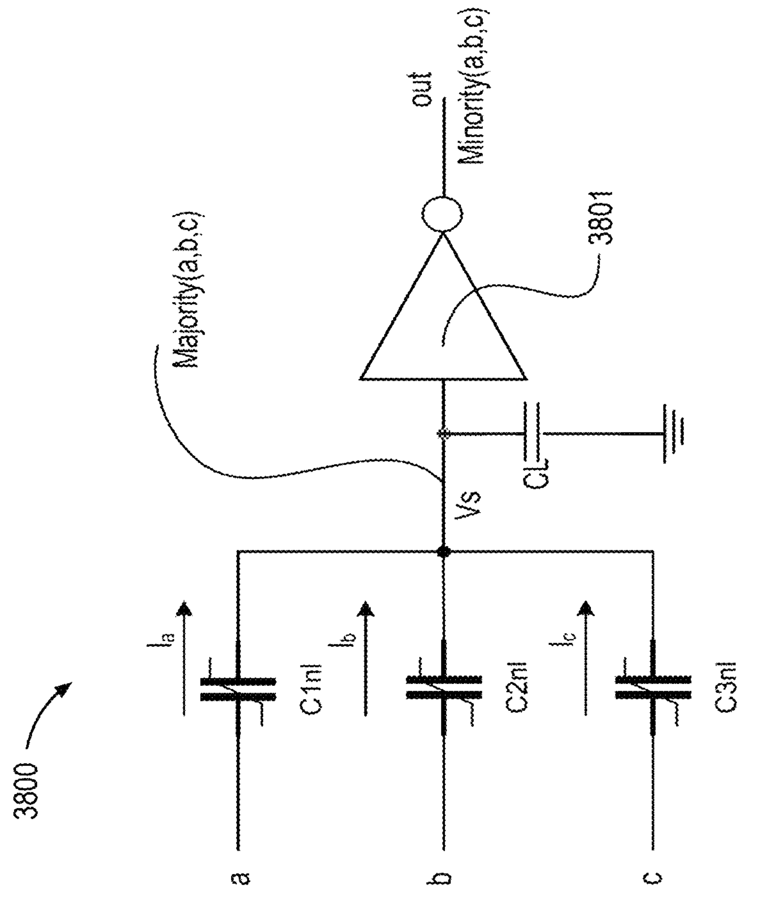
FIG. 38 illustrates a 3-input majority gate using non-linear input capacitors, in accordance with at least one example.

FIG. 38 illustrates a 3-input majority gate 3800 using non-linear input capacitors, in accordance with at least one example. In at least one example, 3-input majority gate 3800 comprises non-linear input capacitors C1*n*1, C2*n*1, and C3*n*1 that receive digital signals a, b, and c, respectively. Here, signal names and node names are interchangeably used. For example, 'a' refers to node 'a' or signal 'a' depending on context of sentence. In at least one example, one end or terminal of capacitor C1*n*1 is coupled to node a while other end of capacitor C1*n*1 is coupled to summing node Vs. Same is true for other non-linear capacitors C2*n*1 and C3*n*1, as shown. In at least one example, 3-input majority gate 3800 comprises driver circuitry 3801. In at least one example, driver circuitry 3801 is an inverter. In at least one example, other types of driver circuitries can be used, such as NAND gate, NOR gate, multiplexer, buffer, or other logic gates. In at least one example, majority function is performed at summing node Vs as Majority(a,b,c). In at least one example, driver circuitry 3801 is an inverter, minority function is performed at output "out" as Minority (a,b,c).

In at least one example, in addition to gate capacitance of driver circuitry 3801, an additional linear capacitor CL is coupled to summing node Vs and ground as shown. In at least one example, linear capacitor CL is a non-ferroelectric capacitor. In at least one example, non-ferroelectric capacitor includes one of: dielectric capacitor, paraelectric capacitor, or non-linear dielectric capacitor. In at least one example, a dielectric capacitor comprises a first metal plate and a second metal plate with a dielectric between them. In at least one example, dielectric includes one or more of: $HfO_X$, $ABO_{3\ perovskite}$s, nitrides, oxy-fluorides, oxides, etc. In at least one example, a paraelectric capacitor comprises a first metal plate and a second metal plate with paraelectric material between them. In at least one example, f-orbital materials (e.g., lanthanides) are doped to ferroelectric materials to make paraelectric material. Examples of room temperature paraelectric material include: $SrTiO_3$, Ba(x)Sr(y) $TiO_3$, $HfZrO_2$, Hf—Si—O, La-substituted $PbTiO_3$, or PMN-PT based relaxor ferroelectrics. In at least one example, a dielectric capacitor comprises a first metal plate and a second metal plate with a non-linear dielectric capacitor between them. In at least one example, range for dielectric constant is 1.2 to 10000. In at least one example, capacitor CL can be implemented as MIM (metal-insulator-metal) capacitor technology, transistor gate capacitor, hybrid of metal capacitors, or transistor capacitor. In at least one example, capacitor CL can be implemented as MIM (metal-insulator-metal) capacitor technology, transistor gate capacitor, hybrid of metal capacitors, or transistor capacitor.

In at least one example, non-linear input capacitors C1n1, C2n1, and C3n1 comprise non-linear polar material. In at least one example, non-linear polar material includes a same material as dielectric layer 806 (FIG. 8A). In at least one example, non-linear polar material includes one of: ferroelectric (FE) material, paraelectric material, relaxor ferroelectric, or non-linear dielectric. In at least one example, paraelectric material is same as FE material, but with chemical doping of active ferroelectric ion by an ion with no polar distortion. In at least one example, non-polar ions are non-s orbital ions formed with p, d, or f external orbitals. In at least one example, non-linear dielectric materials are same as paraelectric materials, relaxors, and dipolar glasses.

In at least one example, FE material can be any suitable low voltage FE material that allows FE material to switch its state by a low voltage (e.g., 100 mV). In at least one example, threshold in FE material has a highly non-linear transfer function in polarization versus voltage response. Threshold is related to: a) non-linearity of switching transfer function; and b) squareness of FE switching. In at least one example, non-linearity of switching transfer function is width of derivative of polarization versus voltage plot. In at least one example, squareness is defined by ratio of remnant polarization to saturation polarization; perfect squareness will show a value of 1.

In at least one example, squareness of FE switching can be suitably manipulated with chemical substitution. In at least one example, in $PbTiO_3$ a P-E (polarization-electric field) square loop can be modified by La or Nb substitution to create an S-shaped loop. Shape can be systematically tuned to ultimately yield a non-linear dielectric. In at least one example, squareness of FE switching can also be changed by granularity of FE layer. In at least one example, a perfect epitaxial, single crystalline FE layer may show higher squareness (e.g., ratio is closer to 1) compared to polycrystalline FE. In at least one example, a perfect epitaxial can be accomplished by use of lattice matched bottom and top electrodes. In at least one example, BiFeO (BFO) can be epitaxially synthesized using lattice matched $SrRuO_3$ bottom electrode yielding P-E loops that are square. In at least one example, progressive doping with La may reduce squareness.

In at least one example, FE material is between two electrodes that comprise perovskite templated conductors. In at least one example, a templated structure comprises a thin layer (e.g., approximately 10 nm) of a perovskite conductor (such as $SrRuO_3$) is coated on top of $IrO_2$, $RuO_2$, $PdO_2$, or $PtO_2$ (which have a non-Perovskite structure but higher conductivity) to provide a seed or template for growth of pure perovskite ferroelectric material at low temperatures.

In at least one example, charge developed on node Vs produces a voltage and current that is output of 3-input majority gate 3800. In at least one example, any suitable driver circuitry 3801 can drive this output. In at least one example, non-FE logic, FE logic, CMOS logic, BJT logic, etc. can be used to drive output to a downstream logic. In at least one example, drivers include one or more of inverters, buffers, NAND gates, NOR gates, XOR gates, amplifiers, comparators, digital-to-analog converters, analog-to-digital converters, multiplexers, etc.

In at least one example, majority function is performed at summing node Vs, and resulting voltage is projected on to capacitance of driver circuitry 3801. In at least one example, majority function of currents ($I_a$, $I_b$, and $I_c$) on node Vs results in a resultant current that charges capacitor. Table 1 illustrates majority function f(Majority a, b, c).

TABLE 1

| a | b | c | Vs (f(Majority a, b, c)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

In at least one example, charge developed on node Vs produces a voltage and current that is output of 3-input majority gate 3800. In at least one example, any suitable driver circuitry 3801 can drive this output. For example, a non-FE logic, FE logic, CMOS logic, or BJT logic, etc., can be used to drive output to a downstream logic. In at least one example, drivers include inverters, buffers, NAND gates, NOR gates, XOR gates, amplifiers, comparators, digital-to-analog converters, analog-to-digital converters, or multiplexers, etc.

While FIG. 38 illustrates a 3-input majority gate, same concept can be extended to more than 3 inputs to make an N-input majority gate, where N is greater than 2, in accordance with at least one example. In at least one example, 'N' is an odd number. In at least one example, 5-input majority gate is similar to a 3-input majority gate 3800 but for additional inputs 'd' and 'e'. In at least one example, inputs can come from same drivers or from different drivers.

In at least one example, 3-input majority gate can be configured as a fast inverter with a much faster propagation delay compared to a similar sized (in terms of area footprint) CMOS inverter. In at least one example, this may be useful when inputs have a significantly slower slope compared to propagation delay through non-linear input capacitors. In at least one example, one way to configurate 3-input majority gate as an inverter is to set one input to a logic high (e.g., b=1) and set another input to a logic low (e.g., b=0). In at least one example, third input is driving input which is to be inverted. In at least one example, inversion will be at Vs node. Same technique can also be applied to N-input majority gate, where 'N' is 1 or any other odd number. In at least one example, in an N-input majority gate, (N−1)/2 inputs are set to '1' and (N−1)/2 inputs are set to '0', and one input is used to decide inversion function. While at least one example is described as a majority gate, same concepts are applicable to a minority gate. In at least one example, driving circuitry is an inverting circuitry coupled to summing node Vs. In at least one example, minority function is seen at output of inverting circuitry.

In at least one example, (2N−1) input majority gate can operate as an N-input AND gate where (N−1) inputs of majority gate are set to zero. In at least one example, AND function will be seen at summing node Vs. In at least one example, N-input NAND, OR, NOR gates can be realized. In at least one example, summing node Vs is driven by a driver circuitry (e.g., inverter, buffer, NAND gate, AND gate, OR gate, NOR gate, or any other logic circuitry). In at least one example, driver circuitry 3801 can be replaced with another majority or minority gate. In at least one example, storage node Vs is directly coupled to a non-linear capacitor of another majority or minority gate.

In at least one example, any logic function $f(x_1, x_2, \ldots x_n)$ can be represented by two levels of logic as given by min-term expansion:

$$f(x_1, x_2, \ldots x_n) = V_{C_1, C_2, \ldots C_n} f(x_1, x_2, \ldots x_n) \Lambda x_1^{C_1} \Lambda x_2^{C_2} \Lambda x_3^{C_3} \ldots \Lambda x_n^{C_n}$$

where $C_i$ is either 0 or 1. When $C_i$ is 1, $$x_i^{C_i} = x_i$$

(input is used in its original form). When $C_i$ is 0, $$x_i^{C_i} = \overline{x_i}$$

(input is used in its inverted form). In at least one example, first level of logic is represented by at most $2^n$ AND gates ($\Delta$), one for each of $2^n$ possible combinations of 0 and 1 for $C_1, C_2, \ldots C_n$. Second level of logic is represented by a single OR gate (V). Each operand of OR gate is a representation of a row in truth table for $f(x_1, x_2, \ldots x_n)$.

In at least one example, a (2N−1)-input majority gate can represent an N-input AND gate, by tying (N−1) of majority gate's inputs to a ground level. Similarly, a (2N−1)-input majority gate can represent an N-input OR gate, by tying (N−1) of majority gate's inputs to a supply level (Vdd). In at least one example, since a majority gate can represent AND and OR gates, and inputs to AND and OR gates are either original or inverted forms of input digital signals, any logic function can be represented by majority gates and inverters.

Figure 39:
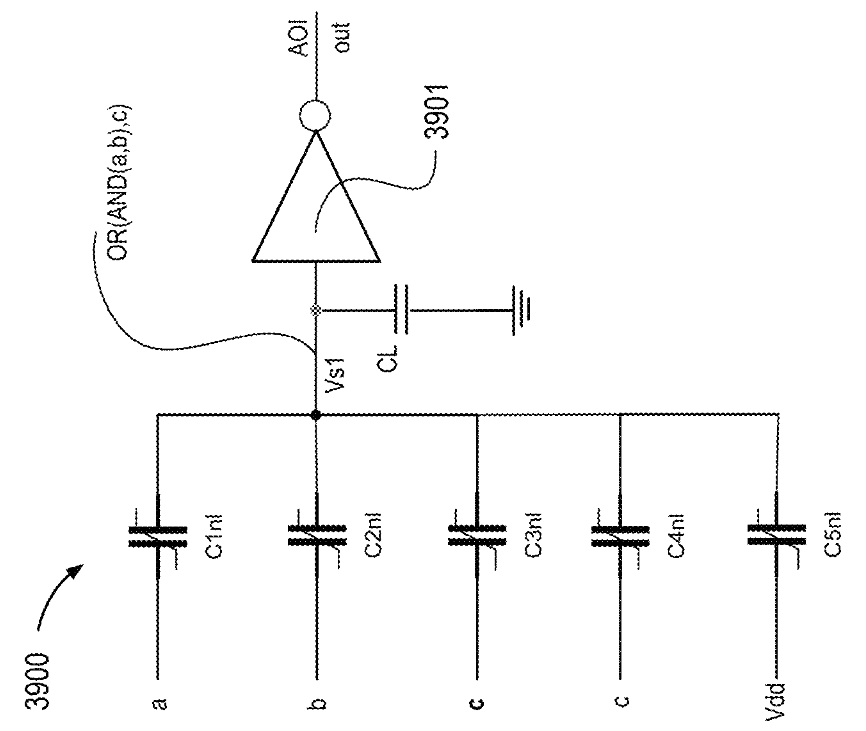
FIG. 39 illustrates a complex logic gate implemented using a 5-input majority gate, in accordance with at least one example.

FIG. 39 illustrates a complex logic gate 3900 implemented using a 5-input majority gate, in accordance with at least one example. In at least one example, an AOI (and-or-invert) logic comprises a 5-input majority gate. In at least one example, 5-input majority gate includes non-linear capacitors **C1*n*1, C2*n*1, C3*n*1, C4*n*1, and C5*n*1, and driving circuitry 3901 coupled as shown. In at least one example, two of non-linear capacitors receive same input. Here, capacitors C3*n*1 and C4*n*1 receive input 'c'. In at least one example, C5*n*1 is coupled to Vdd to produce an OR function at node Vs, where OR function is OR(AND(a,b),c). In at least one example, other logic gates can be realized by changing Vdd to ground for capacitor C5*n*1**, and/or changing other inputs.

Figure 40:
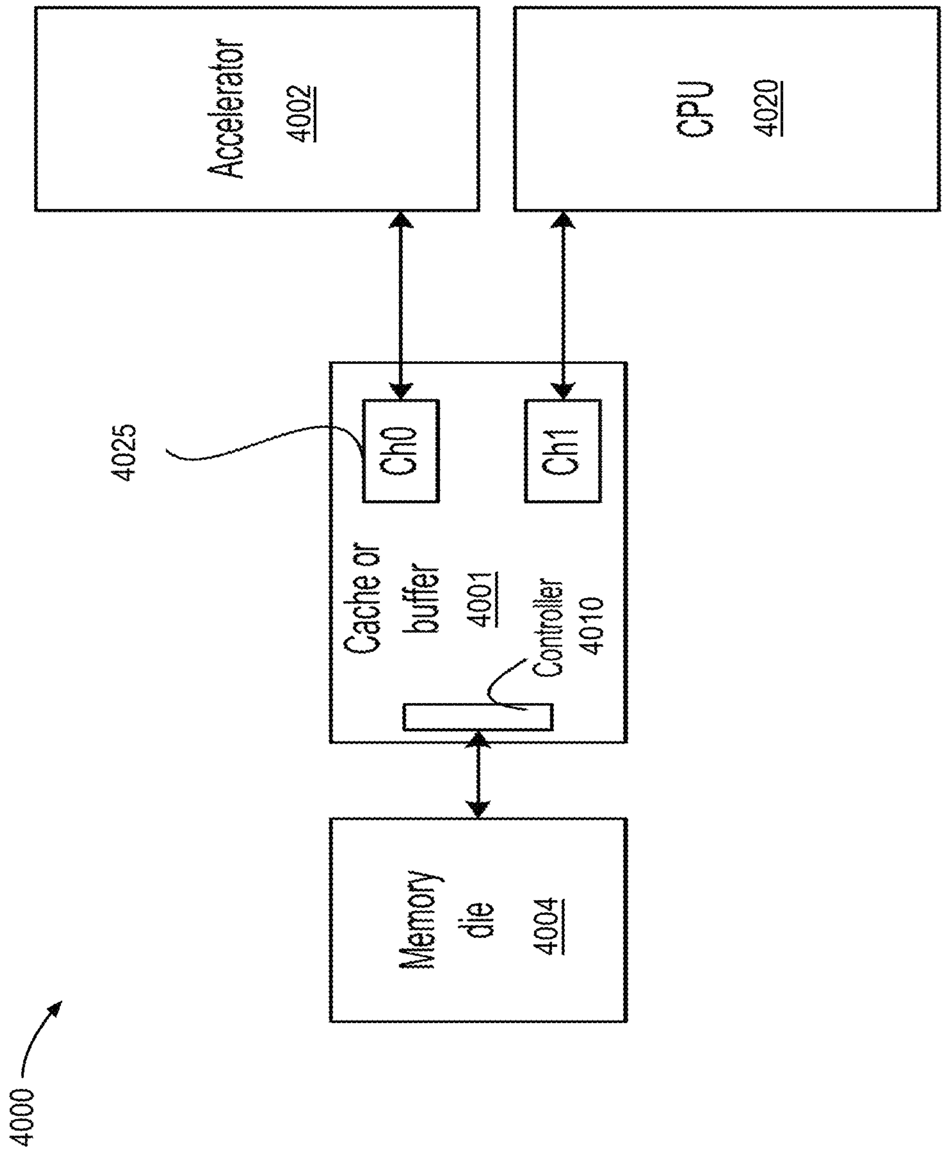
FIG. 40 illustrates a computing architecture with a coherent cache or memory-side buffer chiplet that includes a memory controller, wherein coherent cache, or memory-side buffer chiplet is coupled to an accelerator, a processor, and a memory, in accordance with at least one example.

FIG. 40 illustrates a computing architecture 4000 with a coherent cache or memory-side buffer chiplet that includes a memory controller, where coherent cache or memory-side buffer chiplet is coupled to an accelerator, a processor, and a memory, in accordance with at least one example. In at least one example, computing architecture 4000 comprises a coherent cache or memory-side buffer chiplet 4001, an accelerator 4002 (e.g., inference chip), processor (e.g., processor 4020), and a memory die 4004. In at least one example, coherent cache or memory-side buffer chiplet 4001 comprises at least two channels 4025 which are configured to connect with accelerator 4002 and a processor 4020. In at least one example, coherent cache or memory-side buffer chiplet 4001 comprises I/O and a controller 4010 to manage data traffic with memory die 4004. By moving controller 4010 from processor 4020 to coherent cache or memory-side buffer chiplet 4001, cost in terms of power and die area for processor 4020 is reduced. In at least one example, coherent cache or memory-side buffer chiplet 4001 is a cache memory that comprises ferroelectric memory cells. For example, coherent cache or memory-side buffer chiplet 4001 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation.

Figure 41:
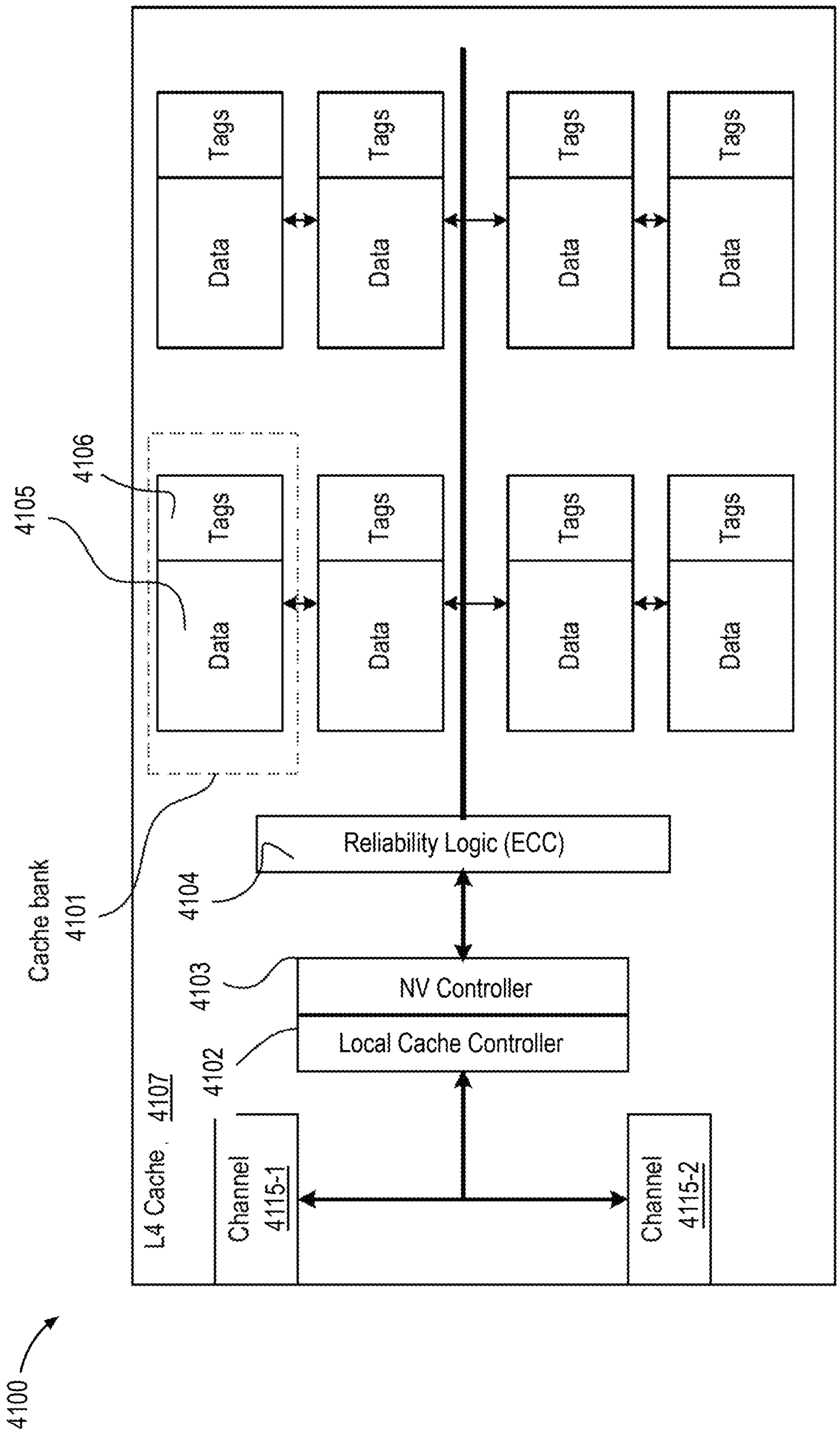
FIG. 41 illustrates an architecture of coherent cache or memory-side buffer chiplet with multiple controllers and multiple cache banks, in accordance with at least one example.

FIG. 41 illustrates an architecture 4100 of coherent cache or memory-side buffer chiplet 4107 with multiple controllers and multiple cache banks, in accordance with at least one example. In at least one example, architecture 4100 comprises channels (e.g., channel 4115-1, which can be ch0 and channel 4115-2, which can be ch1), cache banks 4101, a cache controller 4102, a non-volatile (NV) controller 4103, and a reliability logic 4104. In at least one example, cache controller 4102 is a local cache controller. In at least one example, coherent cache or a memory-side buffer chiplet 4107 may function as a cache or memory buffer. In at least one example, cache lookups can map a large physical memory into a small physical cache using indirection via tags. Here, indirection refers to use of tags to specify which address maps to which physical location. In at least one example, if multiple addresses can map to a single physical location, a tag is used to figure out which address is currently mapped.

In at least one example, each cache bank 4101 includes data bank 4105 (e.g., comprising memory cells) and associated tags 4106. In at least one example, data bank 4105 comprises ferroelectric memory cells. In at least one example, data bank 4105 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation. In at least one example, when data bank 4105 includes ferroelectric memory, it uses NV controller 4103 and a stronger reliability logic (e.g., error correction code) for security compared to non-ferroelectric memory for data bank 4105.

In at least one example, when data bank 4105 is used to implement a cache, tags may be used to identify which addresses map to which physical locations in bank. In at least one example, cache may be set associative, in which a particular address can map to several physical locations. Specific physical location a newly allocated address is mapped to may be determined by a replacement algorithm, such as LRU (least recently used) or pseudo-LRU, or even random. In at least one example, cache might be direct mapped, with each address mapping to merely a single physical cache line. In at least one example, in both set associative and direct mapped caches, several addresses map to a single physical cache line. In at least one example, to identify address currently occupying physical cache line, tag 4106 may be coupled with a physical line. In at least one example, tag 4106 may comprise some address bits, sufficient to uniquely identify which address currently occupies physical line coupled with tag.

In at least one example, cache controller 4102 could be used to control state transitions used for cache look ups such as comparing requested addresses with tags stored in an array of tags 4106 and identifying a candidate for replacement (replacement algorithm) when a cache miss occurs. In at least one example, cache controller could be tasked with initializing cache when cache power is on. In at least one example, when FE memory of data bank 4105, which retains state across power cycles, is used, cache controller 4102 could write 0 s to all memory locations to ensure that data associated with previously executed programs is erased, thus preventing any data leakage to subsequently executed programs, in at least one example. In at least one example, non-volatile memory may also include an NV bit, which could indicate that cache data is meant to be non-volatile and remain across power cycles. In at least one example, cache controller 4102 may skip locations marked thus when initializing memory.

In at least one example, reliability logic 4104 performs error correction to data. Any suitable error correction scheme (e.g., with error correction code (ECC)) may be used by reliability logic 4104. In at least one example, non-volatile (NV) controller 4103 is provided to explicitly clear cache when using a non-volatile memory, such as FM memory for data bank 4105. In at least one example, NV controller 4103 may include an NV bit which indicates cache lines that should not be cleared but are expected to retain their contents across power cycles. In at least one example, functions of NV controller 4103 can be combined in cache controller 4102, or vice versa.

Figure 42:
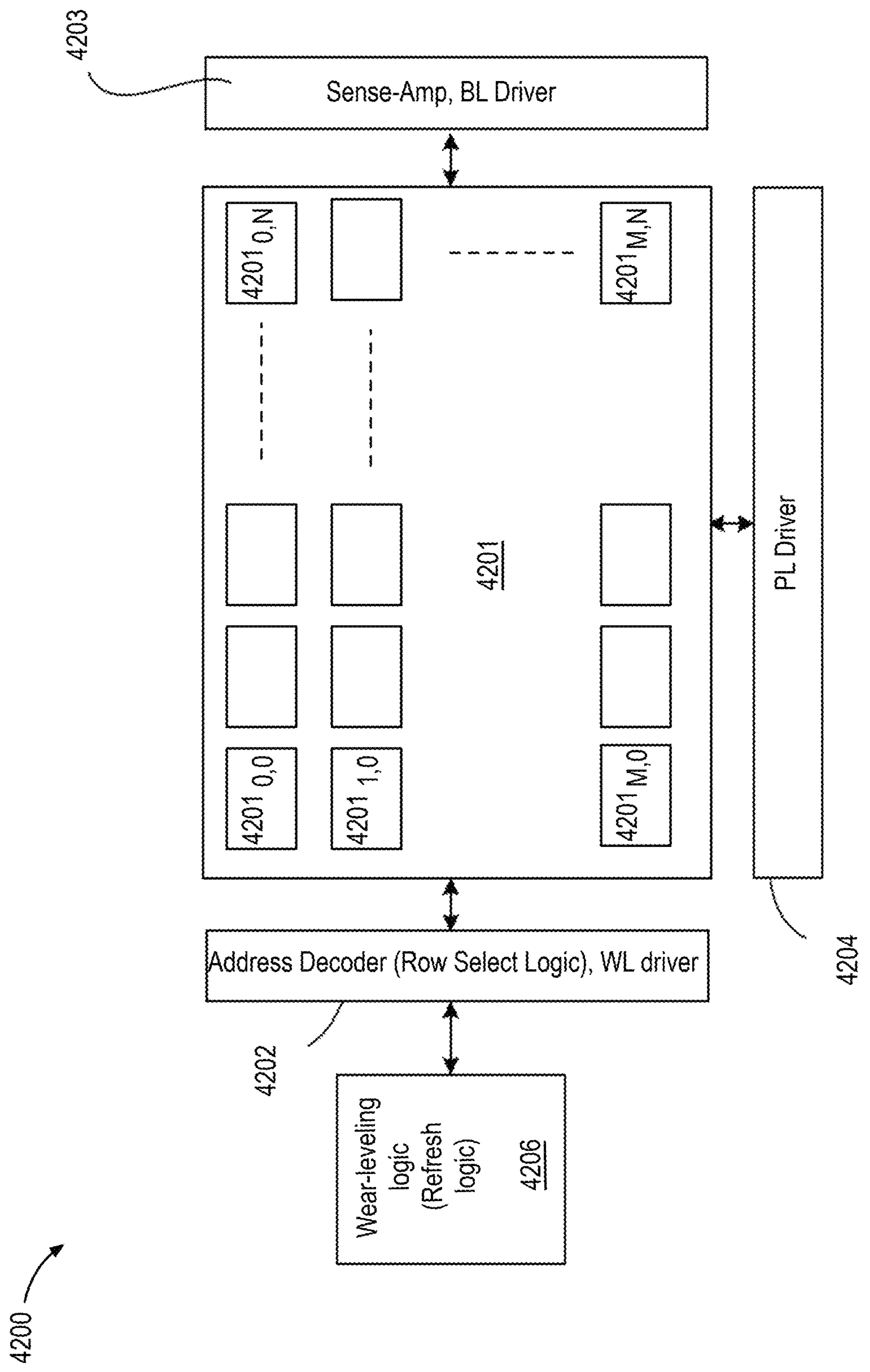
FIG. 42 illustrates an apparatus comprising memory and corresponding logic, wherein memory comprises ferroelectric (FE) memory bit-cells, in accordance with at least one example.

FIG. 42 illustrates an apparatus 4200 comprising an M×N memory array of bit-cells and corresponding periphery circuitry, in accordance with at least one example. In at least one example, apparatus 4200 comprises an M×N memory array 4201 of bit-cells, logic circuitry 4202 for address decoding, and logic circuitry 4203 for sense amplifier and BL driver, and logic circuitry 4204 for write drivers, and plate-line (PL) drivers. In at least one example, plate-lines PL0, PL1 through PLN are parallel to word-lines WL0, WL1, through WLM while bit-lines BL0, BL1 through BLN are orthogonal to plate-lines and word-lines, where 'N' is a number greater than 1. In at least one example, plate-lines PL0, PL1, through PLN are parallel to bit-lines BL0, BL1 through BLN, while word-lines WL0, WL1, through WLM are orthogonal to plate-lines and bit-lines, where 'N' is a number greater than 1. In at least one example, individual memory bit-cells in memory array 4201 are organized in rows and columns. In at least one example, memory bit-cells $\mathbf{4201}_{0,0}$ through $\mathbf{4201}_{M,N}$ are organized in an array.

In at least one example, an individual memory bit-cell (e.g., $\mathbf{4201}_{0,0}$) is a 1TnC bit-cell. An example of a 1TnC bit-cell is described with reference to FIGS. 44A-44B. Referring again to FIG. 42, in at least one example, an individual memory bit-cell (e.g., $\mathbf{4201}_{0,0}$) is a multi-element FE gain bit-cell. An example of a 1TnC bit-cell is described with reference to FIGS. 45A-45B. Referring again to FIG. 42, in at least one example, an individual memory bit-cell (e.g., $\mathbf{4201}_{0,0}$) is a multi-element FE gain bit-cell, where an individual capacitor of bit-cell is connected to a transistor switch. In at least one example, such a memory bit-cell is described with reference to FIG. 46.

Referring again to FIG. 42, in at least one example, when multiple capacitors are used per bit-cell, access transistor may be made larger. In at least one example, access transistor is connected to bit-line as bit-line drives a gate terminal of access transistor. In an example, a larger access transistor can add capacitance to bit-line. In at least one example, one way to reduce bit-line capacitance is to route bit-line on higher level metal layers. In at least one example, higher-level metal layers are usually occupied by ground and supply routes. In at least one example, connecting gate of access transistor to higher-level metal layers to access bit-line means traversing through contact regions and vias. Such signal path may increase resistance and capacitance on bit-line. In at least one example, memory array 4201 is split into two or more subarrays with bit-line multiplexers between subarrays. In at least one example, by splitting array, bit-line routes are split along subarrays via a selection circuitry. In at least one example, selection circuitry decouples bit-line into separate bit-line routes which allows capacitance on bit-line to reduce as parasitic capacitance from bit-line route is reduced, and bit-line is not driving all access transistors in a row of array.

In at least one example, wear-leveling logic 4206 provides one or more endurance mechanisms for 1TnC memory bit-cells. In at least one example, one of endurance mechanisms involves refreshing of data content in capacitor(s).

Figure 43:
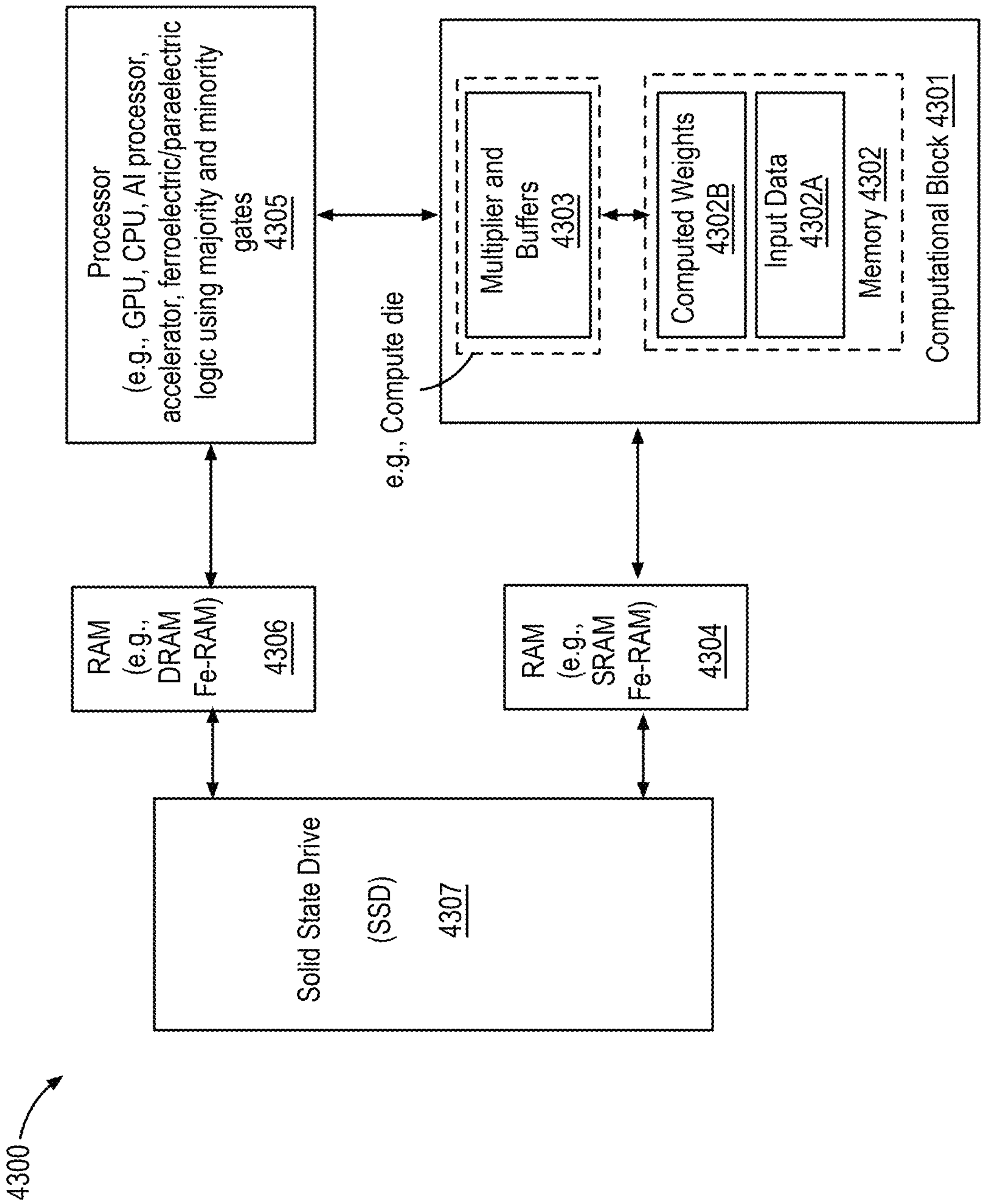
FIG. 43 illustrates a high-level architecture of an artificial intelligence (AI) machine comprising a compute die positioned on top of a memory die, in accordance with at least one example.

FIG. 43 illustrates a high-level architecture of an artificial intelligence (AI) machine 4300 comprising a compute die positioned on top of a memory die, in accordance with at least one example. In at least one example, AI machine 4300 comprises a computational block 4301 or processor having random-access memory (RAM) 4302 and a compute die 4303; a RAM 4304 (e.g., static RAM (SRAM), ferroelectric or paraelectric RAM (FeRAM), ferroelectric or paraelectric static random-access memory (FeSRAM)), a processor 4305, a RAM 4306 (dynamic RAM (DRAM), FeRAM)), and a solid-state memory or solid-state drive 4307. In at least one example, some or all components of AI machine 4300 are packaged in a single package forming a system-on-chip (SoC). In at least one example, SoC can be configured as a logic-on-logic configuration, which can be in a 3D configuration or a 2.5D configuration.

In at least one example, computational block 4301 is packaged in a single package and then coupled to processor 4305 and RAM 4304 and 4306, and solid-state drive 4307 on a printed circuit board (PCB). In at least one example, computational block 4301 is configured as a logic-on-logic configuration, which can be in a 3D configuration or a 2.5D configuration. In at least one example, computational block 4301 comprises special purpose compute die 4303 or microprocessor. In at least one example, compute die 4303 is a compute chiplet that performs a function of an accelerator or inference. In at least one example, memory 4302 is DRAM which forms a special memory/cache for special purpose compute die 4303. In at least one example, DRAM can be embedded DRAM (eDRAM) such as 1T-1C (one transistor and one capacitor) based memories. In at least one example, memory 4302 is ferroelectric or paraelectric RAM (FeRAM).

In at least one example, compute die 4303 is specialized for applications such as Artificial Intelligence, graph processing, and algorithms for data processing. In at least one example, compute die 4303 further has logic computational blocks, for example, for multipliers and buffers, special data memory block (e.g., buffers) comprising DRAM, FeRAM, or a combination of them. In at least one example, memory 4302 has weights and inputs stored in-order to improve computational efficiency. In at least one example, interconnects between processor 4305 (also referred to as special purpose processor), RAM 4304, and compute die 4303 are optimized for high bandwidth and low latency. In at least one example, architecture of FIG. 43 allows efficient packaging to lower energy, power, or cost and provides for ultra-high bandwidth between memory 4302 and compute die 4303 of computational block 4301.

In at least one example, memory 4302 is partitioned to store input data 4302A (or data to be processed) and computed weights 4302B. In at least one example, input data 4302A are stored in a separate memory (e.g., a separate memory die) and computed weights 4302B are stored in a separate memory (e.g., separate memory die).

In at least one example, computational logic or compute die 4303 comprises matrix multiplier, adder, concatenation logic, buffers, and combinational logic. In at least one example, compute die 4303 performs multiplication operation on input data 4302A and computed weights 4302B. In at least one example, computed weights 4302B are fixed weights. For example, processor 4305 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes weights for a training model. Once weights are computed, they are stored in memory 4302. In at least one example, input data, that is to be analyzed using a trained model, is processed by computational block 4301 with computed weights 4302B to generate an output (e.g., a classification result).

In at least one example, RAM 4304 is ferroelectric or paraelectric based SRAM. For example, six transistor (6T) SRAM bit-cells having ferroelectric or paraelectric transistors are used to implement non-volatile FeSRAM. In at least one example, solid-state drive 4307 comprises NAND flash cells. In at least one example, solid-state drive 4307 comprises NOR flash cells. In at least one example, solid-state drive 4307 comprises multi-threshold NAND flash cells.

In at least one example, non-volatility of FeRAM is used to introduce new features such as security, functional safety, and faster reboot time of AI machine 4300. Non-volatile FeRAM is a low power RAM that provides fast access to data and weights. In at least one example, RAM 4304, that is an FeRAM, can also serve as a fast storage for computational block 4301 (or accelerator), which typically has low capacity and fast access requirements.

In various examples, FeRAM (FeDRAM or FeSRAM) includes ferroelectric or paraelectric material. In at least one example, ferroelectric or paraelectric (FE) material may be in a transistor gate stack or in a capacitor of memory. In at least one example, ferroelectric material can be any suitable low voltage FE material that allows FE material to switch its state by a low voltage (e.g., 3000 mV). In at least one example, threshold in FE material has a highly non-linear transfer function in polarization vs. voltage response. In at least one example, threshold is related to: a) non-linearity of switching transfer function, and b) to squareness of FE switching. Non-linearity of switching transfer function is width of derivative of polarization vs. voltage plot. In at least one example, squareness is defined by ratio of remnant polarization to saturation polarization; perfect squareness will show a value of 1.

In at least one example, squareness of FE switching can be suitably manipulated with chemical substitution. For example, in $PbTiO_3$ a P-E (polarization-electric field) square loop can be modified by La or Nb substitution to create an S-shaped loop. In at least one example, shape can be systematically tuned to ultimately yield a non-linear dielectric. Squareness of FE switching can also be changed by granularity of FE layer. In at least one example, a perfectly epitaxial, single crystalline FE layer will show higher squareness (e.g., ratio is closer to 1) compared to a polycrystalline FE. In at least one example, this perfect epitaxial can be accomplished using lattice matched bottom and top electrodes. In one example, BiFeO (BFO) can be epitaxially synthesized using a lattice matched $SrRuO_3$ bottom electrode yielding P-E loops that are square. In at least one example, progressive doping with La will reduce squareness.

In at least one example, FE material includes material of ferroelectric layer which are same as those described herein.

In at least one example, FE material is between two electrodes that comprise perovskite templated conductors. In such a templated structure, a thin layer (e.g., approximately 10 nm) of a perovskite conductor (such as $SrRuO_3$) is coated on top of $IrO_2$, $RuO_2$, $PdO_2$, or $PtO_2$ (which have a non-Perovskite structure but higher conductivity) to provide a seed or template for growth of pure perovskite ferroelectric material at low temperatures.

Figures 44A, 44B:
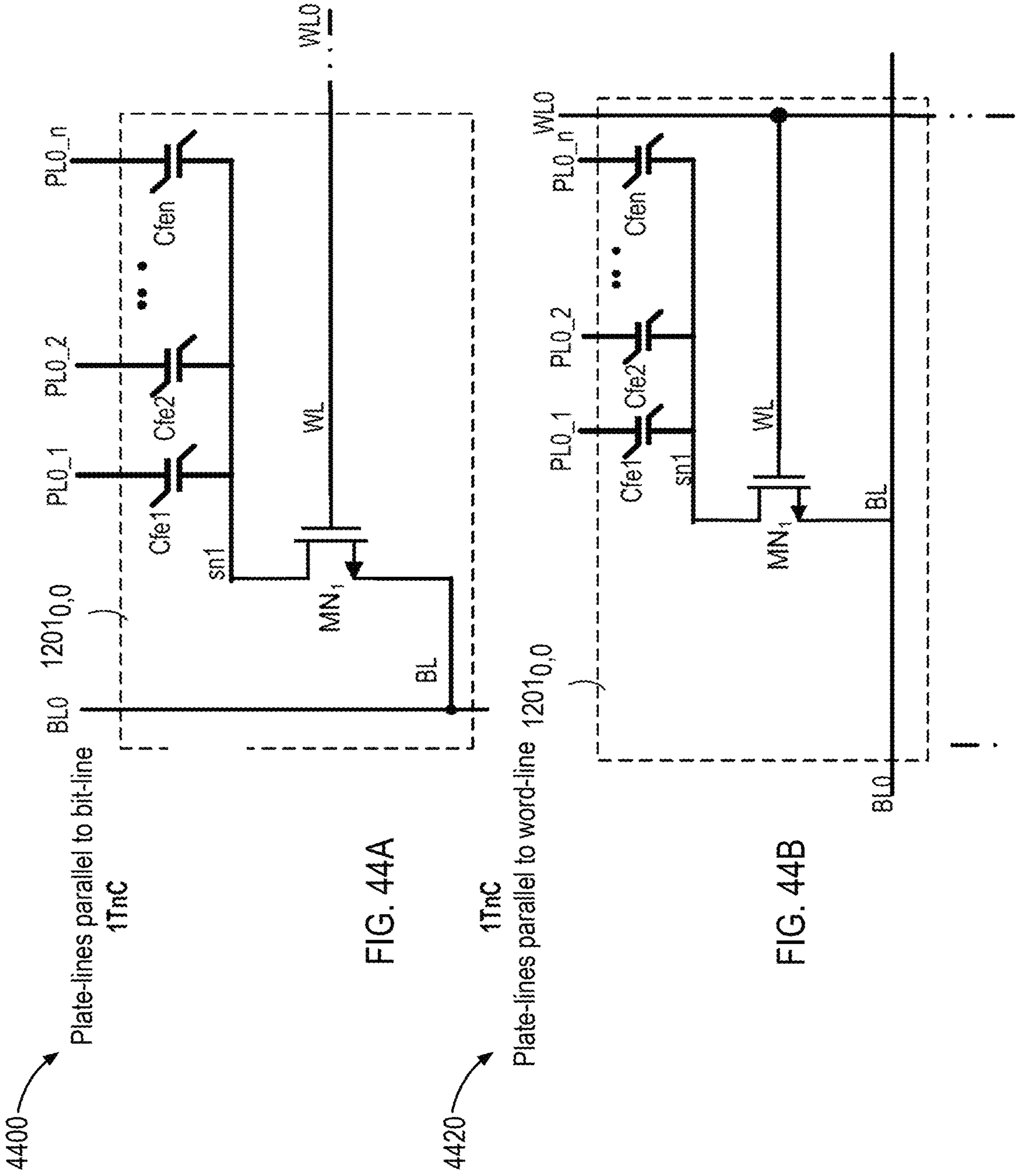
FIG. 44A illustrates a 1TnC bit-cell comprising non-linear polar material for its capacitors, where plate-lines are parallel to bit-line, in accordance with at least one example.

FIG. 44A illustrates a 1TnC bit-cell 4400 comprising non-linear polar material for its capacitors, where plate-lines are parallel to bit-line, in accordance with at least one example. In at least one example, 1TnC bit-cell 4400 (e.g., $\mathbf{1201}_{0,0}$) comprises one select transistor $MN_1$ and a plurality of capacitors Cfe1, Cfe2, through Cfen (where 'n' is a number greater than 1) comprising non-linear polar material (e.g., ferroelectric, paraelectric, or non-linear dielectric). In at least one example, capacitors can be a planar or non-planar capacitor as described. In at least one example, plurality of capacitors Cfe1, Cfe2, through Cfen are stacked and folded capacitors.

In at least one example, gate terminal of transistors $MN_1$ is controllable by WL. In at least one example, BL is coupled to a source or drain terminal of transistor $MN_1$. In at least one example, an individual PL of a plurality of PLs is coupled to an individual capacitor. In at least one example, capacitor Cfe1 is coupled to plate-line PL0_1, capacitor Cfe2 is coupled to plate_line PL0_2, and capacitor Cfen is coupled to plate_line PL0_*n*. In at least one example, plurality of capacitors is coupled to storage node sn1, which is coupled to a drain or source terminal of transistor $MN_1$. In at least one example, a first terminal of capacitor Cfe1 is coupled to PL0_1 and a second terminal of capacitor Cfe1 is coupled to storage node sn1. In at least one example, apparatus 4200 (FIG. 42) has n-number of PLs (e.g., PL0_1 through PL0_*n*) per column which are parallel to a PL for that column.

While at least one example is illustrated with reference to an n-type transistor, at least one example is also applicable to a p-type transistor or a combination of n-type or p-type transistors. In at least one example, when a transistor of a different conductivity type is used than what is shown in FIG. 44A, then driving logic for BL, PLs, and/or WL may also change for proper read and/or write operations. In at least one example, PLs are parallel to BL. In at least one example, PL0_1, PL0_2, PL0_*n* are parallel to BL. In at least one example, transistor $MN_1$ is fabricated on frontend of die and capacitors are stacked over transistor. In at least one example, capacitors are stacked along z-direction and folded along x-axis. In at least one example, capacitors can be planar or non-planar capacitors. In at least one example, a taller and wider bit-cell is formed with a footprint comparable to footprint of transistor $MN_1$. In at least one example, x-y footprint is determined by size of transistor $MN_1$ and its connections to BL, WL, and storage node sn1.

In at least one example, PL (e.g., PL0_1, PL0_2, . . . PL0_*n*) controls which capacitor of bit-cell is programmed, and value of programming. In at least one example, BL acts as a sense-line. In at least one example, voltage on BL (e.g., sense voltage) can create disturbance on other bit-lines during read operation. To mitigate such disturbances. In at least one example, 1TnC bit-cell is periodically refreshed (e.g., every 1 second). In at least one example, periodic refresh is minimized by refreshing in active mode of operation. In at least one example, in standby mode (e.g., low power mode), 1TnC bit-cell is not refreshed as there is no disturb mechanism during standby. In at least one example, wear-leveling logic 4206 (FIG. 42) provides one or more endurance mechanisms for 1TnC memory bit-cells. One of endurance mechanisms involves refreshing of data content in capacitor(s).

In at least one example, in 1TnC bit-cell case (e.g., bit-cell $\mathbf{1201}_{,0}$) with PL parallel to BL, activities seen on an unselected or un-intended bit-cell while performing read/write operations on same column as that of selected bit-cell can have large disturb effects on unselected or unintended bit-cells. In at least one example, this may be true if PL within same column toggles (during read or write) a particular value to desired bit-cell. In at least one example, this signal on PL of that column, which is shared with other unselected cells, can create a field across non-linear polar material based capacitors or devices of unselected cells. In at least one example, field across unselected non-linear polar material based capacitors or devices is a function of dielectric component of individual non-linear polar material based capacitors or devices and total capacitance on storage node sn1 of those bit-cells. In at least one example, since in 1TnC bit-cells storage capacitor has much larger capacitance load, activity seen on unselected bit-line can result into almost all voltage getting dropped across ferroelectric capacitors (e.g., Vfe=Vpl*(Cp/(Cfed+Cp), which creates a disturb effect, which in turn causes unintentional modification of polarization stage of ferroelectric capacitor.

FIG. 44B illustrates a 1TnC bit-cell 4420 comprising non-linear polar material for its capacitors, where plate-lines are parallel to word-line, in accordance with at least one example. 1TnC bit-cell 4420 is similar to 1TnC bit-cell 4400 but plate-lines are parallel to word line.

Figure 45A:
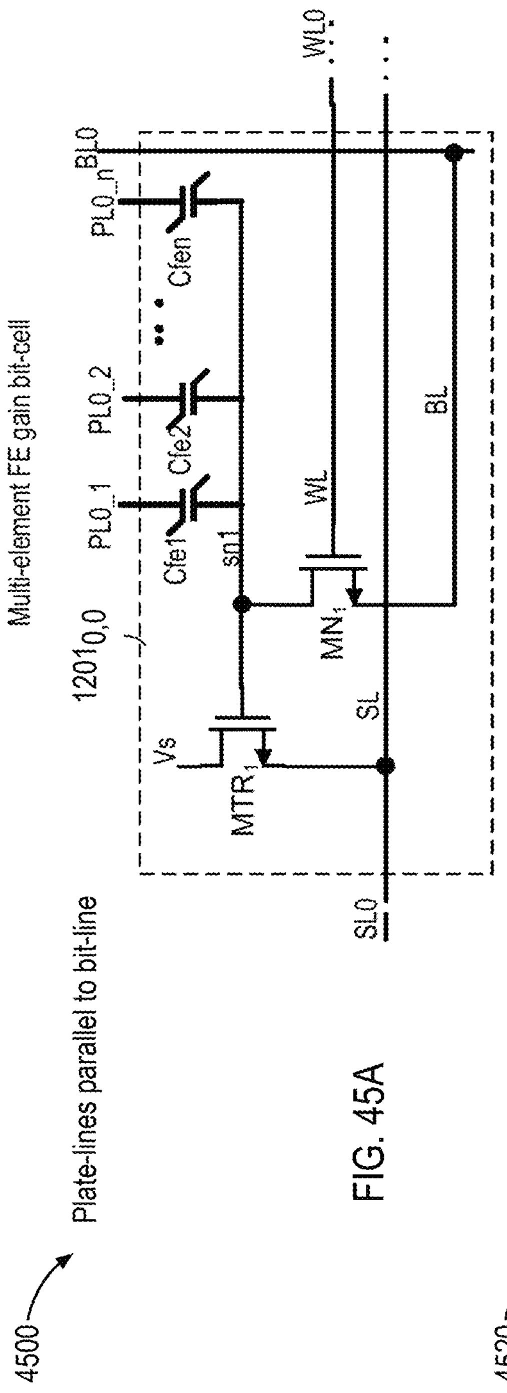

FIG. 45A illustrates a multi-element FE gain bit-cell 4500 with plate-lines parallel to bit-line, in accordance with at least one example. In at least one example, bit-cell 4500 (e.g., $\mathbf{701}_{0,0}$) comprises n-type select transistor $MN_1$, n-type transistor $MTR_1$, bit-line (BL), word-line (WL), sense-line (SL), and 'n' number of ferroelectric (or paraelectric) capacitors Cfe1 through Cfen. In at least one example, gate terminal of n-type transistor $MN_1$ is coupled to WL (e.g., WL1). In at least one example, drain or source terminal of n-type transistor $MN_1$ is coupled to BL. In at least one example, first terminals of each of capacitors Cfe1 through Cfen is coupled to a storage node sn1. In at least one example, storage node sn1 is coupled to a source or drain terminal of n-type transistor $MN_1$ and to a gate of transistor $MTR_1$. In at least one example, drain or source terminal of $MTR_1$ is coupled to a bias voltage Vs. In at least one example, Vs is a programmable voltage that can be generated by any suitable source. In at least one example, Vs voltage can help in biasing gain transistor in conjunction with sense-voltage that builds at sn1 node. In at least one example, source or drain terminal of transistor $MTR_1$ is coupled to SL (e.g., SL1). In at least one example, a p-type transistor can be used as well for gain.

In at least one example, second terminals of each of capacitors Cfe1 through Cfen is coupled to a corresponding plate-line (PL). In at least one example, second terminal of Cfe1 is coupled to PL0_1, second terminal of Cfe2 is coupled to PL0_2, and so on. In at least one example, apparatus 4200 (FIG. 42) has n-number of PLs (e.g., PL0_1 through PL0_*n*) per column which are parallel to a BL for that column. In at least one example, SL is parallel to PL. In at least one example, SL is parallel to WL.

In at least one example, ferroelectric (or paraelectric) capacitors Cfe1 through Cfen are planar capacitors such as those discussed with reference to various examples herein. In at least one example, ferroelectric (or paraelectric) capacitors Cfe1 through Cfen are pillar capacitors such as those discussed with reference to various examples herein. In at least one example, ferroelectric (or paraelectric) capacitors Cfe1 through Cfen are vertically stacked and horizontally folded allowing for tall bit-cells (e.g., higher in z-direction) but with x-y footprint of two transistors. In at least one example, by folding capacitors, diffusion capacitance on BL can be reduced for a given array size, which can improve reading speed. In at least one example, folding capacitors lowers effective routing capacitance on BL. In at least one example, larger footprint in x-y direction of multi-element FE gain bit-cell compared to footprint in x-y direction of 1TnC bit-cell, vertical height of capacitor can be reduced as capacitors can expand in x-y direction more than before for a given height. In at least one example, capacitors are folded more effectively. In at least one example, n/2 capacitors per metal or via layer can be packed. In at least one example, more capacitors can be stacked in multi-element FE gain bit-cell because storage node sn1 is decoupled from BL. In at least one example, multi-element FE gain bit-cell can reduce thickness scaling requirement for pillar capacitor. In at least one example, polarization density requirements are reduced for multi-element FE gain bit-cell compared to 1TnC bit-cell.

In at least one example, x-y footprint is determined by size of transistor $MN_1$ and its connections to BL, WL, and storage node sn1. In at least one example, footprint can still be decided by other factors such as: a number of capacitors that connect to node; how capacitors are arranged, e.g., more folding on same node versus stacking; effective size constraints on those capacitors; and number of capacitors that share same bit-cell. In at least one example, PL (e.g., PL0_1, PL0_2, . . . PL_*n*) controls which cell within same access transistor gets programmed, and value of programming. In at least one example, BL acts as a sense-line. In at least one example, voltage on BL (e.g., sense voltage) can create disturbance on other bit-lines during read operation. To mitigate such disturbances, in at least one example, multi-element FE gain bit-cell (e.g., $\mathbf{701}_{0,0}$) may be periodically refreshed (e.g., every 1 second). In at least one example, periodic refresh is minimized by refreshing in active mode of operation that can be coupled with advance schemes for wear leveling. In standby mode (e.g., low power mode), multi-element FE gain bit-cell (e.g., $\mathbf{701}_{0,0}$) is not refreshed as there is no disturb mechanism during standby. In at least one example, multi-element FE gain bit-cell (e.g., $\mathbf{701}_{0,0}$) relies on isolating read mode from BL or SL capacitance by isolating through access transistor $MN_1$, where $MN_1$ transistor facilitates pre-charging sn1 node, prior to read operation.

In at least one example, there is a possibility of disturbance at storage node sn1 during read operation. In at least one example, PL is toggled for other capacitors to average value of disturbance that will be seen on sn1 node, e.g., when a read pulse of some polarity is applied at PL of capacitor to be read, a non-zero voltage is applied on other PLs of multi-element FE gain bit-cell (e.g., $\mathbf{701}_{0,0}$), that matches expected disturbance seen on shared node. In at least one example, PL driver is configured to support driving different voltage levels on different PLs. In at least one example, wear-leveling logic 4206 (FIG. 42) provides one or more endurance mechanisms for multi-element FE gain bit-cell 4500. In at least one example, one of endurance mechanisms involves refreshing of data content in capacitor(s).

Figure 45B:
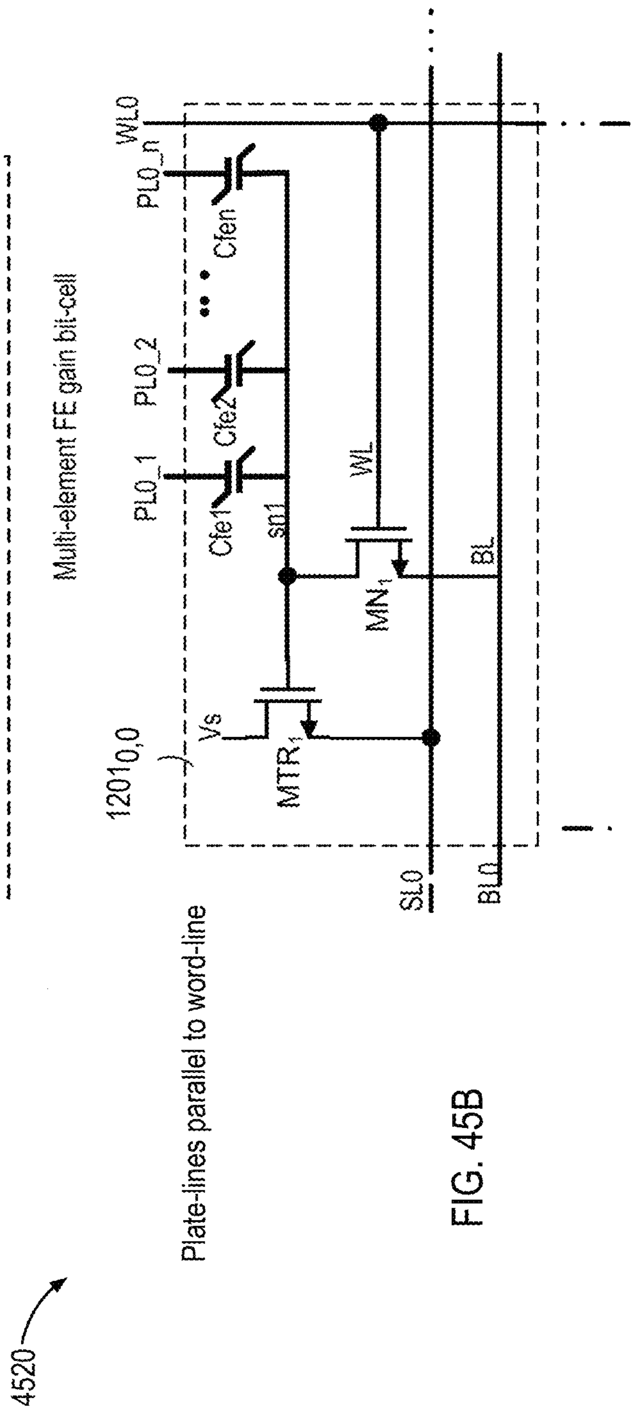

FIG. 45B illustrates a multi-element FE gain bit-cell 4520 with plate-lines parallel to word-line, in accordance with at least one example. In at least one example, multi-element FE gain bit-cell 4520 is similar to multi-element FE gain bit-cell 4500 but plate-lines are parallel to word line.

Figure 46:
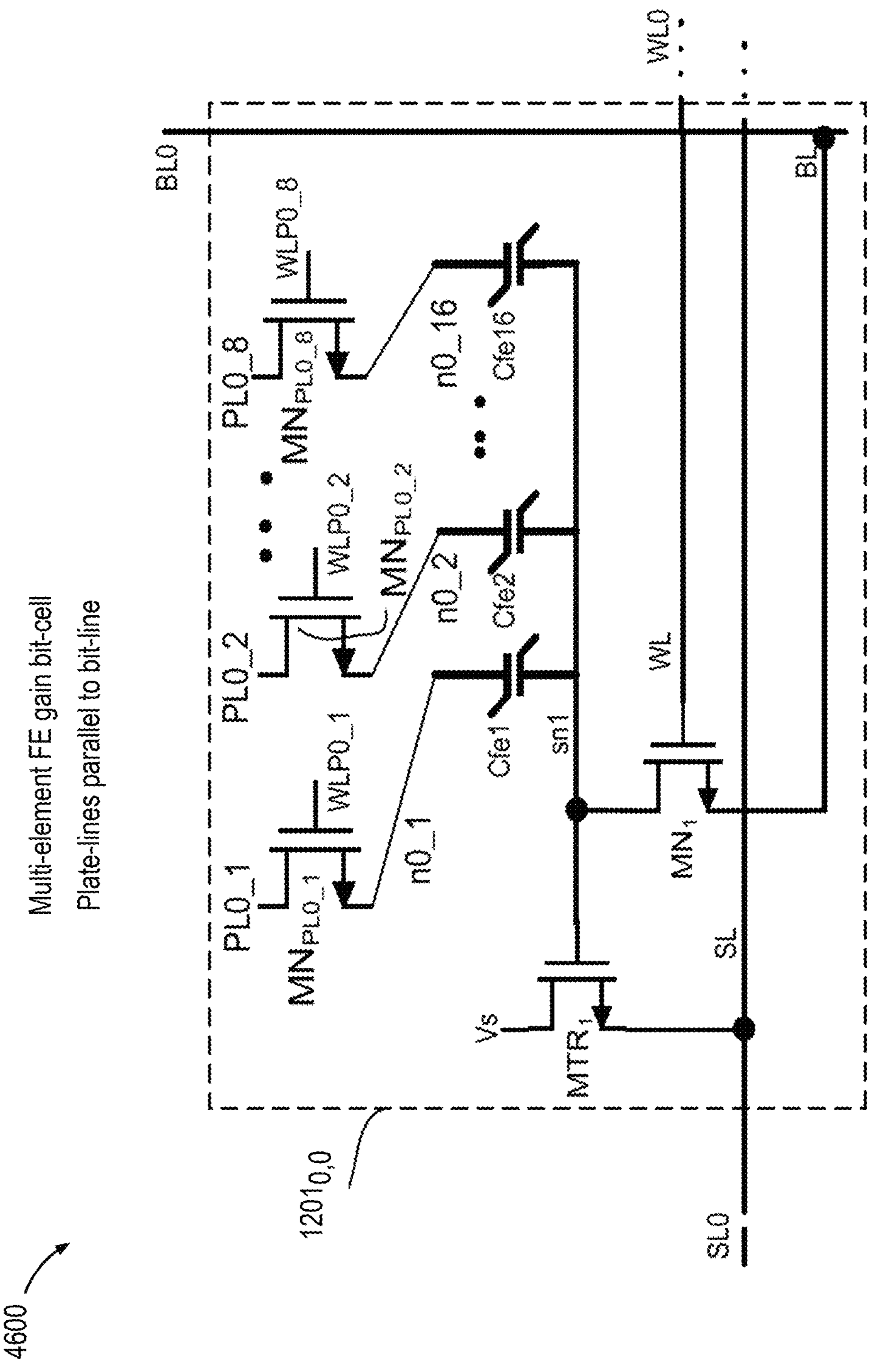

FIG. 46 illustrates a multi-element FE gain bit-cell or a bit-cell 4600 with plate-line switches, in accordance with at least one example. In at least one example, bit-cell 4600 is like bit-cell 3200 (FIG. 32A), but with switches in path of plate-lines and hence a different kind of memory bit-cell. In at least one example, these switches can be added to remove charge disturb effect of unselected bit-cells when bit-lines are arranged parallel to plate-lines. In at least one example, charge disturb effect here is on stored state of capacitors with non-linear polar material. In at least one example, by adding switches, plate-lines are no longer directly affecting charge disturb effect because of corresponding WLs that control switches.

In at least one example, each memory bit-cell in bit-cell 4600 is organized in rows and columns like in apparatus 4200 (FIG. 42), but with bit-lines running parallel to plate-lines. In at least one example, n-type transistor $MN_{PLO\_1}$ is coupled to Cfe1 and plate-line PL0_1. In at least one example, n-type transistor $MN_{PLO\_2}$ is coupled to Cfe2 and plate-line PL0_2. In at least one example, n-type transistor $MN_{PLO\_n}$ is coupled to Cfen and plate-line PL0_*n*. In at least one example, each transistor (or switch) is controlled separately. In at least one example, transistor $MN_{PLO\_1}$ is controllable by WLP0_1, transistor $MN_{PLO\_2}$ is controllable by WLP0_2, and so on. In at least one example, transistor $MN_{PLO\_n}$ is controllable by WLP0_*n*. Here, WLP0_1 . . . WLP0_*n* are extensions of an address space. In this case, depending upon which storage element is being programmed or read, corresponding WLP0_1 . . . WLP0_*n* are kept high (e.g., Vdd) whenever plate-line voltage of OV or Vdd is applied, while unselected storage element sees OV.

While at least one example is illustrated with reference to an n-type transistor or switch, at least one example is also applicable to a p-type transistor or a combination of n-type or p-type transistors. In at least one example, when a transistor of a different conductivity type is used than what is shown in FIG. 46, then driving logic for BL, PLs, WL, and/or WLPs may also change for proper read and/or write operations.

In at least one example, switches added to plate-lines are fabricated in different layers of a die. In at least one example, transistor $MN_1$ is fabricated on frontend of die while transistors $MN_{PLO\_1}$, $MN_{PLO\_2}$, . . . and $MN_{PLO\_n}$, are fabricated in backend of die. In at least one example, capacitor Cfe is fabricated between frontend and backend of die. In at least one example, capacitors Cfe are vertically stacked capacitors and horizontally folded. In at least one example, each switch and its corresponding coupled capacitor is formed in backend of die. In at least one example, each switch and its corresponding coupled capacitor is stacked vertically. In at least one example, transistor $MN_{PLO\_1}$ and capacitor Cfe1 are stacked vertically in a first vertical stack, and transistor $MN_{PLO\_2}$ and capacitor Cfe2 are stacked vertically in a second vertical stack. In at least one example, capacitors Cfe1 and Cfe2 are stacked and folded. In at least one example, these backed transistors or switches can be fabricated using any suitable technology such as IGZO (Indium gallium zinc oxide).

Method of forming structures described herein are applicable to various logic examples. For example, memory devices or capacitive structures formed herein can be used to forming other ferroelectric/paraelectric circuits. In at least one example, these circuits can be implemented with majority gate, minority gate, and/or threshold gate.

Following examples are provided that illustrate at least one example. Examples can be combined with other examples. As such, at least one example can be combined with at least another example without changing scope of at least one example.

Example 1 is a method of fabricating a device, the method comprising: forming a multi-layer stack above a first substrate, the multi-layer stack comprising a plurality of electrode layers and a first dielectric layer comprising a non-linear polar material; forming a second dielectric layer on the multi-layer stack; annealing the multi-layer stack; forming a transistor above a second substrate; forming a third dielectric layer above the transistor; bonding the second dielectric layer with the third dielectric layer; etching the multi-layer stack to form a capacitor and a plate electrode connected with the capacitor; and forming an electrode structure, wherein at least a portion of the electrode structure extends through the plate electrode and couples with a terminal of the transistor.

Example 2 is a method according to any example described herein, in particular example 1, wherein forming the multi-layer stack comprises: depositing a first conductive layer comprising one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \leq x \leq 1$, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$ or wherein 'x' is an integer, nitrogen doped variants of Ir, $Ir_2O_x$, Ru, $RuO_x$, Mo, $MoO_x$, Ta, Cr, Nb, Rh, Ti, W, conductive doped AlN, or conductive doped SiN; depositing the first dielectric layer on the first conductive layer, the first dielectric layer comprising one of: a first form $ABB'O_3$, wherein "A" includes one of: Ba, K, Bi, Y, La, Sc, Ce, Pr, Nd, Pm, Sm, Eu, Gd, Tb, Dy, Ho, Er, Yb, Lu, Li, Bi, K, or Na, wherein "B" includes one of Mn, Fe, Ta, or Nb, and wherein "B'" includes one of: Sc, Ti, V, Cr, Mn, Fe, Co, Ni, Cu, or Zn; a second form $AA'BO_3$, wherein "A" includes one of: Ba, K, Bi, Y, La, Sc, Ce, Pr, Nd, Pm, Sm, Eu, Gd, Tb, Dy, Ho, Er, Yb, Lu, Li, Bi, K, or Na, wherein "B" includes one of Mn, Fe, Ta, or Nb, wherein "A'" includes one of Y, La, Sc, Ce, Pr, Nd, Pm, Sm, Eu, Gd, Tb, Dy, Ho, Er, Yb, Lu, and wherein A' comprises a valency of site A, but different ferroelectric polarizability from A; a third form $ABO_3$, wherein "A" includes one of: Ba, K, Bi, Y, La, Sc, Ce, Pr, Nd, Pm, Sm, Eu, Gd, Tb, Dy, Ho, Er, Yb, Lu, Li, Bi, K, or Na, and wherein "B" includes one of Mn, Fe, Ta, or Nb; bismuth ferrite (BFO), BFO with a first doping material, wherein the first doping material is one of lanthanum, elements from lanthanide series of a periodic table, or elements of 3d, 4d, 5d, 6d, 4f, or 5f series of periodic table; lead zirconium titanate (PZT) or PZT with a second doping material, wherein the second doping material is one of La or Nb; a perovskite material which includes one of: $BaTiO_3$, $PbTiO_3$, $KNbO_3$, $NaTaO_3$, wherein the perovskite material is doped with La or lanthanides, chemically substituted lead titanate, and wherein Zr, La, or Nb is substituted in Ti site; a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a $BaTiO_3$ (BTO) based relaxor which includes one of: $BaTiO_3$—$Bi(Zn_{1/2}Ti_{1/2})O_3$ (BTO-BZT), $BaTiO_3$—$BiScO_3$ (BTO-BS):

$BiScO_3$, $Ba_{(1-x)}Sr_xTiO_3$ (BST), $BaTiO_3$—$Pb(Mg_{1/3}Nb_{2/3})O_3$ (BTO-PMN), $BaTi_{(1-x)}Zr_xO_3$ (BTZ), $BaTiO_3$—$Pb(Zn_{1/3}Nb_{2/3})O_3$ (BTO-PZN), $BaTiO_3$—$Pb(Sc_{1/2}Nb_{1/2})O_3$ (BTO-PSN); a PZT based relaxor which includes one of: PZT-$Pb(Mg_{1/3}Nb_{2/3})O_3$ (PZT-PMN), PZT-$Pb(Ni_{1/3}Nb_{2/3})O_3$ (PZT-PNN), PZT-$Pb(Zn_{1/3}Nb_{2/3})O_3$ (PZT-PZN), PZT-$Pb(Sc_{1/2}Nb_{1/2})O_3$ (PZT-PSN), PZT-$Pb(Fe_{1/2}Nb_{1/2})O_3$ (PZT-PFN), PZT-Pb(La,Zr,Ti)$O_3$ (PZT-PLZT), or PZT-Pb(Ti,Mn)$O_3$ (PZT-PTM); a $SrBi_2Ta_2O_9$ (SBT) based relaxor which includes one of: paraelectric SBT-$SrBi_2(Nb,Ta)_2O_9$ (SBT-SBNT), or SBT doped with one of: Mn, Fe, Co, La, Ce, or Nd, Ba, or Ca; a first hexagonal ferroelectric which includes one of: $YMnO_3$ or $LuFeO_3$; a second hexagonal ferroelectric of a type $RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); lithium niobate, lithium tantalate, lithium iron tantalum oxy fluoride, barium strontium niobate, sodium barium niobate, or potassium strontium niobate; a first superlattice of a fourth form $[A_n/B_n]_m$, wherein 'A' is a material and comprises one of: $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, wherein 'B' is a material and comprises one of: $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, wherein 'A' is different from 'B', wherein 'n' represents a number of layers of material 'A' and material 'B' in the first superlattice, wherein 'n' is at least 1, wherein 'm' represents a number of bilayers, and wherein 'm' is at least 1; a second superlattice of a fifth form $[A_n/B_n/Cn]_m$, wherein 'A' is a material and comprises one of: $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, wherein 'B' is a material and comprises one of: $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, wherein 'C' is a material and comprises one of: $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, wherein 'n' represents a number of layers of material 'A', material 'B', and material 'C' in the second superlattice, wherein 'n' is at least 1, wherein 'm' represents a number of trilayers, and wherein 'm' is at least 1; hafnium (Hf), zirconium (Zr), aluminum (Al), silicon (Si), their oxides or their alloyed oxides; hafnium oxide of a form $Hf_{(1-x)}E_xO_y$, where E includes one of: Al, Ca, Ce, Dy, Er, Gd, Ge, La, Sc, Si, Sr, Sn, Zr, or Y, wherein 'x' and 'y' are first and second fractions, respectively; $HfO_2$ doped with one of: Al, Ca, Ce, Dy, Er, Gd, Ge, La, Sc, Si, Sr, Sn, or Y; $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, wherein 'x' and 'y' are third and fourth fractions, respectively; $LiNbO_3$, $LiTaO_3$, $LiTaO_2F_2$, $Sr_{(x)}Ba_{(1-x)}Nb_2O_6$ where $0.32 \le x \le 0.8$, or $KSr_2Nb_5O_{15}$; a paraelectric material comprising $SrTiO_3$, $Ba_{(x)}Sr_{(y)}TiO_3$, $HfZrO_2$, Hf—Si—O, or La-substituted $PbTiO_3$; Pb(Zr,Sn,Ti)$NbO_3$ (PNZST), $(NH_4)H_2PO_4$(ADP), $La_{0.2}Sr_{0.7}Fe_{12}O_{19}$, $AgBiP_2Se_6$, $CuInP_2S_6$ $CuBiP_2Se_6$ $[Na_{(1-x/2)}La_{(x/2)}][Nb_{(1-y)}Ti_{(y)}]O_3$, $(Ag_{0.90}Ca_{0.05})(Nb_{0.95}Ta_{0.05})O_3$, (1-z)$NaNbO_3$-z$Bi(Ni_{1/2}Sn_{1/2})O_3$, (1-z) $Bi_{0.5}Na_{0.5}TiO_{3-z}Ag_{0.91}Sm_{0.03}NbO_3$, 0.90$NaNbO_3$-0.10$BiFeO_3$, (1-z)$NaNbO_3$-z$Bi(Zn_{2/3}Nb_{1/3})O_3$, (1-z) $NaNbO_3$-z$Bi(Zn_{0.5}Ti_{0.5})O_3$, $Ag_{0.76}La_{0.08}NbO_3$, $Ag_{0.97}Nd_{0.01}Ta_{0.20}Nb_{0.8}O_3$, $Lu_2O_3$ modified $AgNbO_3$, or (La)Pb(Zr,Ti)$O_3$ wherein 'x' is less than or equal to 1, wherein 'y' is less than or equal to 1, and wherein 'z' is less than or equal to 1; or $CsGeX_3$, with bandgap between 1.6 eV and 3.3 eV, wherein 'X' is a halide, $CuInP_2S_6$, $WTe_2$, $LiOsO_3$, $Ca_3Ru_2O_7$, $In_2Se_3$, SnTe, SnS, SnSe, $MoTe_2$, $Bi_{(1-x)}La_xTi_3O_{12}$, $SrBi_2Ta_2O_9$, $Bi_4Ni_3Ti_{12}$, $Bi_4Na_{0.5}TiO_3$, $CH_3NH_3PbI_3$, $CH_3NH_3Pb_{(3-x)}Cl_x$, $PbZr_{0.2}Ti_{0.8}O_3$, wherein 'x' is a compositional fraction, $(CH_3(CH_2)_3NH_3)_2(CH_3NH_3)_{n-1}Pb_{3n+1}$, wherein 'n' is a positive integer, $(Sr_{0.96}La_{0.04})(Zr_{0.90}Ti_{0.10})O_3$, $La_{0.7}Sr_{0.3}MnRu_{0.05}O_3$, $Ca_{0.99}Ce_{0.11}MnO_3$, $H_xSrRuO_3$, $SrRuO_3$, or EuO; depositing a second conductive layer on the first dielectric layer, the second conductive layer comprising one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \le x \le 1$, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_y$, Ru, $RuO_y$, Mo, $MoO_y$, W, or $WO_y$, wherein 'y' is an integer; and depositing a third conductive layer on the second conductive layer, the third conductive layer comprising one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \le x \le 1$, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$, wherein 'x' is an integer; Ir, $Ir_2O_x$, Ru, $RuO_x$, Mo, $MoO_x$, Ta, Cr, Nb, Rh, Ti, or W doped with nitrogen; TiAlN with >30 atomic percent AlN, TaN with >30 atomic percent N, TiSiN with >20 atomic percent SiN, tantalum carbide (TaC), titanium carbide (TiC), tungsten carbide (WC), tungsten nitride (WN), TaCN, TiCN, WCN, titanium monoxide (TiO or $Ti_2O$), tungsten oxide ($WO_3$), tin oxide ($SnO_2$), indium tin oxide (ITO), iridium oxide ($IrO_2$), indium gallium zinc oxide (IGZO), zinc oxide, or METGLAS series of alloys, wherein the third conductive layer is different from the first conductive layer.

Example 3 is a method according to any example described herein, in particular example 2, wherein prior to etching the multi-layer stack the method further comprises removing the second substrate and masking the multi-layer stack, wherein etching the multi-layer stack to form the capacitor further comprises: etching the third conductive layer to form a top electrode; etching the first dielectric layer to form a dielectric; and etching the second conductive layer to form a bottom electrode and exposing the third conductive layer below the bottom electrode, wherein the method further comprises forming an encapsulation layer on a sidewall of the capacitor and on at least a portion of the third conductive layer.

Example 4 is a method according to any example described herein, in particular example 3, the method further comprises: depositing a fourth dielectric layer above the capacitor and on the encapsulation layer; and etching the fourth dielectric layer and the third conductive layer to form the plate electrode above the transistor.

Example 5 is a method according to any example described herein, in particular example 4, wherein the method further comprises: etching to form an opening in the fourth dielectric layer, the opening extending through at least a portion of the plate electrode, the second dielectric layer, and the third dielectric layer; depositing one or more conductive materials into the opening; and planarizing to form the electrode structure.

Example 6 The method of example 4, wherein prior to depositing the fourth dielectric layer the method further comprises etching the encapsulation layer to form a spacer adjacent to the sidewall of the capacitor.

Example 7 is a method according to any example described herein, in particular example 5, wherein the opening exposes at least a portion of a source terminal or a drain terminal of the transistor, wherein depositing the one or more conductive materials into the opening further comprises depositing on the source terminal or on the drain terminal of the transistor, and wherein the electrode structure is coupled with the plate electrode and a lowermost electrode of the capacitor.

Example 8 is a method according to any example described herein, in particular example 5, wherein a portion of the opening above the plate electrode comprises a first lateral thickness, wherein a portion of the opening below the plate electrode comprises a second lateral thickness, and wherein the first lateral thickness is greater than the second lateral thickness.

Example 9 is a method according to any example described herein, in particular example 5, wherein etching the opening through the plate electrode comprises etching through an edge portion of the plate electrode, wherein the electrode structure has a first lateral width above the plate electrode and a second lateral width below the plate electrode, wherein the first lateral width is greater than the second lateral width.

Example 10 is a method according to any example described herein, in particular example 1, wherein annealing further comprises utilizing a rapid thermal annealing process, wherein the rapid thermal annealing process comprises heating to a first temperature of more than 700 degrees Celsius, for a time duration between 1 s and 60 s, at a first pressure range between vacuum and 760 Torr, and wherein the rapid thermal annealing process further comprises flowing oxygen, nitrogen, or argon gas while operating at the first pressure range.

Example 11 is a method according to any example described herein, in particular example 1, wherein etching the multi-layer stack further comprises: etching to form a block, wherein a lowermost conductive layer in the block forms the plate electrode; and masking and etching the block to form the capacitor, wherein etching the block exposes an uppermost surface of the plate electrode, wherein the method further comprises forming an encapsulation layer on the capacitor and on the plate electrode.

Example 12 is a method according to any example described herein, in particular example 1, wherein the second dielectric layer comprises silicon and one or more of oxygen, nitrogen, or carbon and the third dielectric layer comprises silicon and one or more of oxygen, nitrogen, or carbon.

Example 13 is a method of fabricating a device array, the method comprising: depositing a multi-layer stack above a first substrate, the multi-layer stack comprising a plurality of electrode layers and a first dielectric layer comprising a non-linear polar material having a form ABB'O$_3$, AA'BO$_3$, or ABO$_3$; forming a second dielectric layer on the multi-layer stack; annealing the multi-layer stack; forming a first transistor and a second transistor above a second substrate; forming a third dielectric layer above the first transistor and the second transistor; bonding the second dielectric layer with the third dielectric layer; removing at least a portion of the first substrate and exposing the multi-layer stack; etching the multi-layer stack to form a first capacitor, a second capacitor and a plate electrode coupled with the first capacitor and the second capacitor; and forming an electrode structure through at least a portion of the plate electrode, the electrode structure coupled with a bridge structure, wherein the bridge structure is coupled with the first transistor and the second transistor.

Example 14 is a method according to any example described herein, in particular example 13, wherein forming the electrode structure further comprises: depositing a fourth dielectric layer above the first capacitor, the second capacitor and the plate electrode; etching to form an opening in the fourth dielectric layer, the opening extending through the plate electrode, the second dielectric layer, the third dielectric layer, an interlayer dielectric between the third dielectric layer and the bridge structure; depositing one or more conductive materials into the opening on a portion of the bridge structure; and planarizing to form the electrode structure.

Example 15 is a method according to any example described herein, in particular example 13, wherein the first transistor is fabricated laterally apart from the second transistor, wherein the first transistor is identical to the second transistor, and wherein the bridge structure is a conductive bridge structure.

Example 16 is a method according to any example described herein, in particular example 13, wherein the method further comprises: etching the multi-layer stack to form a block, wherein a lowermost conductive layer in the block forms the plate electrode; etching the block to form the first capacitor and the second capacitor, wherein etching exposes portions of the plate electrode; and forming an encapsulation layer on the first capacitor and on the second capacitor and on the plate electrode.

Example 17 is a method of fabricating a 1T-1C cell, the method comprising: bonding a first dielectric layer of a first substrate with a second dielectric layer of second substrate, wherein the first substrate comprises a capacitor, the capacitor comprising a top electrode, a bottom electrode and a dielectric therebetween formed above a plate electrode, and wherein the second substrate comprises a transistor; and forming an electrode structure by creating an opening in the first dielectric layer, in the second dielectric layer and through at least a portion of the plate electrode, the electrode structure coupled with the plate electrode and a terminal of the transistor.

Example 18 is a method according to any example described herein, in particular example 17, wherein after bonding, the method further comprises: etching a multi-layer stack to form the capacitor, wherein the multi-layer stack comprises: a first conductive layer comprising one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \leq x \leq 1$, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$ or wherein 'x' is an integer, nitrogen doped variants of Ir, $Ir_2O_x$, Ru, $RuO_x$, Mo, $MoO_x$, Ta, Cr, Nb, Rh, Ti, W, conductive doped AlN, or conductive doped SiN; a second conductive layer comprising one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \leq x \leq 1$, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$ or wherein 'x' is an integer, nitrogen doped variants of Ir, $Ir_2O_x$, Ru, $RuO_x$, Mo, $MoO_x$, Ta, Cr, Nb, Rh, Ti, W, conductive doped AlN, or conductive doped SiN; and a third dielectric layer between the first conductive layer and second conductive layer, the third dielectric layer comprising a material described herein;

depositing a second conductive layer on the first dielectric layer, the second conductive layer comprising one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \le x \le 1$, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_y$, Ru, $RuO_y$, Mo, $MoO_y$, W, or $WO_y$, wherein 'y' is an integer; etching a third conductive layer below the first conductive layer to form the plate electrode, wherein the third conductive layer comprises one of: $La_{(1-x)}Sr_{(x)}FeO_3$, $La_{(1-x)}Sr(x)CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \le x \le 1$, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$, wherein 'x' is an integer; one of: Ir, $Ir_2O_x$, Ru, $RuO_x$, Mo, $MoO_x$, Ta, Cr, Nb, Rh, Ti, or W doped with nitrogen; one of: TiAlN with >30 atomic percent AlN, TaN with >30 atomic percent N, TiSiN with >20 atomic percent SiN, tantalum carbide (TaC), titanium carbide (TiC), tungsten carbide (WC), tungsten nitride (WN), TaCN, TiCN, WCN, titanium monoxide (TiO or $Ti_2O$), tungsten oxide ($WO_3$), tin oxide ($SnO_2$), indium tin oxide (ITO), iridium oxide ($IrO_2$), indium gallium zinc oxide (IGZO), zinc oxide or METGLAS series of alloys, wherein the third conductive layer is different from the first conductive layer.

Example 19 is a method according to any example described herein, in particular example 18, wherein the plate electrode extends laterally above the transistor and beyond the top electrode, wherein the top electrode is formed by etching the first conductive layer, and wherein the dielectric is formed by etching the third dielectric layer.

Example 20 is a method according to any example described herein, in particular example 18, wherein the second conductive layer and the third conductive layer comprise different materials.

Example 21 is a method according to any example described herein, in particular example 18, further comprising forming a dielectric spacer adjacent to sidewall of the capacitor and on the third conductive layer prior to forming the plate electrode.

Example 1A is method of fabricating a device, the method comprising: forming a multi-layer stack above a first substrate, the multi-layer stack comprising a plurality of electrode layers and a first dielectric layer comprising a non-linear polar material; forming a second dielectric layer above the multi-layer stack; annealing the multi-layer stack; forming a transistor above a second substrate; forming a third dielectric layer above the transistor; bonding the second dielectric layer with the third dielectric layer; etching the multi-layer stack to form a capacitor; and forming an electrode structure, wherein at least a portion of the electrode structure extends through a portion of a plate electrode of the capacitor and couples with a terminal of the transistor.

Example 2A is a method according to any example described herein, in particular example 1A, wherein forming the multi-layer stack comprises: depositing a first conductive layer comprising one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \le x \le 1$, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$ or wherein 'x' is an integer, nitrogen doped variants of Ir, $Ir_2O_x$, Ru, $RuO_x$, Mo, $MoO_x$, Ta, Cr, Nb, Rh, Ti, W, conductive doped AlN, or conductive doped SiN; depositing the non-linear polar material on the first conductive layer, the non-linear polar material comprising a material described herein; and depositing a second conductive layer on the non-linear polar material, the second conductive layer comprising one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \le x \le 1$, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$ or wherein 'x' is an integer, nitrogen doped variants of Ir, $Ir_2O_x$, Ru, $RuO_x$, Mo, $MoO_x$, Ta, Cr, Nb, Rh, Ti, W, conductive doped AlN, or conductive doped SiN.

Example 3A is a method according to any example described herein, in particular example 2A, wherein prior to etching the multi-layer stack the method further comprises: removing the second substrate and masking the multi-layer stack, and wherein etching the multi-layer stack further comprises: etching the second conductive layer to form a top electrode; etching the first dielectric layer to form a dielectric; and forming an encapsulation layer on a first sidewall of the top electrode and on a second sidewall of the dielectric.

Example 4A is a method according to any example described herein, in particular example 3A, wherein the method further comprises: depositing a fourth dielectric layer on the top electrode, on the encapsulation layer and above the first conductive layer; and etching the fourth dielectric layer and the first conductive layer to form the plate electrode above the transistor.

Example 5A is a method according to any example described herein, in particular example 4A, wherein the plate electrode extends laterally beyond a first sidewall of the top electrode and a second sidewall of the dielectric by at least 5 nm.

Example 6A is a method according to any example described herein, in particular example 4A, wherein forming the electrode structure further comprises: etching to form an opening in the fourth dielectric layer, through at least a portion of the plate electrode, through the second dielectric layer, and through the third dielectric layer; depositing one or more conductive materials into the opening; and planarizing to form the electrode structure.

Example 7A is a method according to any example described herein, in particular example 6A, wherein the opening exposes at least a portion of a source terminal or a drain terminal of the transistor, and wherein depositing the one or more conductive materials into the opening further comprises depositing on the source terminal or the drain terminal, and wherein the electrode structure is connected to the plate electrode.

Example 8A is a method according to any example described herein, in particular example 6A, wherein a portion of the opening above the plate electrode comprises a first lateral thickness, wherein a portion of the opening below the plate electrode comprises a second lateral thickness, and wherein the first lateral thickness is greater than the second lateral thickness.

Example 9A is a method according to any example described herein, in particular example 6A, wherein etching the opening through the plate electrode comprises etching through an edge portion of the plate electrode, wherein the electrode structure has a first lateral width above the plate electrode and a second lateral width below the plate electrode, wherein the first lateral width is greater than the second lateral width.

Example 10A is a method according to any example described herein, in particular example 1A, wherein after forming the multi-layer stack, annealing further comprises utilizing a rapid thermal annealing process, wherein the rapid thermal annealing process comprises heating to a first temperature of more than 700 degrees Celsius, for a time duration between 1 s and 60 s, at a first pressure between vacuum and 760 Torr, and wherein the rapid thermal annealing process further comprises flowing $O_2$, $N_2$, or Argon gas while operating at the first pressure between 1 Torr and 760 Torr.

Example 11A is a method according to any example described herein, in particular example 1A, wherein the second dielectric layer comprises silicon and one or more of oxygen, nitrogen or carbon and the third dielectric layer comprises silicon and one or more of oxygen, nitrogen or carbon.

Example 12A is a method according to any example described herein, in particular example 2A, wherein etching the multi-layer stack further comprises: etching to form a block, wherein etching the first conductive layer forms the plate electrode, the plate electrode extending laterally above the transistor; masking and etching the second conductive layer to form a top electrode; and etching the non-linear polar material to form a sixth dielectric layer and exposing an uppermost surface of the plate electrode.

Example 13A is a method of fabricating a 1T-1C cell, the method comprising: bonding a first dielectric layer of a first substrate with a second dielectric layer of second substrate, wherein the first substrate comprises a capacitor, the capacitor comprising a top electrode, a plate electrode and a dielectric therebetween, and wherein the second substrate comprises a transistor; and forming an electrode structure by creating an opening in the first dielectric layer, in the second dielectric layer and through at least a portion of the plate electrode, the electrode structure coupling the plate electrode with a terminal of the transistor.

Example 14A is a method according to any example described herein, in particular example 13A, wherein after bonding, the method further comprises: etching a multi-layer stack to form the capacitor, wherein the multi-layer stack comprises: a first conductive layer comprising one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \leq x \leq 1$, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$ or wherein 'x' is an integer, nitrogen doped variants of Ir, $Ir_2O_x$, Ru, $RuO_x$, Mo, $MoO_x$, Ta, Cr, Nb, Rh, Ti, W, conductive doped AlN, or conductive doped SiN; a second conductive layer comprising one of: $La_{(1-x)}Sr_{(x)}FeO_3$, $La_{(1-x)}Sr(x)CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \leq x \leq 1$, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$ or wherein 'x' is an integer, nitrogen doped variants of Ir, $Ir_2O_x$, Ru, $RuO_x$, Mo, $MoO_x$, Ta, Cr, Nb, Rh, Ti, W, conductive doped AlN, or conductive doped SiN; and a third dielectric layer between the first conductive layer and second conductive layer, the third dielectric layer comprising a material described herein.

Example 15A is a method according to any example described herein, in particular example 14A, wherein etching the multi-layer stack further comprises: etching the second conductive layer to form a top electrode; etching the third dielectric layer to form the dielectric; forming a mask on the top electrode and over a portion of the second conductive layer; and etching the first conductive layer to form the plate electrode, the plate electrode comprising a sidewall that extends beyond a first sidewall of the top electrode and a second sidewall of the dielectric.

Example 16A is a method according to any example described herein, in particular example 15A, wherein prior to masking the top electrode, the method further comprises: forming a dielectric spacer adjacent to the first sidewall and the second sidewall; depositing a fourth dielectric layer on the top electrode and on the first conductive layer; and etching the fourth dielectric layer.

Example 17A is a method of fabricating a device array, the method comprising: depositing a multi-layer stack above a first substrate, the multi-layer stack comprising a plurality of electrode layers and a first dielectric layer comprising a non-linear polar material having a form ABB'$O_3$, AA'B'$O_3$, or $ABO_3$; forming a second dielectric layer on the multi-layer stack; annealing the multi-layer stack; forming a first transistor and a second transistor above a second substrate; forming a third dielectric layer above the first transistor and the second transistor; bonding the second dielectric layer with the third dielectric layer; etching the multi-layer stack to form a first capacitor, a second capacitor, wherein the first capacitor and the second capacitor comprise a shared plate electrode; and forming an electrode structure through at least a portion of the shared plate electrode, the electrode structure coupled with a bridge structure, wherein the bridge structure is coupled with the first transistor and the second transistor.

Example 18A is a method according to any example described herein, in particular example 17, wherein prior to forming the first capacitor or the second capacitor, the method further comprises removing at least a portion of the first substrate, wherein forming the shared plate electrode further comprises: etching a first conductive layer to form a top electrode of the first capacitor and the second capacitor; etching the first dielectric layer to form a dielectric of the first capacitor and the second capacitor; forming an encapsulation layer on a first sidewall of the top electrode and on a second sidewall of the dielectric; masking the top electrode and a portion of a second conductive layer below the dielectric; and etching the second conductive layer to form the shared plate electrode, the shared plate electrode extending laterally beyond the first sidewall, the second sidewall, and above at least the first transistor or the second transistor.

Example 19A is a method according to any example described herein, in particular example 18A, wherein forming the electrode structure further comprises: depositing a fourth dielectric layer above the first capacitor, the second capacitor and the shared plate electrode; etching to form an opening in the fourth dielectric layer, the opening extending through the shared plate electrode, the second dielectric layer, and the third dielectric layer; depositing one or more conductive materials into the opening on the bridge structure; and planarizing to form the electrode structure.

Example 20A is a method according to any example described herein, in particular example 18A, where the first transistor the second transistor are fabricated on a same level, wherein the first transistor is identical to the second transistor, and wherein the bridge structure is a conductive bridge structure coupling a gate terminal of the first transistor with a drain terminal of the second transistor.

Example 1B is a device comprising: a transistor above a substrate; a planar capacitor above the transistor, the planar capacitor comprising a non-linear polar dielectric having a form ABB'$O_3$, AA'B'$O_3$, or $ABO_3$, wherein A' is a first dopant for atomic site A, wherein B' is a second dopant for atomic site B, wherein O is oxygen, wherein the non-linear polar dielectric is between a first electrode and a second electrode; a first dielectric in contact with the second electrode; a second dielectric in contact with the first dielectric, wherein the first dielectric is a part of a first die and wherein the second dielectric is a part of a second die; and a via electrode coupled between the second electrode and a terminal of the transistor, wherein the via electrode further extends through at least a portion of the second electrode, the first dielectric and the second dielectric.

Example 2B is a device according to any example described herein, in particular example 1B, wherein the non-linear polar dielectric comprises a material described herein.

Example 3B The device of claim 1, wherein the second electrode comprises one of: $La_{(1-x)}Sr_{(x)}FeO_3$, $La_{(1-x)}Sr(x)CoO_3$, $La_{(1-x)}Ca_{(x)}MnO_3$, $La_{(1-x)}Sr_{(x)}MnO_3$, $Ba_{(1-x)}Sr(x)RuO_3$, $La_{(1-x)}Sr_{(x)}MnO_3$, where 0≤x≤1, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$ or wherein 'x' is an integer, nitrogen doped variants of Ir, $Ir_2O_x$, Ru, $RuO_x$, Mo, $MoO_x$, Ta, Cr, Nb, Rh, Ti, W, conductive doped AlN, or conductive doped SiN.

Example 4B is a device according to any example described herein, in particular example 1B, wherein the via electrode has a first lateral thickness above the second electrode and a second lateral thickness below the second electrode, wherein the first lateral thickness is greater than the second lateral thickness.

Example 5B is a device according to any example described herein, in particular example 4B, wherein the via electrode extends through within a perimeter of the second electrode.

Example 6B is a device according to any example described herein, in particular example 4B, wherein the via electrode comprises a first portion and a second portion, wherein the first portion is on a third portion of a top surface of the second electrode, and wherein the second portion is adjacent to a sidewall of the second electrode.

Example 7B is a device according to any example described herein, in particular example 1B, wherein the first dielectric comprises silicon and one or more of oxygen, nitrogen or carbon and the second dielectric comprises silicon and one or more of oxygen, nitrogen or carbon.

Example 8B is a device according to any example described herein, in particular example 1B wherein the second electrode is amorphous or polycrystalline.

Example 9B is a device according to any example described herein, in particular example 1B wherein an interface between the first dielectric and the second electrode comprises irregularities that are at least 2 nm.

Example 10B is a device according to any example described herein, in particular example 1B further comprising a dielectric spacer, the dielectric spacer comprising a first sidewall adjacent to a second sidewall of the planar capacitor, wherein the dielectric spacer is on a top surface of the second electrode.

Example 11B is a device comprising: a transistor above a substrate, the transistor comprising a source, a gate, and a drain; a plate electrode above the transistor; a first capacitor comprising a non-linear polar dielectric material on a first portion of the plate electrode, the non-linear polar dielectric material having a form ABC, wherein A and B are two different cations, wherein C is oxygen or nitrogen, and wherein B is combined with a dopant; a second capacitor comprising the non-linear polar dielectric material on a second portion of the plate electrode; a first dielectric on the transistor; a second dielectric between the plate electrode and the first dielectric; and an electrode structure coupled with the plate electrode and a terminal of the transistor, wherein at least a portion of the electrode structure is in contact with the plate electrode.

Example 12B is a device according to any example described herein, in particular example 11B further comprising a dielectric spacer laterally adjacent to a first sidewall of the first capacitor and on a second sidewall of the second capacitor.

Example 13B is a device according to any example described herein, in particular example 12B, wherein a material of the dielectric spacer extends laterally on an uppermost surface of the electrode structure to a third sidewall of the electrode structure.

Example 14B is a device according to any example described herein, in particular example 12B, wherein the electrode structure extends laterally beyond the dielectric spacer adjacent to the first sidewall and the second sidewall.

Example 15B is a device according to any example described herein, in particular example 11B, wherein the plate electrode extends on a plane above the source or the drain of the transistor.

Example 16B is a device according to any example described herein, in particular example 11B, wherein the transistor is a first transistor, and the device further comprises a second transistor identical to the first transistor, wherein the first transistor and the second transistor are on a same plane, and wherein the drain of the first transistor is coupled with a second gate of the second transistor.

Example 17B is a device comprising: a transistor above a substrate; a plate electrode above the transistor; a capacitor on a first portion of the plate electrode, the capacitor comprising a non-linear polar dielectric material between a first electrode and a second electrode, the non-linear polar dielectric material having a form ABC, wherein A and B are two different cations, wherein C is oxygen or nitrogen, and wherein B is combined with a dopant; a first dielectric on the transistor; a second dielectric between the plate electrode and the first dielectric; and an electrode structure coupled with the plate electrode and a terminal of the transistor, wherein the electrode structure extends through at least a second portion of the plate electrode.

Example 18 is a device according to any example described herein, in particular example 17B, wherein the first electrode comprises one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where 0≤x≤1, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_y$, Ru, $RuO_y$, Mo, $MoO_y$, W, or $WO_y$, wherein 'y' is an integer, wherein the second electrode comprises one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where 0≤x≤1, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_y$, Ru, $RuO_y$, Mo, $MoO_y$, W, or $WO_y$, wherein 'y' is an integer, and wherein the plate electrode comprises one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where 0≤x≤1, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$, wherein 'x' is an integer; Ir, $Ir_2O_x$, Ru, $RuO_x$, Mo, $MoO_x$, Ta, Cr, Nb, Rh, Ti, or W doped with nitrogen; TiAlN with >30 atomic percent AlN, TaN with >30 atomic percent N, TiSiN with >20 atomic percent SiN, tantalum carbide (TaC), titanium carbide (TiC), tungsten carbide (WC), tungsten nitride (WN), TaCN, TiCN, WCN, titanium monoxide (TiO or $Ti_2O$), tungsten oxide ($WO_3$), tin oxide ($SnO_2$), indium tin oxide (ITO), iridium oxide ($IrO_2$), indium gallium zinc oxide (IGZO), zinc oxide, or METGLAS series of alloys, and wherein the plate electrode is different from the first electrode.

Example 19B is a device according to any example described herein, in particular example 17B, wherein the first dielectric comprises silicon and one or more of oxygen, nitrogen or carbon and the second dielectric comprises silicon and one or more of oxygen, nitrogen or carbon.

Example 20B is a device according to any example described herein, in particular example 17B, wherein a portion of the electrode structure is laterally surrounded by the plate electrode.

Example 1C is a method of fabricating a device, the method comprising: forming a planar capacitor above a first substrate, the planar capacitor comprising a first dielectric comprising a non-linear polar material between a top electrode and a bottom electrode: depositing a conductive layer above the planar capacitor; depositing a first dielectric layer on the conductive layer; forming a transistor above a second substrate; depositing a second dielectric layer above the transistor; bonding the first dielectric layer with the second dielectric layer; etching the conductive layer to form a plate electrode coupled with the planar capacitor; and forming an electrode structure, wherein at least a first portion of the electrode structure extends through the plate electrode and couples with a terminal of the transistor.

Example 2C is a method according to any example described herein, in particular example 1C further comprises: forming an encapsulation layer on a sidewall of the planar capacitor; and depositing a second dielectric on the encapsulation layer, wherein the conductive layer is further deposited on the second dielectric.

Example 3C is a method according to any example described herein, in particular example 2C where the method further comprises etching the encapsulation layer to form a spacer on the sidewall of the planar capacitor prior to depositing the second dielectric.

Example 4C is a method according to any example described herein, in particular example 2C where the method further comprises: removing the first substrate after bonding; and etching the second dielectric and the conductive layer in a region surrounding the planar capacitor to form a block, the block comprising the plate electrode formed above the transistor.

Example 5C is a method according to any example described herein, in particular example 2C, wherein forming the electrode structure further comprises: etching an opening through the second dielectric, through at least a second portion of the plate electrode, and through the first dielectric layer and the second dielectric layer; depositing one or more conductive materials into the opening; and planarizing to form the electrode structure.

Example 6C is a example according to any example described herein, in particular example 5C, wherein depositing the one or more conductive materials into the opening further comprises depositing on a source terminal or a drain terminal of the transistor, and wherein the electrode structure is further coupled with a lower most electrode of the planar capacitor.

Example 7C is a method according to any example described herein, in particular example 5C, wherein the opening comprises a third portion above the plate electrode and a fourth portion below the plate electrode, wherein the third portion comprises a first lateral thickness and the fourth portion comprises a second lateral thickness, wherein the first lateral thickness is greater than the second lateral thickness.

Example 8C is a method according to any example described herein, in particular example 5C, wherein etching the opening comprises etching through the plate electrode, wherein at least a fifth portion of the electrode structure is laterally surrounded by the plate electrode.

Example 9C is a method according to any example described herein, in particular example 5C, wherein etching the opening through the plate electrode comprises etching through an edge portion of the plate electrode, wherein the electrode structure has a larger lateral width above the plate electrode compared to below the plate electrode.

Example 10C is a method according to any example described herein, in particular example 1C, wherein forming the electrode structure further comprises forming a sixth portion on the plate electrode and a seventh portion extending along a sidewall of the plate electrode towards the transistor, wherein the seventh portion is in contact with a source region or a drain region of the transistor.

Example 11C is a method according to any example described herein, in particular example 6C, wherein depositing the one or more conductive materials comprises: depositing a liner layer that extends from an uppermost surface of the source terminal or the drain terminal, along a sidewall of the opening; and depositing a conductive fill metal on the liner layer within the opening.

Example 12C is a method according to any example described herein, in particular example 1C, wherein forming the planar capacitor comprises: forming a multi-layer stack by: depositing a first conductor comprising one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \leq x \leq 1$, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$ or wherein 'x' is an integer, nitrogen doped variants of Ir, $Ir_2O_x$, Ru, $RuO_x$, Mo, $MoO_x$, Ta, Cr, Nb, Rh, Ti, W, conductive doped AlN, or conductive doped SiN; depositing a third dielectric layer on the first conductor, the third dielectric layer comprising a material described herein; depositing a second conductor on the third dielectric layer, the second conductor comprising one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \leq x \leq 1$, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$ or wherein 'x' is an integer, nitrogen doped variants of Ir, $Ir_2O_x$, Ru, $RuO_x$, Mo, $MoO_x$, Ta, Cr, Nb, Rh, Ti, W, conductive doped AlN, or conductive doped SiN; and etching the multi-layer stack, wherein the etching comprises: etching the second conductor to form the top electrode; etching the third dielectric layer to form the first dielectric; and etching the first conductor to form the bottom electrode.

Example 13C is a method according to any example described herein, in particular example 12C, wherein the method further comprises annealing the multi-layer stack prior to etching, wherein annealing comprises: annealing at temperatures between 450 and 1100 degrees Celsius.

Example 14C is a method according to any example described herein, in particular example 12C, wherein the conductive layer comprises one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \leq x \leq 1$, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$, wherein 'x' is an integer; Ir, $Ir_2O_x$, Ru, $RuO_x$, Mo, $MoO_x$, Ta, Cr, Nb, Rh, Ti, or W doped with nitrogen; TiAlN with >30 atomic percent AlN, TaN with >30 atomic percent N, TiSiN with >20 atomic percent SiN, tantalum carbide (TaC), titanium carbide (TiC), tungsten carbide (WC), tungsten nitride (WN), TaCN, TiCN, WCN, titanium monoxide (TiO or $Ti_2O$), tungsten oxide ($WO_3$), tin oxide ($SnO_2$), indium tin oxide (ITO), iridium oxide ($IrO_2$), indium gallium zinc oxide (IGZO), zinc oxide, or METGLAS series of alloys, wherein the conductive layer comprises a material that is different from a material of the second conductor.

Example 15C is a method of fabricating a device, the method comprising: forming a multi-layer stack above a first substrate, the multi-layer stack comprising a non-linear polar dielectric material having a form ABC, wherein A and B are two different cations, wherein C is Oxygen or Nitrogen, and wherein B is combined with a dopant; patterning the multi-layer stack to form a first capacitor and a second capacitor; forming an encapsulation layer on the first capacitor and on the second capacitor; depositing a conductive hydrogen barrier layer on the first capacitor and on the second capacitor; depositing a first dielectric layer on the conductive hydrogen barrier layer; forming a transistor above a second substrate; depositing a second dielectric layer above the transistor; bonding the first dielectric layer with the second dielectric layer; removing the first substrate; patterning the conductive hydrogen barrier layer to form a plate electrode, the plate electrode coupling a first terminal of the first capacitor and a second terminal of the second capacitor; and forming an electrode structure wherein at least a portion of the electrode structure extends through the plate electrode and couples with a terminal of the transistor.

Example 16C is a method according to any example described herein, in particular example 15C, wherein forming the electrode structure further comprises: depositing a third dielectric layer adjacent to the encapsulation layer prior to depositing the conductive hydrogen barrier layer; after bonding, etching the third dielectric layer and the conductive hydrogen barrier layer to form a block, wherein etching the conductive hydrogen barrier layer forms the plate electrode; forming an opening in the third dielectric layer, in the plate electrode, in the first dielectric layer and in the second dielectric layer to expose a source or a drain of the transistor; and depositing a conductive material in the opening and planarizing to form the electrode structure.

Example 17C is a method according to any example described herein, in particular example 15C, wherein forming the first capacitor and the second capacitor comprises forming a first electrode, a second electrode and a dielectric layer comprising the non-linear polar dielectric material therebetween, wherein the first electrode comprises a first lateral thickness and the second electrode comprises a second lateral thickness, wherein the first lateral thickness is greater than that second lateral thickness, and wherein the first electrode is closer to the transistor than the second electrode.

Example 18C is a method of fabricating a 1T-1C cell, the method comprising: bonding first dielectric layer of a first substrate with a second dielectric layer of a second substrate, wherein the first substrate comprises a capacitor coupled with a conductive layer between the capacitor and the first dielectric layer, the capacitor including a non-linear polar material having a form ABC, wherein A and B are two different cations, wherein C is Oxygen or nitrogen, and wherein B is combined with a dopant, and wherein the second substrate includes a transistor below the second dielectric layer; patterning the conductive layer to form a plate electrode; and forming an electrode structure to couple the capacitor with a terminal of the transistor through at least a portion of the plate electrode.

Example 19C is a method according to any example described herein, in particular example 18C, wherein forming the electrode structure further comprises: etching through a portion of an encapsulation layer formed adjacent to the capacitor and through a dielectric between the plate electrode and the encapsulation layer.

Example 20C is a method according to any example described herein, in particular example 18C, wherein the method further comprises planarizing the conductive layer prior to bonding.

Example 1D is a method of fabricating a device, the method comprising: forming a planar capacitor above a first substrate, the planar capacitor comprising a dielectric between a top electrode and a bottom electrode, wherein the dielectric comprises a non-linear polar material; forming a transistor above a second substrate; removing the first substrate and exposing an electrode structure coupled with the bottom electrode of the planar capacitor; and bonding the electrode structure with a conductive interconnect formed above a source or a drain of the transistor.

Example 2D is a method according to any example described herein, in particular example 1D, wherein removing at least a portion of the first substrate comprises performing a mechanical grinding process, wherein the mechanical grinding process removes a majority of the first substrate and leaves less than 100 microns of the first substrate.

Example 3D The method of example 2, wherein removing the less than 100 microns of the first substrate further comprises performing at least a chemical mechanical planarization process or an etch process.

Example 4D is a method according to any example described herein, in particular example 1D, wherein the method further comprises: forming an encapsulation layer on a sidewall of the planar capacitor; depositing a second dielectric on the encapsulation layer; and forming a via electrode on the top electrode.

Example 5D is a method according to any example described herein, in particular example 1D, wherein after removing the first substrate, the method further comprises planarizing a barrier layer in the electrode structure and a first dielectric layer laterally surrounding the electrode structure.

Example 6D is a method according to any example described herein, in particular example 5D wherein the method further comprises: bonding the first dielectric layer with a second dielectric layer laterally surrounding the conductive interconnect.

Example 7D is a method according to any example described herein, in particular example 6D, wherein a misalignment between the electrode structure and the conductive interconnect forms a first overlap between the first dielectric layer and the conductive interconnect, and a second overlap between the second dielectric layer and the electrode structure.

Example 8D is a method according to any example described herein, in particular example 7D, wherein the first overlap and the second overlap is less than 5 nm.

Example 9D is a method according to any example described herein, in particular example 6D, wherein the first dielectric layer comprises one of silicon and one or more of oxygen, nitrogen, or carbon and the second dielectric layer comprises one of silicon and one or more of oxygen, nitrogen, or carbon.

Example 10D is a method according to any example described herein, in particular example 5D, wherein the barrier layer comprises one of: Ir, $Ir_2O_x$, Ru, $RuO_x$, Mo, $MoO_x$, Ta, Cr, Nb, Rh, Ti, W, $WO_x$, wherein 'x' is an integer; Ir, $Ir_2O_x$, Ru, $RuO_x$, Mo, $MoO_x$, Ta, Cr, Nb, Rh, Ti, or W doped with nitrogen; TiAlN with >30 atomic percent AlN, TaN with >30 atomic percent N, TiSiN with >20 atomic percent SiN, tantalum carbide (TaC), titanium carbide (TiC), tungsten carbide (WC), tungsten nitride (WN), TaCN, TiCN, WCN, titanium monoxide (TiO or $Ti_2O$), tungsten oxide ($WO_3$), tin oxide ($SnO_2$), indium tin oxide (ITO), iridium oxide ($IrO_2$), indium gallium zinc oxide (IGZO), zinc oxide, or METGLAS series of alloys, and wherein the conductive interconnect comprises one of: Ru, Ti, Co, Cu, Mo, Co, Ni, W, or Ta; or nitrides of Ti, W, or Ta.

Example 11D is a method according to any example described herein, in particular example 1D, wherein forming the planar capacitor comprises: forming a multi-layer stack by: depositing a first conductor comprising one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \le x \le 1$, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$ or wherein 'x' is an integer, nitrogen doped variants of Ir, $Ir_2O_x$, Ru, $RuO_x$, Mo, $MoO_x$, Ta, Cr, Nb, Rh, Ti, W, conductive doped AlN, or conductive doped SiN; depositing a dielectric layer on the first conductor, the dielectric layer comprising one of: a material described herein; depositing a second conductor on the dielectric layer, the second conductor comprising one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \le x \le 1$, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$ or wherein 'x' is an integer, nitrogen doped variants of Ir, $Ir_2O_x$, Ru, $RuO_x$, Mo, $MoO_x$, Ta, Cr, Nb, Rh, Ti, W, conductive doped AlN, or conductive doped SiN; and etching the multi-layer stack, wherein the etching comprises: etching the first conductor to form the top electrode; etching the dielectric layer to form the dielectric; and etching the second conductor to form the bottom electrode.

Example 12D is method of fabricating a device, the method comprising: forming a first electrode structure and a second electrode structure within a first dielectric layer, the first dielectric layer above a first substrate; forming a capacitor on the first electrode structure, the capacitor comprising a dielectric between a top electrode and a bottom electrode, wherein the dielectric comprises a non-linear polar material; forming a first transistor and a second transistor above a second substrate; removing the first substrate; and performing a bonding operation, wherein the bonding operation brings into contact: the first electrode structure with a first conductive interconnect formed above a first source or a first drain of the first transistor, and the second electrode structure with a second conductive interconnect formed above a second source or a third drain of the second transistor.

Example 13D is a method according to any example described herein, in particular example 12D, wherein after forming the capacitor, the method further comprises: depositing an encapsulation layer on a sidewall of the capacitor; depositing a second dielectric layer above the first dielectric layer; and forming a via electrode on the top electrode.

Example 14D is a method according to any example described herein, in particular example 13D, wherein prior to bonding, the method further comprises: forming a third conductive interconnect in an opening formed by etching portion of the second dielectric layer; and depositing one or more conductive materials into the opening and on the second electrode structure to form the third conductive interconnect.

Example 15D is a method according to any example described herein, in particular example 12D, wherein the first transistor and the second transistor are on a same level, and wherein the first conductive interconnect and the second conductive interconnect comprise a first conductive material that is different from a second conductive material of the first electrode structure and the second electrode structure.

Example 16D is a method of fabricating a device, the method comprising: forming a planar capacitor above a first substrate, the planar capacitor comprising a dielectric between a top electrode and a bottom electrode, wherein the dielectric comprises a non-linear polar dielectric material having a form ABC, wherein A and B are two different cations, wherein C is Oxygen or Nitrogen, and wherein B is combined with a dopant; forming a transistor above a second substrate; removing the first substrate and exposing the bottom electrode; and bonding the bottom electrode with a conductive interconnect formed above a source or a drain of the transistor.

Example 17D is a method according to any method described herein, in particular example 16D, wherein the method further comprises: depositing a first dielectric layer above the first substrate, wherein the first dielectric layer is adjacent to the planar capacitor; and performing a chemical mechanical polish process to remove the first substrate, wherein the chemical mechanical polish process exposes first lowermost surface of the bottom electrode.

Example 18D is a method according to any method described herein, in particular example 17D, wherein the method further comprises depositing an encapsulation layer on a sidewall of the planar capacitor prior to depositing the first dielectric layer, wherein the chemical mechanical polish process exposes a second lowermost surface of the encapsulation layer adjacent to the first lowermost surface.

Example 19D The method of example 17, wherein the chemical mechanical polish process planarizes to form the first lowermost surface to be coplanar with a second lowermost surface of the first dielectric layer.

Example 20D The method of example 18 further comprises bonding the encapsulation layer with a second dielectric layer formed adjacent to the conductive interconnect.

What is claimed is:

1. A method of fabricating a device, the method comprising:

forming a multi-layer stack above a first substrate, the multi-layer stack comprising a plurality of electrode layers and a first dielectric layer comprising a non-linear polar material;

forming a second dielectric layer above the multi-layer stack;

annealing the multi-layer stack;

forming a transistor above a second substrate;

forming a third dielectric layer above the transistor;

bonding the second dielectric layer with the third dielectric layer;

etching the multi-layer stack to form a capacitor; and forming an electrode structure, wherein at least a portion of the electrode structure extends through a portion of a plate electrode of the capacitor and couples with a terminal of the transistor.

2. The method of claim 1, wherein forming the multi-layer stack comprises:

depositing a first conductive layer comprising one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \leq x \leq 1$, $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$ or wherein 'x' is an integer, nitrogen doped variants of Ir, $Ir_2O_x$, Ru, $RuO_x$, Mo, $MoO_x$, Ta, Cr, Nb, Rh, Ti, W, conductive doped AlN, or conductive doped SiN;

depositing the non-linear polar material on the first conductive layer, the non-linear polar material comprising one of:

depositing the first dielectric layer on the first conductive layer, the first dielectric layer comprising one of:

- a first form $ABB'O_3$, wherein "A" includes one of: Ba, K, Bi, Y, La, Sc, Ce, Pr, Nd, Pm, Sm, Eu, Gd, Tb, Dy, Ho, Er, Yb, Lu, Li, Bi, K, or Na, wherein "B" includes one of Mn, Fe, Ta, or Nb, and wherein "B'" includes one of: Sc, Ti, V, Cr, Mn, Fe, Co, Ni, Cu, or Zn;
- a second form $AA'BO_3$, wherein "A" includes one of: Ba, K, Bi, Y, La, Sc, Ce, Pr, Nd, Pm, Sm, Eu, Gd, Tb, Dy, Ho, Er, Yb, Lu, Li, Bi, K, or Na, wherein "B" includes one of Mn, Fe, Ta, or Nb, wherein "A'" includes one of Y, La, Sc, Ce, Pr, Nd, Pm, Sm, Eu, Gd, Tb, Dy, Ho, Er, Yb, Lu, and wherein A' comprises a valency of site A, but different ferroelectric polarizability from A;
- a third form $ABO_3$, wherein "A" includes one of: Ba, K, Bi, Y, La, Sc, Ce, Pr, Nd, Pm, Sm, Eu, Gd, Tb, Dy, Ho, Er, Yb, Lu, Li, Bi, K, or Na, and wherein "B" includes one of Mn, Fe, Ta, or Nb;
- bismuth ferrite (BFO), BFO with a first doping material, wherein the first doping material is one of lanthanum, elements from lanthanide series of a periodic table, or elements of 3d, 4d, 5d, 6d, 4f, or 5f series of periodic table;
- lead zirconium titanate (PZT) or PZT with a second doping material, wherein the second doping material is one of La or Nb;
- a perovskite material which includes one of: $BaTiO_3$, $PbTiO_3$, $KNbO_3$, $NaTaO_3$, wherein the perovskite material is doped with La or lanthanides, chemically substituted lead titanate, and wherein Zr, La, or Nb is substituted in Ti site;
- a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);
- a $BaTiO_3$ (BTO) based relaxor which includes one of: $BaTiO_3$—$Bi(Zn_{1/2}Ti_{1/2})O_3$ (BTO-BZT), $BaTiO_3$—$BiScO_3$ (BTO-BS): $BiScO_3$, $Ba_{(1-x)}Sr_xTiO_3$ (BST), $BaTiO_3$—$Pb(Mg_{1/3}Nb_{2/3})O_3$ (BTO-PMN), $BaTi_{(1-x)}Zr_xO_3$ (BTZ), $BaTiO_3$—$Pb(Zn_{1/3}Nb_{2/3})O_3$ (BTO-PZN), $BaTiO_3$—$Pb(Sc_{1/2}Nb_{1/2})O_3$ (BTO-PSN);
- a PZT based relaxor which includes one of: PZT-$Pb(Mg_{1/3}Nb_{2/3})O_3$ (PZT-PMN), PZT-$Pb(Ni_{1/3}Nb_{2/3})O_3$ (PZT-PNN), PZT-$Pb(Zn_{1/3}Nb_{2/3})O_3$ (PZT-PZN), PZT-$Pb(Sc_{1/2}Nb_{1/2})O_3$ (PZT-PSN), PZT-$Pb(Fe_{1/2}Nb_{1/2})O_3$ (PZT-PFN), PZT-$Pb(La,Zr,Ti)O_3$ (PZT-PLZT), or PZT-$Pb(Ti,Mn)O_3$ (PZT-PTM);
- a $SrBi_2Ta_2O_9$ (SBT) based relaxor which includes one of: paraelectric SBT-$SrBi_2(Nb,Ta)_2O_9$ (SBT-SBNT), or SBT doped with one of: Mn, Fe, Co, La, Ce, or Nd, Ba, or Ca;
- a first hexagonal ferroelectric which includes one of: $YMnO_3$ or $LuFeO_3$;
- a second hexagonal ferroelectric of a type $RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
- lithium niobate, lithium tantalate, lithium iron tantalum oxy fluoride, barium strontium niobate, sodium barium niobate, or potassium strontium niobate;
- a first superlattice of a fourth form $[A_n/B_n]_m$, wherein 'A' is a material and comprises one of: $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, wherein 'B' is a material and comprises one of: $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, wherein 'A' is different from 'B', wherein 'n' represents a number of layers of material 'A' and material 'B' in the first superlattice, wherein 'n' is at least 1, wherein 'm' represents a number of bilayers, and wherein 'm' is at least 1;
- a second superlattice of a fifth form $[A_n/B_n/C_n]_m$, wherein 'A' is a material and comprises one of: $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, wherein 'B' is a material and comprises one of: $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, wherein 'C' is a material and comprises one of: $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, wherein 'n' represents a number of layers of material 'A', material 'B', and material 'C' in the second superlattice, wherein 'n' is at least 1, wherein 'm' represents a number of trilayers, and wherein 'm' is at least 1;
- hafnium (Hf), zirconium (Zr), aluminum (Al), silicon (Si), their oxides or their alloyed oxides;
- hafnium oxides of a form $Hf_{(1-x)}E_xO_y$, where E includes one of: Al, Ca, Ce, Dy, Er, Gd, Ge, La, Sc, Si, Sr, Sn, Zr, or Y, wherein 'x' and 'y' are first and second fractions, respectively;
- $HfO_2$ doped with one of: Al, Ca, Ce, Dy, Er, Gd, Ge, La, Sc, Si, Sr, Sn, or Y;
- $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, wherein 'x' and 'y' are third and fourth fractions, respectively;

$LiNbO_3$, $LiTaO_3$, $LiTaO_2F_2$, $Sr_{(x)}Ba_{(1-x)}Nb_2O_6$ where $0.32 \leq x \leq 0.8$, or $KSr_2Nb_5O_{15}$;

a paraelectric material comprising $SrTiO_3$, Ba(x)Sr(y) $TiO_3$, $HfZrO_2$, Hf—Si—O, or La-substituted $PbTiO_3$;

Pb(Zr,Sn,Ti)$NbO_3$ (PNZST), $(NH_4)H_2PO_4$(ADP), $La_{0.2}Sr_{0.7}Fe_{12}O_{19}$, $AgBiP_2Se_6$, $CuInP_2S_6$ $CuBiP_2Se_6$ $[Na_{(1-x/2)}La_{(x/2)}][Nb_{(1-y)}Ti_{(y)}]O_3$, $(Ag_{0.90}Ca_{0.05})(Nb_{0.95}Ta_{0.05})O_3$, (1-z)$NaNbO_3$-zBi$(Ni_{1/2}Sn_{1/2})O_3$, (1-z)$Bi_{0.5}Na_{0.5}TiO_3$-z$Ag_{0.91}Sm_{0.03}NbO_3$, 0.90$NaNbO_3$-0.10$BiFeO_3$, (1-z)$NaNbO_3$-zBi$(Zn_{2/3}Nb_{1/3})O_3$, (1-z)$NaNbO_3$-zBi$(Zn_{0.5}Ti_{0.5})O_3$, $Ag_{0.76}La_{0.08}NbO_3$, $Ag_{0.97}Nd_{0.01}Ta_{0.20}Nb_{0.8}O_3$, $Lu_2O_3$ modified $AgNbO_3$, or (La)Pb(Zr,Ti)$O_3$ wherein 'x' is less than or equal to 1, wherein 'y' is less than or equal to 1, and wherein 'z' is less than or equal to 1; or $CsGeX_3$, with bandgap between 1.6 eV and 3.3 eV, wherein 'X' is a halide, $CuInP_2S_6$, $WTe_2$, $LiOsO_3$, $Ca_3Ru_2O_7$, $In_2Se_3$, SnTe, SnS, SnSe, $MoTe_2$, $Bi_{(1-x)}La_xTi_3O_{12}$, $SrBi_2Ta_2O_9$, $Bi_4Ni_3Ti_{12}$, $Bi_4Na_{0.5}TiO_3$, $CH_3NH_3PbI_3$, $CH_3NH_3PbI_{(3-x)}Cl_x$, $PbZr_{0.2}Ti_{0.8}O_3$, wherein 'x' is a compositional fraction, $(CH_3(CH_2)_3NH_3)_2(CH_3NH_3)_{n-1}Pb_nI_{3n+1}$, wherein 'n' is a positive integer, $(Sr_{0.96}La_{0.04})(Zr_{0.90}Ti_{0.10})O_3$, $La_{0.7}Sr_{0.3}MnRu_{0.05}O_3$, $Ca_{0.99}Ce_{0.11}MnO_3$, $H_xSr$-$RuO_3$, $SrRuO_3$, or EuO; and depositing a second conductive layer on the non-linear polar material, the second conductive layer comprising one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \leq x \leq 1$ $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$ or wherein 'x' is an integer, nitrogen doped variants of Ir, $Ir_2O_x$, Ru, $RuO_x$, Mo, $MoO_x$, Ta, Cr, Nb, Rh, Ti, W, conductive doped AlN, or conductive doped SiN.

3. The method of claim 2, wherein prior to etching the multi-layer stack the method further comprises:

removing the second substrate and masking the multi-layer stack, and wherein etching the multi-layer stack further comprises:

etching the second conductive layer to form a top electrode;

etching the first dielectric layer to form a dielectric; and forming an encapsulation layer on a first sidewall of the top electrode and on a second sidewall of the dielectric.

4. The method of claim 3, wherein the method further comprises:

depositing a fourth dielectric layer on the top electrode, on the encapsulation layer, and above the first conductive layer; and etching the fourth dielectric layer and the first conductive layer to form the plate electrode above the transistor.

5. The method of claim 4, wherein the plate electrode extends laterally beyond a first sidewall of the top electrode and a second sidewall of the dielectric by at least 5 nm.

6. The method of claim 4, wherein forming the electrode structure further comprises:

etching to form an opening in the fourth dielectric layer, through at least a portion of the plate electrode, through the second dielectric layer, and through the third dielectric layer;

depositing one or more conductive materials into the opening; and planarizing to form the electrode structure.

7. The method of claim 6, wherein the opening exposes at least a portion of a source terminal or a drain terminal of the transistor, wherein depositing the one or more conductive materials into the opening further comprises depositing on the source terminal or the drain terminal, and wherein the electrode structure is connected to the plate electrode.

8. The method of claim 6, wherein a portion of the opening above the plate electrode comprises a first lateral thickness, wherein a portion of the opening below the plate electrode comprises a second lateral thickness, and wherein the first lateral thickness is greater than the second lateral thickness.

9. The method of claim 6, wherein etching the opening through the plate electrode comprises etching through an edge portion of the plate electrode, wherein the electrode structure has a first lateral width above the plate electrode and a second lateral width below the plate electrode, and wherein the first lateral width is greater than the second lateral width.

10. The method of claim 1, wherein after forming the multi-layer stack, annealing further comprises utilizing a rapid thermal annealing process, wherein the rapid thermal annealing process comprises heating to a first temperature of more than 700 degrees Celsius, for a time duration between 1 s and 60 s, at a first pressure between vacuum and 760 Torr, and wherein the rapid thermal annealing process further comprises flowing $O_2$, $N_2$, or Argon gas while operating at the first pressure between 1 Torr and 760 Torr.

11. The method of claim 1, wherein the second dielectric layer comprises silicon and one or more of oxygen, nitrogen, or carbon and the third dielectric layer comprises silicon and one or more of oxygen, nitrogen or carbon.

12. The method of claim 2, wherein etching the multi-layer stack further comprises:

etching to form a block, wherein etching the first conductive layer forms the plate electrode, the plate electrode extending laterally above the transistor;

masking and etching the second conductive layer to form a top electrode; and etching the non-linear polar material to form a sixth dielectric layer and exposing an uppermost surface of the plate electrode.

13. A method of fabricating a 1T-1C cell, the method comprising:

bonding a first dielectric layer of a first substrate with a second dielectric layer of a second substrate, wherein the first substrate comprises a capacitor, the capacitor comprising a top electrode, a plate electrode, and a dielectric therebetween, and wherein the second substrate comprises a transistor; and forming an electrode structure by creating an opening in the first dielectric layer, in the second dielectric layer, and through at least a portion of the plate electrode, the electrode structure coupling the plate electrode with a terminal of the transistor.

14. The method of claim 13, wherein after bonding, the method further comprises:

etching a multi-layer stack to form the capacitor, and wherein the multi-layer stack comprises:

a first conductive layer comprising one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \leq x \leq 1$ $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$ or wherein 'x' is an integer, nitrogen doped variants of Ir, $Ir_2O_x$, Ru, $RuO_x$, Mo, $MoO_x$, Ta, Cr, Nb, Rh, Ti, W, conductive doped AlN, or conductive doped SiN;

a second conductive layer comprising one of: $La_{(1-x)}Sr_{(x)}FeO_3$, $La_{(1-x)}Sr_{(x)}CoO_3$, $La_{(1-x)}Ca_{(x)}MnO_3$, $La_{(1-x)}Sr_{(x)}MnO_3$, $Ba_{(1-x)}Sr_{(x)}RuO_3$, $La_{(1-x)}Sr_{(x)}MnO_3$, where $0 \leq x \leq 1$ $SrRuO_3$, $Sr_2RuO_4$, $SrMoO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, Ta, Cr, Nb, Rh, Ti, W, $WO_x$ or wherein 'x' is an integer, nitrogen doped variants of Ir, $Ir_2O_x$, Ru, $RuO_x$, Mo, $MoO_x$, Ta, Cr, Nb, Rh, Ti, W, conductive doped AlN, or conductive doped SiN; and a third dielectric layer between the first conductive layer and second conductive layer, the third dielectric layer comprising one of:

a first form $ABB'O_3$, wherein "A" includes one of: Ba, K, Bi, Y, La, Sc, Ce, Pr, Nd, Pm, Sm, Eu, Gd, Tb, Dy, Ho, Er, Yb, Lu, Li, Bi, K, or Na, wherein "B" includes one of Mn, Fe, Ta, or Nb, and wherein "B'" includes one of: Sc, Ti, V, Cr, Mn, Fe, Co, Ni, Cu, or Zn;

a second form $AA'BO_3$, wherein "A" includes one of: Ba, K, Bi, Y, La, Sc, Ce, Pr, Nd, Pm, Sm, Eu, Gd, Tb, Dy, Ho, Er, Yb, Lu, Li, Bi, K, or Na, wherein "B" includes one of Mn, Fe, Ta, or Nb, wherein "A'" includes one of Y, La, Sc, Ce, Pr, Nd, Pm, Sm, Eu, Gd, Tb, Dy, Ho, Er, Yb, Lu, and wherein A' comprises a valency of site A, but different ferroelectric polarizability from A;

a third form $ABO_3$, wherein "A" includes one of: Ba, K, Bi, Y, La, Sc, Ce, Pr, Nd, Pm, Sm, Eu, Gd, Tb, Dy, Ho, Er, Yb, Lu, Li, Bi, K, or Na, and wherein "B" includes one of Mn, Fe, Ta, or Nb;

bismuth ferrite (BFO), BFO with a first doping material, wherein the first doping material is one of lanthanum, elements from lanthanide series of a periodic table, or elements of 3d, 4d, 5d, 6d, 4f, or 5f series of periodic table;

lead zirconium titanate (PZT) or PZT with a second doping material, wherein the second doping material is one of La or Nb;

a perovskite material which includes one of: $BaTiO_3$, $PbTiO_3$, $KNbO_3$, $NaTaO_3$, wherein the perovskite material is doped with La or lanthanides, chemically substituted lead titanate, and wherein Zr, La, or Nb is substituted in Ti site;

a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);

a $BaTiO_3$ (BTO) based relaxor which includes one of: $BaTiO_3$—$Bi(Zn_{1/2}Ti_{1/2})O_3$ (BTO-BZT), $BaTiO_3$—$BiScO_3$ (BTO-BS): $BiScO_3$, $Ba_{(1-x)}Sr_xTiO_3$ (BST), $BaTiO_3$—$Pb(Mg_{1/3}Nb_{2/3})O_3$ (BTO-PMN), $BaTi_{(1-x)}Zr_xO_3$ (BTZ), $BaTiO_3$—$Pb(Zn_{1/3}Nb_{2/3})O_3$ (BTO-PZN), $BaTiO_3$—$Pb(Sc_{1/2}Nb_{1/2})O_3$ (BTO-PSN);

a PZT based relaxor which includes one of: PZT-$Pb(Mg_{1/3}Nb_{2/3})O_3$ (PZT-PMN), PZT-$Pb(Ni_{1/3}Nb_{2/3})O_3$ (PZT-PNN), PZT-$Pb(Zn_{1/3}Nb_{2/3})O_3$ (PZT-PZN), PZT-$Pb(Sc_{1/2}Nb_{1/2})O_3$ (PZT-PSN), PZT-$Pb(Fe_{1/2}Nb_{1/2})O_3$ (PZT-PFN), PZT-Pb(La,Zr,Ti)$O_3$ (PZT-PLZT), or PZT-Pb(Ti,Mn)$O_3$ (PZT-PTM);

a $SrBi_2Ta_2O_9$ (SBT) based relaxor which includes one of: paraelectric SBT-$SrBi_2(Nb,Ta)_2O_9$ (SBT-SBNT), or SBT doped with one of: Mn, Fe, Co, La, Ce, or Nd, Ba, or Ca;

a first hexagonal ferroelectric which includes one of: $YMnO_3$ or $LuFeO_3$;

a second hexagonal ferroelectric of a type $RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);

lithium niobate, lithium tantalate, lithium iron tantalum oxy fluoride, barium strontium niobate, sodium barium niobate, or potassium strontium niobate;

a first superlattice of a fourth form $[A_n/B_n]_m$, wherein 'A' is a material and comprises one of $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, wherein 'B' is a material and comprises one of $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, wherein 'A' is different from 'B', wherein 'n' represents a number of layers of material 'A' and material 'B' in the first superlattice, wherein 'n' is at least 1, wherein 'm' represents a number of bilayers, and wherein 'm' is at least 1;

a second superlattice of a fifth form $[A_n/B_n/C_n]_m$, wherein 'A' is a material and comprises one of $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, wherein 'B' is a material and comprises one of $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, wherein 'C' is a material and comprises one of $BaTiO_3$, $SrTiO_3$, $LaAl_2O_3$, $PbTiO_3$, $SrIrO_3$, $SrRuO_3$, $La_{0.7}Sr_{0.3}MnO_3$, $TmFe_5O_{12}$, Pt, $PbZrO_3$, $Pb(Mg_{1/3}Nb_{2/3})O_3$, $BiFeO_3$, $SnTiO_3$ or $CaTiO_3$, wherein 'n' represents a number of layers of material 'A', material 'B', and material 'C' in the second superlattice, wherein 'n' is at least 1, wherein 'm' represents a number of trilayers, and wherein 'm' is at least 1;

hafnium (Hf), zirconium (Zr), aluminum (Al), silicon (Si), their oxides, or their alloyed oxides;

hafnium oxides of a form $Hf_{(1-x)}E_xO_y$, where E includes one of Al, Ca, Ce, Dy, Er, Gd, Ge, La, Sc, Si, Sr, Sn, Zr, or Y, wherein 'x' and 'y' are first and second fractions, respectively;

$HfO_2$ doped with one of Al, Ca, Ce, Dy, Er, Gd, Ge, La, Sc, Si, Sr, Sn, or Y;

$Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, wherein 'x' and 'y' are third and fourth fractions, respectively;

$LiNbO_3$, $LiTaO_3$, $LiTaO_2F_2$, $Sr_{(x)}Ba_{(1-x)}Nb_2O_6$ where $0.32 \leq x \leq 0.8$, or $KSr_2Nb_5O_{15}$;

a paraelectric material comprising $SrTiO_3$, Ba(x)Sr(y)$TiO_3$, $HfZrO_2$, Hf—Si—O, or La-substituted $PbTiO_3$;

Pb(Zr,Sn,Ti)$NbO_3$ (PNZST), $(NH_4)H_2PO_4$(ADP), $La_{0.2}Sr_{0.7}Fe_{12}O_{19}$, $AgBiP_2Se_6$, $CuInP_2S_6$ $CuBiP_2Se_6$ $[Na_{(1-x/2)}La_{(x/2)}][Nb_{(1-y)}Ti_{(y)}]O_3$, $(Ag_{0.90}Ca_{0.05})(Nb_{0.95}Ta_{0.05})O_3$, (1-z)$NaNbO_3$-z$Bi(Ni_{1/2}Sn_{1/2})O_3$, $(1\text{-}z)Bi_{0.5}Na_{0.5}TiO_3\text{-}zAg_{0.91}Sm_{0.03}NbO_3$, $0.90NaNbO_3\text{-}0.10BiFeO_3$, $(1\text{-}z)NaNbO_3\text{-}zBi(Zn_{2/3}Nb_{1/3})O_3$, $(1\text{-}z)NaNbO_3\text{-}zBi(Zn_{0.5}Ti_{0.5})O_3$, $Ag_{0.76}La_{0.08}NbO_3$, $Ag_{0.97}Nd_{0.01}Ta_{0.20}Nb_{0.8}O_3$, $Lu_2O_3$ modified $AgNbO_3$, or $(La)Pb(Zr,Ti)O_3$ wherein 'x' is less than or equal to 1, wherein 'y' is less than or equal to 1, and wherein 'z' is less than or equal to 1; or $CsGeX_3$, with bandgap between 1.6 eV and 3.3 eV, wherein 'X' is a halide, $CuInP_2S_6$, $WTe_2$, $LiOsO_3$, $Ca_3Ru_2O_7$, $In_2Se_3$, SnTe, SnS, SnSe, $MoTe_2$, $Bi_{(1-x)}La_xTi_3O_{12}$, $SrBi_2Ta_2O_9$, $Bi_4Ni_3Ti_{12}$, $Bi_4Na_{0.5}TiO_3$, $CH_3NH_3PbI_3$, $CH_3NH_3PbI_{(3-x)}Cl_x$, $PbZr_{0.2}Ti_{0.8}O_3$, wherein 'x' is a compositional fraction, $(CH_3(CH_2)_3NH_3)_2(CH_3NH_3)_{n-1}Pb_nI_{3n+1}$, wherein 'n' is a positive integer, $(Sr_{0.96}La_{0.04})(Zr_{0.90}Ti_{0.10})O_3$, $La_{0.7}Sr_{0.3}MnRu_{0.05}O_3$, $Ca_{0.99}Ce_{0.11}MnO_3$, $H_xSrRuO_3$, $SrRuO_3$, or EuO.

15. The method of claim 14, wherein etching the multi-layer stack further comprises:

etching the second conductive layer to form a top electrode;

etching the third dielectric layer to form the dielectric;

forming a mask on the top electrode and over a portion of the second conductive layer; and etching the first conductive layer to form the plate electrode, the plate electrode comprising a sidewall that extends beyond a first sidewall of the top electrode and a second sidewall of the dielectric.

16. The method of claim 15, wherein prior to masking the top electrode, the method further comprises:

forming a dielectric spacer adjacent to the first sidewall and the second sidewall;

depositing a fourth dielectric layer on the top electrode and on the first conductive layer; and etching the fourth dielectric layer.

17. A method of fabricating a device array, the method comprising:

depositing a multi-layer stack above a first substrate, the multi-layer stack comprising a plurality of electrode layers and a first dielectric layer comprising a non-linear polar material having a form $ABB'O_3$, $AA'B'O_3$, or $ABO_3$;

forming a second dielectric layer on the multi-layer stack;

annealing the multi-layer stack;

forming a first transistor and a second transistor above a second substrate;

forming a third dielectric layer above the first transistor and the second transistor;

bonding the second dielectric layer with the third dielectric layer;

etching the multi-layer stack to form a first capacitor, and a second capacitor, wherein the first capacitor and the second capacitor comprise a shared plate electrode; and forming an electrode structure through at least a portion of the shared plate electrode, the electrode structure coupled with a bridge structure, wherein the bridge structure is coupled with the first transistor and the second transistor.

18. The method of claim 17, wherein prior to forming the first capacitor or the second capacitor, the method further comprises removing at least a portion of the first substrate, and wherein forming the shared plate electrode further comprises:

etching a first conductive layer to form a top electrode of the first capacitor and the second capacitor;

etching the first dielectric layer to form a dielectric of the first capacitor and the second capacitor;

forming an encapsulation layer on a first sidewall of the top electrode and on a second sidewall of the dielectric;

masking the top electrode and a portion of a second conductive layer below the dielectric; and etching the second conductive layer to form the shared plate electrode, the shared plate electrode extending laterally beyond the first sidewall, the second sidewall, and above at least the first transistor or the second transistor.

19. The method of claim 18, wherein forming the electrode structure further comprises:

depositing a fourth dielectric layer above the first capacitor, the second capacitor and the shared plate electrode;

etching to form an opening in the fourth dielectric layer, the opening extending through the shared plate electrode, the second dielectric layer, and the third dielectric layer;

depositing one or more conductive materials into the opening on the bridge structure; and planarizing to form the electrode structure.

20. The method of claim 18, where the first transistor and the second transistor are fabricated on a same level, wherein the first transistor is identical to the second transistor, and wherein the bridge structure is a conductive bridge structure coupling a gate terminal of the first transistor with a drain terminal of the second transistor.

* * * * *